US009268226B2

(12) United States Patent
Ichikawa et al.

(10) Patent No.: US 9,268,226 B2
(45) Date of Patent: Feb. 23, 2016

(54) RESIN, RESIST COMPOSITION AND METHOD FOR PRODUCING RESIST PATTERN

(71) Applicant: Sumitomo Chemical Company, Limited, Tokyo (JP)

(72) Inventors: Koji Ichikawa, Toyonaka (JP); Akira Kamabuchi, Kobe (JP); Yuichi Mukai, Sanda (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 79 days.

(21) Appl. No.: 14/052,671

(22) Filed: Oct. 11, 2013

(65) Prior Publication Data

US 2014/0038105 A1 Feb. 6, 2014

Related U.S. Application Data

(62) Division of application No. 12/872,817, filed on Aug. 31, 2010, now Pat. No. 8,592,129.

(30) Foreign Application Priority Data

| | | |
|---|---|---|
| Aug. 31, 2009 | (JP) | 2009-200637 |
| Dec. 21, 2009 | (JP) | 2009-288800 |
| Dec. 21, 2009 | (JP) | 2009-289082 |
| Dec. 21, 2009 | (JP) | 2009-289083 |
| Dec. 21, 2009 | (JP) | 2009-289084 |
| Dec. 21, 2009 | (JP) | 2009-289085 |
| May 27, 2010 | (JP) | 2010-121139 |

(51) Int. Cl.

| | |
|---|---|
| ***G03F 7/004*** | (2006.01) |
| ***C08F 220/18*** | (2006.01) |
| ***G03F 7/039*** | (2006.01) |
| ***G03F 7/038*** | (2006.01) |
| *C08F 220/30* | (2006.01) |
| *C08F 220/60* | (2006.01) |
| *G03F 7/20* | (2006.01) |

(52) U.S. Cl.

CPC ............ *G03F 7/0397* (2013.01); *C08F 220/18* (2013.01); *G03F 7/0045* (2013.01); *G03F 7/038* (2013.01); *G03F 7/20* (2013.01); *C08F 220/30* (2013.01); *C08F 220/60* (2013.01); *G03F 7/0046* (2013.01); *G03F 7/2041* (2013.01)

(58) Field of Classification Search

None

See application file for complete search history.

(56) References Cited

U.S. PATENT DOCUMENTS

| | | | | |
|---|---|---|---|---|
| 3,174,955 | A * | 3/1965 | Black | 526/264 |
| 3,779,778 | A | 12/1973 | Smith et al. | |
| 3,849,137 | A | 11/1974 | Barzynski et al. | |
| 3,859,099 | A | 1/1975 | Petropoulos et al. | |
| 4,576,902 | A | 3/1986 | Saenger et al. | |
| 4,822,716 | A | 4/1989 | Onishi et al. | |
| 4,857,437 | A | 8/1989 | Banks et al. | |
| 5,017,453 | A | 5/1991 | Onishi et al. | |
| 5,073,476 | A | 12/1991 | Meier et al. | |
| 5,198,520 | A | 3/1993 | Onishi et al. | |
| 5,260,410 | A | 11/1993 | Schwalm | |
| 5,453,341 | A | 9/1995 | Schwalm | |
| 6,132,462 | A | 10/2000 | Li | |
| 6,596,458 | B1 | 7/2003 | Sato et al. | |
| 7,122,542 | B2 | 10/2006 | Singh et al. | |
| 7,452,879 | B2 | 11/2008 | Singh et al. | |
| 7,511,137 | B2 | 3/2009 | Li | |

(Continued)

FOREIGN PATENT DOCUMENTS

| | | | |
|---|---|---|---|
| DE | 1218718 | | 6/1966 |
| DE | 3914407 | A1 | 10/1990 |
| EP | 0 126 712 | A1 | 11/1984 |
| JP | 55-164824 | A | 12/1980 |
| JP | 62-69263 | A | 3/1987 |
| JP | 62-153853 | A | 7/1987 |
| JP | 63-26653 | A | 2/1988 |
| JP | 63-146029 | A | 6/1988 |
| JP | 63-146038 | A | 6/1988 |

(Continued)

OTHER PUBLICATIONS

Machine translation JP 2002-023371. Jan. 23, 2002.*

(Continued)

*Primary Examiner* — Cynthia H Kelly
*Assistant Examiner* — Alyssa L Cepluch
(74) *Attorney, Agent, or Firm* — Birch, Stewart, Kolasch & Birch, LLP

(57) ABSTRACT

A resin comprises a structural unit derived from a compound represented by the formula (I);

(I)

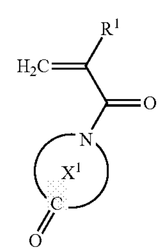

wherein $R^1$ represents a hydrogen atom, a halogen atom or a $C_1$ to $C_6$ alkyl group that optionally has one or more halogen atoms; $X^1$ represents a $C_2$ to $C_{36}$ heterocyclic group, one or more hydrogen atoms contained in the heterocyclic group may be replaced by a halogen atom, a hydroxy group, a $C_1$ to $C_{24}$ hydrocarbon group, a $C_1$ to $C_{12}$ alkoxyl group, a $C_2$ to $C_4$ acyl group, or a $C_2$ to $C_4$ acyloxy group, and one or more —$CH_2$— contained in the heterocyclic group may be replaced by —CO— or —O—.

15 Claims, No Drawings

(56) References Cited

U.S. PATENT DOCUMENTS

| | | | | |
|---|---|---|---|---|
| 7,560,466 | B2 | 7/2009 | Singh et al. | |
| 7,582,648 | B2 | 9/2009 | Singh et al. | |
| 7,754,714 | B2 | 7/2010 | Li et al. | |
| 7,981,989 | B2 | 7/2011 | Yan et al. | |
| 2002/0058201 | A1 | 5/2002 | Miyaji et al. | |
| 2005/0113398 | A1 | 5/2005 | Argade et al. | |
| 2005/0192301 | A1 | 9/2005 | Li | |
| 2005/0209224 | A1 | 9/2005 | Rajinder et al. | |
| 2005/0234049 | A1 | 10/2005 | Singh et al. | |
| 2006/0035891 | A1 | 2/2006 | Li et al. | |
| 2006/0167249 | A1 | 7/2006 | Argade et al. | |
| 2006/0194982 | A1 | 8/2006 | Harada et al. | |
| 2006/0199100 | A1 | 9/2006 | Kanda | |
| 2007/0167439 | A1 | 7/2007 | Singh et al. | |
| 2007/0172761 | A1 | 7/2007 | Takahashi et al. | |
| 2007/0179140 | A1 | 8/2007 | Argade et al. | |
| 2007/0225495 | A1 | 9/2007 | Singh et al. | |
| 2007/0299060 | A1 | 12/2007 | Li et al. | |
| 2008/0009484 | A1 | 1/2008 | Argade et al. | |
| 2008/0009494 | A1 | 1/2008 | Li et al. | |
| 2008/0021020 | A1 | 1/2008 | Argade et al. | |
| 2008/0027045 | A1 | 1/2008 | Argade et al. | |
| 2008/0051412 | A1 | 2/2008 | Argade et al. | |
| 2008/0312438 | A1 | 12/2008 | Singh et al. | |
| 2009/0035692 | A1 | 2/2009 | Tarutani et al. | |
| 2009/0068590 | A1 * | 3/2009 | Dazai et al. | 430/285.1 |
| 2009/0137589 | A1 | 5/2009 | Argade et al. | |
| 2009/0176981 | A1 | 7/2009 | Argade et al. | |
| 2009/0202945 | A1 | 8/2009 | Nakagawa et al. | |
| 2009/0226842 | A1 * | 9/2009 | Shimizu et al. | 430/281.1 |
| 2009/0318687 | A1 | 12/2009 | Singh et al. | |
| 2010/0203446 | A1 | 8/2010 | Ichikawa et al. | |
| 2010/0279226 | A1 | 11/2010 | Hata et al. | |
| 2011/0053082 | A1 | 3/2011 | Ichikawa et al. | |
| 2011/0060112 | A1 * | 3/2011 | Nakayama et al. | 526/257 |
| 2011/0266534 | A1 | 11/2011 | Yan et al. | |
| 2012/0052443 | A1 | 3/2012 | Masuyama et al. | |
| 2012/0058431 | A1 | 3/2012 | Takahashi et al. | |
| 2012/0070778 | A1 | 3/2012 | Ichikawa et al. | |
| 2012/0148954 | A1 | 6/2012 | Fukumoto et al. | |
| 2012/0219899 | A1 | 8/2012 | Ichikawa et al. | |
| 2012/0219907 | A1 | 8/2012 | Ichikawa et al. | |
| 2012/0219909 | A1 | 8/2012 | Ichikawa et al. | |
| 2012/0219912 | A1 | 8/2012 | Ichikawa et al. | |

FOREIGN PATENT DOCUMENTS

| | | | | |
|---|---|---|---|---|
| JP | 63-163452 | A | | 7/1988 |
| JP | 11-52575 | A | | 2/1999 |
| JP | 2000-503049 | A | | 3/2000 |
| JP | 2001-22070 | A | | 1/2001 |
| JP | 2002-23371 | A | | 1/2002 |
| JP | 2002023371 | A | * | 1/2002 |
| JP | 2002-226436 | A | | 8/2002 |
| JP | 2006-257078 | A | | 9/2006 |
| JP | 2006-276851 | A | | 10/2006 |
| JP | 2007-119696 | A | | 5/2007 |
| JP | 2007-514775 | A | | 6/2007 |
| JP | 2007-272194 | A | | 10/2007 |
| JP | 2009-19146 | A | | 1/2009 |
| JP | 2009-53688 | A | | 3/2009 |
| JP | 2009-69381 | A | | 4/2009 |
| JP | 2009-86358 | A | | 4/2009 |
| JP | 2009086358 | A | * | 4/2009 |
| JP | 2009-175660 | A | | 8/2009 |
| JP | 2010-152341 | A | | 7/2010 |
| JP | 2010-197413 | A | | 9/2010 |
| JP | 2010-204646 | A | | 9/2010 |
| WO | 2007/116664 | A1 | | 10/2007 |
| WO | WO 2009104722 | A1 | * | 8/2009 |
| WO | 2011/024953 | A1 | | 3/2011 |

OTHER PUBLICATIONS

Machine translation JP 2009-086358. Apr. 23, 2009.*

The Office Action, dated Sep. 24, 2013, issued in corresponding Japanese Patent Application No. 2010-121139.

The Office Action, dated Jun. 30, 2015, issued in the corresponding Japanese Patent Application No. 2014-192346.

The Office Action, dated Jun. 30, 2015, issued in the corresponding Japanese Patent Application No. 2014-192347.

An Office Action issued in the corresponding Japanese Patent Application No. 2014-192316 on Jul. 28, 2015.

Office Action issued in the corresponding Japanese Patent Application No. 2014-192347 on Jan. 5, 2016.

* cited by examiner

RESIN, RESIST COMPOSITION AND METHOD FOR PRODUCING RESIST PATTERN

BACKGROUND OF THE INVENTION

1. Field of the Invention

The present invention relates to a resin, a resist composition and a method for producing resist pattern.

2. Background Information

Resist compositions used in the microfabrication of semiconductors using lithography technology contain resins.

A resin having the structural units of the followings and a chemically amplified photoresist composition containing the resin are described in Patent document, JP2006-276851-A.

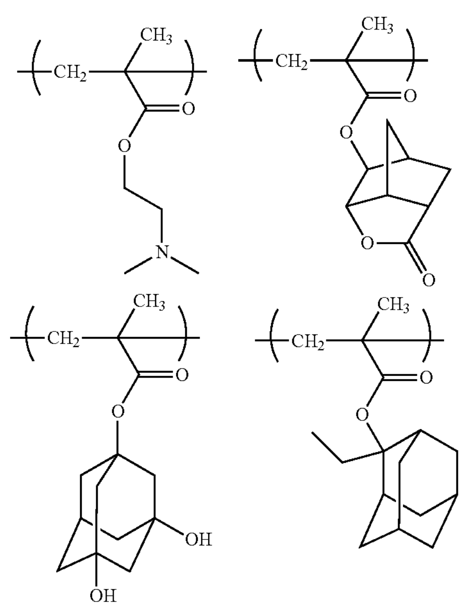

SUMMARY OF THE INVENTION

The object of the present invention is to provide a resin, a resist composition that provides satisfactory pattern shape and focus margin.

The present invention provides following inventions of <1> to <18>.

<1> A resin comprises a structural unit derived from a compound represented by the formula (I);

(I)

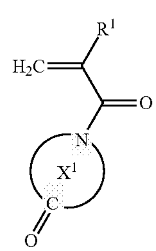

wherein $R^1$ represents a hydrogen atom, a halogen atom or a $C_1$ to $C_6$ alkyl group that optionally has one or more halogen atoms;

$X^1$ represents a $C_2$ to $C_{36}$ heterocyclic group, one or more hydrogen atoms contained in the heterocyclic group may be replaced by a halogen atom, a hydroxy group, a $C_1$ to $C_{24}$ hydrocarbon, a $C_1$ to $C_{12}$ alkoxyl group, a $C_2$ to $C_4$ acyl group, or a $C_2$ to $C_4$ acyloxy group, and one or more —$CH_2$— contained in the heterocyclic group may be replaced by —CO— or —O—.

<2> The resin according to <1>, wherein the compound represented by the formula (I) is a compound represented by the formula (III);

(III)

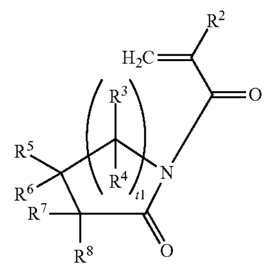

wherein $R^2$ represents a hydrogen atom, a halogen atom or a $C_1$ to $C_6$ alkyl group that optionally has one or more halogen atoms;

$R^3$ to $R^8$ independently represent a hydrogen atom, or a $C_1$ to $C_{24}$ hydrocarbon group, and at least two of $R^3$ to $R^8$ may be bonded together to form a $C_3$ to $C_{30}$ ring, one or more hydrogen atoms contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group, or a $C_2$ to $C_4$ acyloxy group, and one or more —$CH_2$— contained in the hydrocarbon group or the ring may be replaced by —CO— or —O—;

t1 represents an integer of 0 to 3.

<3> The resin according to any one of <1> or <2>, wherein the compound represented by the formula (I) is a compound represented by the formula (IV);

(IV)

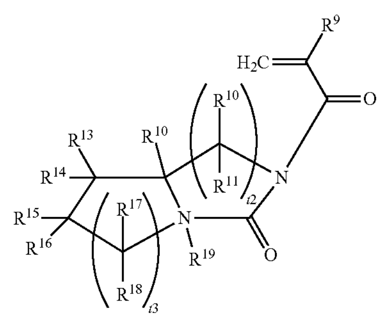

wherein $R^9$ represents a hydrogen atom, a halogen atom or a $C_1$ to $C_6$ alkyl group that optionally has one or more halogen atoms;

$R^{10}$ to $R^{19}$ independently represent a hydrogen atom, or a $C_1$ to $C_{12}$ hydrocarbon group, and at least two of $R^{10}$ to $R^{19}$ may be bonded together to form a $C_3$ to $C_{24}$ ring, one or more hydrogen atoms contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group, or a $C_2$ to $C_4$ acyloxy group, and one or more —$CH_2$— contained in the hydrocarbon group or the ring may be replaced by —CO— or —O—;

t2 and t3 independently represent an integer of 0 to 3.

<4> The resin according to any one of <1> to <3>, wherein the compound represented by the formula (I) is a compound represented by the formula (VI);

(VI)

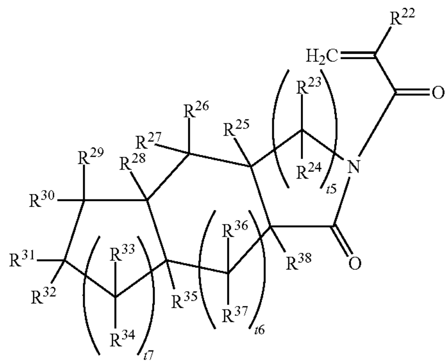

wherein $R^{22}$ represents a hydrogen atom, a halogen atom or a $C_1$ to $C_6$ alkyl group that optionally has one or more halogen atoms;

$R^{23}$ to $R^{38}$ independently represent a hydrogen atom, or a $C_1$ to $C_{12}$ hydrocarbon group, and at least two of $R^{23}$ to $R^{38}$ may be bonded together to form a $C_3$ to $C_{18}$ ring, one or more hydrogen atoms contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group, or a $C_2$ to $C_4$ acyloxy group, and one or more —$CH_2$— contained in the hydrocarbon group or the ring may be replaced by —CO— or —O—;

t5, t6 and t7 independently represent an integer of 0 to 3.

<5> The resin according to <1>, wherein the compound represented by the formula (I) is a compound represented by the formula (V);

(V)

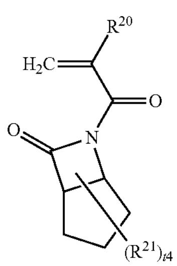

wherein $R^{20}$ represents a hydrogen atom, a halogen atom or a $C_1$ to $C_6$ alkyl group that optionally has one or more halogen atoms;

$R^{21}$ represents a halogen atom, a hydroxy group, a $C_1$ to $C_{12}$ alkyl group, a $C_1$ to $C_{12}$ alkoxyl group, a $C_2$ to $C_4$ acyl group, or a $C_2$ to $C_4$ acyloxy group;

t4 represents an integer of 0 to 8.

<6> The resin according to <1>, wherein the compound represented by the formula (I) is a compound represented by the formula (VII);

(VII)

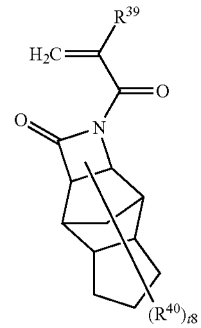

wherein $R^{39}$ represents a hydrogen atom, a halogen atom or a $C_1$ to $C_6$ alkyl group that optionally has one or more halogen atoms;

$R^{40}$ represents a halogen atom, a hydroxy group, a $C_1$ to $C_{12}$ alkyl group, a $C_1$ to $C_{12}$ alkoxyl group, a $C_2$ to $C_4$ acyl group, or a $C_2$ to $C_4$ acyloxy group;

t8 represents an integer of 0 to 14.

<7> The resin according to any one of <1> to <6>, which comprising an acid-labile group, and being insoluble or poorly soluble in aqueous alkali solution but becoming soluble in aqueous alkali solution by the action of acid.

<8> The resin according to any one of <1> to <7>, wherein the resin comprising the structural unit derived from a compound represented by the formula (I) and a structural unit derived from a compound represented by the formula (II1);

(II1)

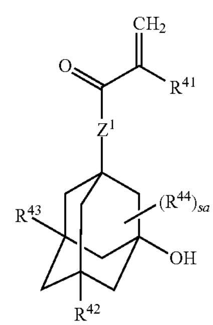

wherein $R^{41}$ represents a hydrogen atom, a halogen atom or a $C_1$ to $C_6$ alkyl group that optionally has one or more halogen atoms;

$Z^1$ represents a divalent $C_1$ to $C_{17}$ saturated hydrocarbon group, and one or more —$CH_2$— contained in the saturated hydrocarbon group may be replaced by —O—, —CO— or —S—;

$R^{42}$ and $R^{43}$ independently represent a hydrogen atom, a methyl group or hydroxy group, provided that at least one of $R^{42}$ and $R^{43}$ represents a hydroxy group;

$R^{44}$ represents a $C_1$ to $C_6$ alkyl group;

sa represents an integer of 0 to 10.

<9> The resin according to any one of <1> to <8>, wherein the resin comprising the structural unit derived from a compound represented by the formula (I) and a structural unit derived from a compound represented by the formula (II2);

(II2)

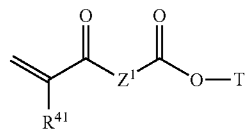

wherein $R^{41}$ represents a hydrogen atom, a halogen atom or a $C_1$ to $C_6$ alkyl group that optionally has one or more halogen atoms;

$Z^1$ represents a divalent $C_1$ to $C_{17}$ saturated hydrocarbon group, and one or more —$CH_2$— contained in the saturated hydrocarbon group may be replaced by —O—, —CO—, —S— or —N($R^{45}$)—;

$R^{45}$ represents a hydrogen atom or a $C_1$ to $C_6$ alkyl group;

T represents a heterocyclic group containing —$SO_2$— as skeleton, one or more hydrogen atoms contained in the heterocyclic group may be replaced by a halogen atom, a hydroxy group, a $C_1$ to $C_{12}$ alkyl group, a $C_1$ to $C_{12}$ alkoxyl group, a $C_6$ to $C_{12}$ aryl group, a $C_7$ to $C_{13}$ aralkyl group, glycidyloxy group or a $C_2$ to $C_4$ acyl group, and one or more —$CH_2$— contained in the heterocyclic group may be replaced by —CO—, —O—, —S—, —$SO_2$— or —N($R^{45}$)—.

<10> The resin according to <9>, wherein T is a group having norbornane skeleton.

<11> The resin according to <9>, wherein T is a group represented by the formula (T3);

(T3)

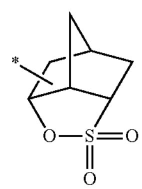

wherein one or more hydrogen atoms contained in the ring may be replaced by a halogen atom, a hydroxy group, a $C_1$ to $C_{12}$ alkyl group, a $C_1$ to $C_{12}$ alkoxyl group, a $C_6$ to $C_{12}$ aryl group, a $C_7$ to $C_{13}$ aralkyl group, glycidyloxy group or a $C_2$ to $C_4$ acyl group, and one or more —$CH_2$— contained in the ring may be replaced by —CO—, —O—, —S—, $SO_2$ or —N($R^{45}$)—;

$R^{45}$ represents a hydrogen atom or a $C_1$ to $C_6$ alkyl group;

* represents a binding position to —O—.

<12> The resin according to any one of <1> to <11>, wherein the resin comprising the structural unit derived from a compound represented by the formula (I) and a structural unit derived from a compound represented by the formula (II3);

(II3)

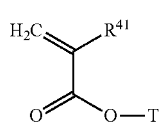

wherein $R^{41}$ represents a hydrogen atom, a halogen atom or a $C_1$ to $C_6$ alkyl group that optionally has one or more halogen atoms;

T represents a heterocyclic group containing —$SO_2$— as skeleton, one or more hydrogen atoms contained in the heterocyclic group may be replaced by a halogen atom, a hydroxy group, a $C_1$ to $C_{12}$ alkyl group, a $C_1$ to $C_{12}$ alkoxyl group, a $C_6$ to $C_{12}$ aryl group, a $C_7$ to $C_{13}$ aralkyl group, glycidyloxy group or a $C_2$ to $C_4$ acyl group, and one or more —$CH_2$— contained in the heterocyclic group may be replaced by —CO—, —O—, —S—, —$SO_2$— or —N($R^{45}$)—;

$R^{45}$ represents a hydrogen atom or a $C_1$ to $C_6$ alkyl group.

<13> The resin according to <12>, wherein T is a group having norbornane skeleton.

<14> The resin according to <12>, wherein T is a group represented by the formula (T3);

(T3)

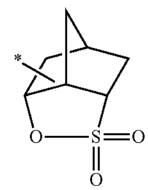

wherein one or more hydrogen atoms contained in the ring may be replaced by a halogen atom, a hydroxy group, a $C_1$ to $C_{12}$ alkyl group, a $C_1$ to $C_{12}$ alkoxyl group, a $C_6$ to $C_{12}$ aryl group, a $C_7$ to $C_{13}$ aralkyl group, glycidyloxy group or a $C_2$ to $C_4$ acyl group, and one or more —$CH_2$— contained in the ring may be replaced by —CO—, —O—, —S—, $SO_2$ or —N($R^{45}$)—;

$R^{45}$ represented a hydrogen atom or a $C_1$ to $C_6$ alkyl group;

* represents a binding position to —O—.

<15> The resin according to any one of <1> to <14>, wherein the resin comprising the structural unit derived from the compound represented by the formula (I) and a structural unit derived from a compound represented by the formula (II4);

(II4)

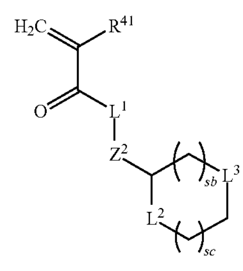

wherein $R^{41}$ represents a hydrogen atom, a halogen atom or a $C_1$ to $C_6$ alkyl group that optionally has one or more halogen atoms;

$Z^2$ represents a single bond or *—$(CH_2)_{sd}$—CO-$L^4$-;

$L^1$, $L^2$, $L^3$ and $L^4$ independently represent —O— or —S—;

sb represents an integer of 1 to 3;

sc represents an integer of 0 to 3;

sd represents an integer of 1 to 4;

* represent a binding position to $L^1$.

<16> A resist composition comprises a resin according any one of <1> to <15>, and an acid generator.

<17> The resist composition according to <16>, which further comprises a basic compound.

<18> A method for producing resist pattern comprises steps of;

(1) applying the resist composition according to claim 16 onto a substrate;

(2) drying the applied composition to form a composition layer;

(3) exposing to the composition layer using a exposure device;

(4) baking the exposed composition layer and, (5) developing the baked composition layer using a developing apparatus.

According to the resin and the resist composition of the present invention, it is possible to achieve satisfactory pattern shape and wide focus margin (DOF) in the pattern formed.

DETAILED DESCRIPTION OF THE PREFERRED EMBODIMENTS

"(Meth)acrylic monomer" means at least one monomer having a structure of "$CH_2$=CH—CO—" or "$CH_2$=C($CH_3$)—CO—", as well as "(meth)acrylate" and "(meth) acrylic acid" mean "at least one acrylate or methacrylate" and "at least one acrylic acid or methacrylic acid," respectively.

The resin of the present invention has structural units derived from a compound represented by the formula (I).

<Compound Represented by the Formula (I)>

(I)

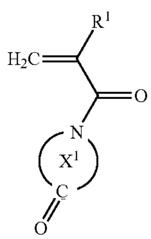

wherein $R^1$ represents a hydrogen atom, a halogen atom or a $C_1$ to $C_6$ alkyl group that optionally has one or more halogen atoms;

$X^1$ represents a $C_2$ to $C_{36}$ heterocyclic group, one or more hydrogen atoms contained in the heterocyclic group may be replaced by a halogen atom, a hydroxy group, a $C_1$ to $C_{24}$ hydrocarbon group, a $C_1$ to $C_{12}$ alkoxyl group, a $C_2$ to $C_4$ acyl group, or a $C_2$ to $C_4$ acyloxy group, and one or more —$CH_2$— contained in the heterocyclic group may be replaced by —CO— or —O—.

A structural unit derived from the compound represented by the formula (I) is a structural unit below.

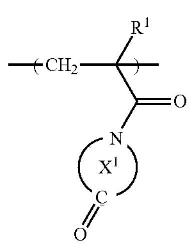

Examples of the halogen atom include fluorine, chlorine, bromine and iodine atom.

Examples of the alkyl group include methyl, ethyl, n-propyl, iso-propyl, n-butyl, sec-butyl, tert-butyl, iso-butyl, n-pentyl, iso-pentyl, tert-pentyl, neo-pentyl, 1-methylbutyl, 2-methylbutyl, n-hexyl, 1-methylpentyl, 1,2-dimethylpropyl and 1-ethylpropyl groups.

Examples of the alkyl group which may have a halogen atom include perfluoromethyl, perfluoroethyl, perfluoropropyl, perfluoro-isopropyl, perfluorobutyl, perfluoro-sec-butyl, perfluoro-tert-butyl, perfluoropentyl and perfluorohexyl groups.

The heterocyclic group may be a group containing —CO— and a nitrogen atom, it may be any of an aromatic heterocyclic or a non-aromatic heterocyclic group, and any of a monocyclic or a polycyclic compound.

Specific examples of the group below include as follows.

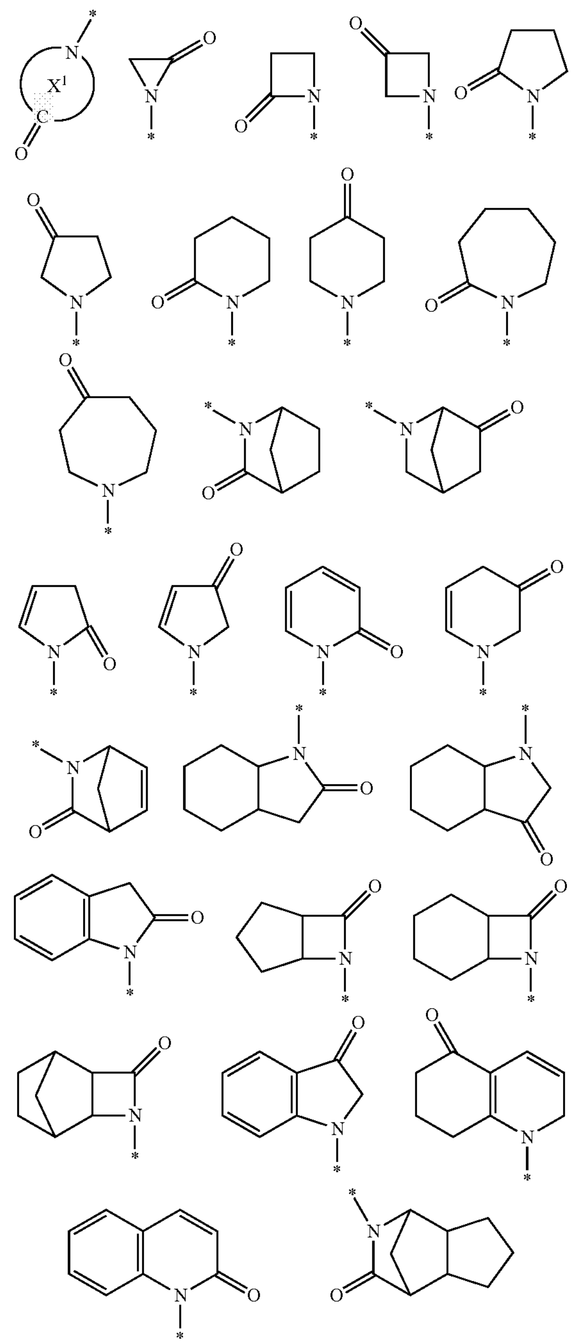

-continued

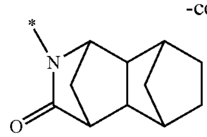
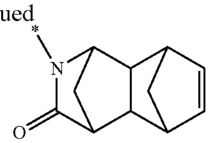
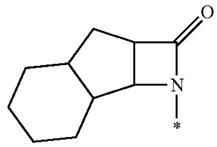
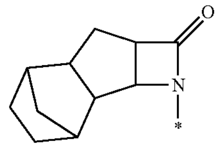
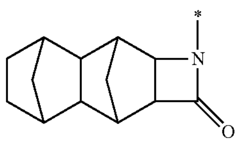
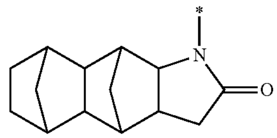
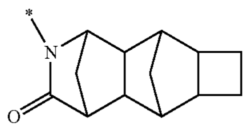
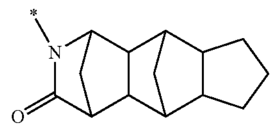
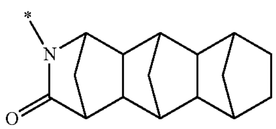
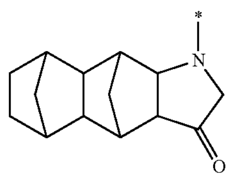
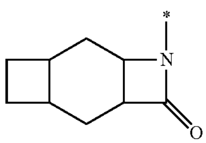
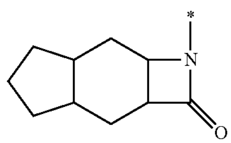
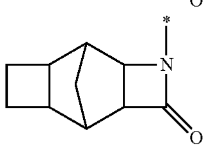
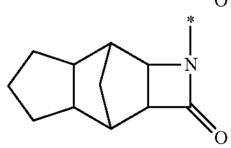
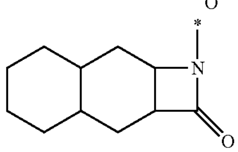
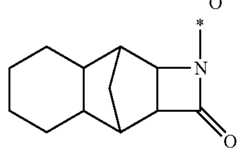
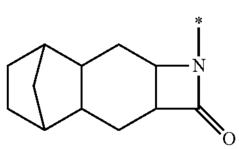
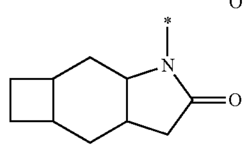
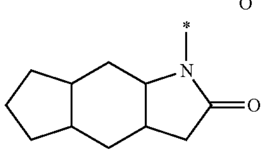
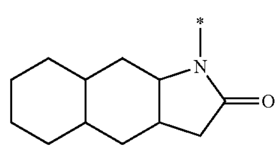
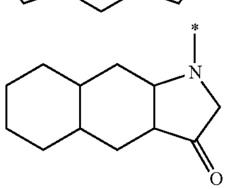
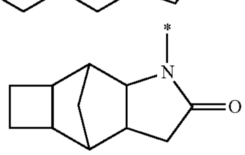
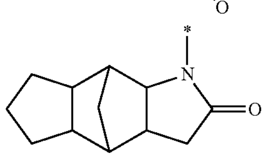
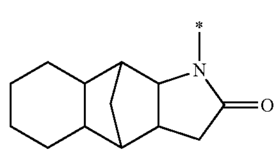

-continued

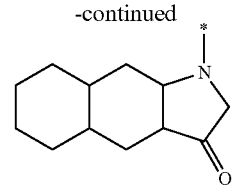

The hydrocarbon group may be any of an aliphatic hydrocarbon group, a saturated cyclic hydrocarbon group and an aromatic hydrocarbon group.

Examples of the hydrocarbon group include aliphatic hydrocarbon groups such as methyl, ethyl, n-propyl, isopropyl, n-butyl, sec-butyl, tert-butyl, n-pentyl, n-hexyl, heptyl, 2-ethylhexhyl, oethyl, nonyl decyl, undecyl and dodecyl groups;

monocyclic or polycyclic saturated hydrocarbon groups such as cyclopropyl, cyclobutyl, cyclopentyl, cyclohexyl, cycloheptyl, cyclooctyl, cyclononyl, cyclodecyl, norbornyl, 1-adamantyl, 2-adamantly) and isobornyl groups; and aromatic hydrocarbon groups such as phenyl, naphthyl, anthnyl, p-methylphenyl, p-tert-butylphenyl, p-adamantylphenyl, tolyl, xylyl, cumenyl, mesityl, biphenyl, anthryl, phenanthryl, 2,6-diethylphenyl and 2-methyl-6-ethylphenyl groups. These groups may be combined.

Among these, the hydrocarbon group is preferably a $C_1$ to $C_{12}$ alkyl group.

Examples of the alkoxyl group include methoxy, ethoxy, n-propoxy, iso-propoxy, n-butoxy, sec-butoxy, tert-butoxy, n-pentoxy, n-hextoxy, heptoxy, octyloxy, 2-ethylhexyloxy, nonyloxy, decyloxy, undecyloxy and dodecyloxy groups.

Examples of the acyl group include acetyl, propionyl and butyryl groups.

Examples of the acyloxy group include acethyloxy, propyonyloxy, butylyloxy and iso-butylyloxy groups.

In the formula (I), $R^1$ is preferably a hydrogen atom or methyl group.

$X^1$ is preferably a 4 to 6-membered heterocyclic group containing a nitrogen atom or a group containing the 4 to 6-membered heterocyclic group. The —CO— is preferably positioned so as to be adjacent to the nitrogen atom.

As the compound represented by the formula (I), a compound represented by the formula (III) is preferable;

(III)

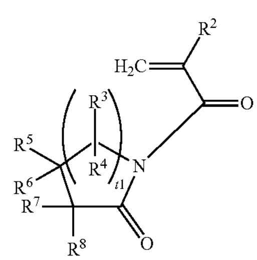

wherein $R^2$ represents a hydrogen atom, a halogen atom or a $C_1$ to $C_6$ alkyl group that optionally has one or more halogen atoms;

$R^3$ to $R^8$ independently represent a hydrogen atom, or a $C_1$ to $C_{24}$ hydrocarbon group, and at least two of $R^3$ to $R^8$ may be bonded together to form a $C_3$ to $C_{30}$ ring, one or more hydrogen atoms contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group, or a $C_2$ to $C_4$ acyloxy group, and one or more —$CH_2$— contained in the hydrocarbon group or the ring may be replaced by —CO— or —O—;

t1 represents an integer of 0 to 3.

As the compound represented by the formula (I), a compound represented by the formula (IV) is preferable;

(IV)

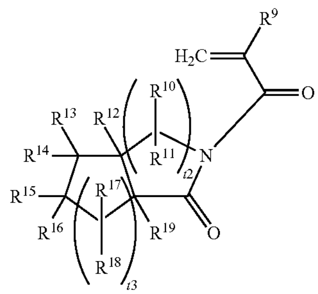

wherein $R^9$ represents a hydrogen atom, a halogen atom or a $C_1$ to $C_6$ alkyl group that optionally has one or more halogen atoms;

$R^{10}$ to $R^{19}$ independently represent a hydrogen atom, or a $C_1$ to $C_{12}$ hydrocarbon group, and at least two of $R^{10}$ to $R^{19}$ may be bonded together to form a $C_3$ to $C_{24}$ ring, one or more hydrogen atoms contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group, a $C_2$ to $C_4$ acyloxy group, and one or more —$CH_2$— contained in the hydrocarbon group or the ring may be replaced by —CO— or —O—;

t2 and t3 independently represent an integer of 0 to 3.

As the compound represented by the formula (I), a compound represented by the formula (VI) is preferable;

(VI)

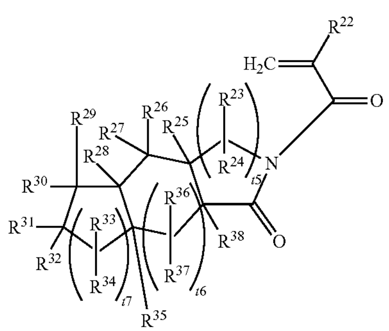

wherein $R^{22}$ represents a hydrogen atom, a halogen atom or a $C_1$ to $C_6$ alkyl group that optionally has one or more halogen atoms;

$R^{23}$ to $R^{38}$ independently represent a hydrogen atom, or a $C_1$ to $C_{12}$ hydrocarbon group, and at least two of $R^{23}$ to $R^{38}$ may be bonded together to form a $C_3$ to $C_{18}$ ring, one or more hydrogen atoms contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group, a $C_2$ to $C_4$ acyloxy group, and one or more —$CH_2$— contained in the hydrocarbon group or the ring may be replaced by —CO— or —O—;

t5, t6 and t7 independently represent an integer of 0 to 3.

As the compound represented by the formula (I), a compound represented by the formula (V) is preferable;

(V)

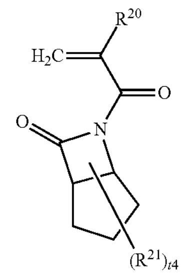

wherein $R^{20}$ represents a hydrogen atom, a halogen atom or a $C_1$ to $C_6$ alkyl group that optionally has one or more halogen atoms;

$R^{21}$ represents a halogen atom, a hydroxy group, a $C_1$ to $C_{12}$ alkyl group, a $C_1$ to $C_{12}$ alkoxyl group, a $C_2$ to $C_4$ acyl group, or a $C_2$ to $C_4$ acyloxy group;

t4 represents an integer of 0 to 8.

As the compound represented by the formula (I), a compound represented by the formula (VII) is preferable;

(VII)

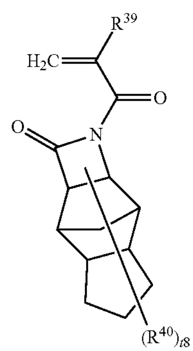

wherein $R^{39}$ represents a hydrogen atom, a halogen atom or a $C_1$ to $C_6$ alkyl group that optionally has one or more halogen atoms;

$R^{40}$ represents a halogen atom, a hydroxy group, a $C_1$ to $C_{12}$ alkyl group, a $C_1$ to $C_{12}$ alkoxyl group, a $C_2$ to $C_4$ acyl group, or a $C_2$ to $C_4$ acyloxy group;

t8 represents an integer of 0 to 14.

Examples of the ring formed by bonding at least two of $R^3$ to $R^8$, $R^{10}$ to $R^{19}$, or $R^{23}$ to $R^{38}$ include the same heterocyclic group as described above.

t1 is preferably 0 or 1, and more preferably 0.

t2 is preferably 0 or 1, and more preferably 0.

t3 is preferably 1 or 2, and more preferably 1.

t4 is preferably 0 or 1, and more preferably 0.

t5 is preferably 0 or 1, and more preferably 0.

t6 is preferably 0 or 1, and more preferably 1.

t7 is preferably 0 or 1, and more preferably 0.

t8 is preferably 0 or 1, and more preferably 0.

Examples of the $C_1$-$C_{12}$ alkyl group include methyl, ethyl, n-propyl, iso-propyl, n-butyl, sec-butyl, tert-butyl, iso-butyl, n-pentyl, iso-pentyl, tert-pentyl, neo-pentyl, 1-methylbutyl, 2-methylbutyl, n-hexyl, 1-methylpentyl, 1,2-dimethylpropyl and 1-ethylpropyl groups.

Examples of the $C_1$-$C_{12}$ alkoxyl group include methoxy, ethoxy, n-propoxy, iso-propoxy, n-butoxy, sec-butoxy, tert-butoxy, n-pentoxy, n-hextoxy, heptoxy, octyloxy, 2-ethylhexyloxy, nonyloxy, decyloxy, undecyloxy and dodecyloxy groups.

Examples of the $C_2$-$C_4$ acyl group include acetyl, propionyl and butyryl groups.
Examples of the $C_2$-$C_4$ acyloxy group include acethyloxy, propyonyloxy, butylyloxy and iso-butylyloxy groups.
Example of the compound represented by the formula (I) include compounds below.
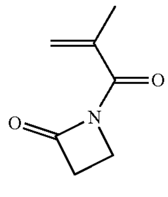
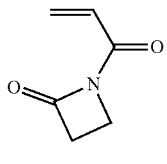
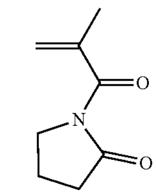
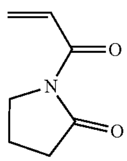
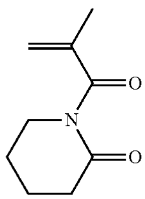
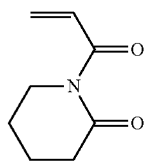
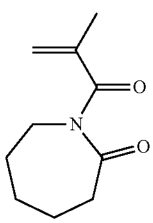
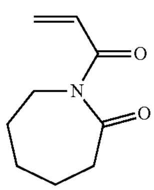
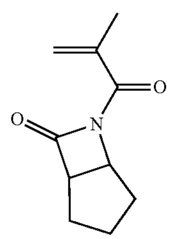
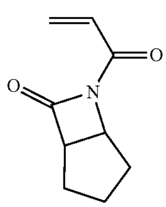
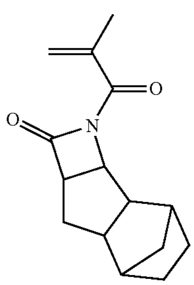
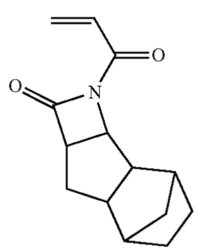
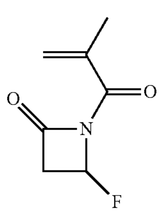
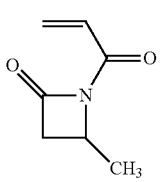
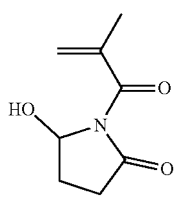
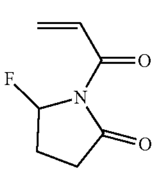
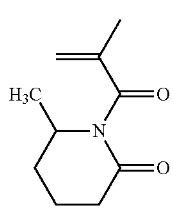
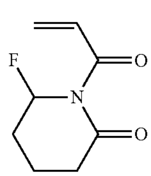
-continued
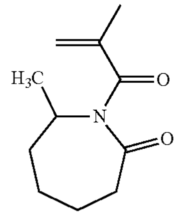
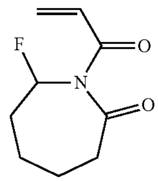
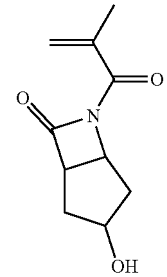
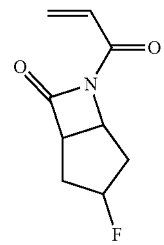
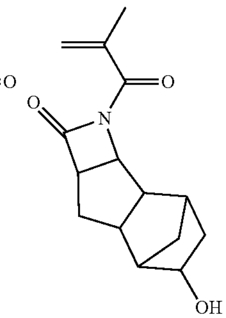
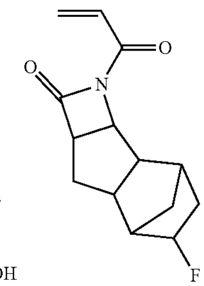
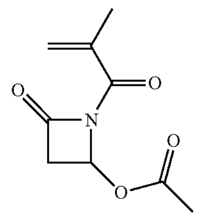
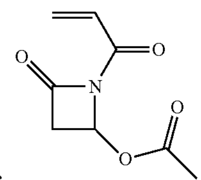
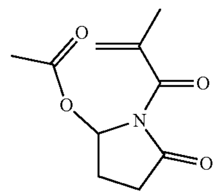
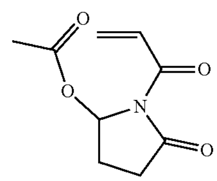
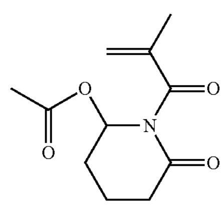
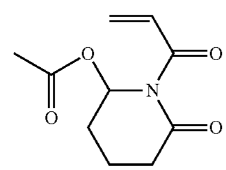
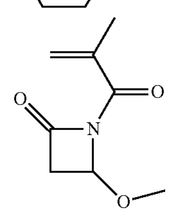
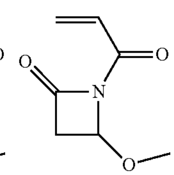
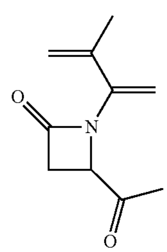
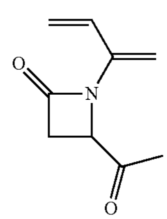
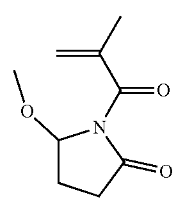

-continued
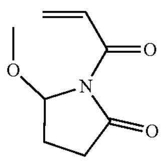
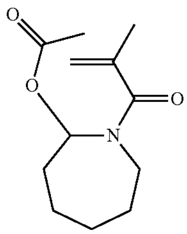
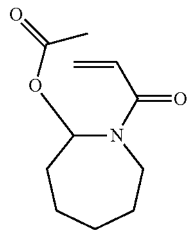
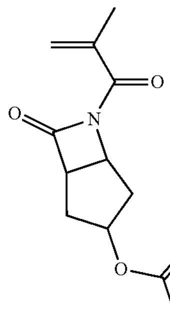
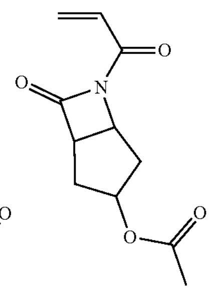
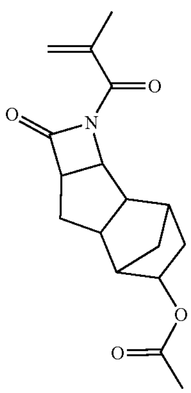
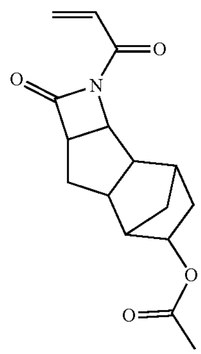
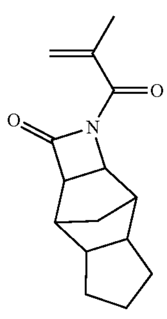
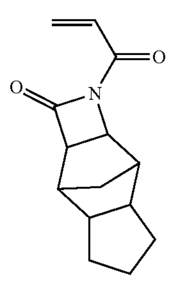
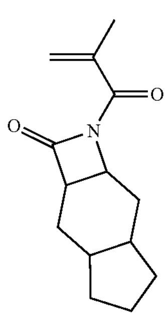
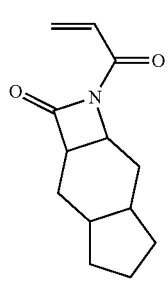
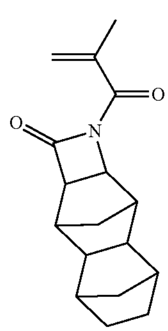
-continued
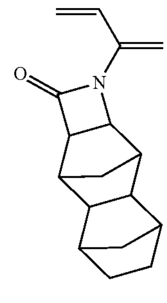
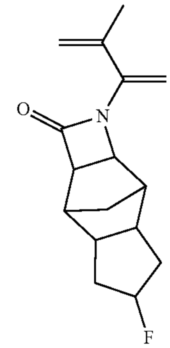
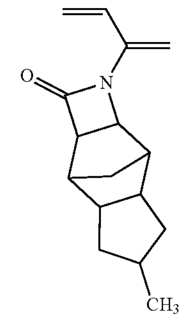
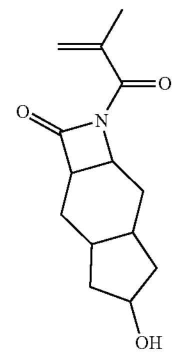
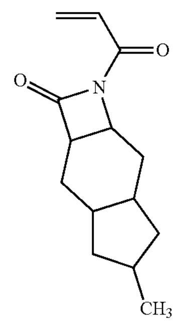
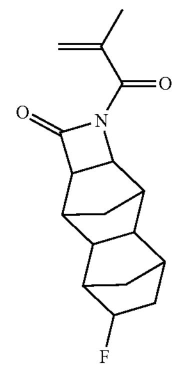
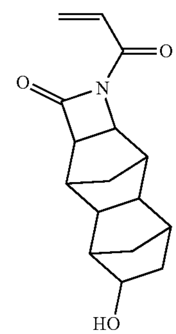
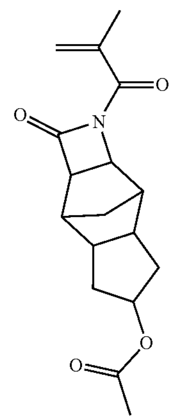
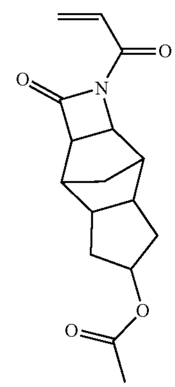
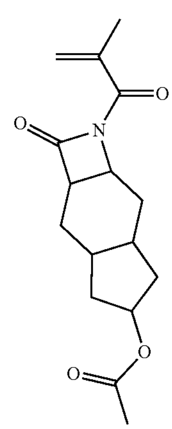
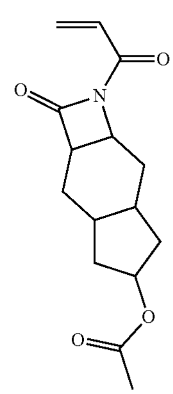

-continued

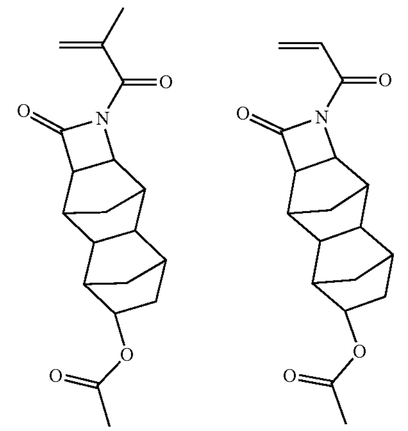 [SMILES: C=C(C)C(=O)N1C(=O)C2C3CC(C4C5CC(OC(C)=O)C(C5)C34)C21 ; C=CC(=O)N1C(=O)C2C3CC(C4C5CC(OC(C)=O)C(C5)C34)C21]

The compound represented by the formula (I) can be produced by a known method in the field, for example, a method below.

The compound represented by the formula (I) can be obtained by reacting a compound represented by the formula (I-a) with a compound represented by the formula (I-b) in presence of a catalyst in a solvent. Preferred examples of the catalyst include N-methylpyrrolidine. Preferred examples of the solvent include N,N-dimethylformamide.

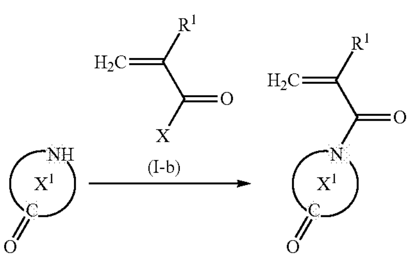

(I-a) (I)

wherein $X^1$ and $R^1$ represent the same meaning as described above;

X represents a halogen atom or (meth)acryloyloxy group.

Examples of the halogen atom include fluorine, chlorine, bromine or iodine atom. The chlorine atom is preferable.

Example of the compound represented by the formula (I-a) include, for example, compounds below. Commercially available compounds are used as these.

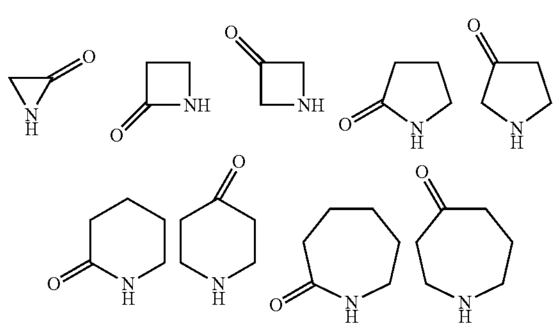

-continued

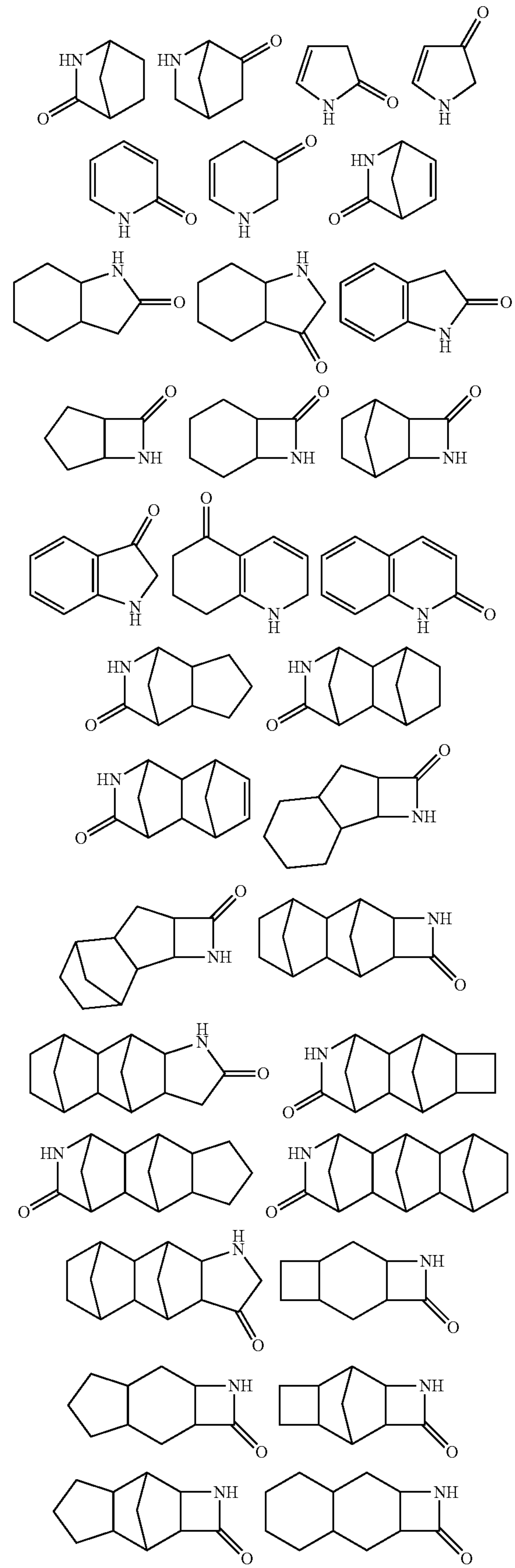

-continued

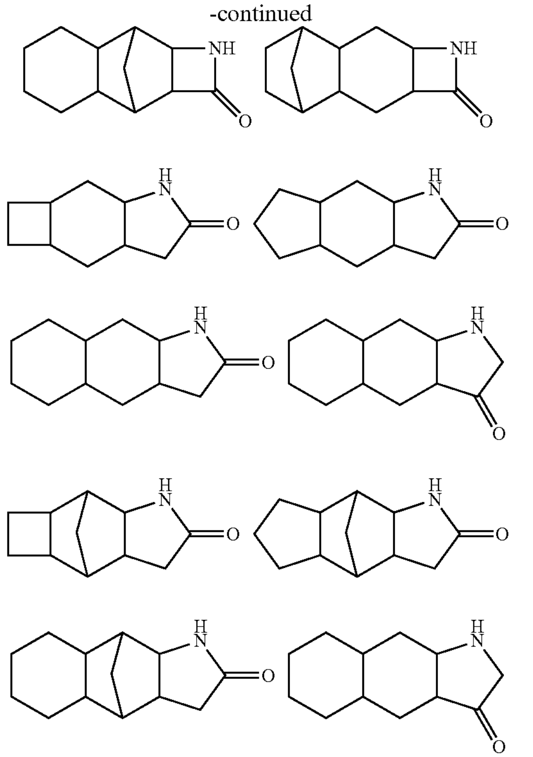

The compound represented by the formula (I-a-1) can be obtained by reacting cyclophentene with chlorosulfonyl isocyanate (see, JP2007-514775-A).

(I-a-1)

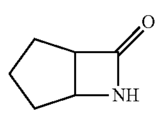

Examples of the compound represented by the formula (I-b) include methacryloyl chloride and methacrylic anhydride.

The content of the structural units derived from the compound represented by the formula (I) in the resin are generally 1 to 100 weight %, preferably 5 to 95 weight %, and more preferably 10 to 80 weight %, with respect to the total structural units constituting the resin.

The resin of the present invention preferably includes a structural unit derived from a monomer having an acid-labile group in addition to the structural unit derived from the compound represented by the formula (I). That is, the resin may be any of a blend of a polymer or an oligomer, or a copolymer including these structural units. Such resin is a resin which is insoluble or poorly soluble in an alkali aqueous solution but becomes soluble in an alkali aqueous solution by the action of the acid.

The "acid-labile group" means a group in which an elimination group is cleaved by contacting with an acid resulting in forming a hydrophilic group such as a hydroxy or carboxy group. Examples of the acid-labile group include, for example, an alkoxy carbonyl group represented by the formula (1) in which an oxygen atom bonds a tertiary carbon atom. Hereinafter a group represented by the formula (1) may refer to as an "acid-labile group (1)".

(1)

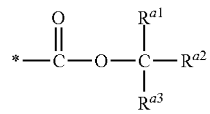

wherein $R^{a1}$ to $R^{a3}$ independently represent a $C_1$ to $C_8$ aliphatic hydrocarbon group or a $C_3$ to $C_{20}$ saturated cyclic hydrocarbon, or $R^{a1}$ and $R^{a2}$ may be bonded together to form a $C_3$ to $C_{20}$ ring, * represents a binding position to an adjacent atom.

The saturated cyclic hydrocarbon group may include a monocyclic or a polycyclic saturated hydrocarbon group. Examples of the monocyclic saturated hydrocarbon group include a cycloalkyl group such as cyclopentyl group, cyclohexyl group, methylcyclohexyl group, dimethylcyclohexyl group, cycloheptyl group and cyclooctyl group. Examples of the polycyclic saturated hydrocarbon group include decahydronaphthyl group, adamantyl group, norbornyl group, methylnorbornylgroup and groups described below.

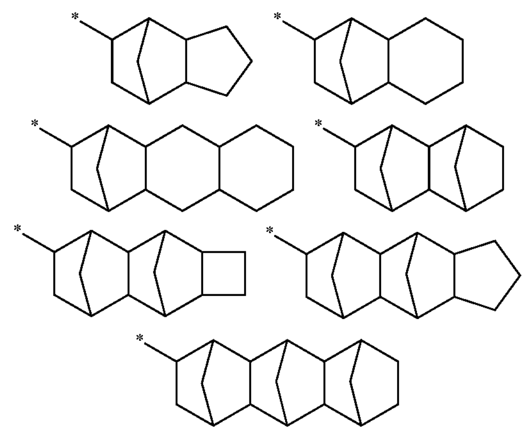

In the formula (1), the saturated cyclic hydrocarbon group preferably has 1 to 16 carbon atoms.

When $R^{a1}$ and $R^{a2}$ is bonded together to form a $C_3$ to $C_{20}$ ring, examples of the group-$C(R^{a1})(R^{a2})(R^{a3})$ include groups below. The ring preferably has 3 to 12 carbon atoms.

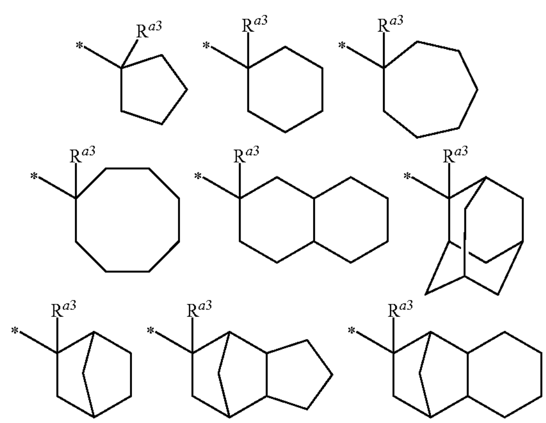

-continued

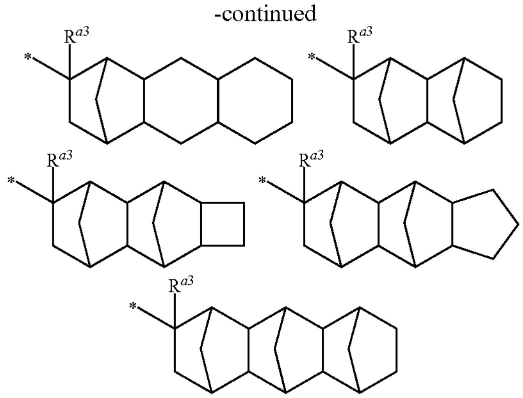

When one of the acid-labile group is described as an R ester of —COOR, and "—COO—C($CH_3$)$_3$" may be described as "tert-butyl ester", examples of the acid-labile group include an alkyl ester group such as a tert-butyl ester group;

an acetal type ester group such as a methoxymethyl ester, ethoxymethyl ester, 1-ethoxyethyl ester, 1-isobutoxyethyl ester, 1-isopropoxyethyl ester, 1-ethoxypropoxy ester, 1-(2-methoxyethoxy)ethyl ester, 1-(2-acetoxyethoxy)ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester group; and a saturated hydrocarbon ester group such as an isobornyl ester, 1-alkylcycloalkyl ester, 2-alkyl-2-adamantyl ester and 1-(1-adamantyl)-1-alkylalkyl ester group.

The resin containing the structural unit derived from a monomer having the acid-labile group can be produced by conducting addition polymerization reaction of a monomer or monomers having the acid-labile group and an olefinic double bond.

As the acid-labile group, those having a bulky group such as a 2-alkyl-2-adamantyl and a 1-(1-adamantyl)-1-alkylalkyl groups are preferable, since excellent resolution tends to be obtained when the resist composition obtained is used.

Examples of such monomer having the acid-labile group include a 2-alkyl-2-adamantyl (meth)acrylate, 1-(1-adamantyl)-1-alkylalkyl (meth)acrylate, a 2-alkyl-2-adamantyl 5-norbornene-2-carboxylate, a 1-(1-adamantyl)-1-alkylalkyl 5-norbornene-2-carboxylate, a 2-alkyl-2-adamantyl α-chloroacrylate, a 1-(1-adamantyl)-1-alkylalkyl α-chloroacrylate, tert butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methycyclohexyl)-1-methylethyl 5-norbornene-2-carboxylate, 1-(4-hydroxycyclohexyl)-1-methylethyl 5-norbornene-2-carboxylate, 1-methyl-(4-oxocyclohexyl)ethyl 5-norbornene-2-carboxylate and 1-(1-adamantyl)-1-methylethyl 5-norbornene-2-carboxylate.

Particularly, when the 2-alkyl-2-adamantyl (meth)acrylate or the 2-alkyl-2-adamantyl α-chloroacrylate is used as the monomer, the resist composition having excellent resolution tend to be obtained.

Specific examples of the 2-alkyl-2-adamantyl (meth)acrylate include 2-methyl-2-adamantyl acrylate, 2-methyl-2-adamantyl methacrylate, 2-ethyl-2-adamantyl acrylate, 2-ethyl-2-adamantyl methacrylate, 2-n-butyl-2-adamantyl acrylate, 2-n-butyl-2-adamantyl methacrylate. Specific examples of the 2-alkyl-2-adamantyl α-chloroacrylate include 2-methyl-2-adamantyl α-chloroacrylate and 2-ethyl-2-adamantyl α-chloroacrylate.

Among these, 2-ethyl-2-adamantyl (meth)acrylate or 2-isopropyl-2-adamantyl (meth)acrylate is preferably because of the resist composition having excellent sensitivity and heat resistance tends to be obtained.

The content of the structural unit derived from the monomer having acid-labile group in the resin is generally 10 to 95 mol %, preferably 15 to 90 mol %, and more preferably 20 to 85 mol %, with respect to the total structural units constituting the resin.

The 2-alkyl-2-adamantyl (meth)acrylate can be generally produced by reacting a 2-alkyl-2-adamantanol or a metal salt thereof with an acrylic halide or methacrylic halide.

When the structural unit derived from 2-alkyl-2-adamantyl (meth)acrylate or 1-(1-adamantyl)-1-alkylalkyl (meth)acrylate is included as the structural unit derived from the monomer having the acid-labile group, adjusting the content to about 15 mol % or more with respect to the total structural units constituting the resin will result in a sturdy structure because the resin will have an alicyclic group, which is advantageous in terms of the dry etching resistance of the resulting resist.

The monomers having the acid-labile group may be a combination of monomers that have the same olefinic double bond moiety but different acid-labile group, combination of monomers with the same acid-labile group and different olefinic double bond moiety, and a combination of monomers with different acid-labile group and different olefinic double bond moiety.

In addition to the structural unit derived from the compound represented by the formula (I) and the structural unit derived from the monomers having acid-labile group, a structural unit derived from an acid-stable monomer may be included in the resin of the present invention. The acid-stable monomer means the monomer which does not have the acid-labile group.

Specific examples include a structural unit derived from a free carboxyl group such as acrylic acid and methacrylic acid;

a structural unit derived from an aliphatic unsaturated dicarboxylic anhydride such as maleic anhydride and itaconic anhydride;

a structural unit derived from 2-norbornene;

a structural unit derived from (meth)acrylonitrile;

a structural unit derived from a (meth)acrylic ester in which a hydrogen atom is replaced with —CH($R^{a4}$)($R^{a5}$), —$CH_2$($R^{a6}$) (here, $R^{a4}$ and $R^{a6}$ are the same meaning of the $R^{a1}$, and $R^{a5}$ is the same meaning of the $R^{a2}$) or 1-adamantyl group;

a structural unit derived from a styrene monomer such as p- or m-hydroxystyrene; and a structural unit derived from (meth)acryloyloxy-γ-butyrolactone having a lactone ring which may be substituted with an alkyl group. The 1-adamantyl group may be substituted with at least one hydroxy group.

Among these, using the acid-stable monomer having hydroxy adamantyl group or the acid-stable monomer having lactone ring as the acid-stable monomer is preferable because the adhesiveness of resist to a substrate and resolution of resist tend to be improved. These can be used alone or as mixture of two or more monomers.

Example of the acid-stable monomer having hydroxy adamantyl the monomer represented by the formula (a2-1).

(a2-1)

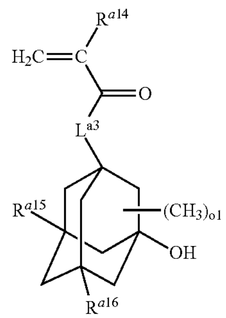

wherein $L^{a3}$ represents —O— or *—O—$(CH_2)_{k2}$—CO—O—;

k2 represents an integer of 1 to 7;

* represents a binding position to —CO—;

$R^{a14}$ represents a hydrogen atom or a methyl group;

$R^{a15}$ and $R^{a16}$ independently represent a hydrogen atom, a methyl group or a hydroxy group;

o1 represents an integer of 0 to 10.

In the formula (a2-1), $L^{a3}$ is preferably —O—, —O—$(CH_2)_{f1}$—CO—O—, here f1 represents an integer of 1 to 4, and more preferably —O—.

$R^{a14}$ is preferably a methyl group.

$R^{a15}$ is preferably a hydrogen atom.

$R^{a16}$ is preferably a hydrogen atom or a hydroxy group.

o1 is preferably an integer of 0 to 3, and more preferably an integer of 0 or 1.

Examples of the acid-stable monomer having the hydroxy adamantyl group represented by the formula (a2-1) include compounds below.

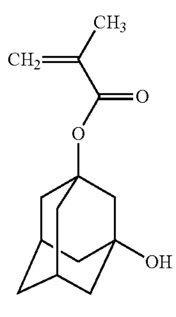
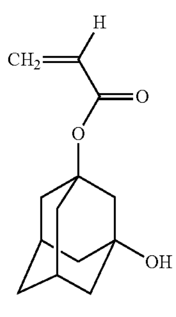
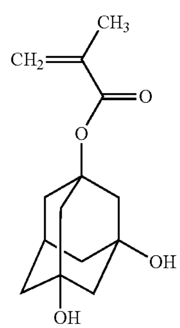

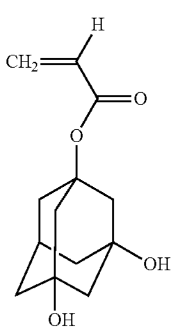
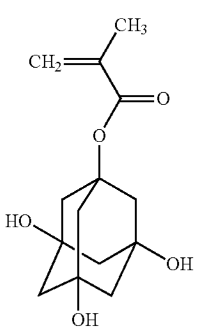
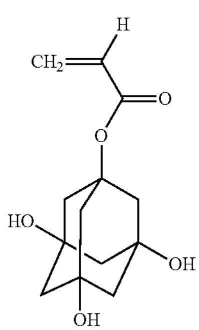

-continued

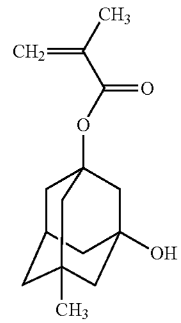
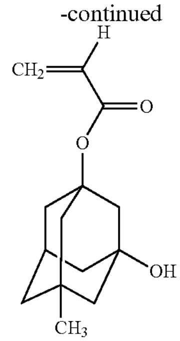
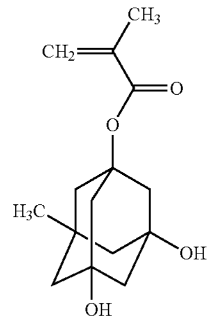

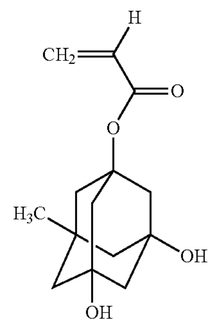
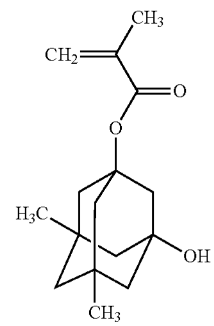

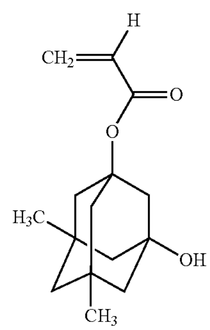
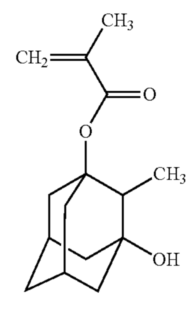

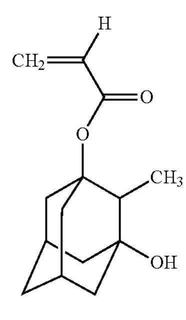
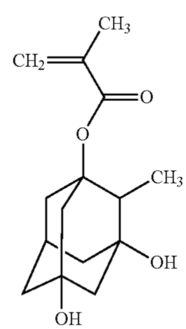
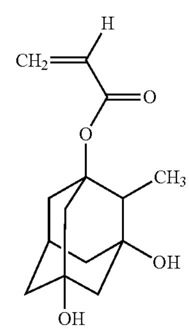

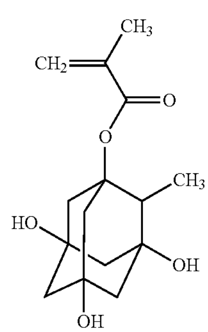
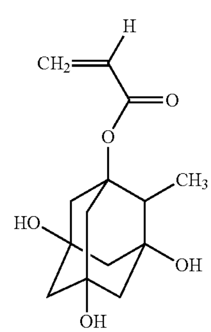

-continued
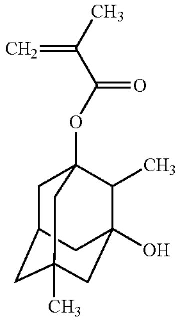
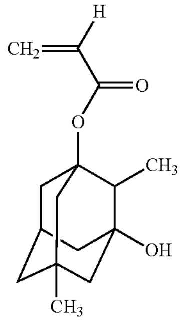
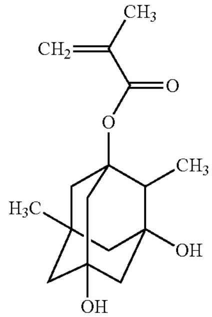
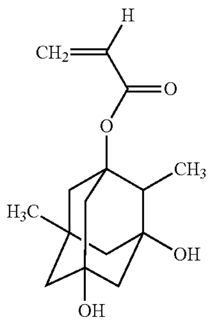
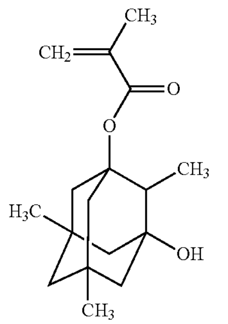
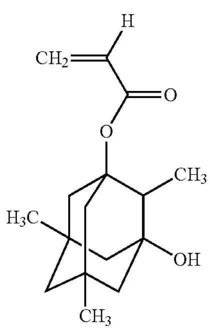
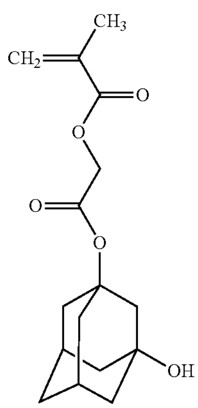
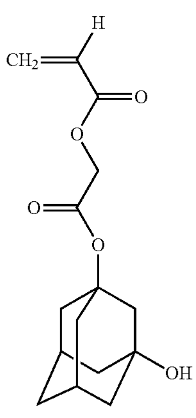
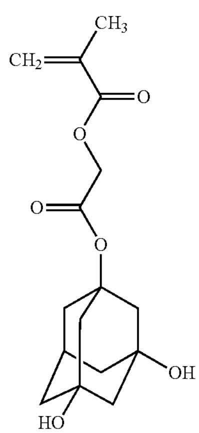
-continued
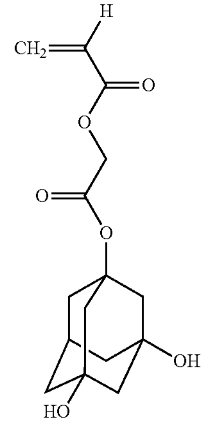
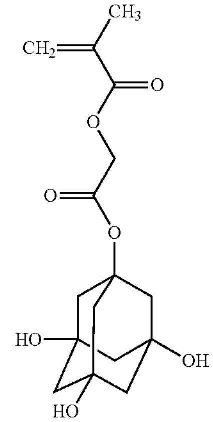
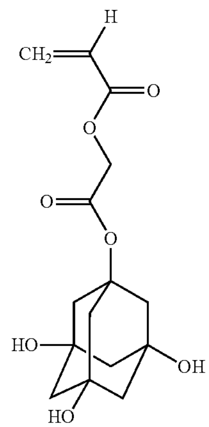
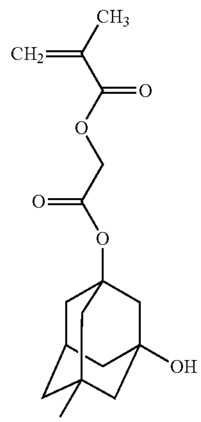
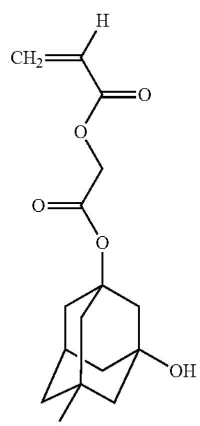
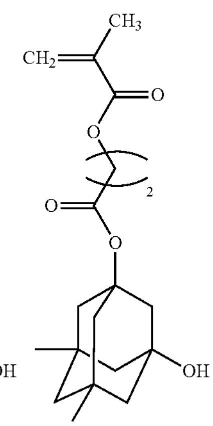
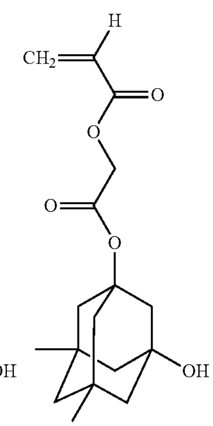
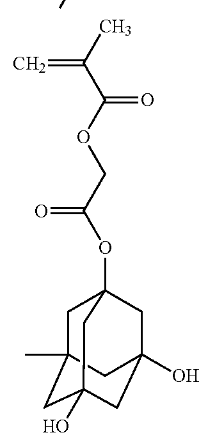
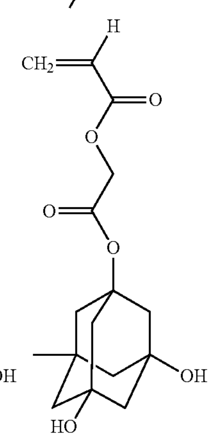
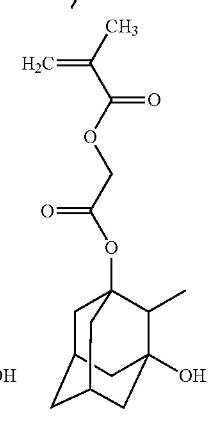

-continued

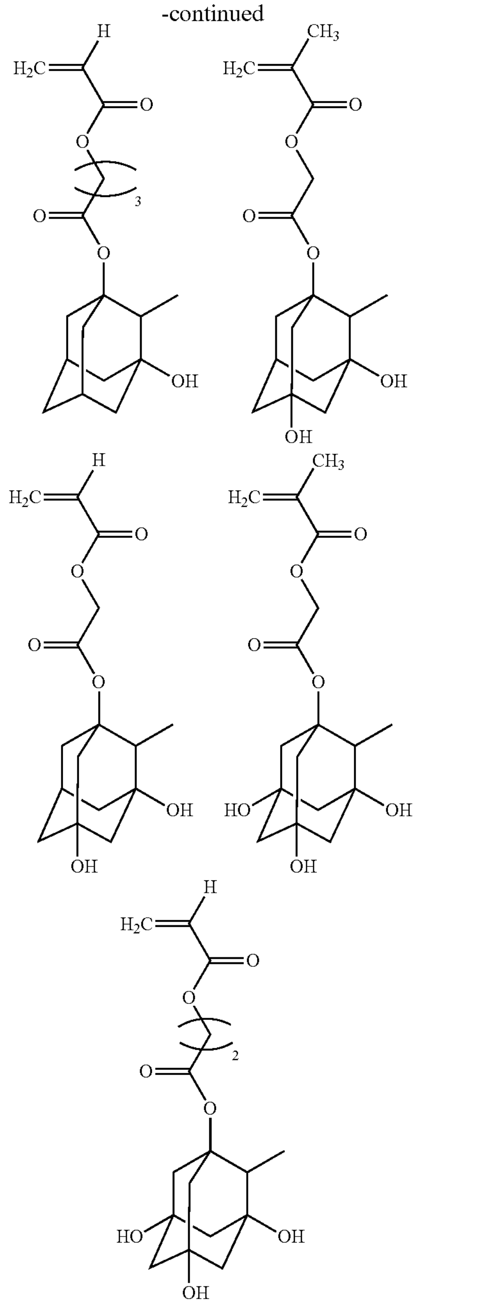

Among these, 3-hydroxy-1-adamantyl (meth)acrylate, 3,5-dihydroxy-1-adamantyl (meth)acrylate, and 1-(3,5-dihydroxy-1-adamantyl oxycarbonyl) methyl (meth)acrylate are preferable, and 3-hydroxy-1-adamantyl (meth)acrylate, and 3,5-dihydroxy-1-adamantyl (meth)acrylate are more preferable, and 3-hydroxy-1-adamantyl acrylate and 3,5-dihydroxy-1-adamantyl acrylate are still more preferable.

The monomer such as 3-hydroxy-1-adamantyl (meth) acrylate and 3,5-dihydroxy-1-adamantyl (meth)acrylate can be produced, for example, by reacting corresponding hydroxyadamantane with (meth)acrylic acid or its halide, and they are also commercially available.

The content of the structural unit derived from the monomer represented by the formula (a2-1) in the resin is generally 3 to 40 mol %, preferably 5 to 35 mol %, and more preferably 5 to 30 mol %, with respect to the total structural units constituting the resin.

Examples of the acid-stable monomer having the lactone ring include monomers represented by formula (a3-1), the formula (a3-2) and the formula (a3-3).

(a3-1)

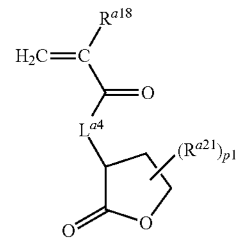

(a3-2)

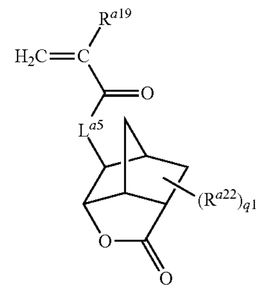

(a3-3)

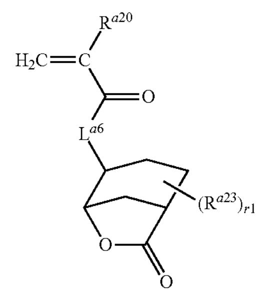

wherein $L^{a4}$ to $L^{a6}$ independently represent —O— or *—O—$(CH_2)_{k3}$—CO—O—;

k3 represents an integer of 1 to 7, * represents a binding position to —CO—;

$R^{a18}$ to $R^{a20}$ independently represent a hydrogen atom or a methyl group;

$R^{a21}$ represents a $C_1$ to $C_4$ aliphatic hydrocarbon group;

p1 represents an integer of 0 to 5;

$R^{a22}$ to $R^{a23}$ independently represent a carboxyl group, cyano group, and a $C_1$ to $C_4$ aliphatic hydrocarbon group;

q1 and r1 independently represent an integer of 0 to 3.

In the formulae (a3-1) to (a3-3), $L^{a4}$ to $L^{a6}$ include the same group as described in $L^{a3}$ above, and are independently preferably —O—, *—O—$(CH_2)_{d1}$—CO—O—, here d1 represents an integer of 1 to 4, and more preferably —O—;

$R^{a18}$ to $R^{a21}$ are independently preferably a methyl group.

$R^{a22}$ and $R^{a23}$ are independently preferably a carboxyl group, cyano group or methyl group;

p1 to r1 are independently preferably an integer of 0 to 2, and more preferably an integer of 0 or 1.

Examples of the acid-stable monomers having γ-butyrolactone ring represented by the formula (a3-1) include below.

-continued
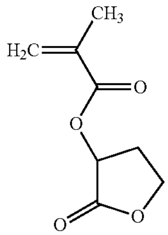
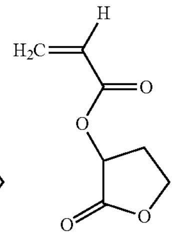
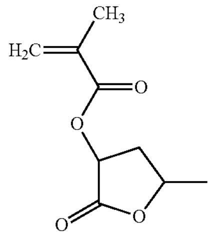
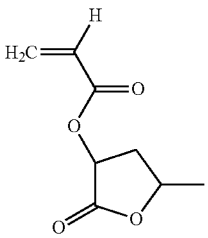
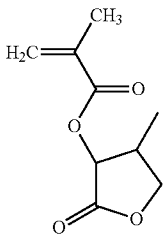
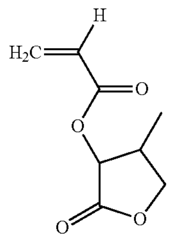
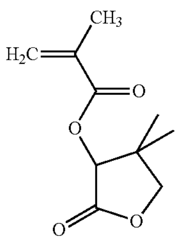
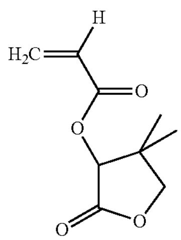
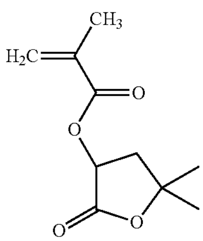
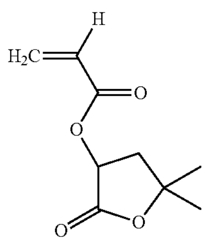
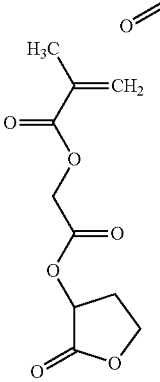
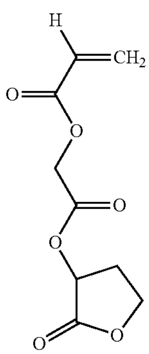
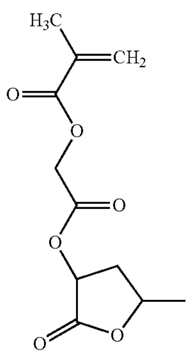
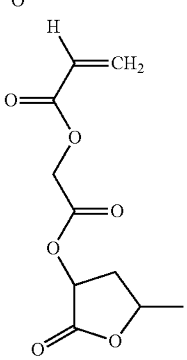
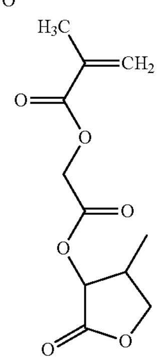
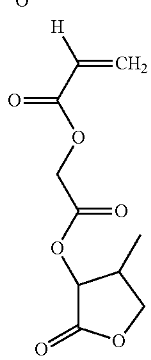
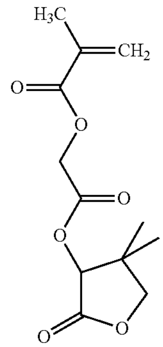
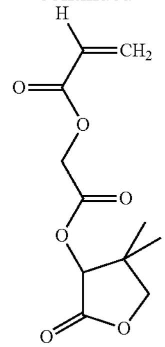
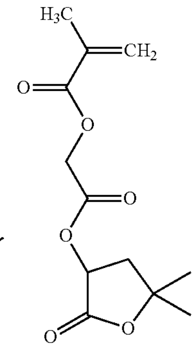
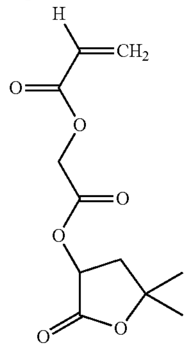
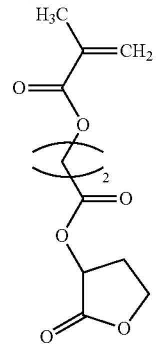
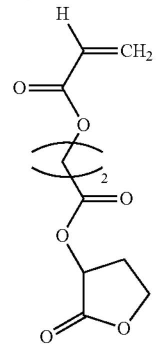
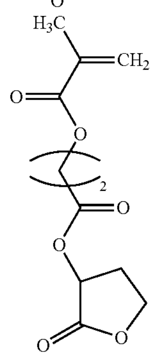
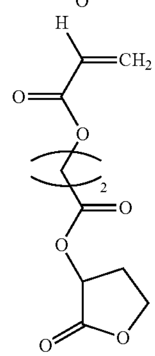
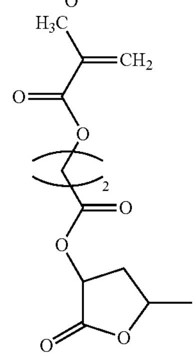
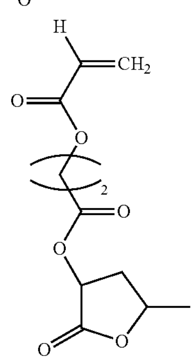
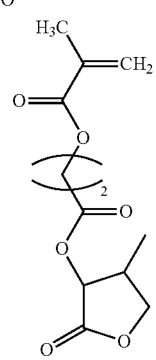
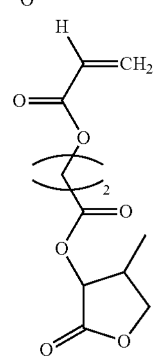
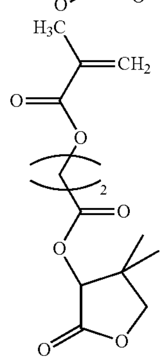
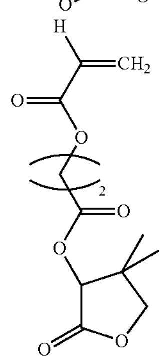
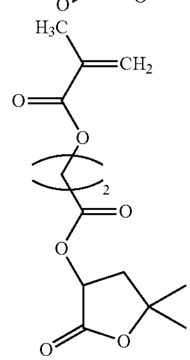

-continued
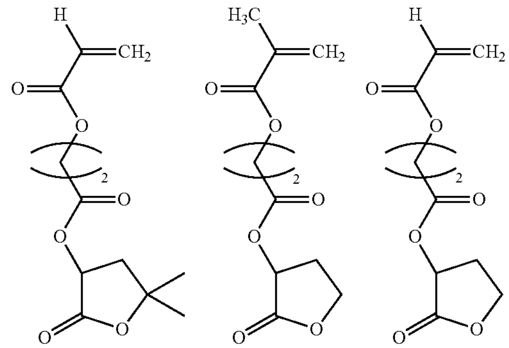
Examples of the acid-stable monomers having γ-butyrolactone ring represented by the formula (a3-1) also include acid-labile monomers below.
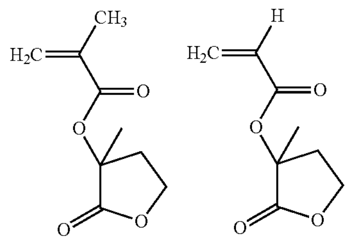
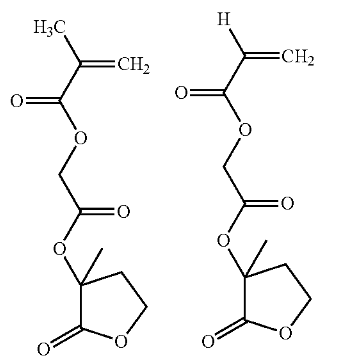
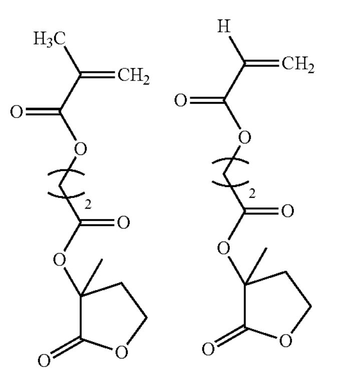
Examples of the acid-stable monomers having a condensed ring with γ-butyrolactone ring and norbornene ring represented by the formula (a3-2) include below.
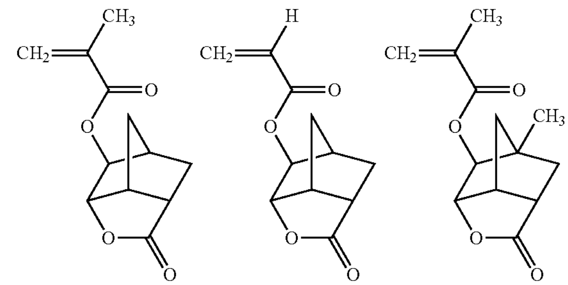
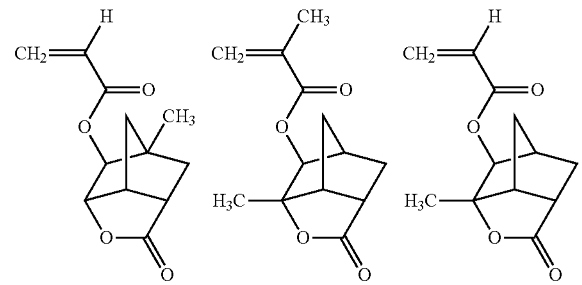
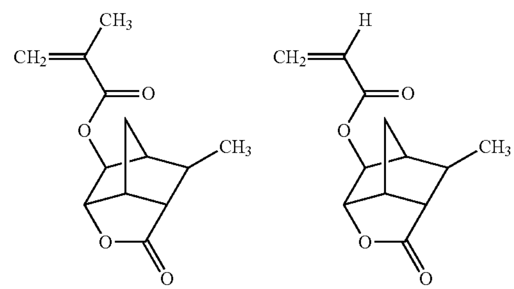
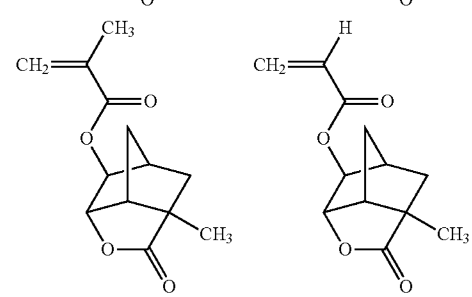
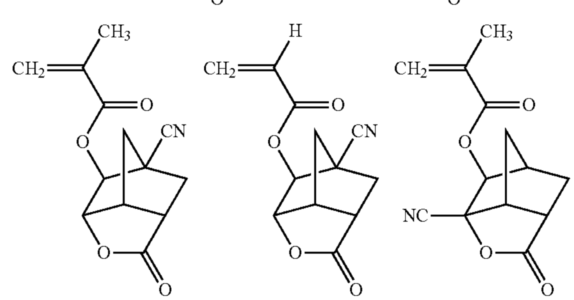
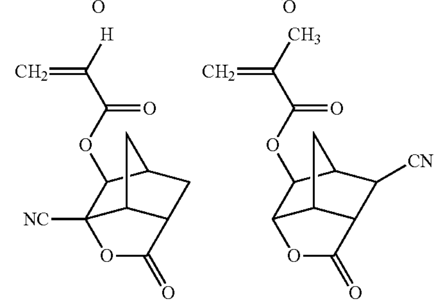

-continued
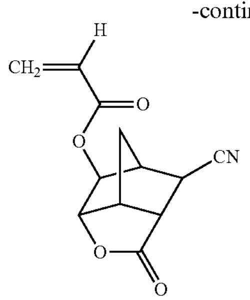
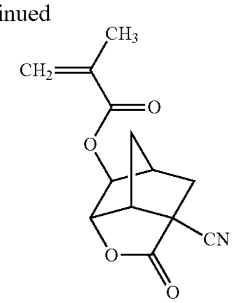
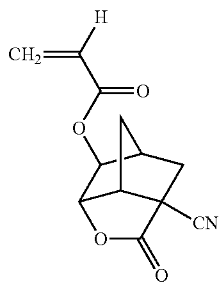
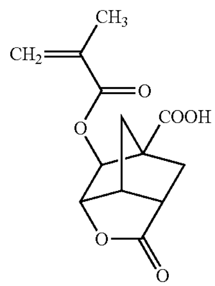
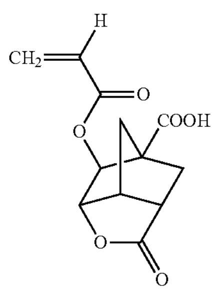
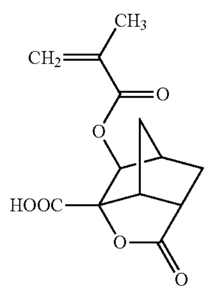
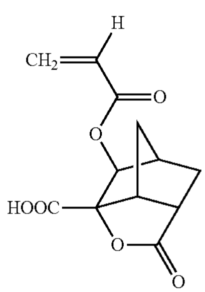
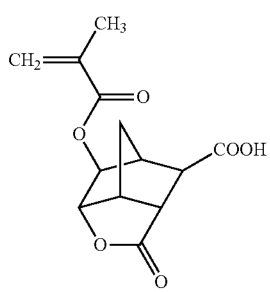
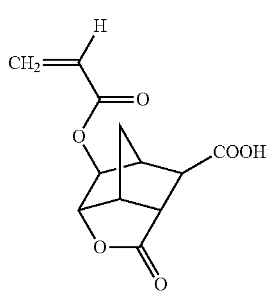
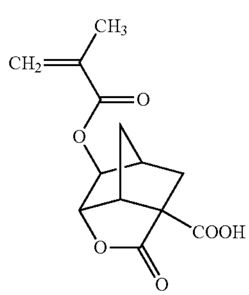
-continued
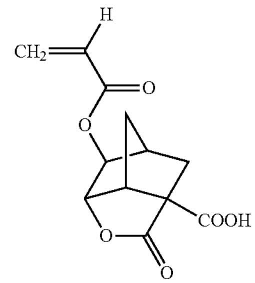
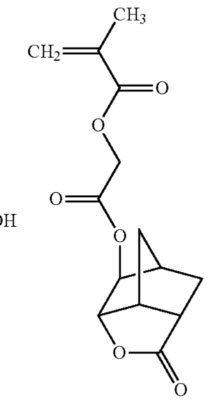
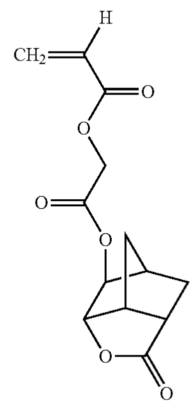
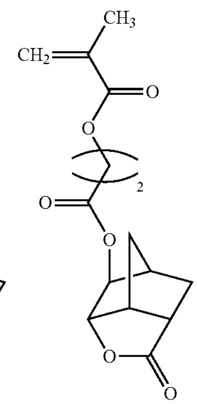
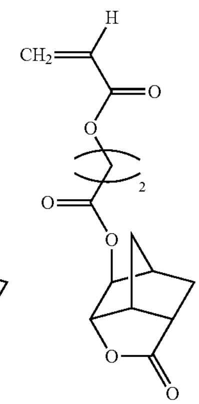
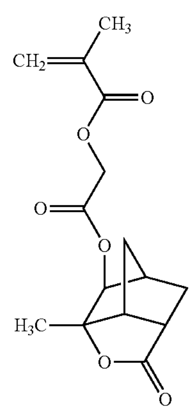
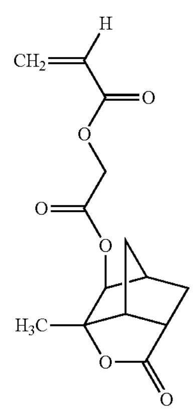
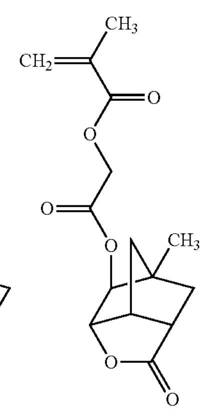
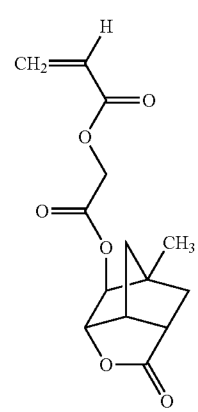
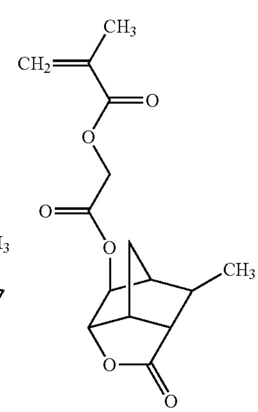

-continued
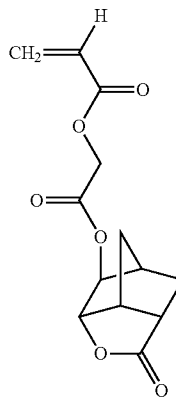
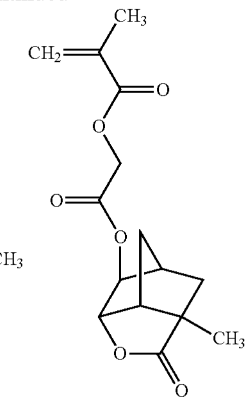
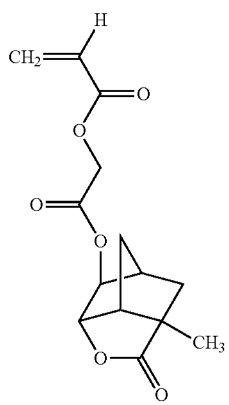
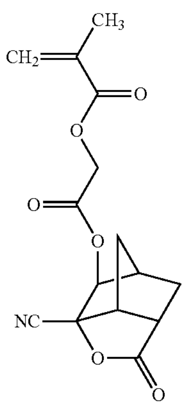
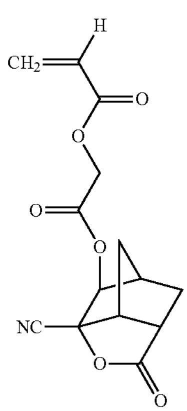
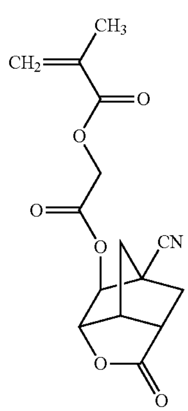
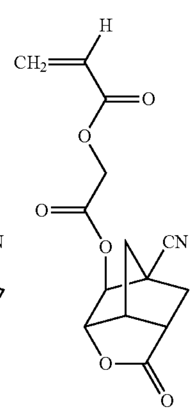
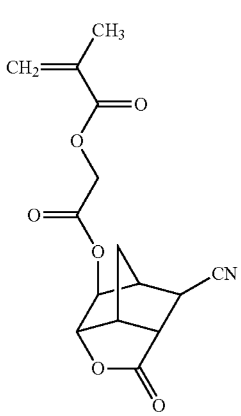
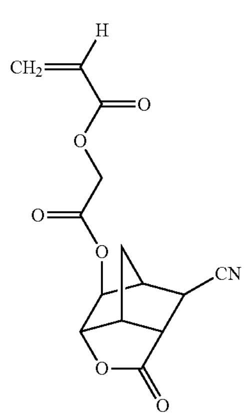
-continued
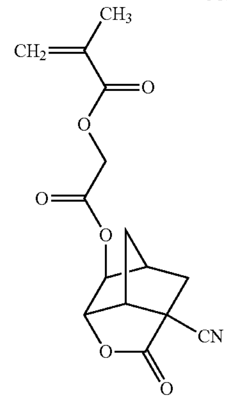
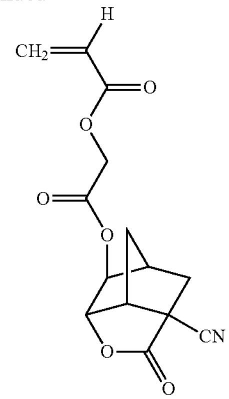
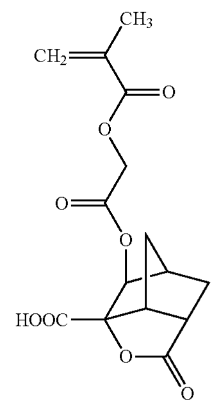
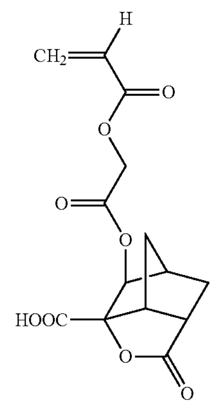
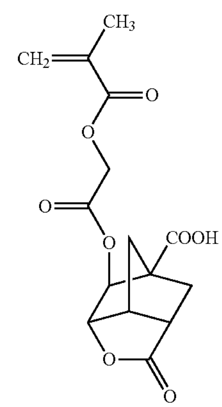
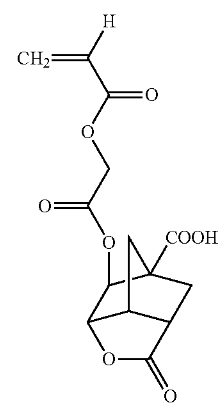
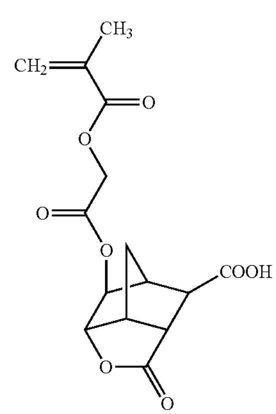
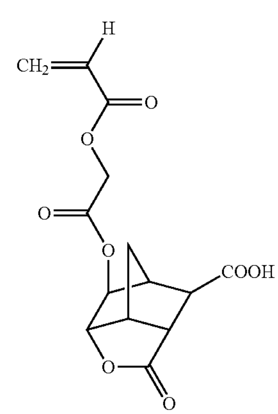

-continued
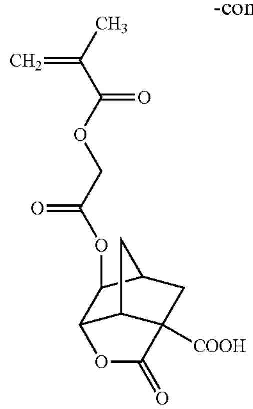
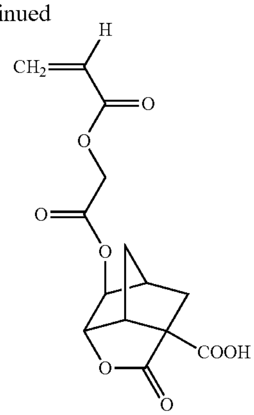
Examples of the acid-stable monomers having a condensed ring with γ-butyrolactone ring and norbornene ring represented by the formula (a3-2) also include acid-labile monomers below.
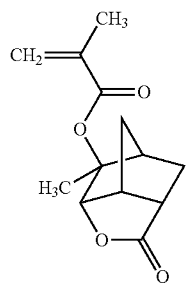
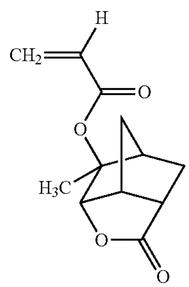
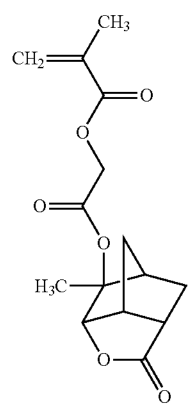
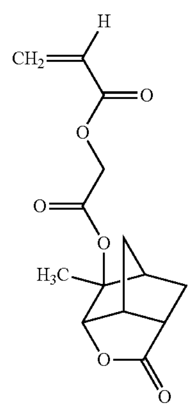
Examples of the acid-stable monomers having a condensed ring with γ-butyrolactone ring and cyclohexane ring represented by the formula (a3-3) also include below.
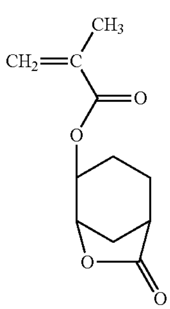
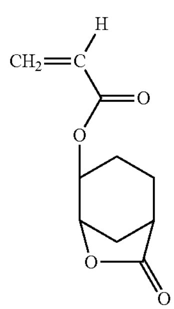
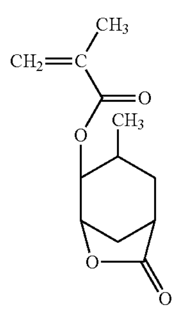
-continued
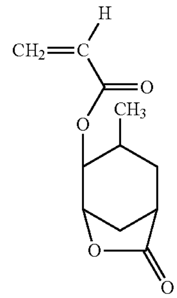
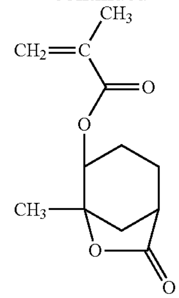
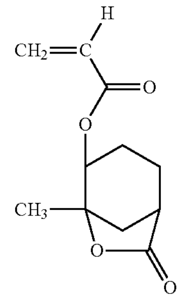
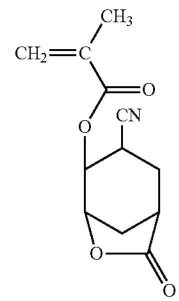
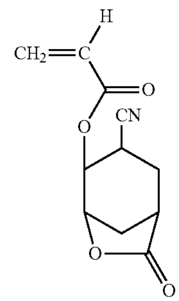
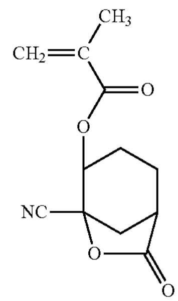
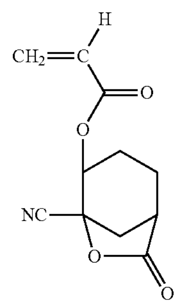
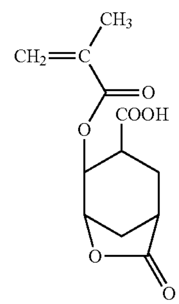
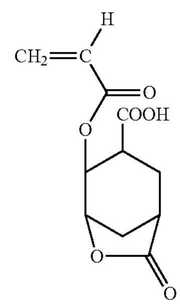
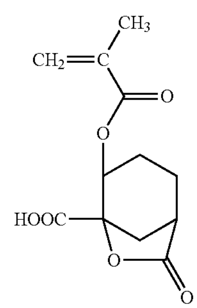
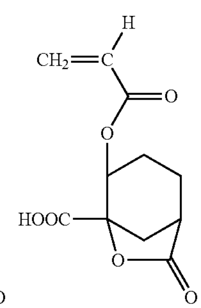
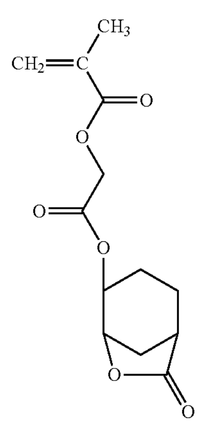
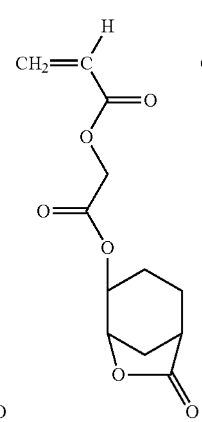
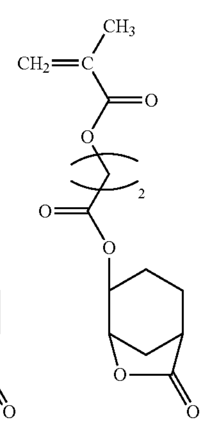

-continued

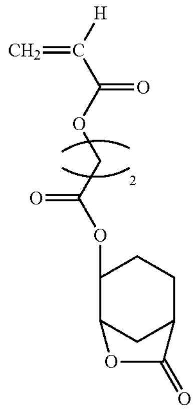
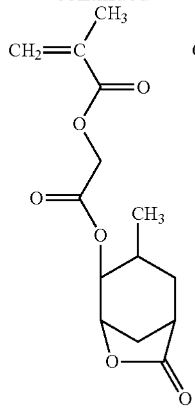
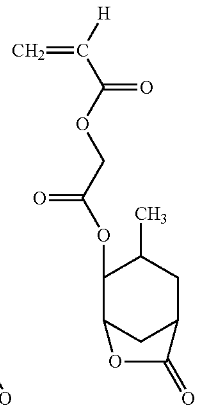
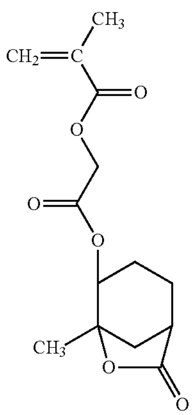
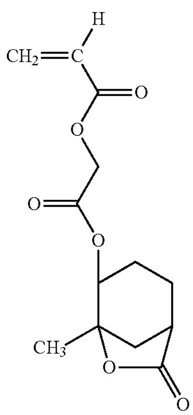
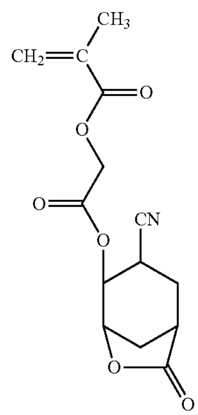
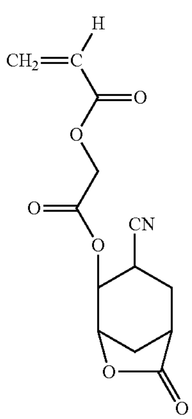
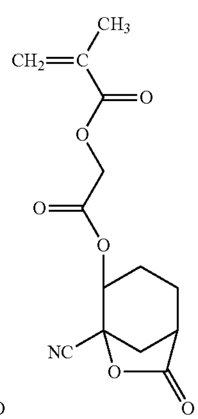
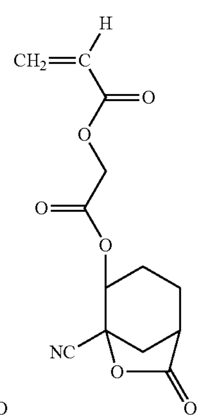
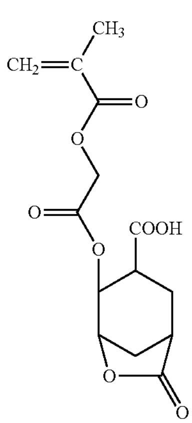
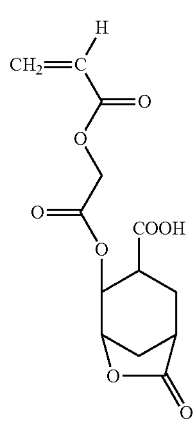

-continued

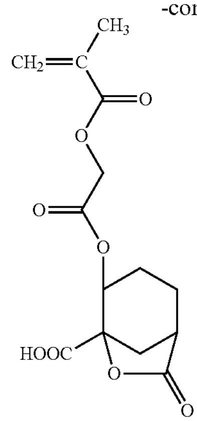
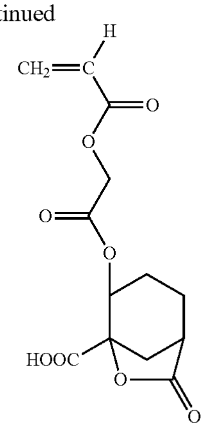

Examples of the acid-stable monomers having a condensed ring with γ-butyrolactone ring and cyclohexane ring represented by the formula (a3-3) also include acid-labile monomers below.

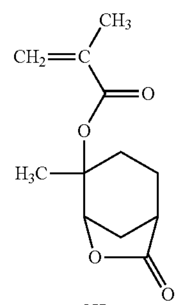
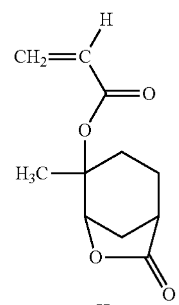
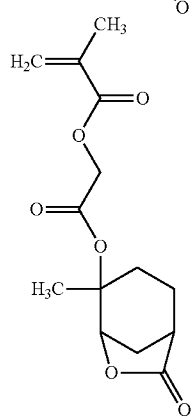
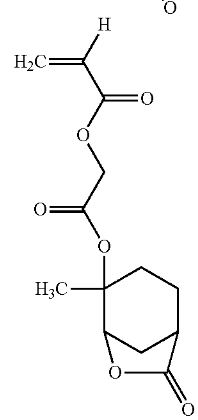

Among the acid-stable monomer having lactone ring represented by the formula (a3), (5-oxo-4-oxatricyclo[4.2.1.$0^{3,7}$]nonane-2-yl) (meth)acrylate, tetrahydro-2-oxo-3-furyl (meth)acrylate and 2-(5-oxo-4-oxatricyclo[4.2.1.$0^{3,7}$]nonane-2-yloxy)-2-oxoethyl (meth)acrylate are preferable, and the (meth)acrylate compounds are more preferable.

The monomer represented by the formula (a3-1) can be produced by reacting (meth)acrylic acid with a α- or β-bromo-γ-butyrolactone in which the lactone ring can be substituted with an alkyl group, or reacting (meth)acrylic halide with a α- or β-hydroxy-γ-butyrolactone in which the lactone ring can be substituted with an alkyl group.

The content of the structural unit represented by the formula (a3-1), the structural unit represented by the formula (a3-2) or the structural unit represented by the formula (a3-3)

in the resin are generally 5 to 50 mol %, preferably 10 to 45 mol %, and more preferably 15 to 40 mol %, with respect to the total structural units constituting the resin.

Specific examples of the acid-stable monomer other than the above include;

a styrene monomer such as p- or m-hydroxystyrene;

an alicyclic compound having olefinic double bond inner molecular such as norbornene;

an alicyclic unsaturated dicarbonic anhydride such as maleic anhydride and itaconic anhydride.

When KrF excimer laser lithography and EUV lithography are used, even in the case of using a structure unit derived from a styrene monomer such as p- or m-hydroxystyrene as the structure unit of the resin, the resist composition having sufficient transparency can be obtained. Such copolymer resins can be obtained by radical-polymerizing the corresponding (meth)acrylic ester monomer with acetoxystyrene and styrene followed by de-acetylating them with an acid.

Specific examples of the monomer giving the structural unit derived from styrene monomers include the compounds below.

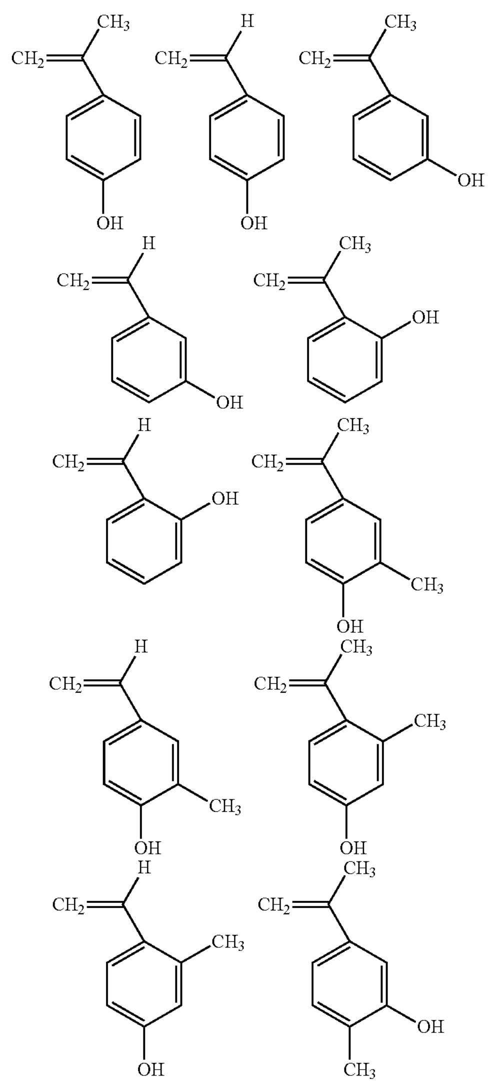

-continued

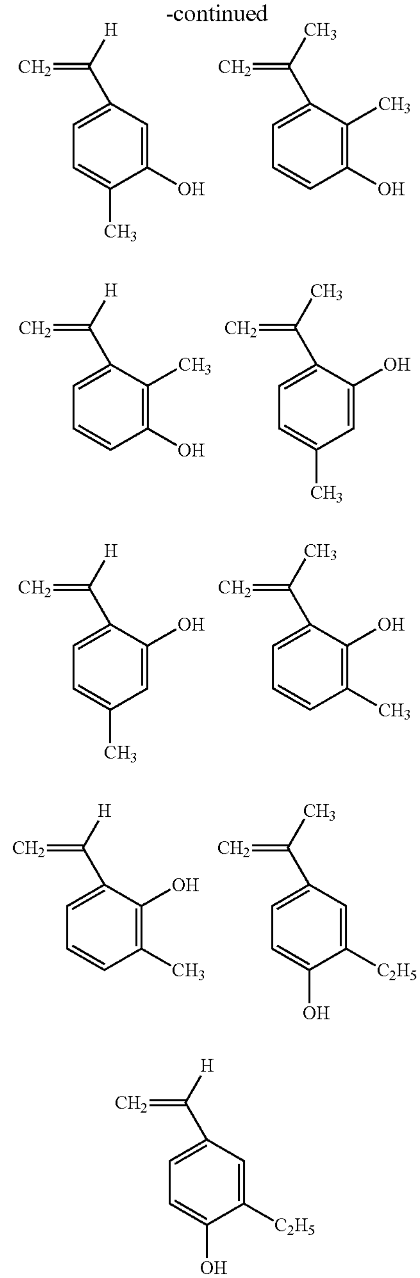

Among styrene monomers, 4-hydroxystyrene or 4-hydroxy-α-methylstyrene is particular preferable.

The resin containing a structural unit derived from 2-norbornene shows strong structure because the alicyclic group is directly present on its main chain and shows a property that dry etching resistance is excellent.

The structural unit derived from 2-norbornene can be introduced into the main chain by radical polymerization using an aliphatic unsaturated dicarboxylic anhydride such as maleic anhydride and itaconic anhydride together in addition to corresponding 2-norbornene. Therefore, the structural unit formed by opening of double bond of norbornene can be represented by the formula (c), and the structural unit formed by opening of double bond of maleic anhydride and itaconic anhydride can be represented by the formula (d) and (e), respectively.

(c)

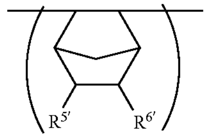

(d)

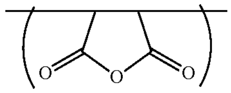

(e)

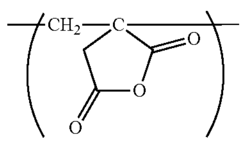

wherein $R^{5'}$ and $R^{6'}$ independently represent a hydrogen atom, a $C_1$ to $C_3$ alkyl group, a carboxyl group, a cyano group or —COOU, wherein U represents an alcohol residue, or $R^{5'}$ and $R^{6'}$ are bonded together to form a carboxylic anhydride residue represented by —C(═O)OC(═O)—.

When $R^{5'}$ and $R^{6'}$ form the —COOU group, it is an ester formed from carboxyl group, and examples of the alcohol residue corresponding to U include an optionally substituted $C_1$ to $C_8$ alkyl group and 2-oxooxolan-3- or -4-yl group. The alkyl group may be substituted with a hydroxy and an alicyclic hydrocarbon residue group.

Specific examples, for when $R^{5'}$ and $R^{6'}$ are alkyl groups, include methyl, ethyl and propyl groups, and specific examples of the alkyl group to which a hydroxy group is bonded include hydroxymethyl and 2-hydroxyethyl groups.

Specific examples of monomer giving the acid-stable structural unit which is the norbornene structural represented by the formula (c) include the following compounds;

2-norbornene, 2-hydroxy-5-norbornene, 5-norbornene-2-carboxylic acid, methyl 5-norbornene-2-carboxylate, 2-hydroxy-1-ethyl 5-norbornene-2-carboxylate, 5-norbornene-2-methanol and 5-norbornene-2,3-dicarboxylic anhydride.

As long as the U of —COOU of $R^{5'}$ and $R^{6'}$ in the formula (c) is an acid-labile group, such as an aliphatic ester in which carbon atom adjacent to the —O— is quaternary carbon atom, the structural unit will have an acid-labile group, despite having a norbornene structure.

Specific examples of the monomer having the norbornene structure and the acid-labile group include t-butyl 5-norbornene-2-carboxylate, 1-cyclohexyl-1-methylethyl 5-norbornene-2-carboxylate, 1-methylcyclohexyl-5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxycyclohexyl)-1-methylethyl 5-norbornene-2-carboxylate, 1-methyl-1-(4-oxocyclohexyl)ethyl 5-norbornene-2-carboxylate, and 1-(1-adamantyl)-1-methylethyl 5-norbornene-2-carboxylate.

Furthermore, the acid stable group may include a structural unit that has a fluorine atom represented by the formula (b1).

(b1)

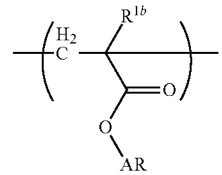

wherein $R^{1b}$ represents a hydrogen atom, a methyl group or a trifluoromethyl group;

AR represents a $C_1$ to $C_{30}$ hydrocarbon group, and one or more hydrogen atoms contained in the hydrocarbon group is replaced by fluorine atom, the one or more —$CH_2$— contained in the hydrocarbon group may be replaced by —O—, —S— or —N($R^c$)—, and a hydrogen atom contained in the hydrocarbon group may be replaced by a hydroxy group or a $C_1$ to $C_6$ aliphatic hydrocarbon group;

$R^c$ represents a hydrogen atom or a $C_1$ to $C_6$ aliphatic hydrocarbon group.

Specific examples of monomers giving the structural unit represented by the formula (b1) include monomers below.

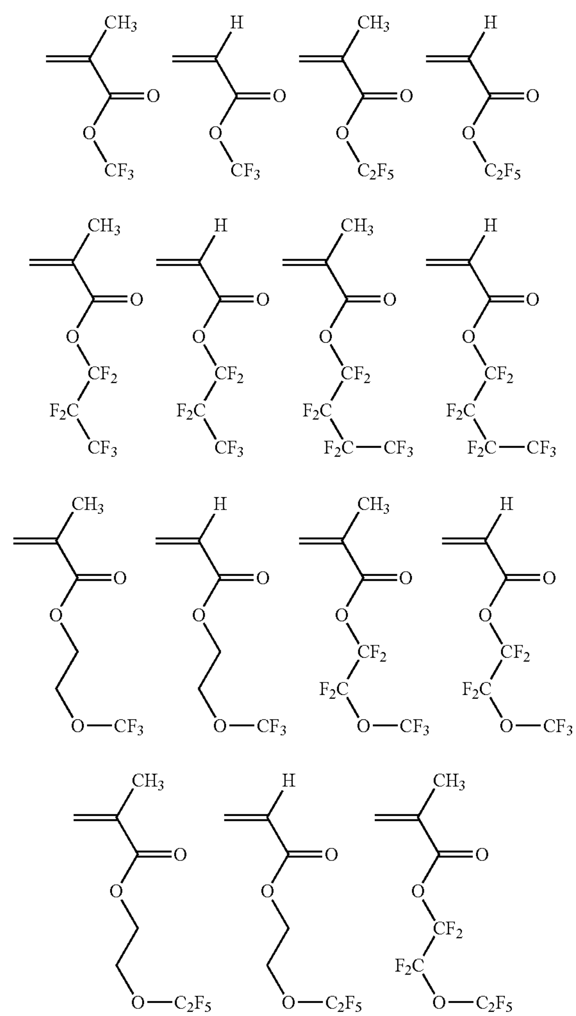

-continued
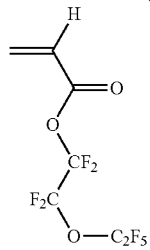
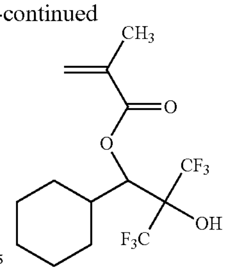
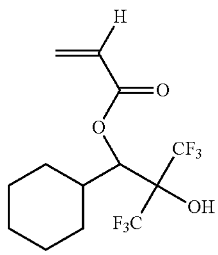
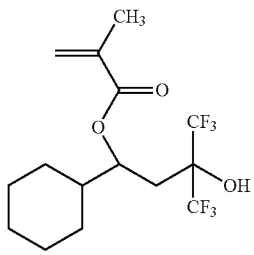
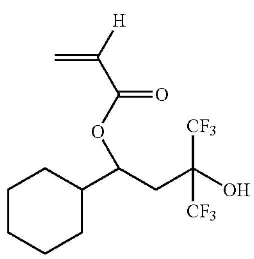
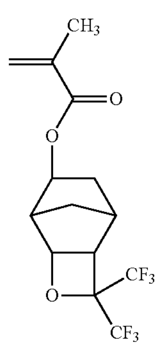
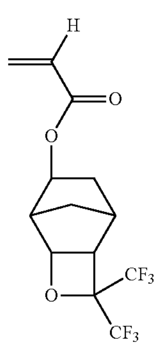
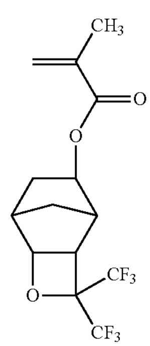
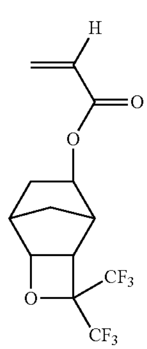
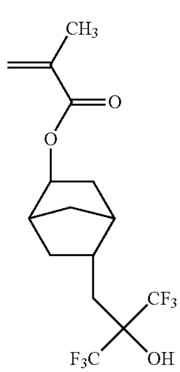
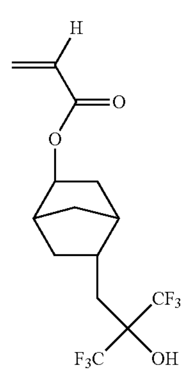
-continued
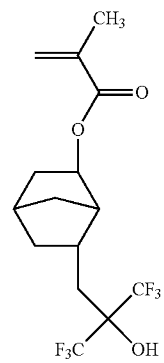
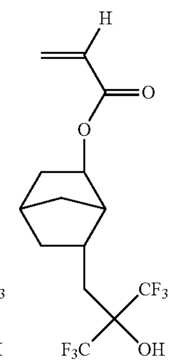
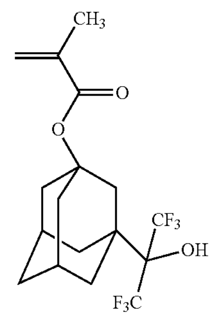
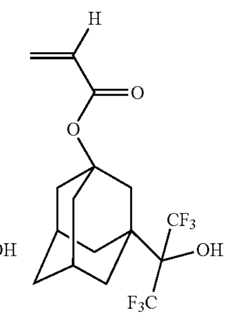
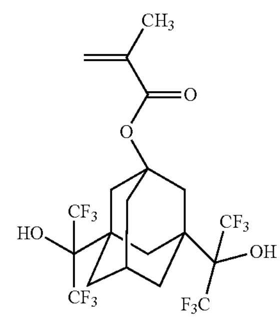
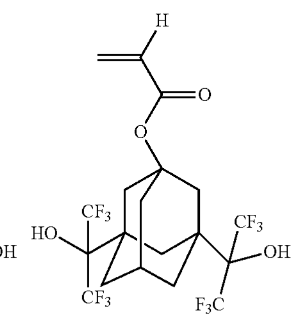
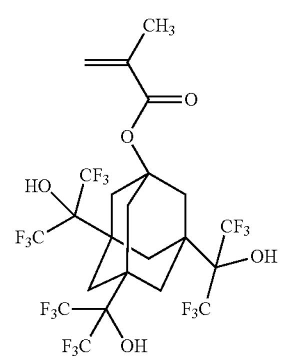
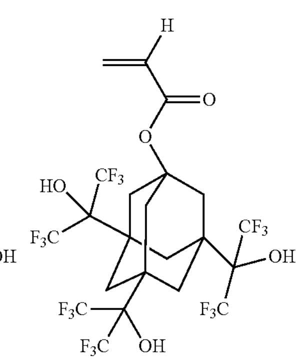
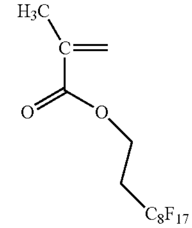
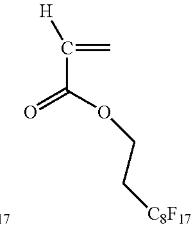

-continued

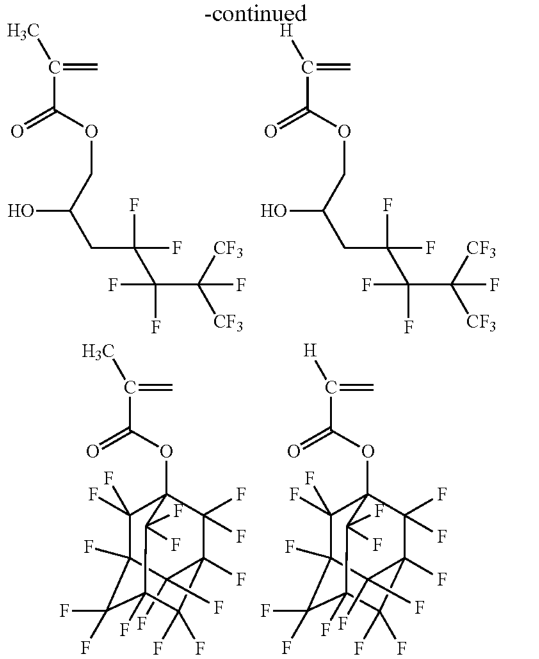

The weight average molecular weight of the resin is preferably 2,500 to 100,000, more preferably 2,700 to 50,000, and even more preferably 3,000 to 40,000. The weight average molecular weight is a value determined by gel permeation chromatography using polystyrene as the standard product. The detailed condition of this analysis is described in Examples.

The resin of the present invention may contain a structural unit derived from a compound represented by the formula (II1), the formula (II2), the formula (II3) or the formula (II4) in addition to the structural unit derived from the compound represented by the formula (I).

<Compound Represented by the Formula (II1)>

(II1)

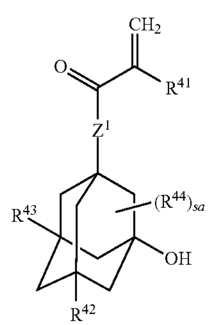

wherein $R^{41}$ represents a hydrogen atom, a halogen atom or a $C_1$ to $C_6$ alkyl group that optionally has one or more halogen atoms;

$Z^1$ represents a divalent $C_1$ to $C_{17}$ saturated hydrocarbon group, and one or more —$CH_2$— contained in the saturated hydrocarbon group may be replaced by —O—, —CO— or —S—;

$R^{42}$ and $R^{43}$ independently represent a hydrogen atom, a methyl group or hydroxy group, provided that at least one of $R^{42}$ and $R^{43}$ represents a hydroxy group;

$R^{44}$ represents a $C_1$ to $C_6$ alkyl group;

sa represents an integer of 0 to 10.

The structural unit derived from the compound represented by the formula (II1) is a structural unit described below.

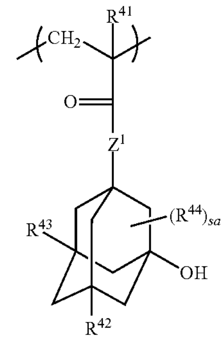

In the formula (II1), $R^{41}$ is preferably a hydrogen atom and methyl group.

Examples of the divalent saturated hydrocarbon group include, for example, a divalent group including an alkylene group and divalent saturated cyclic hydrocarbon group.

Examples of the alkylene group include methylene, dimethylene, trimethylene, tetramethylene, pentamethylene, hexamethylene, heptamethylene, octamethylene, nonamethylene, decamethylene, undecamethylene, dodecamethylene, tridecamethylene, tetradecamethylene, pentadecamethylene, hexadecamethylene, heptadecamethylene, ethylene, propylene, isopuropylene, sec-buthylene, tert-buthylene and propylidene groups.

Examples of the divalent group including the divalent saturated cyclic hydrocarbon group include groups represented by the formula (Z1) to the formula (Z3);

(Z1)

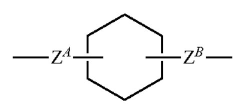

(Z2)

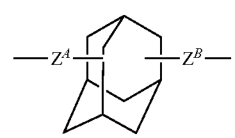

(Z3)

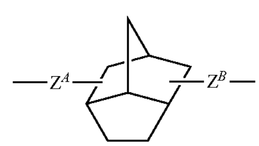

wherein $Z^A$ and $Z^B$ independently represent a single bond or a $C_1$ to $C_6$ alkylene group, provided that the groups represented by the formula (Z1) to the formula (Z3) have $C_1$ to $C_{17}$.

$Z^1$ is preferably a group in which one or more —$CH_2$— contained in the alkylene group is replaced by —O—, —S— or —CO—, for example, such as —O—, —O—$Z^2$—CO—, —O—$Z^2$—CO—O—, —O—$Z^2$—. $Z^2$ represents a $C_1$ to $C_6$ alkylene group. Among these, —O— and —O—$Z^2$—CO—O— are preferable.

Examples of the compound represented by the formula (II1) include compounds below.

-continued
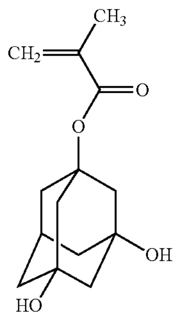
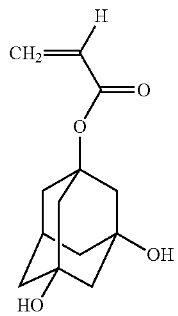
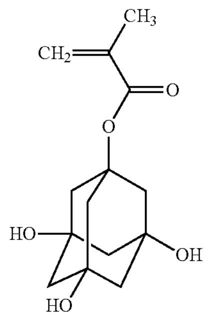
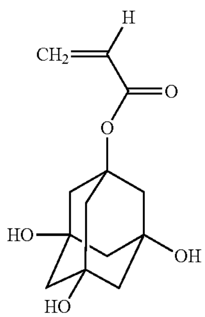
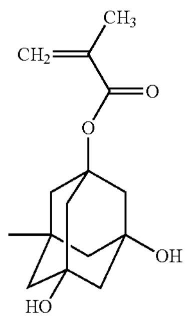
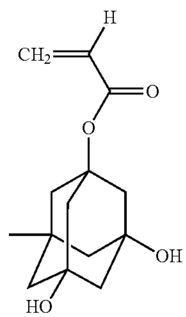
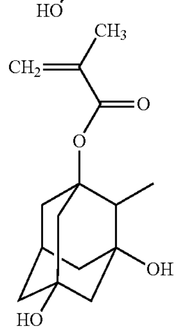
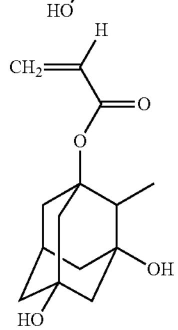
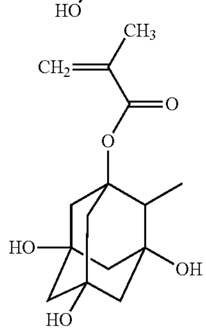
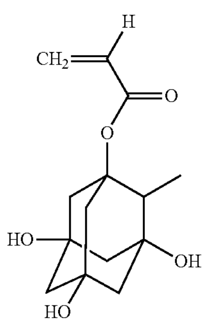
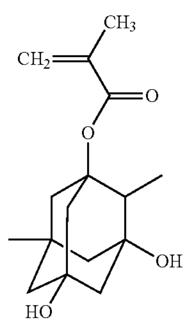
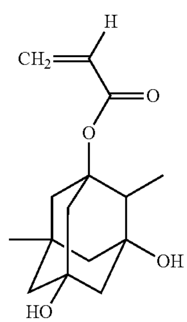
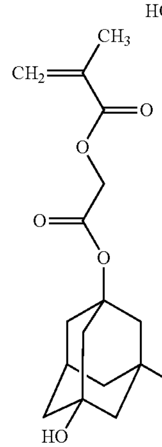
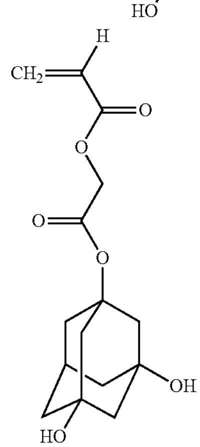
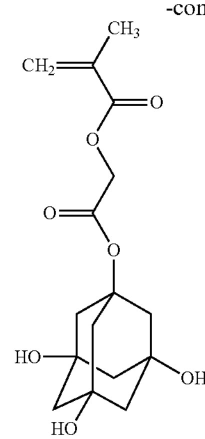
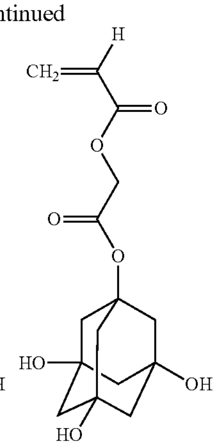
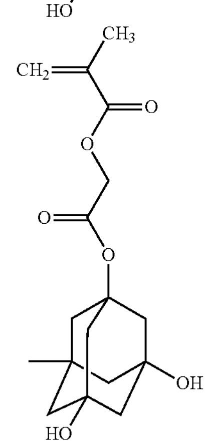
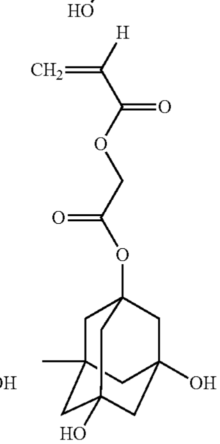
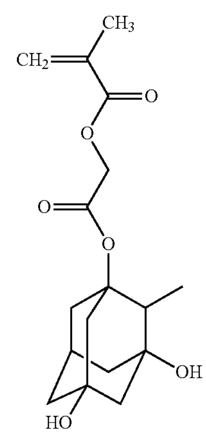
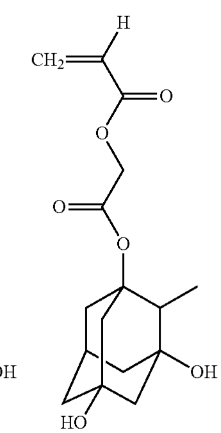
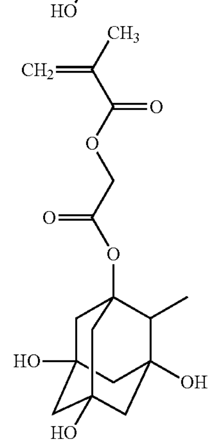
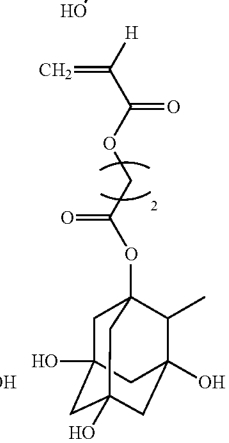

Among these, 3,5-dihydroxy-1-adamantyl (meth)acrylate, and 1-(3,5-dihydroxy-1-adamantyl oxycarbonyl) methyl (meth)acrylate are preferable, and 3,5-dihydroxy-1-adamantyl (meth)acrylate are more preferable, and 3,5-dihydroxy-1-adamantyl acrylate are still more preferable.

The compound represented by the formula (II1) can be produced by the known methods.

The mole ratio of the structural unit derived from the compounds represented by the formula (I) and the formula (II1) in the resin (the structural unit derived from the compound represented by the formula (I): the structural unit derived from the compound represented by the formula (II1)) is generally 1:0.2 to 1:10, preferably 1:0.4 to 1:8, and more preferably 1:0.5 to 1:5.

The total content of the structural unit derived from the compounds represented by the formula (I) and the formula (II1) in the resin is generally 5 to 100 mol %, preferably 10 to 70 mol %, and more preferably 15 to 50 mol %, with respect to the total structural units constituting the resin.

<Compound Represented by the Formula (II2)>

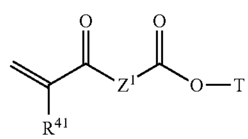

(II2)

wherein $R^{41}$ represents a hydrogen atom, a halogen atom or a $C_1$ to $C_6$ alkyl group that optionally has one or more halogen atoms;

$Z^1$ represents a divalent $C_1$ to $C_{17}$ saturated hydrocarbon group, and one or more —$CH_2$— contained in the saturated hydrocarbon group may be replaced by —O—, —CO—, —S— or —N($R^{45}$)—;

$R^{45}$ represents a hydrogen atom or a $C_1$ to $C_6$ alkyl group;

T represents a heterocyclic group containing —$SO_2$— as skeleton, one or more hydrogen atoms contained in the heterocyclic group may be replaced by a halogen atom, a hydroxy group, a $C_1$ to $C_{12}$ alkyl group, a $C_1$ to $C_{12}$ alkoxyl group, a $C_6$ to $C_{12}$ aryl group, a $C_7$ to $C_{13}$ aralkyl group, glycidyloxy group or a $C_2$ to $C_4$ acyl group, and one or more —$CH_2$— contained in the heterocyclic group may be replaced by —CO—, —O—, —S—, —$SO_2$—, or —N($R^{45}$)—.

The structural unit derived from the compound represented by the formula (II2) is a structural unit described below.

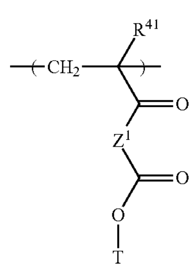

In the formula (II2), $R^{41}$ is preferably a hydrogen atom and methyl group.

Examples of the divalent saturated hydrocarbon group include, for example, a divalent group including an alkylene group and divalent saturated cyclic hydrocarbon group described above.

$Z^1$ is preferably a divalent saturated hydrocarbon group in which one or more —$CH_2$— contained in the alkylene group is replaced by —O—, —S—, —CO— or r —N($R^{45}$)—.

$R^{45}$ is preferably a hydrogen atom.

Examples of $Z^1$ include —O—$X^{11}$—, —$X^{11}$—O—, —$X^{11}$—CO—O—, —$X^{11}$—O—CO—, —$X^{11}$—O—$X^{12}$—, —NH—$X^{11}$— and —$X^{11}$—NH—, preferably —O—$X^{11}$—, —$X^{11}$—O—, —$X^{11}$—CO—O—, —NH—$X^{11}$— and —$X^{11}$—NH—, and more preferably —O—$X^{11}$— and —NH—$X^{11}$—. Among these, —O—$CH_2$— is still more preferable as $Z^1$. $X^{11}$ and $X^{12}$ independently represents a single bond or a $C_1$ to $C_6$ alkylene group, provided that main chain constituting the groups in which one or more —$CH_2$— contained in the alkylene group replaced by —CO—, —O—, —S—, —$SO_2$—, or —N($R^{45}$)— suitably have 1 to 17 atoms, preferably 1 to 11 atoms, and more preferably 1 to 5 atoms.

Examples of the aralkyl group include, for example, benzyl, phenethyl, phenylpropyl, trityl, naphthylmethyl and naphthylethyl groups.

Examples of the aryl group include phenyl, naphthyl, anthranyl, p-methylphenyl, p-tert-butylphenyl, p-adamantylphenyl; tolyl, xylyl, cumenyl, mesityl, biphenyl, anthryl, phenanthryl, 2,6-diethylphenyl, and 2-methyl-6-ethylphenyl groups.

In the compound represented by the formula (II2), T is preferably a group having a norbornane skeleton.

T is preferably represented by the formula (T1), and in particular, preferably a group represented by the formula (T2).

Further, T is preferably a group represented by the formula (T3), and in particular, more preferably a group represented by the formula (T4).

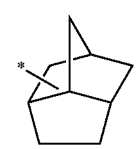

(T1)

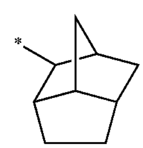

(T2)

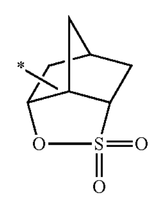

(T3)

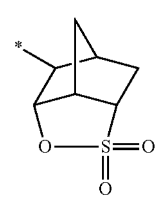

(T4)

where one or more hydrogen atoms contained in the ring may be replaced by a halogen atom, a hydroxyl group, a $C_1$ to $C_{12}$ alkyl group, a $C_1$ to $C_{12}$ alkoxyl group, a $C_6$ to $C_{12}$ aryl group, a $C_7$ to $C_{13}$ aralkyl group, a glycidyloxy group, a $C_2$ to $C_4$ acyl group, and one or more —$CH_2$— contained in the ring may be replaced by —CO—, —O—, —S—, —$SO_2$— or —N($R^{45}$)—;
$R^{45}$ represents the same meaning as defined above;
* represents a binding position to —O—.
Specific examples of T include the followings. The * represents a binding position to —O—.
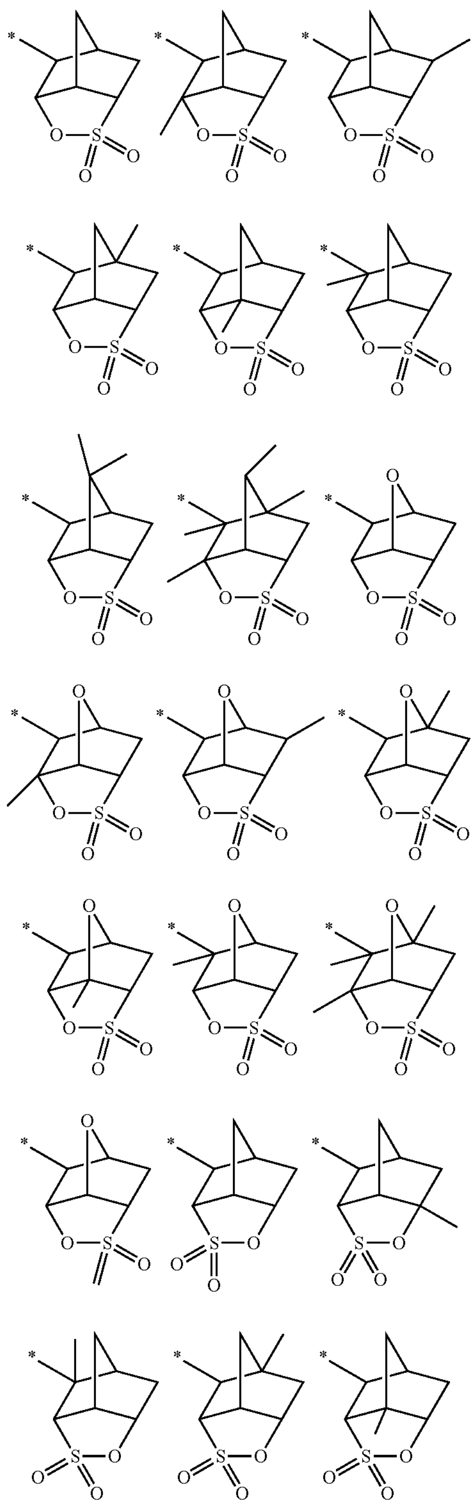
-continued
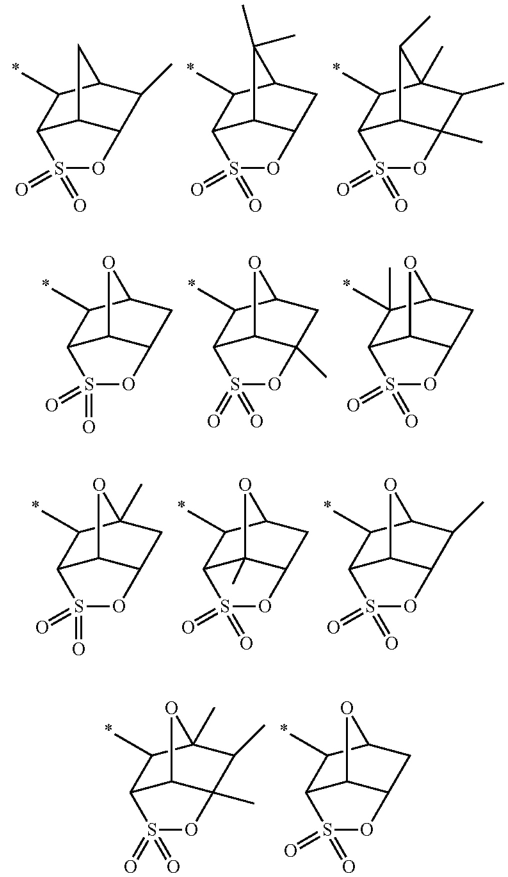
Examples of the compound represented by the formula (II2) include compounds below.
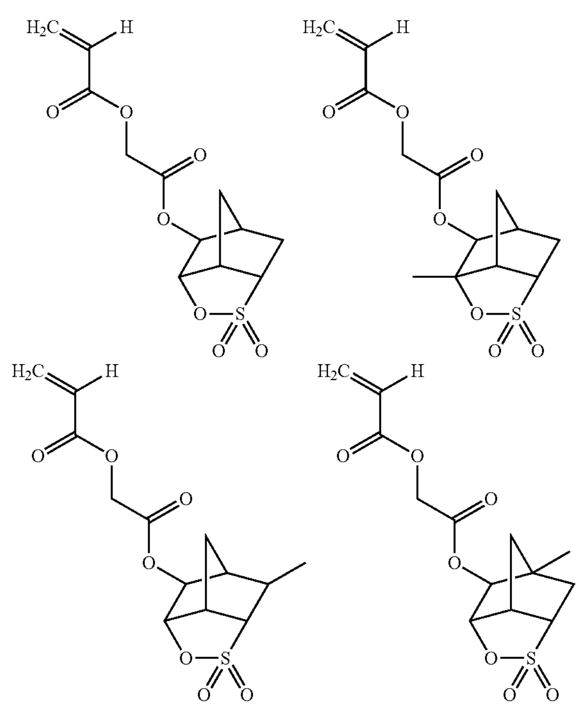

-continued
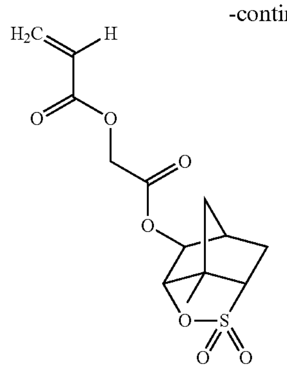
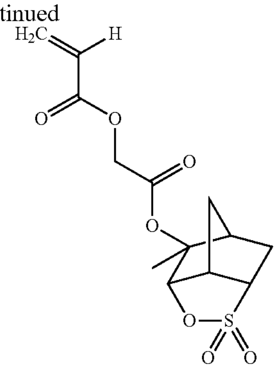
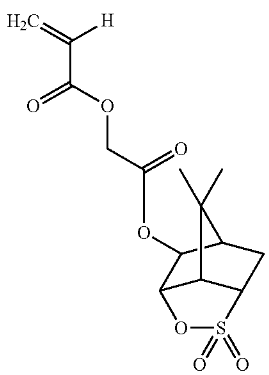
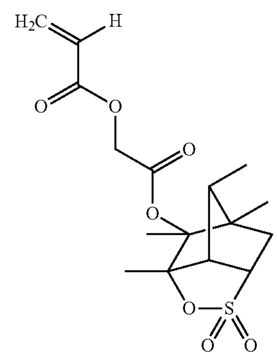
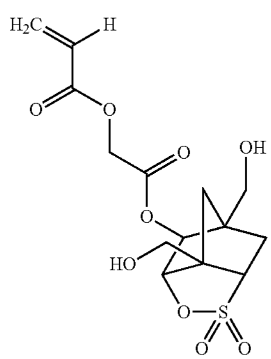
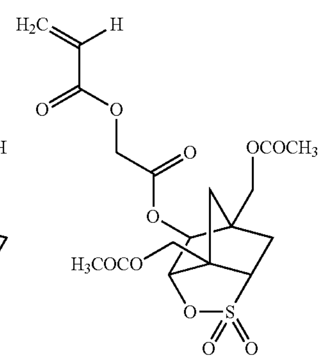
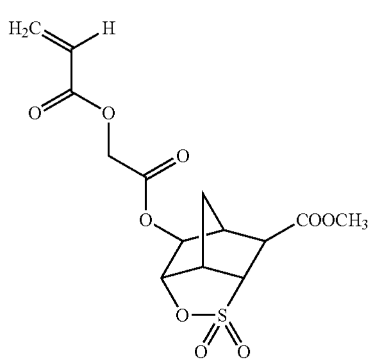
-continued
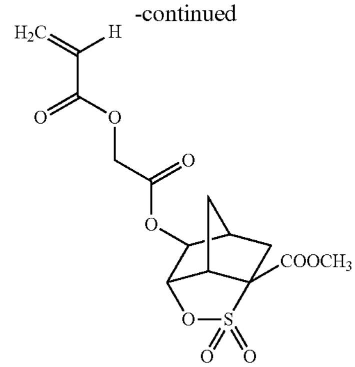
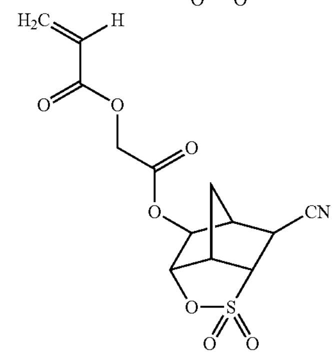
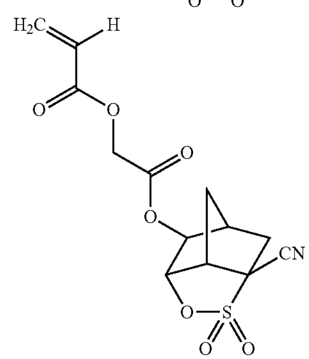
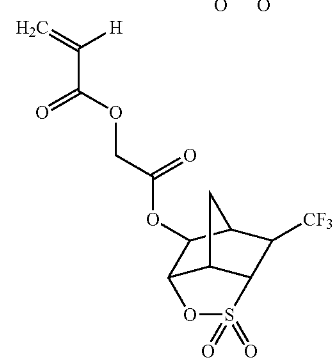
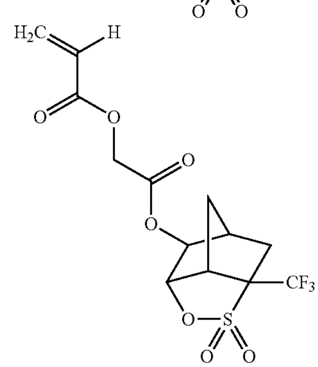

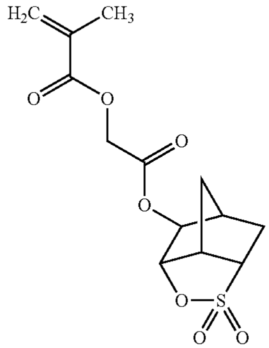
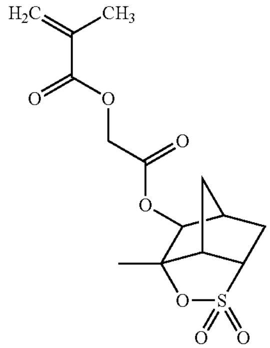
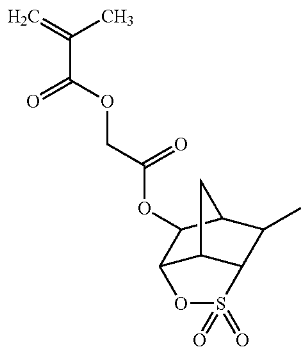
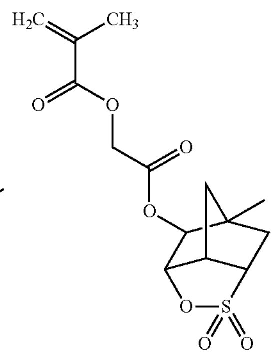
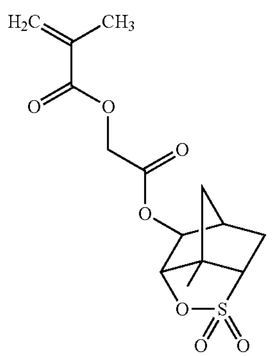
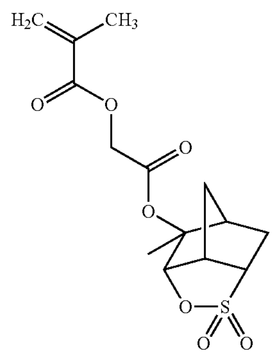
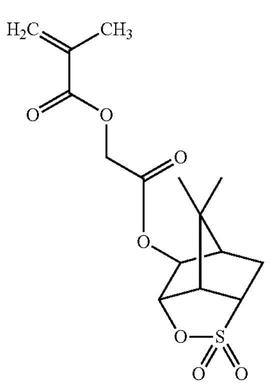
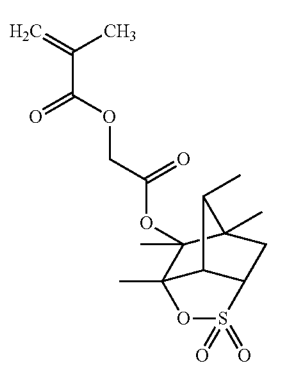
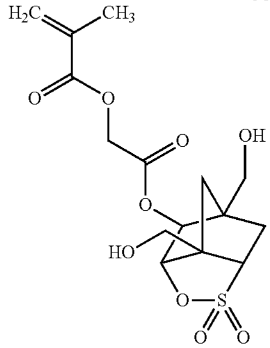
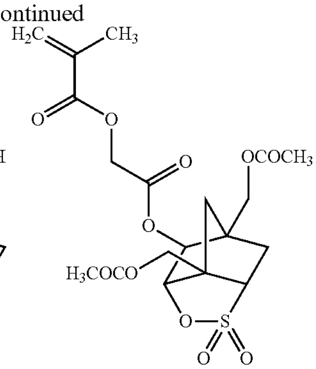
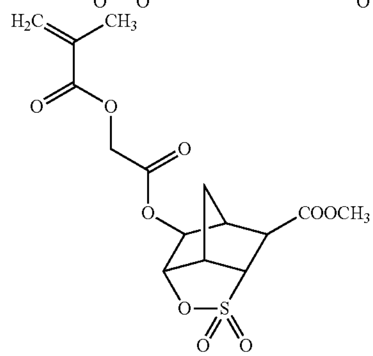
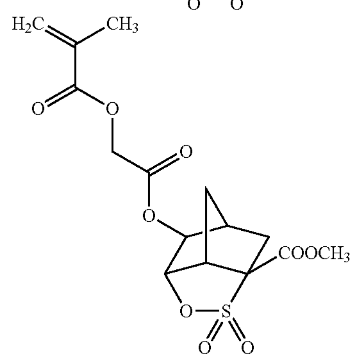
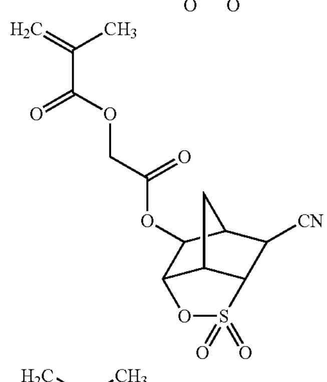
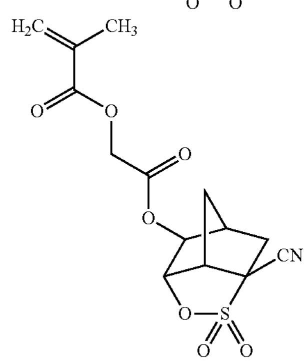

-continued
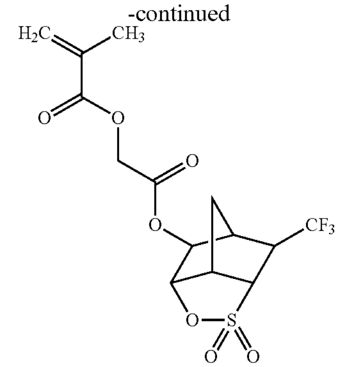
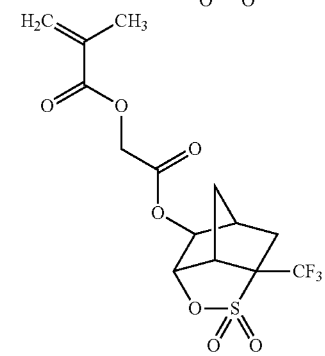
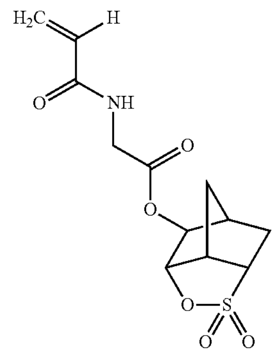
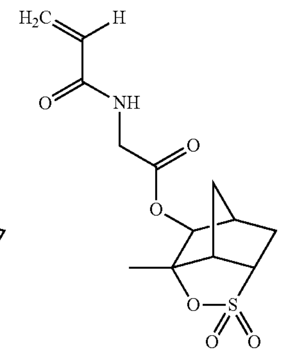
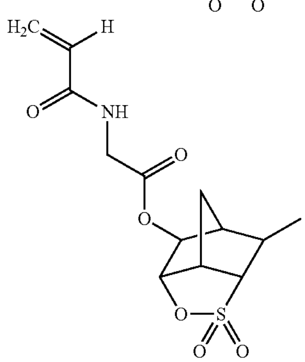
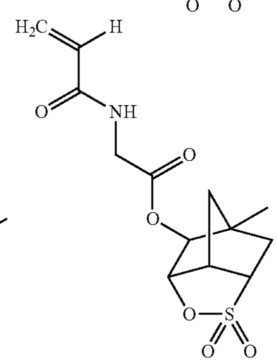
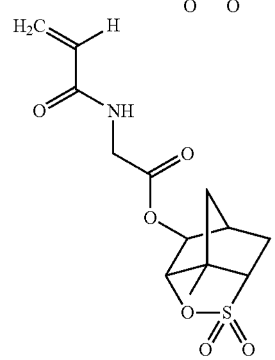
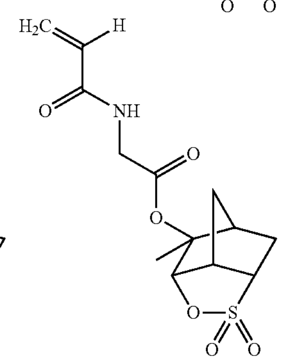
-continued
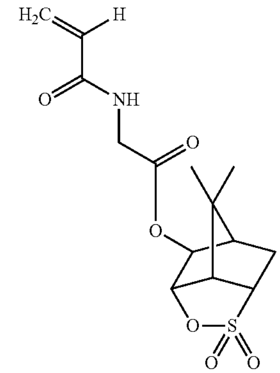
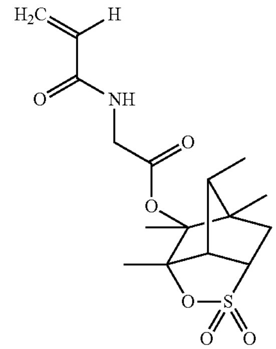
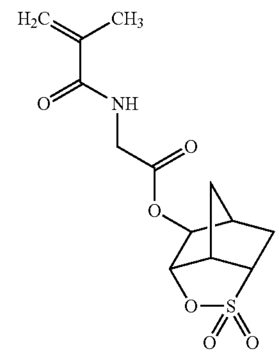
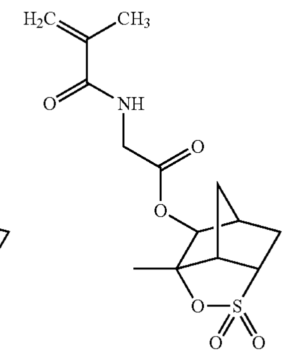
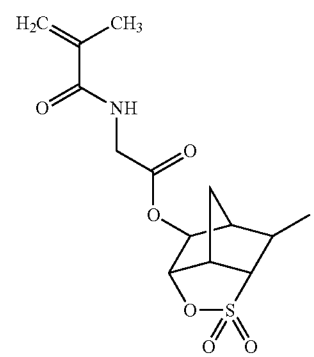
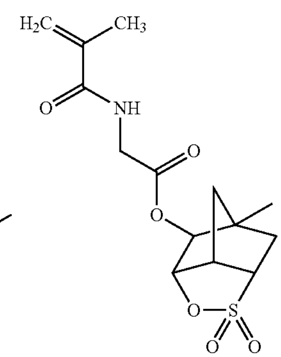
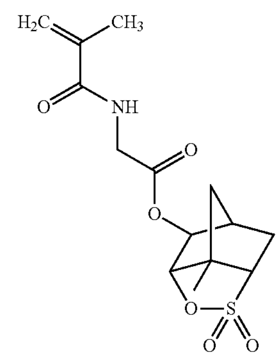
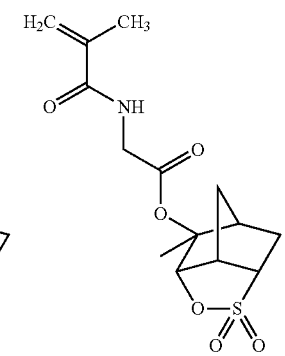

-continued
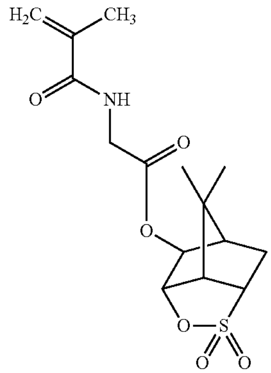
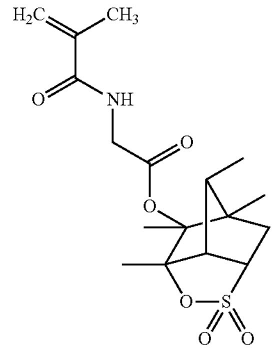
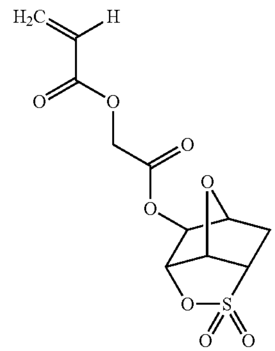
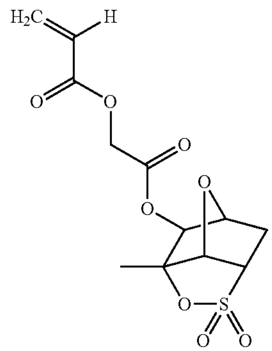
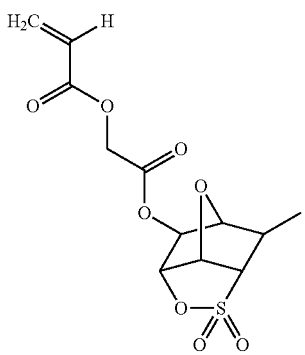
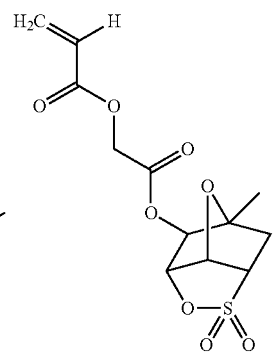
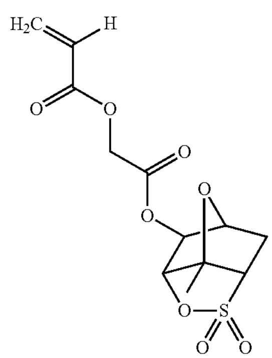
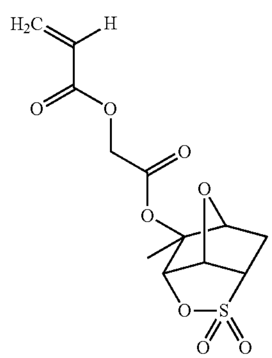
-continued
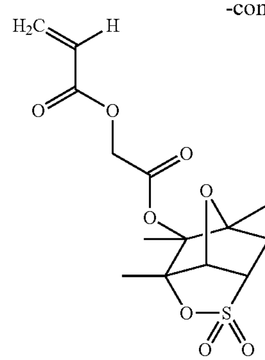
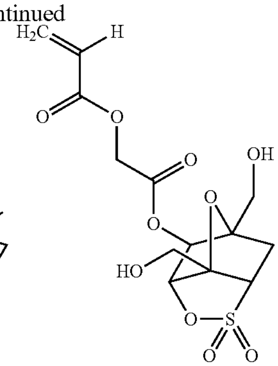
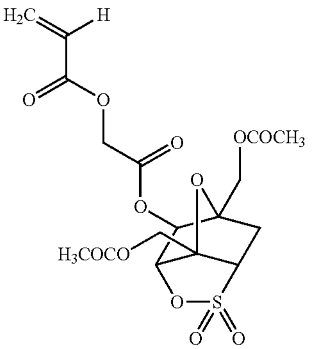
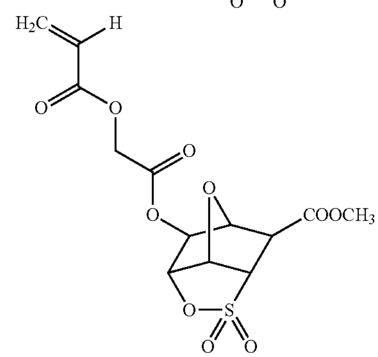
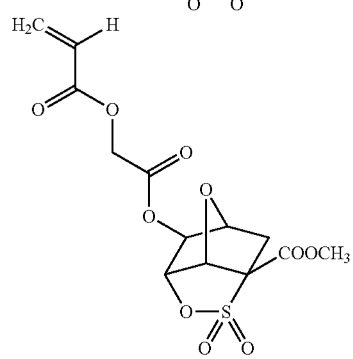
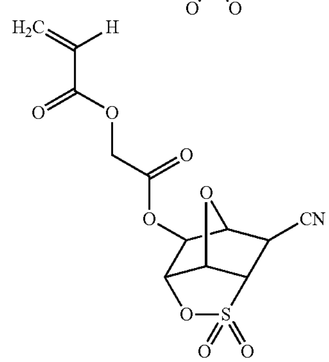

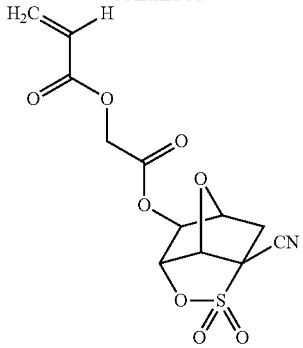
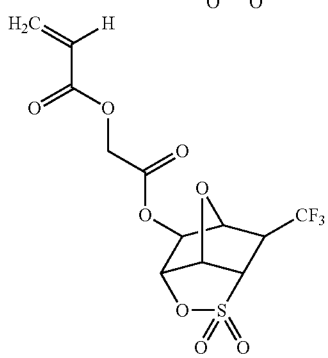
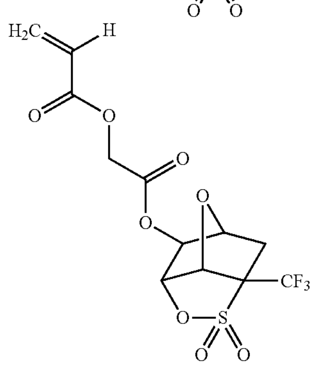
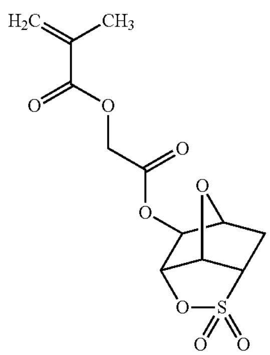
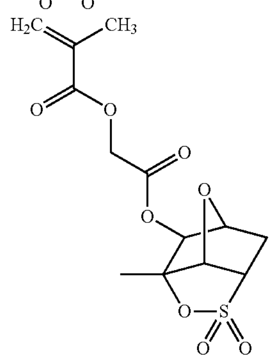
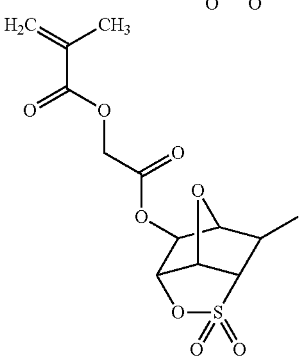
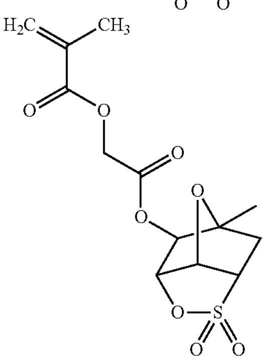
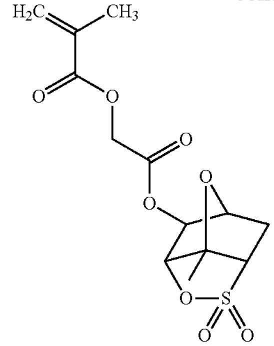
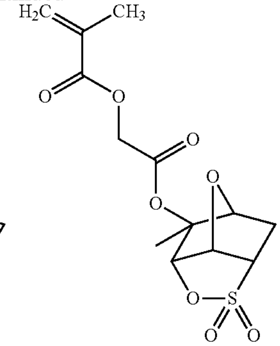
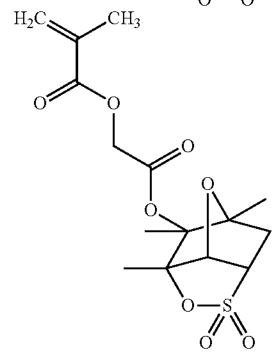
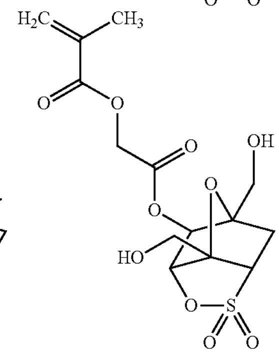
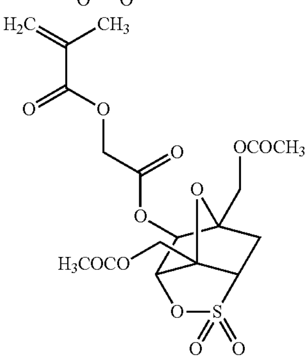
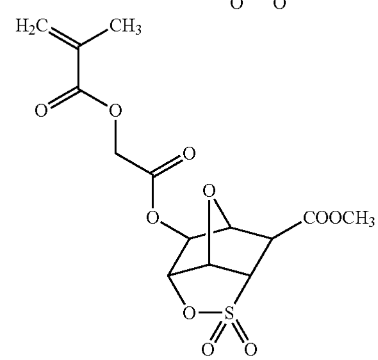
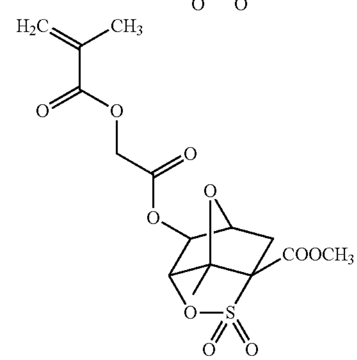

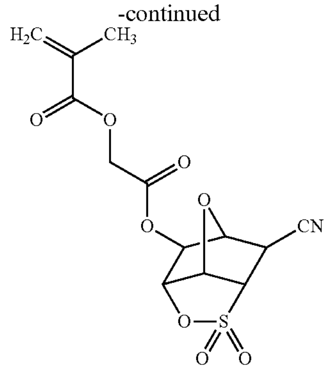
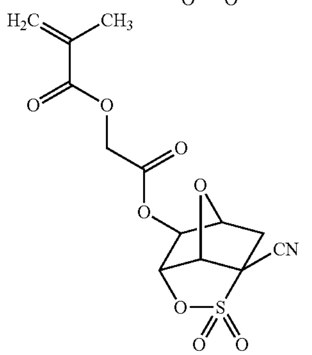
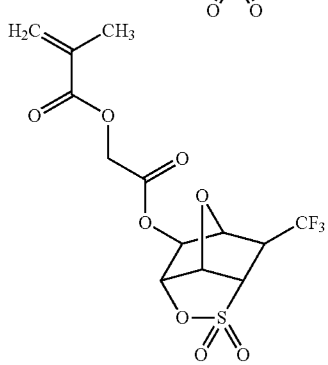
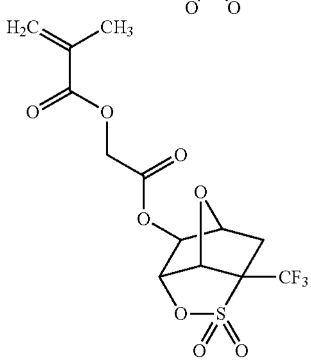
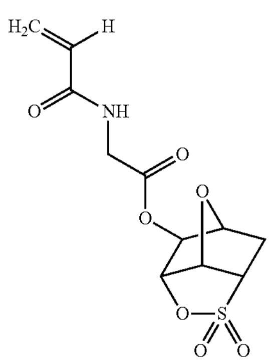
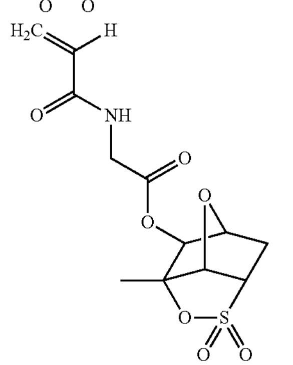
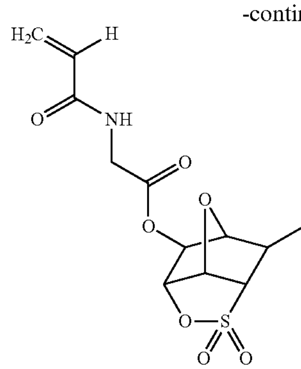
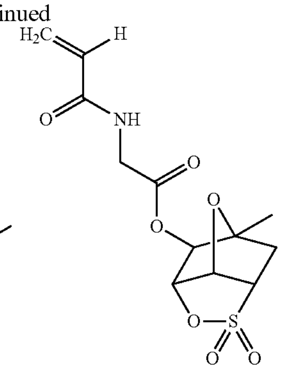
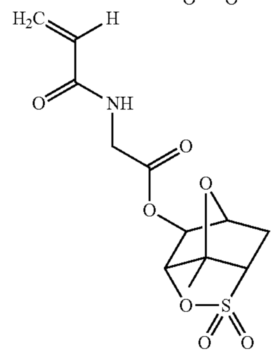
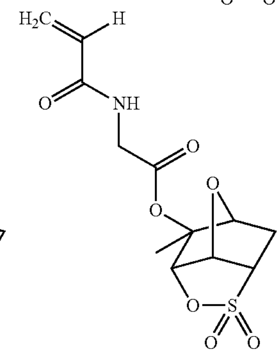
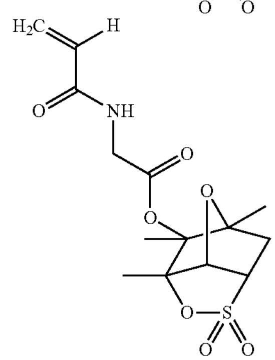
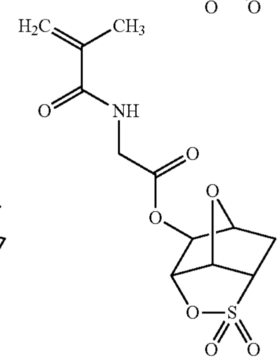
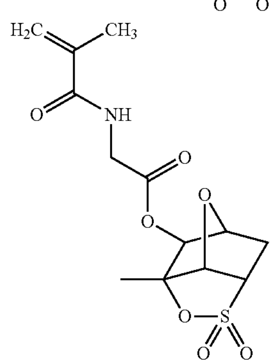
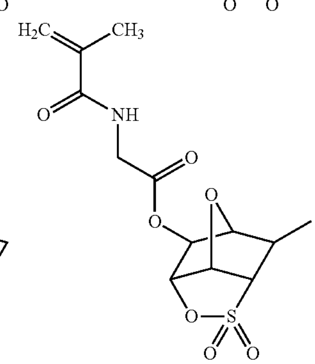
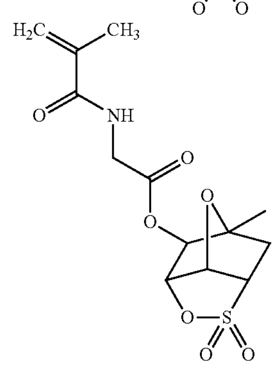
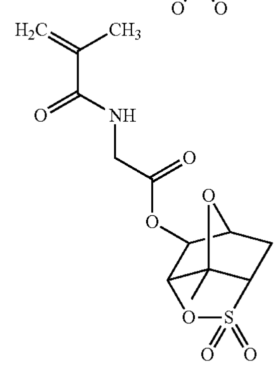

-continued
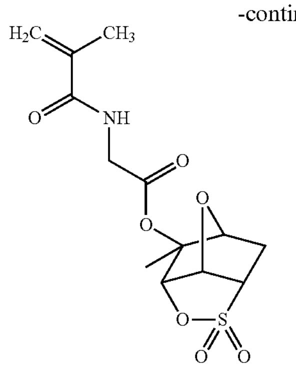
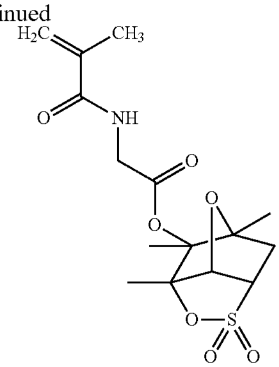
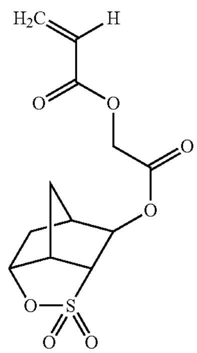
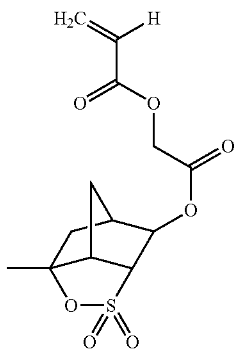
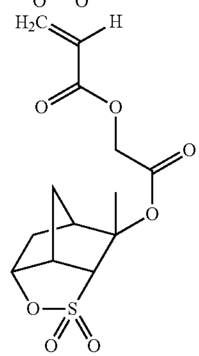
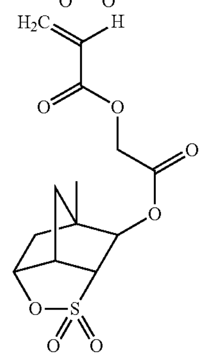
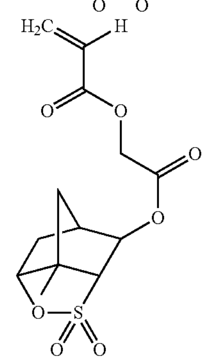
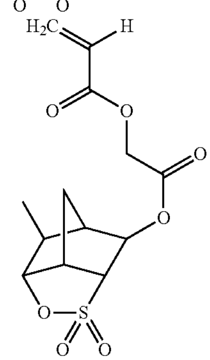
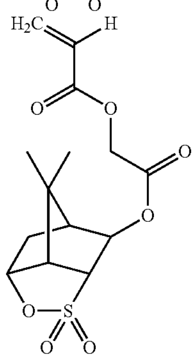
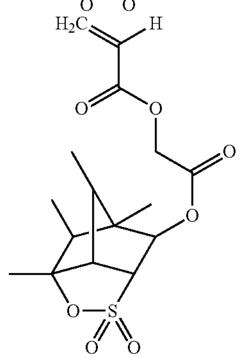
-continued
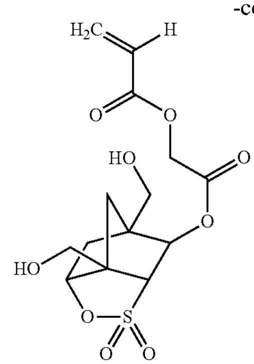
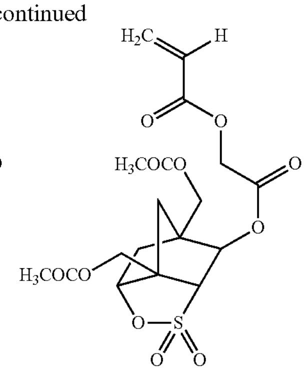
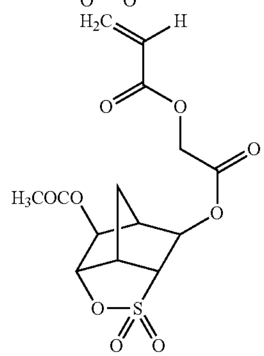
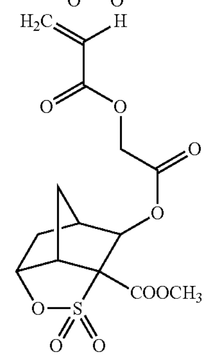
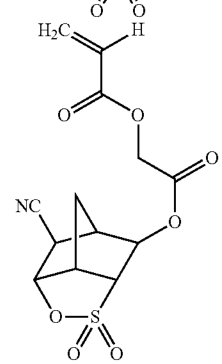
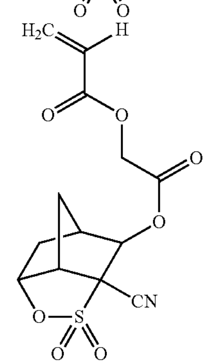
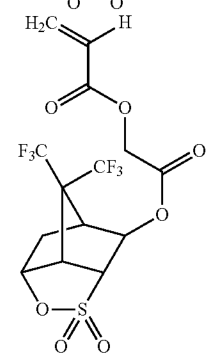
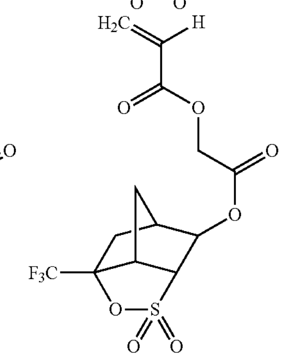
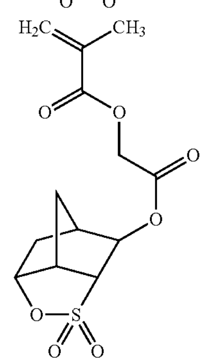
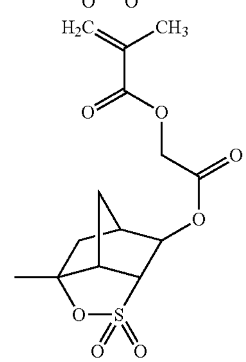

-continued
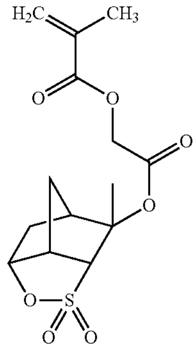
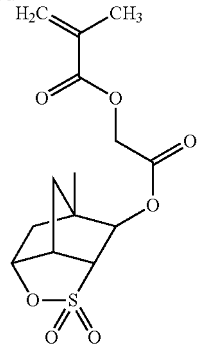
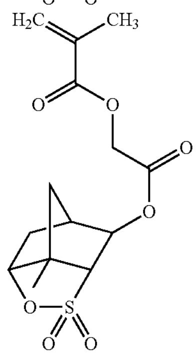
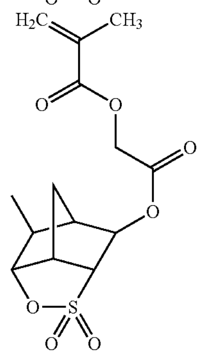
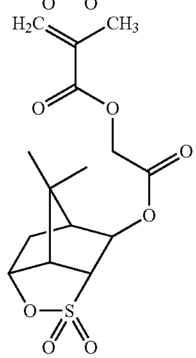
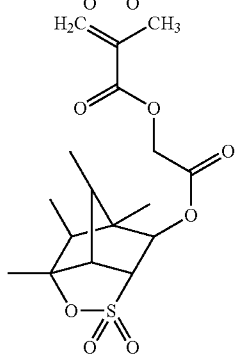
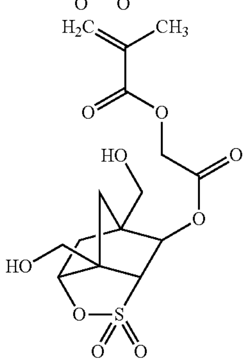
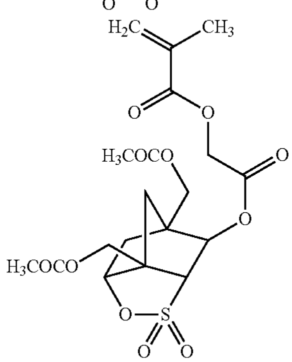
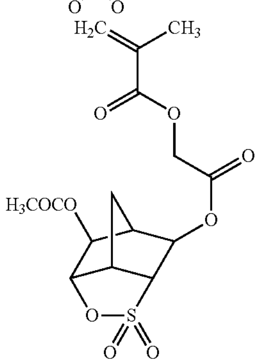
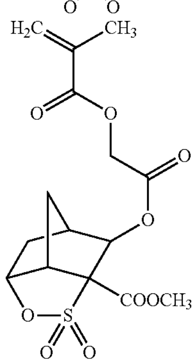
-continued
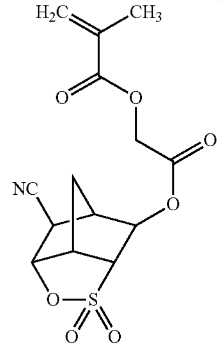
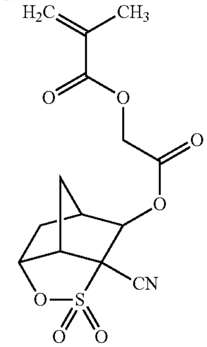
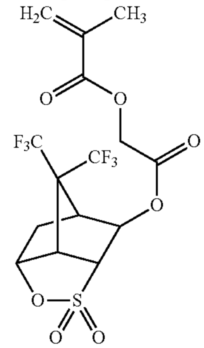
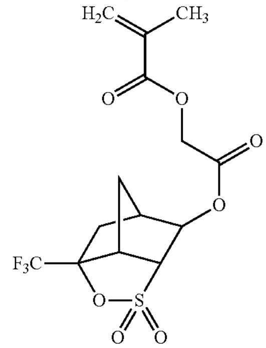
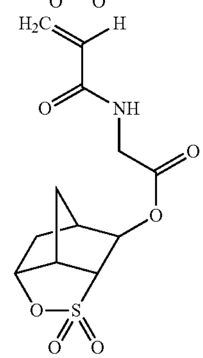
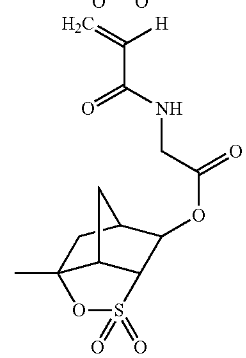
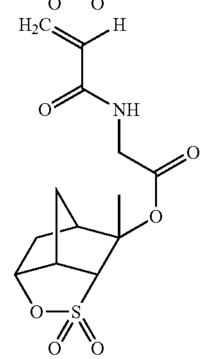
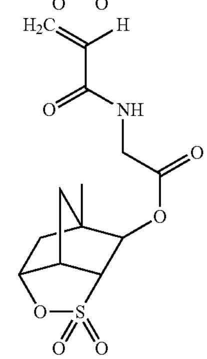
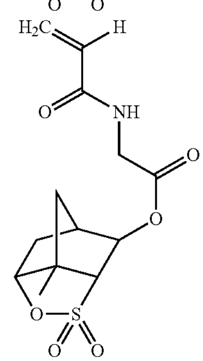
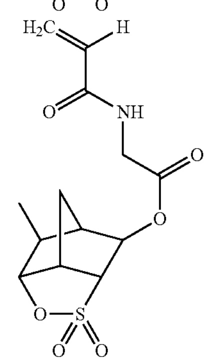

-continued
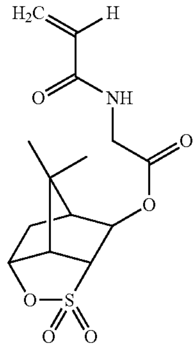
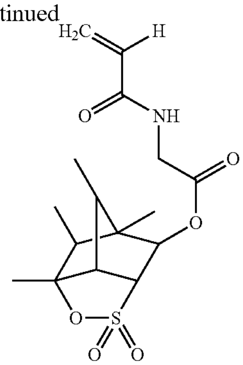
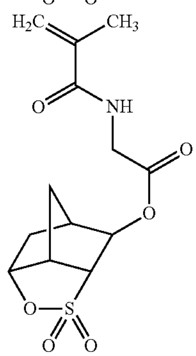
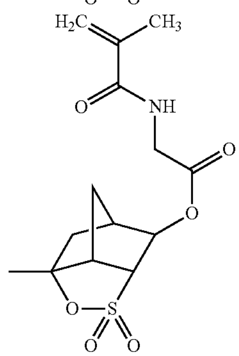
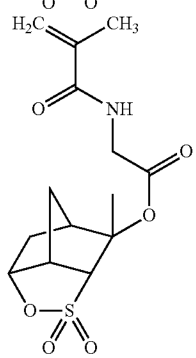
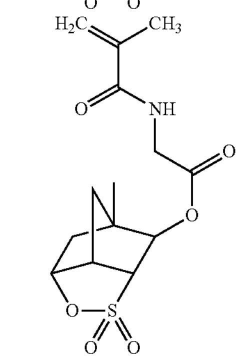
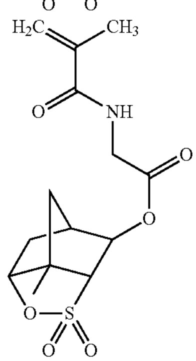
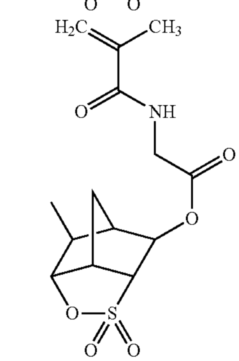
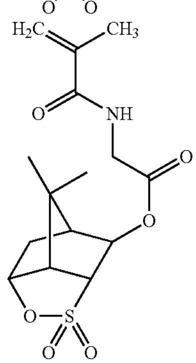
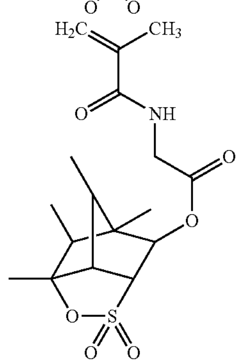
-continued
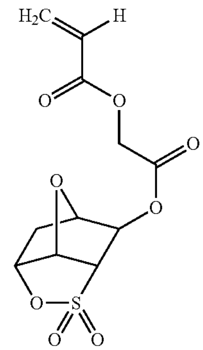
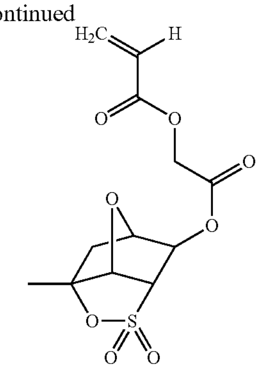
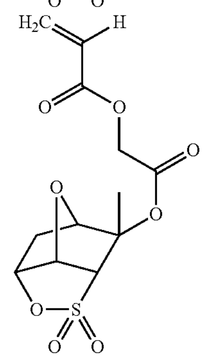
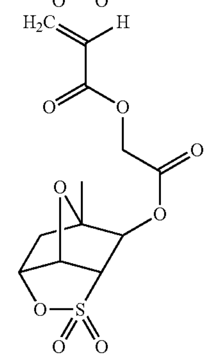
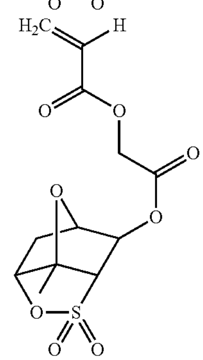
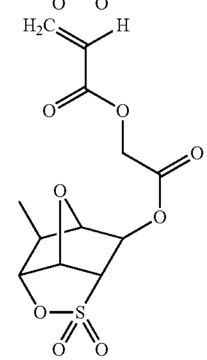
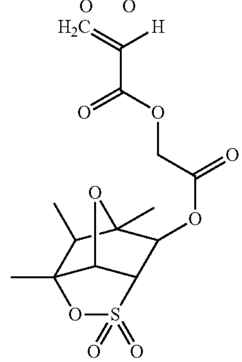
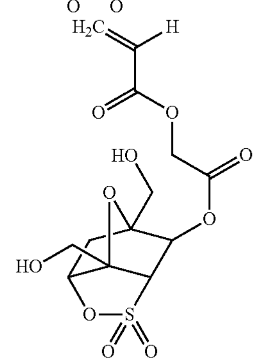
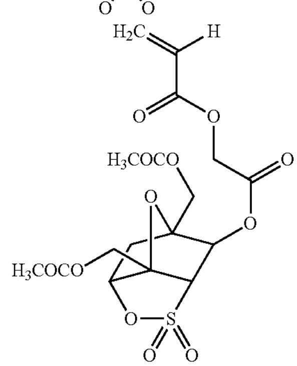
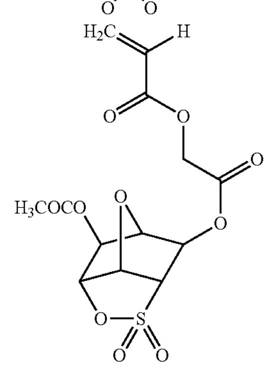

-continued
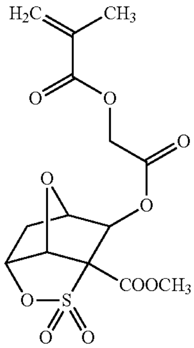
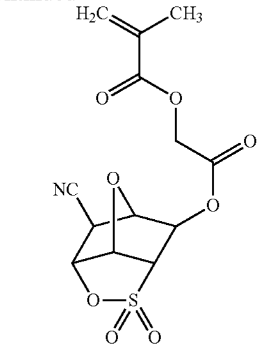
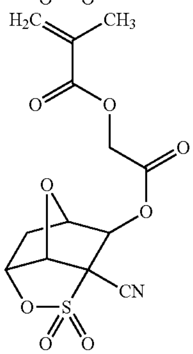
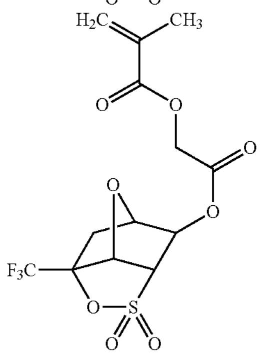
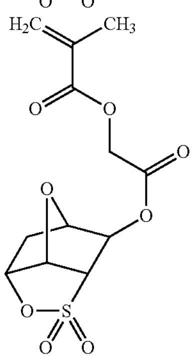
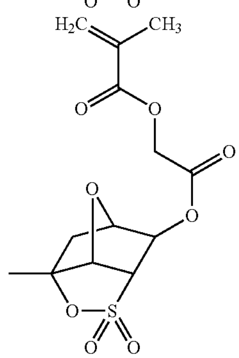
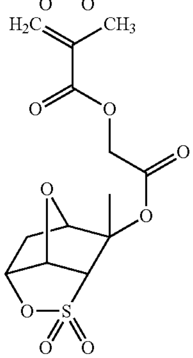
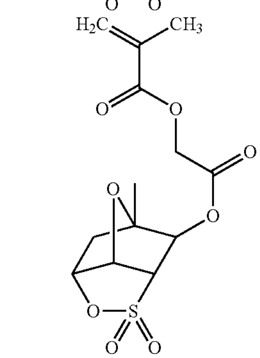
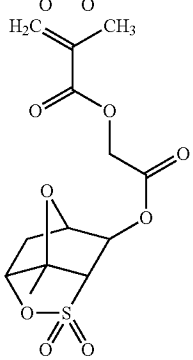
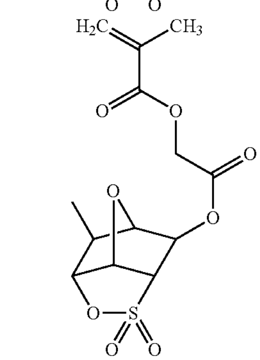
-continued
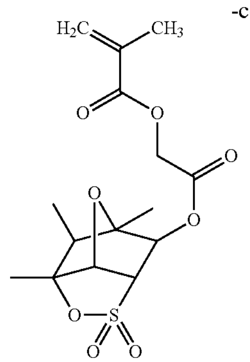
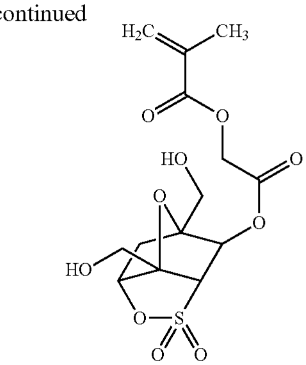
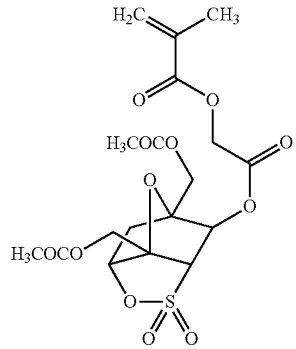
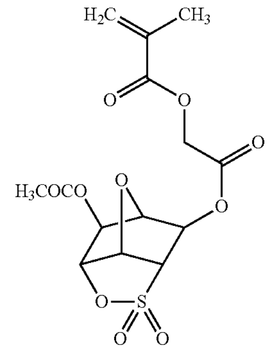
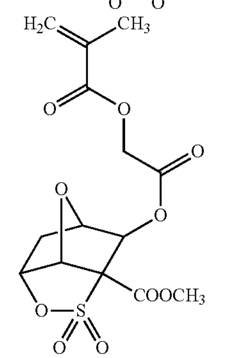
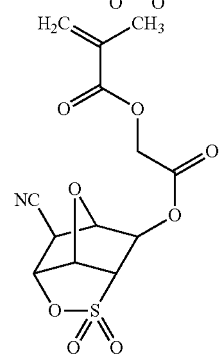
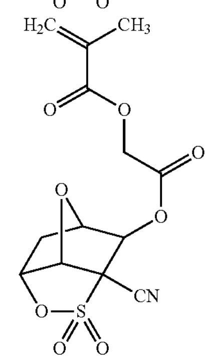
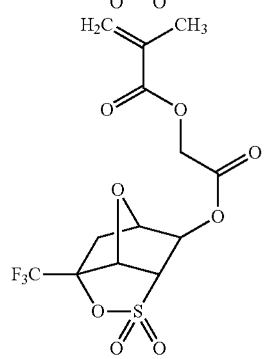
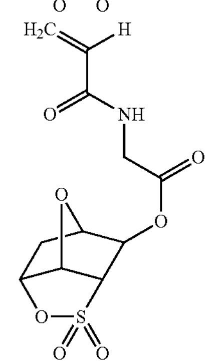
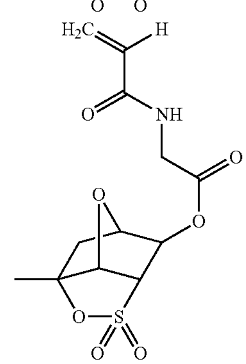

-continued

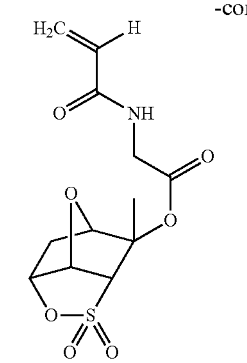

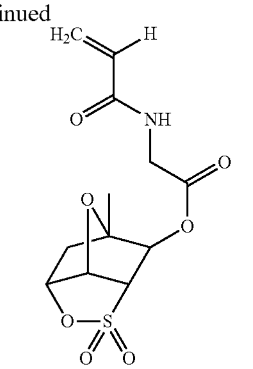

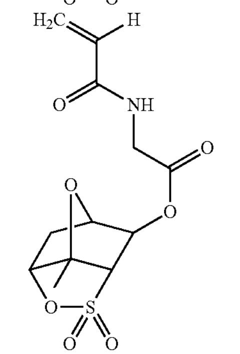

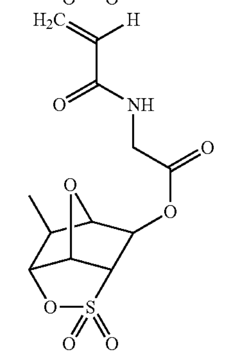

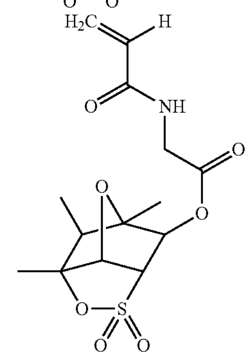

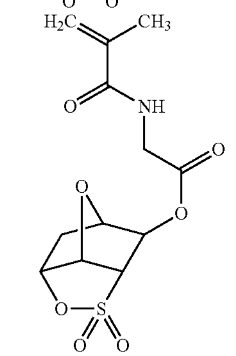

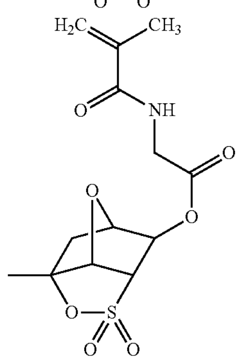

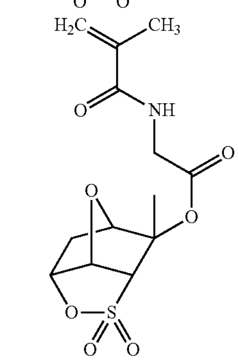

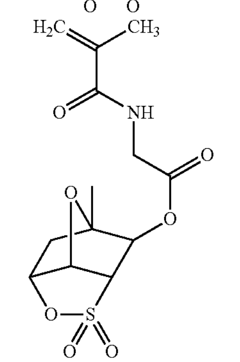

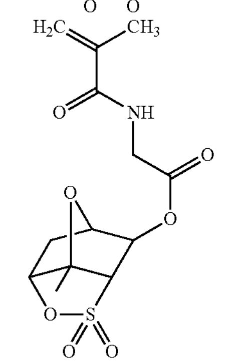

-continued

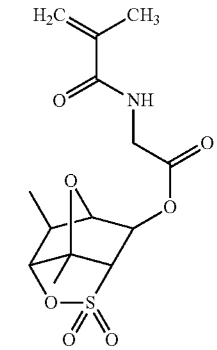

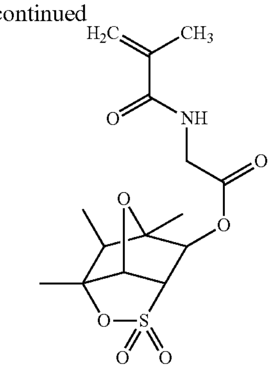

The compound represented by the formula (II2) can be produced by the known methods.

Examples of the method include a method below.

A compound represented by the formula (II2-c) can be produced by reacting a compound represented by the formula (II2-a) with a compound represented by the formula (II2-b) in presence of a basic catalyst in a solvent. Here, examples of the basic catalyst include pyridine, and examples of the solvent include tetrahydrofuran. And then a compound (II2') in which $Z^1$ is —O—$CH_2$— can be produced by reacting the compound represented by the formula (II2-c) with a compound represented by the formula (II2-d) in presence of a catalyst in a solvent. Preferred examples of the catalyst include N-methylpyrrolidine. Preferred examples of the solvent include N,N-dimethylformamide.

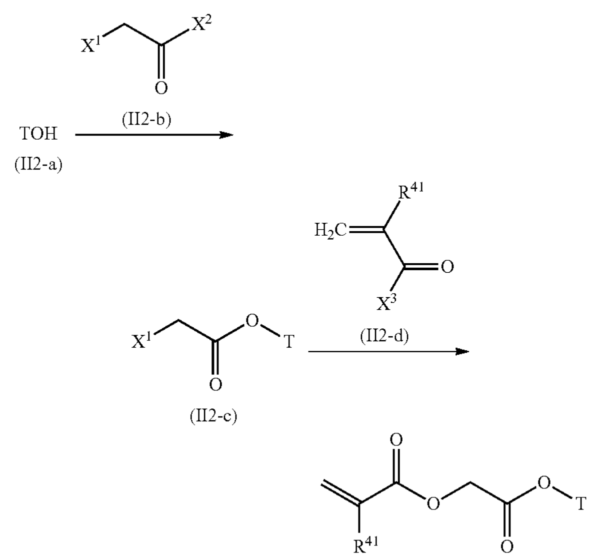

wherein T and $R^{41}$ represent the same meaning as described above;

$X^1$ and $X^2$ independently represent a halogen atom, $X^3$ represents a halogen atom or (meth)acryloyloxy group.

Examples of the halogen atom preferably include chlorine atom.

Examples of the compound represented by the formula (II2-a) include 5-hydroxy-3-oxa-2-thiatricyclo[4.2.1.0.$^{4,8}$]nonane-2,2-dion described in JP-2007-119696-A.

Examples of the compound represented by the formula (II2-b) include chloroacetyl chloride.

Examples of the compound represented by the formula (II2-d) include methacryloyl chloride and methacrylic anhydride.

The mole ratio of the structural units derived from the compounds represented by the formula (I) and the formula (II2) (the structural units derived from the compound represented by the formula (I): the structural units derived from the compound represented by the formula (II2)) is generally 1:0.2 to 1:10, preferably 1:0.4 to 1:8, and more preferably 1:0.5 to 1:5.

The total content of the structural units derived from the compounds represented by the formula (I) and the formula (II2) is generally 5 to 100 mol %, preferably 10 to 70 mol %, and more preferably 15 to 50 mol %, with respect to the total structural units constituting the resin.

<Compound Represented by the Formula (II3)>

(II3)

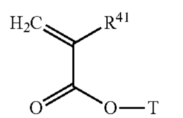

wherein $R^{41}$ represents a hydrogen atom, a halogen atom or a $C_1$ to $C_6$ alkyl group that optionally has one or more halogen atoms;

T represents a heterocyclic group containing —$SO_2$— as skeleton, one or more hydrogen atoms contained in the heterocyclic group may be replaced by a halogen atom, a hydroxy group, a $C_1$ to $C_{12}$ alkyl group, a $C_1$ to $C_{12}$ alkoxyl group, a $C_6$ to $C_{12}$ aryl group, a $C_7$ to $C_{13}$ aralkyl group, glycidyloxy group or a $C_2$ to $C_4$ acyl group, and one or more —$CH_2$— contained in the heterocyclic group may be replaced by —CO—, —O—, —S—, —$SO_2$—, or —$N(R^{45})$—;

$R^{45}$ represents a hydrogen atom or a $C_1$ to $C_6$ alkyl group.

The structural unit derived from the compound represented by the formula (II3) is a structural unit described below.

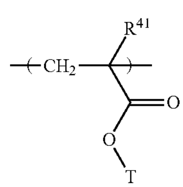

In the formula (II3), $R^{41}$ is preferably a hydrogen atom and methyl group.

In the compound represented by the formula (II3), T is preferably a group having a norbornane skeleton.

T is preferably represented by the formula (T1) above, and in particular, preferably a group represented by the formula (T2) above.

Further, T is preferably a group represented by the formula (T3) above, and in particular, more preferably a group represented by the formula (T4) above.

Examples of the compound represented by the formula (II3) include compounds below.

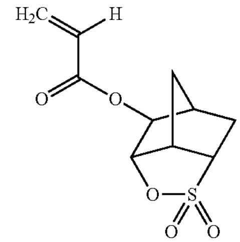

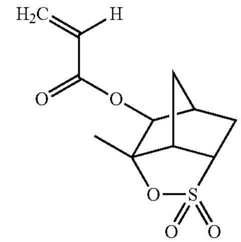

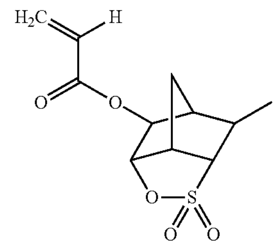

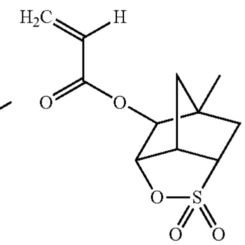

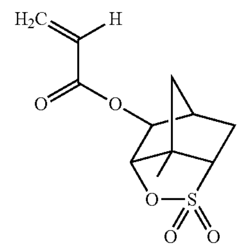

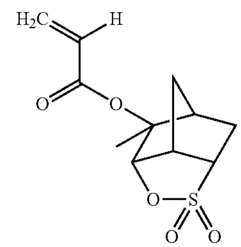

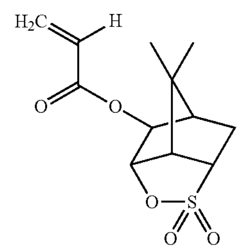

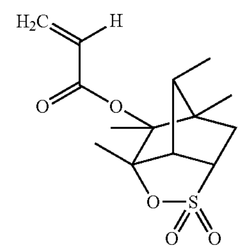

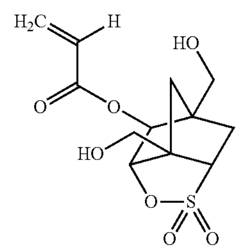

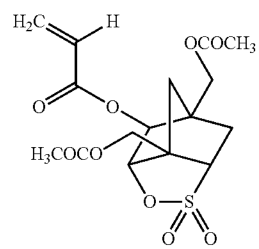

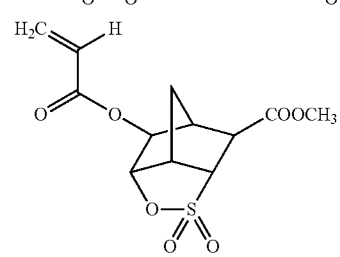

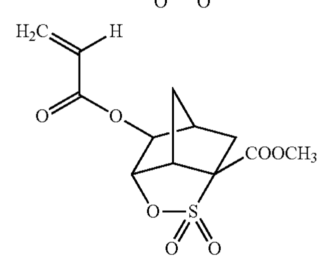

-continued
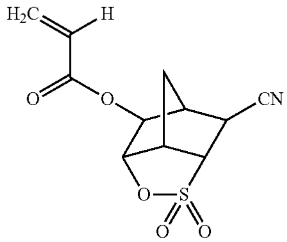
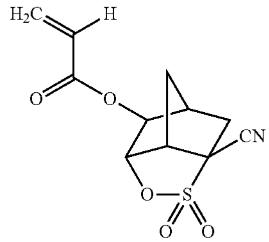
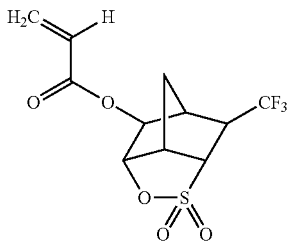
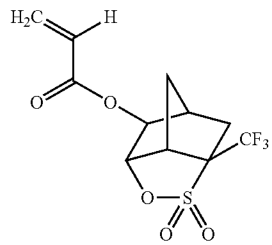
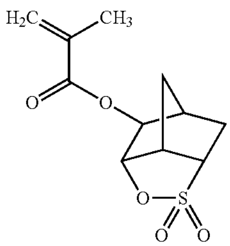
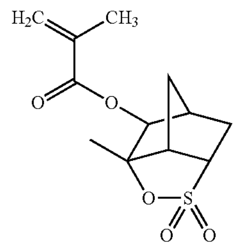
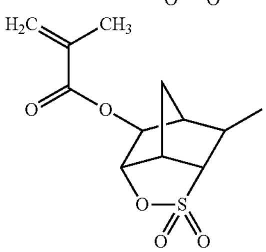
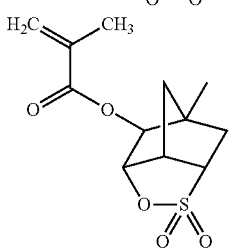
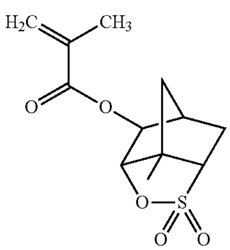
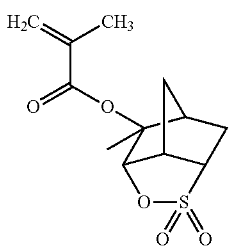
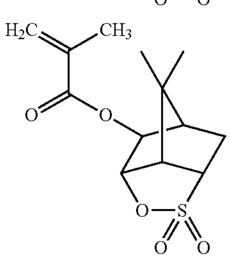
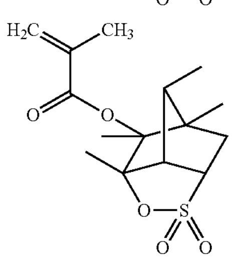
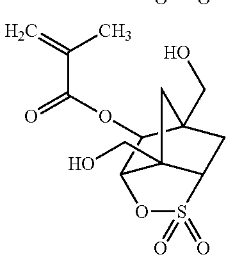
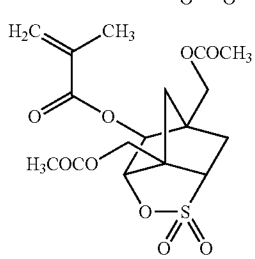
-continued
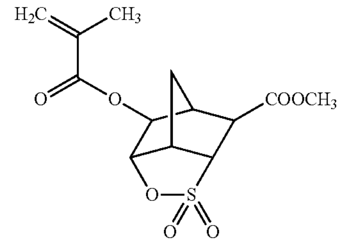
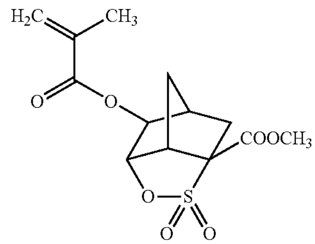
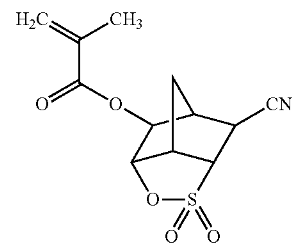
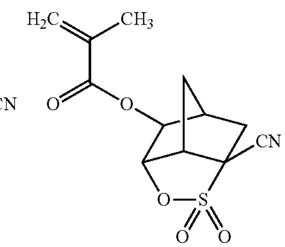
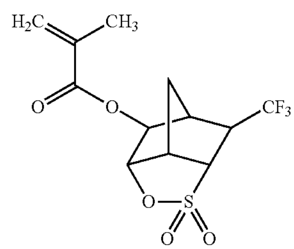
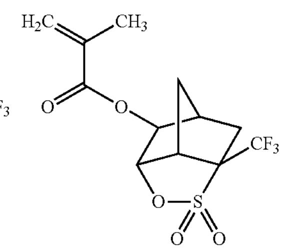
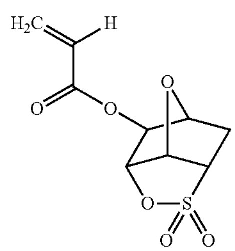
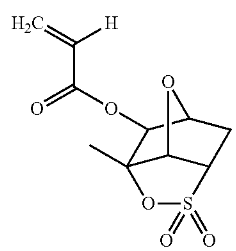
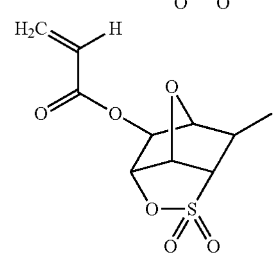
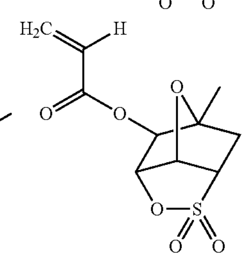
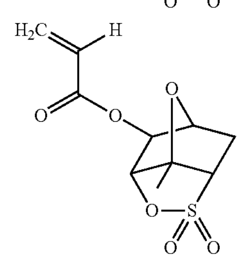
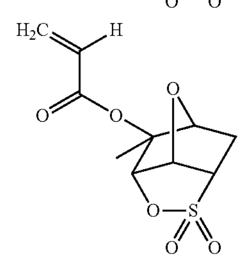

-continued
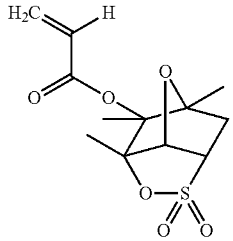
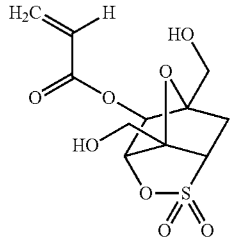
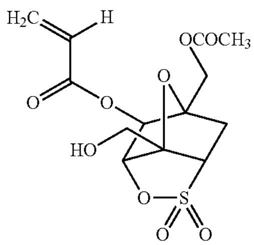
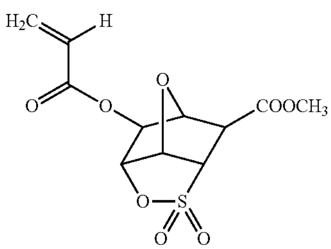
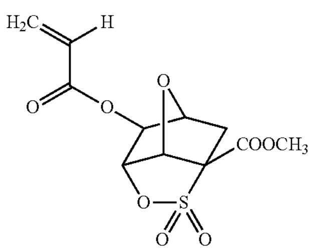
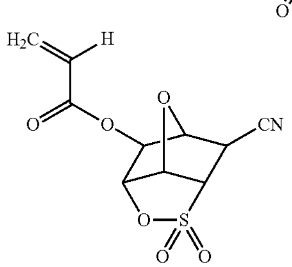
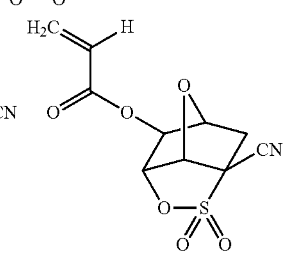
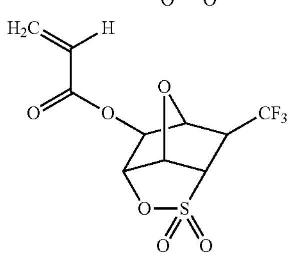
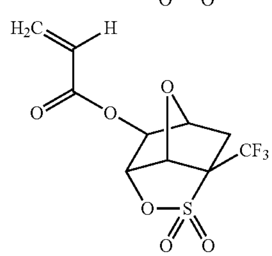
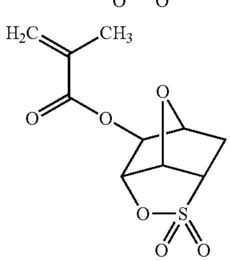
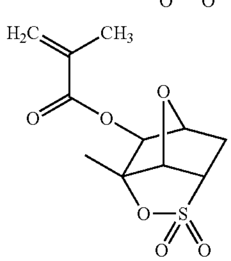
-continued
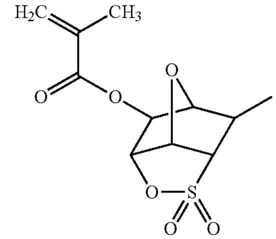
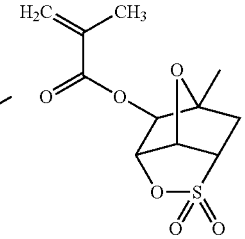
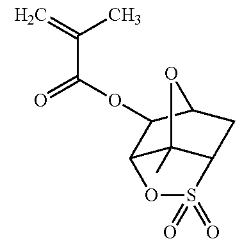
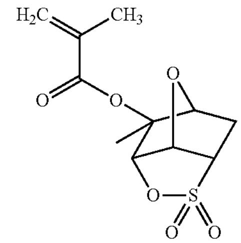
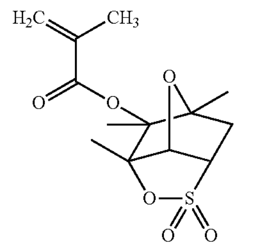
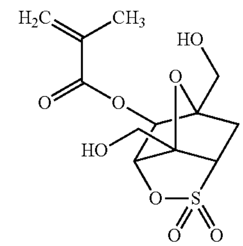
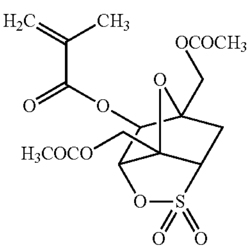
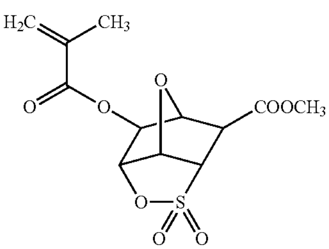
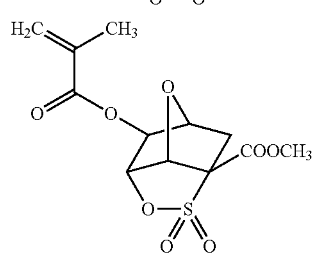
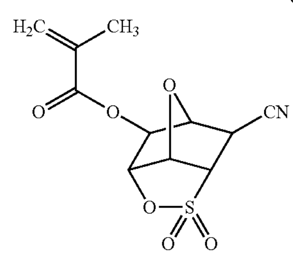
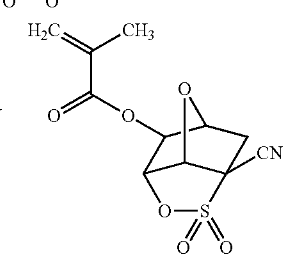

-continued
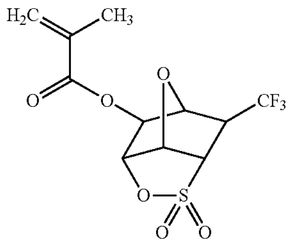
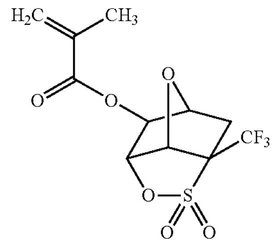
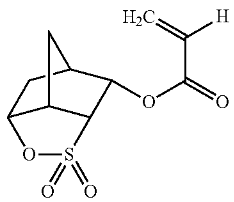
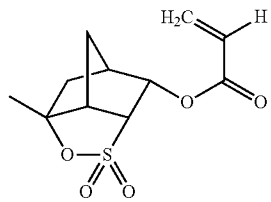
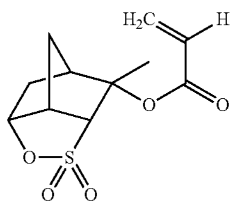
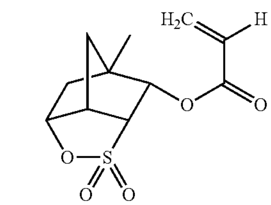
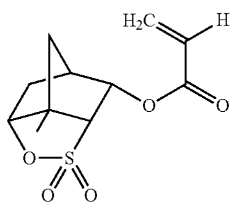
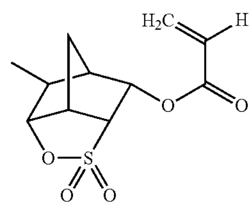
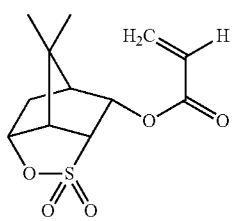
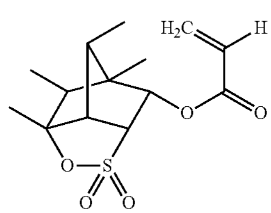
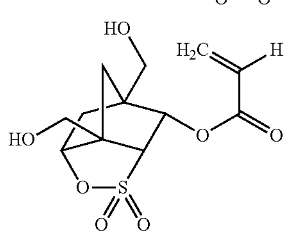
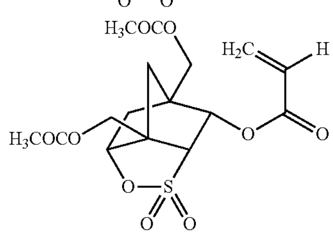
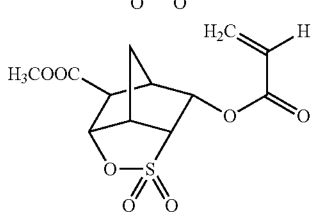
-continued
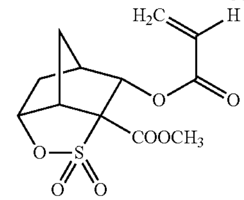
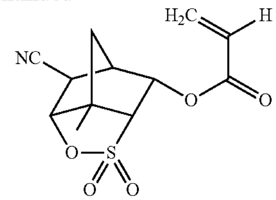
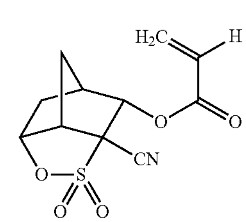
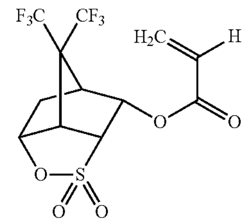
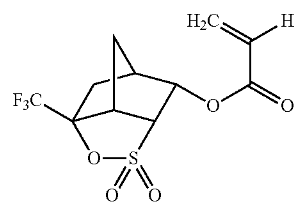
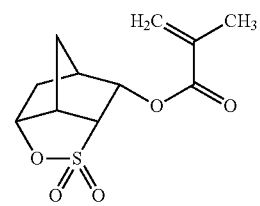
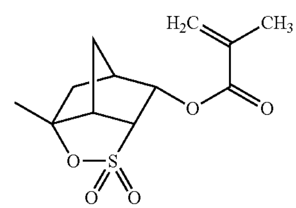
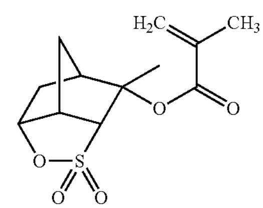
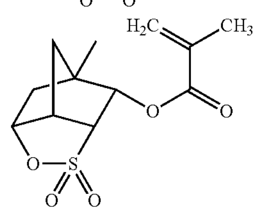
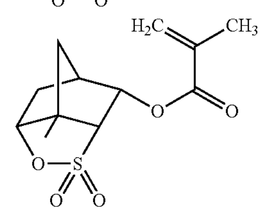
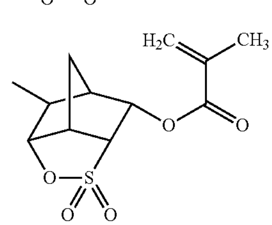
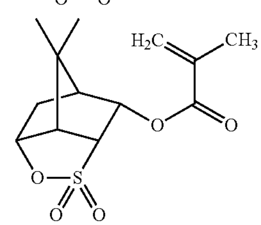
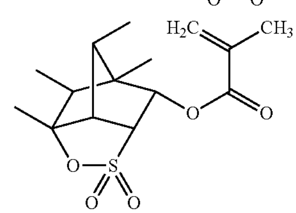
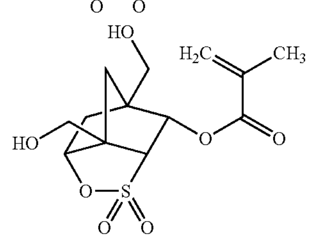

-continued
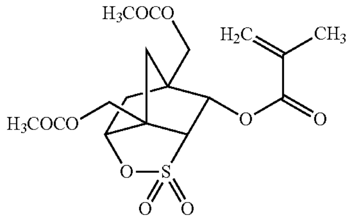
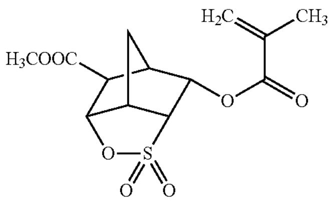
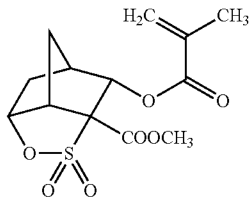
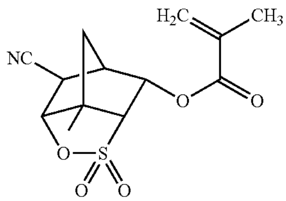
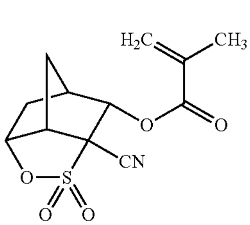
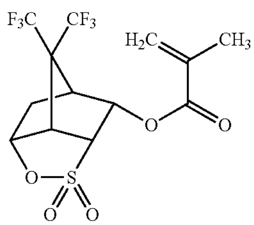
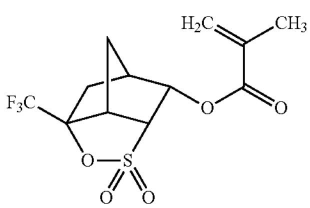
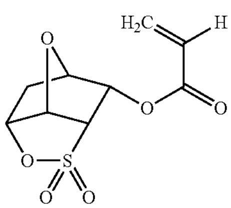
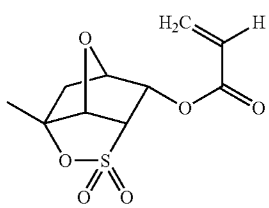
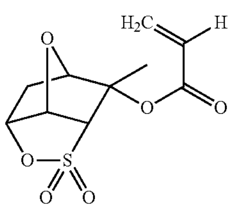
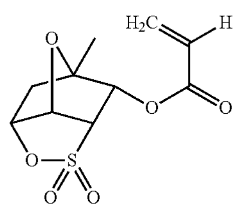
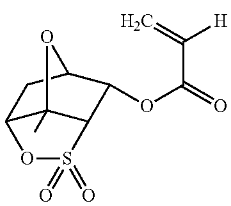
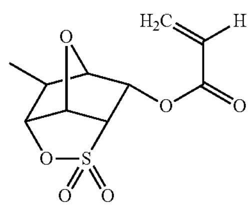
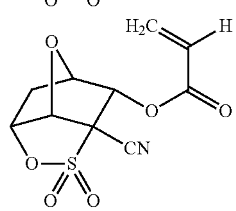
-continued
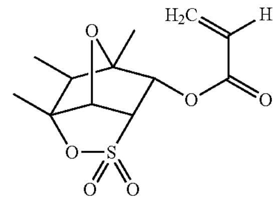
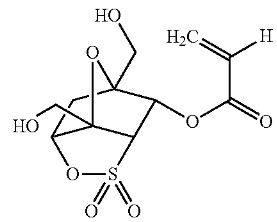
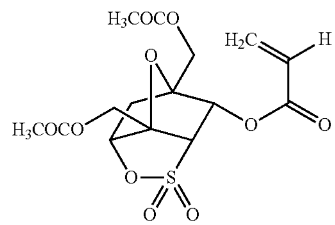
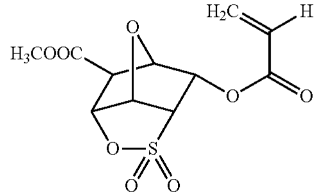
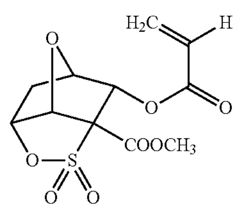
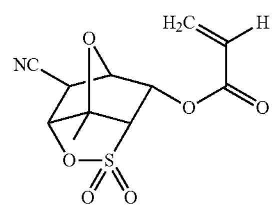
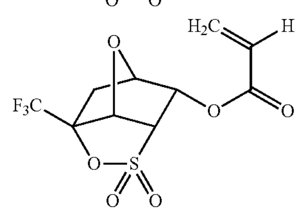
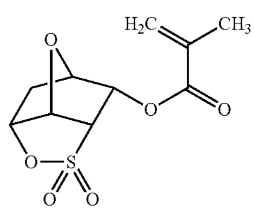
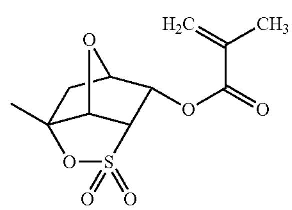
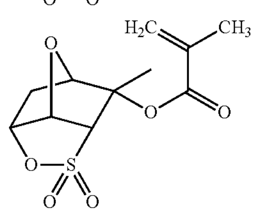
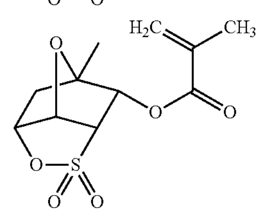

-continued
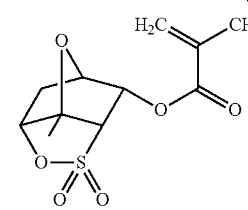
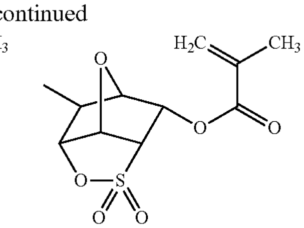
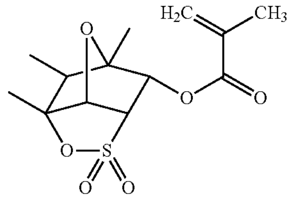
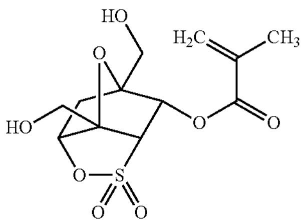
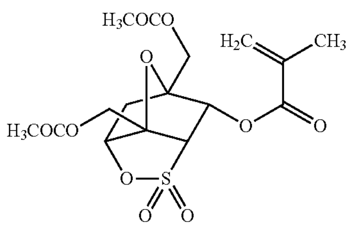
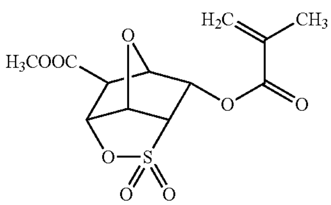
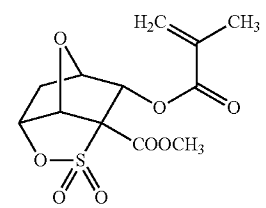
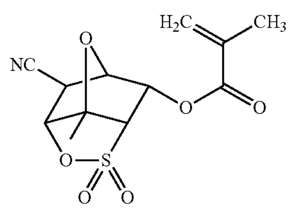
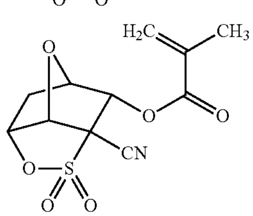
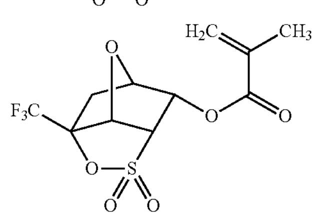
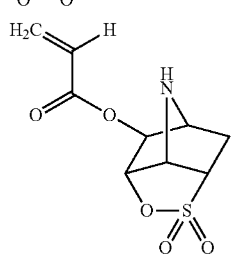
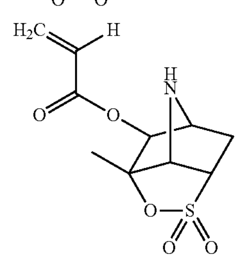
-continued
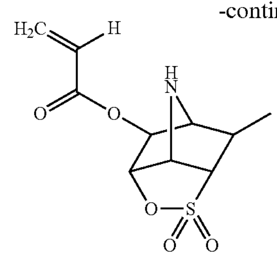
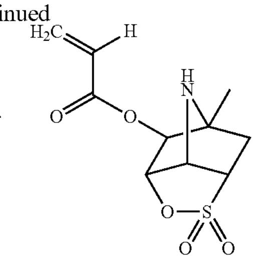
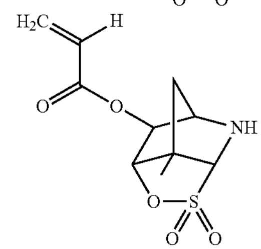
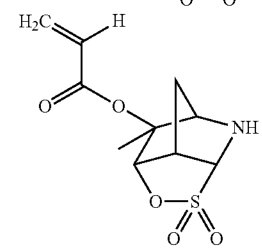
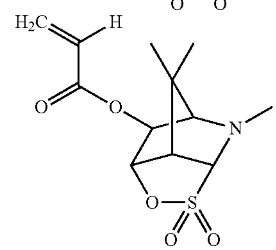
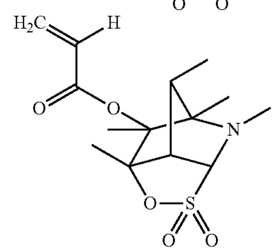
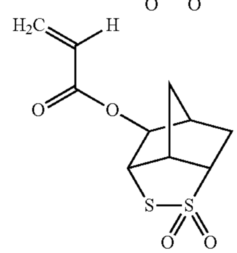
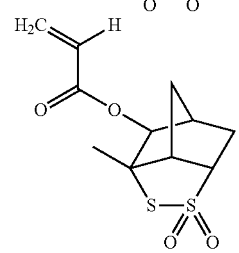
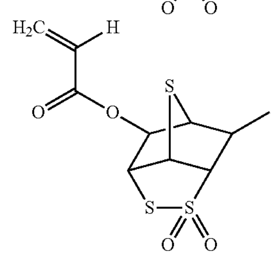
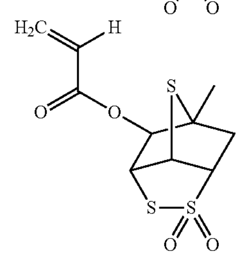
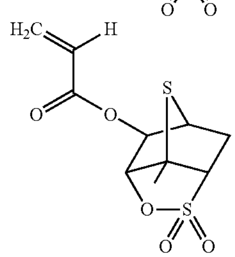
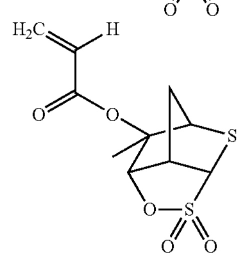
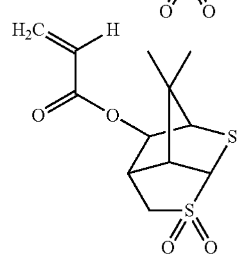
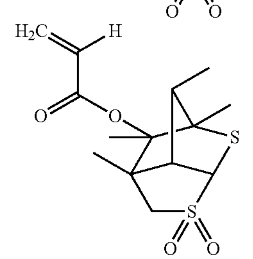
The compound represented by the formula (II3) can be produced by the known methods.

Examples of the method include a method below.

The compound represented by the formula (II3) can be produced by reacting a compound represented by the formula (II3-a) with a compound represented by the formula (II3-b) in presence of a catalyst in a solvent. Here, preferred examples of the catalyst include N-methylpyrrolidine. Preferred examples of the solvent include N,N-dimethylformamide.

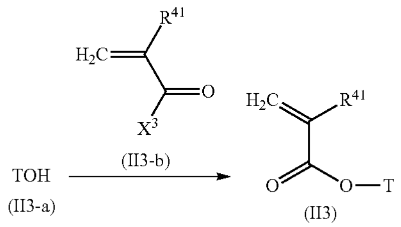

wherein T, and $R^{41}$ represent the same meaning as described above;

$X^3$ represents a halogen atom or (meth)acryloyloxy group.

Examples of the halogen atom preferably include chlorine atom.

Examples of the compound represented by the formula (II3-a) include 5-hydroxy-3-oxa-2-thiatricyclo[4.2.1.0.$^{4,8}$] nonane-2,2-dion described in JP-2007-119696-A.

Examples of the compound represented by the formula (II3-b) include methacryloyl chloride and methacrylic anhydride.

The mole ratio of the structural units derived from the compounds represented by the formula (I) and the formula (II3) (the structural units derived from the compound represented by the formula (I): the structural units derived from the compound represented by the formula (II3)) is generally 1:0.2 to 1:10, preferably 1:0.4 to 1:8, and more preferably 1:0.5 to 1:5.

The total content of the structural units derived from the compounds represented by the formula (I) and the formula (II3) is generally 5 to 100 mol %, preferably 10 to 70 mol %, and more preferably 15 to 50 mol %, with respect to the total structural units constituting the resin.

<Compound Represented by the Formula (II4)>

(II4)

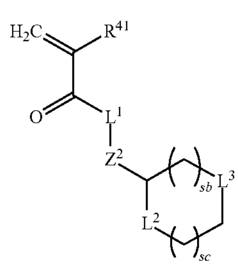

wherein $R^{41}$ represents a hydrogen atom, a halogen atom or a $C_1$ to $C_6$ alkyl group that optionally has one or more halogen atoms;

$Z^2$ represents a binding position or *—$(CH_2)_{sd}$—CO-$L^4$-;

$L^1$, $L^2$, $L^3$ and $L^4$ independently represent —O— or —S—;

sb represents an integer of 1 to 3;

sc represents an integer of 0 to 3;

sd represents an integer of 1 to 4;

* represents a binding position to $L^1$.

The structural unit derived from the compound represented by the formula (II4) is a structural unit described below.

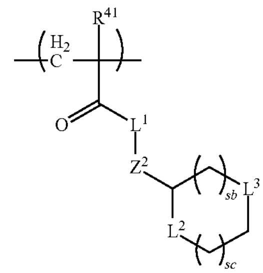

In the formula (II3), $R^{41}$ is preferably a hydrogen atom and methyl group.

$L^1$, $L^2$ and $L^4$ are independently preferably —O—.

$L^3$ is preferably —S—.

sb is preferably 1.

sc is preferably an integer of 0 to 2.

$Z^2$ is preferably a binding position.

Examples of the compound represented by the formula (II4) include compounds below.

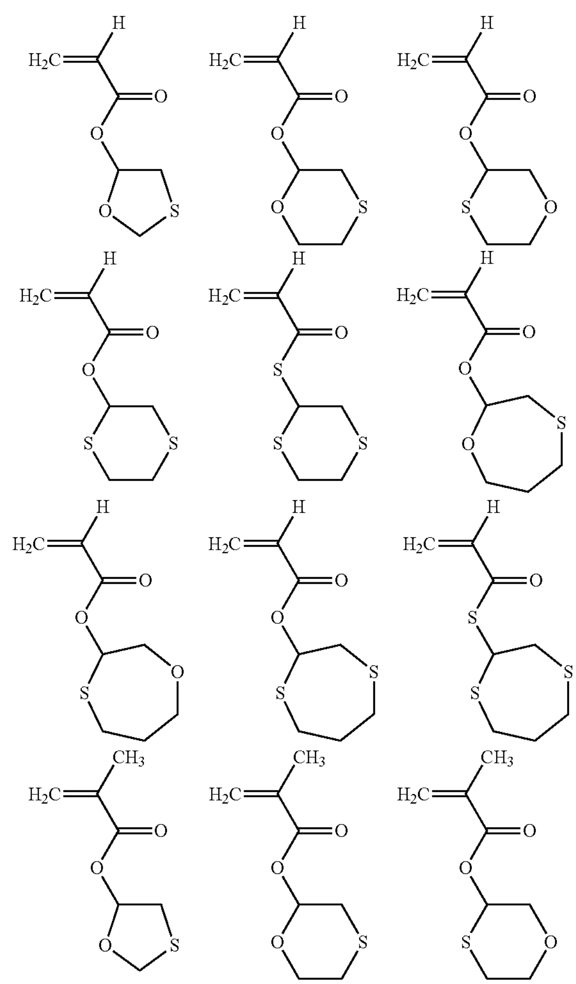

-continued

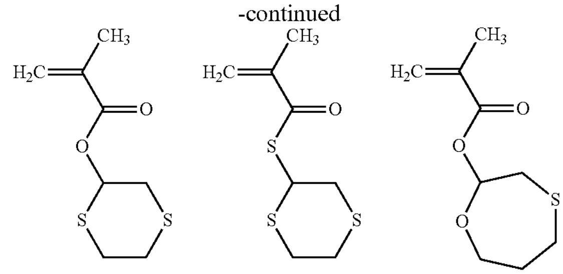
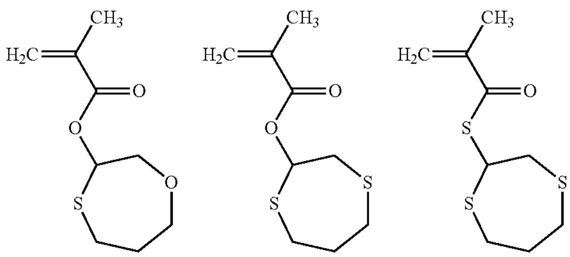
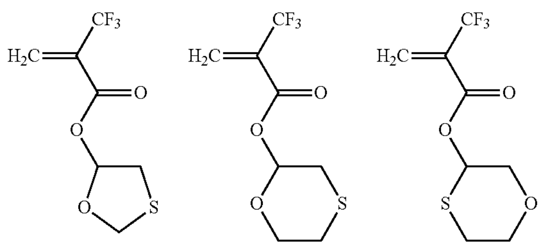
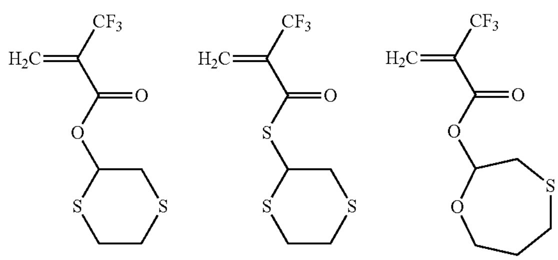
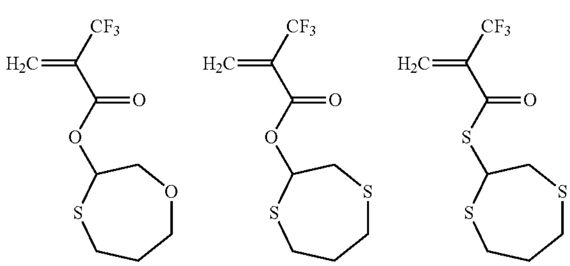
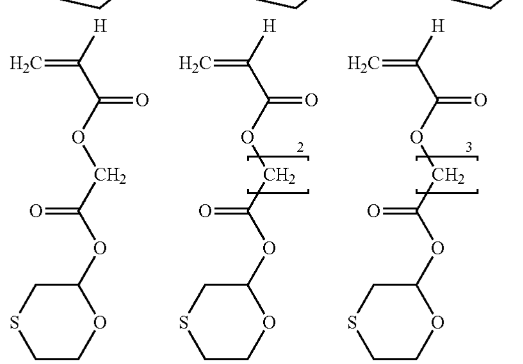

-continued

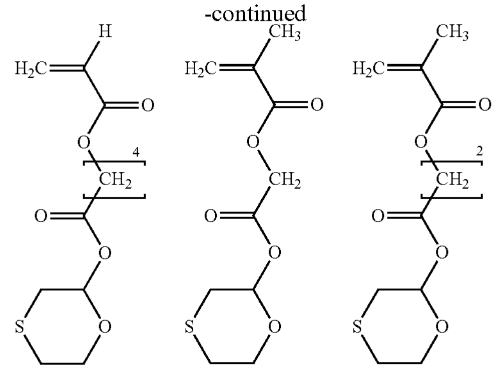
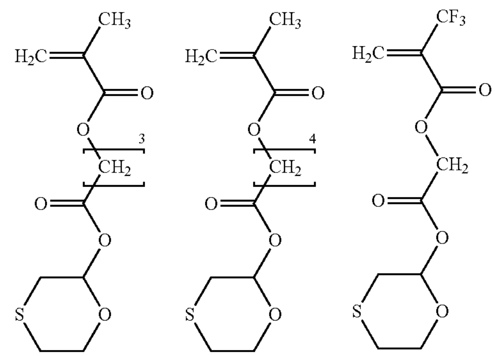
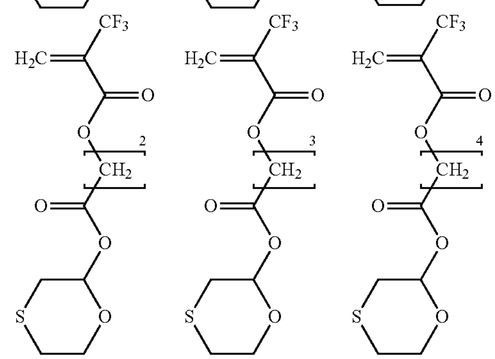

The compound represented by the formula (II4) can be produced by the known methods.

Examples of the method include a method below.

A compound represented by the formula (II4') in which $L^1$ is —O— can be produced by reacting a compound represented by the formula (II4-a) with a compound represented by the formula (II4-b) in presence of a basic catalyst in a solvent. Here, Preferred examples of the catalyst include N-methylpyrrolidine. Preferred examples of the solvent include N,N-dimethylformamide.

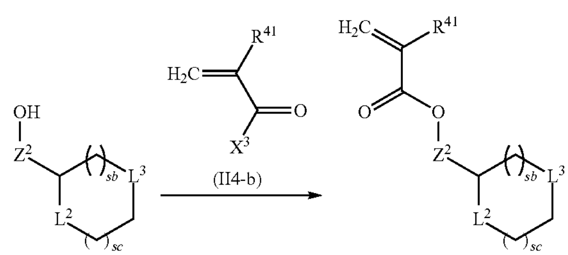

(II4-a) (II4')

wherein $R^{41}$, $Z^2$, $L^2$, $L^3$ sb and sc represent the same meaning as described above;

$X^3$ represents a halogen atom or (meth)acryloyloxy group.

Examples of the halogen atom preferably include chlorine atom.

Examples of the compound represented by the formula (II4-a) include 1,4-oxathian-2-ol described in WO2009/104726-A.

Examples of the compound represented by the formula (II4-b) include methacryloyl chloride and methacrylic anhydride.

The mole ratio of the structural units derived from the compounds represented by the formula (I) and the formula (II4) (the structural units derived from the compound represented by the formula (I): the structural units derived from the compound represented by the formula (II4)) is generally 1:0.2 to 1:10, preferably 1:0.4 to 1:8, and more preferably 1:0.5 to 1:5.

The total content of the structural units derived from the compounds represented by the formula (I) and the formula (II4) is generally 5 to 100 mol %, preferably 10 to 70 mol %, and more preferably 15 to 50 mol %, with respect to the total structural units constituting the resin.

<Acid Generator (Hereinafter May be Referred to as "Acid Generator (B)">

An acid generator (B) is classified into non-ionic-based or ionic-based acid generator.

Examples of the non-ionic-based acid generator include organic halogenated compounds; sulfonate esters such as 2-nitrobenzyl ester, aromatic sulfonate, oxime sulfonate, N-sulfonyl oxyimide, sulfonyl oxyketone and DNQ 4-sulfonate; sulfones such as disulfone, ketosulfone and sulfone diazomethane.

Examples of the ionic acid generator includes onium salts containing onium cation (such as diazonium salts, phosphonium salts, sulfonium salts, iodonium salts).

Examples of anion of onium salts include sulfonate anion, sulfonylimide anion and sulfonylmethyde anion.

For the acid generator (B), not only an acid generator (particularly photo-acid generator) which is used in the field of the resist but also a known compound, which generate an acid by irradiation (light), such as a photo-initiator of the light cation polymerization, a photo-achromatic agent such as coloring agent, or a photo-discoloring agent, and a mixture thereof can be used accordingly.

For example, compounds which generate an acid by radiation described in JP S63-26653-A, JP S55-164824-A, JP S62-69263-A, JP S63-146038-A, JP S63-163452-A, JP S62-153853-A, JP S63-146029-A, U.S. Pat. Nos. 3,779,778-B, 3,849,137-B, DE3,914,407-B and EP-126,712-A can be used.

A fluorine-containing acid generator is preferable for the acid generator (B), and a sulfonic acid salt represented by the formula (B1) is more preferable.

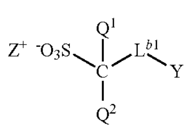

(B1)

wherein $Q^1$ and $Q^2$ independently represent a fluorine atom or a $C_1$ to $C_6$ perfluoroalkyl group;

$L^{b1}$ represents a single bond or an optionally substituted $C_1$ to $C_{17}$ divalent saturated hydrocarbon group.

Y represents a $C_1$ to $C_{36}$ aliphatic hydrocarbon group or a $C_3$ to $C_{36}$ saturated cyclic hydrocarbon group, and one or more —$CH_2$— contained in the cyclic hydrocarbon group may be replaced by —O— or —CO—.

$Z^+$ represents an organic counter cation.

Examples of the perfluoroalkyl group include perfluoromethyl, perfluoroethyl, perfluoropropyl, perfluoro-isopropyl, perfluorobutyl, perfluoro-sec-butyl, perfluoro-tert-butyl, perfluoropentyl and perfluorohexyl groups.

Among these, $Q^1$ and $Q^2$ independently are preferably perfluoromethyl or fluorine atom, and more preferably a fluorine atom.

Y may be, for example, a cyclic ether group (a group replaced —$CH_2$— by —O—), a saturated cyclic hydrocarbon group having oxo group (a group replaced —$CH_2$— by —CO—), a sultone ring group (a group replaced adjacent two —$CH_2$— by —O— and —$SO_2$—, respectively), or a lactone ring group (a group replaced adjacent two —$CH_2$— by —O— and —CO—, respectively)

Examples of the aliphatic hydrocarbon group of Y include a $C_1$ to $C_6$ alkyl group.

Examples of the saturated cyclic hydrocarbon group of Y, for example, include a group represented by the formula (Y1) to the formula (Y26).

(Y1)

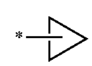

(Y2)

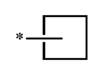

(Y3)

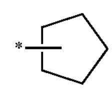

(Y4)

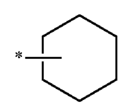

(Y5)

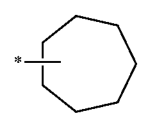

(Y6)

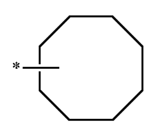

(Y7)

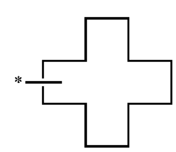

(Y8)

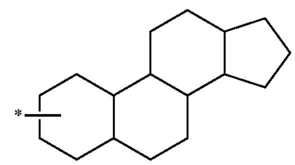

(Y9)

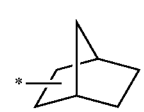

-continued (Y10)

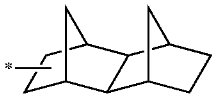

(Y11)

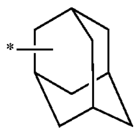

(Y12)

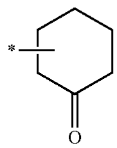

(Y13)

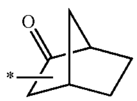

(Y14)

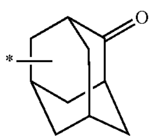

(Y15)

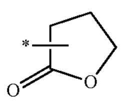

(Y16)

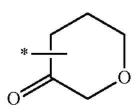

(Y17)

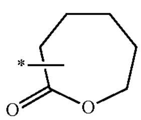

(Y18)

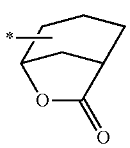

(Y19)

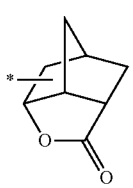

(Y20)

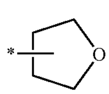

(Y21)

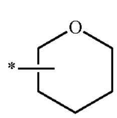

-continued (Y22)

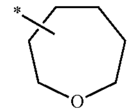

(Y23)

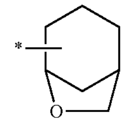

(Y24)

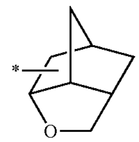

(Y25)

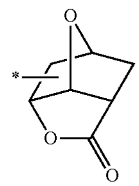

(Y26)

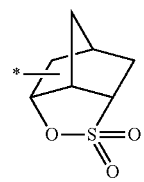

Among these, the saturated cyclic group is preferably groups represented by the formula (Y1) to the formula (Y19), more preferably group represented by the formula (Y11), (Y14), (Y15) or (Y19), and still more preferably group represented by the formula (Y11) or (Y14).

Y may have a substituent.

Examples of the substituent of Y include a halogen atom (other than fluorine atom), a hydroxy group, an oxo group, a $C_1$ to $C_{12}$ aliphatic hydrocarbon group, a hydroxy group-containing $C_1$ to $C_{12}$ aliphatic hydrocarbon group, a $C_3$ to $C_{16}$ saturated cyclic hydrocarbon group, a $C_1$ to $C_{12}$ alkoxy group, a $C_6$ to $C_{18}$ aromatic hydrocarbon group, a $C_7$ to $C_{21}$ aralkyl group, a $C_2$ to $C_4$ acyl group, a glycidyloxy group or a $—(CH_2)_{j2}—O—CO—R^{b1}$ group, wherein $R^{b1}$ represents a $C_1$ to $C_{16}$ aliphatic hydrocarbon group, a $C_3$ to $C_{16}$ saturated cyclic hydrocarbon group or a $C_6$ to $C_{18}$ aromatic hydrocarbon group, j2 represents an integer of 0 to 4.

Examples of the hydroxy group-containing aliphatic hydrocarbon group include hydroxymethyl group.

Examples of the aralkyl group include, for example, benzyl, phenethyl, phenylpropyl, trityl, naphthylmethyl and naphthylethyl groups.

A plurality of substituents may be the same or different to each other.

The aliphatic hydrocarbon group, the saturated cyclic hydrocarbon group, the aromatic hydrocarbon group and the aralkyl group may have further substituent. Examples of the substituent include, for example, a $C_1$ to $C_6$ alkyl group, a halogen atom, a hydroxy group and an oxo group.

Examples of Y having an aliphatic hydrocarbon group include the groups below.

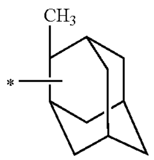
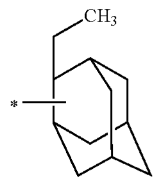
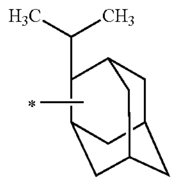

Examples of Y having a hydroxy group or a hydroxy group-containing aliphatic hydrocarbon group include the groups below.

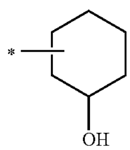
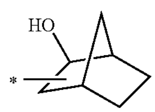
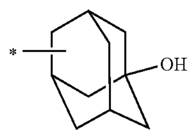
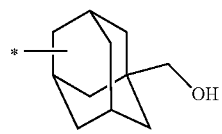

Examples of Y having an aromatic hydrocarbon group include the groups below.

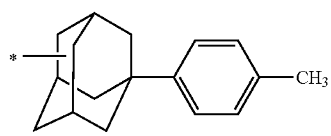
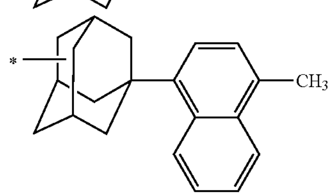

Examples of Y having a —$(CH_2)_{j2}$—O—CO—$R^{b1}$ group include the group below.

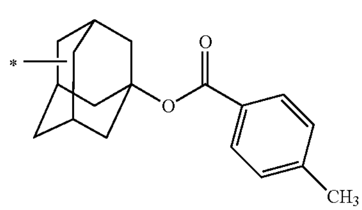

Y is preferably an adamantyl group which is optionally substituted, for example, a oxo group, and more preferably an adamantyl group and an oxoadamantyl group.

Examples of the a divalent saturated hydrocarbon group include;

a linear chain alkanediyl group such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,1'-diyl, dodecane-1,12-diyl, tridecane-1,13-diyl, tetradecane-1,14-diyl, pentadecane-1,15-diyl, hexadecane-1,16-diyl and heptadecane-1,17-diyl groups;

a branched alkanediyl group such as a group in which a linear chain alkanediyl group is bonded with a side chain of a $C_1$ to $C_4$ alkyl group (such as methyl, ethyl, propyl, isopropyl, butyl, sec-butyl, tert-butyl);

a cyclic divalent saturated hydrocarbon group such as a cycloalkanediyl group (for example, cyclohexanediyl group), a divalent bridged cyclic hydrocarbon group (for example, adamantinediyl group), and a combination of two or more groups.

These divalent saturated hydrocarbon group may be combined two or more.

Examples of the substituent of the divalent saturated hydrocarbon group of $L^{b1}$ include, for example, a halogen atom, a hydroxy group, a carboxy group, a $C_6$ to $C_{18}$ aromatic hydrocarbon group, a $C_7$ to $C_{21}$ aralkyl group, a $C_2$ to $C_4$ acyl group or a glycidyloxy group.

Examples of $L^{b1}$ in which one —$CH_2$— contained in the saturated hydrocarbon group is replaced by —O— or —CO— include, for example, groups represented by the formula (b1-1) to the formula (b1-6). Among these, the groups represented by the formula (b1-1) to the formula (b1-4) are preferable, and the group represented by the formula (b1-1) or the formula (b1-2) is more preferable.

In the formula (b1-1) to the formula (b1-6), the group is represented so as to correspond with two sides of the formula (B 1), that is, the left side of the group bonds to $C(Q^1)(Q^2)$- and the right side of the group bonds to —Y (examples of the formula (b1-1) to the formula (b1-6) are the same as above).

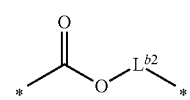
(b1-1)

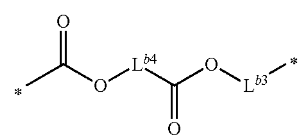
(b1-2)

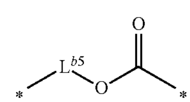
(b1-3)

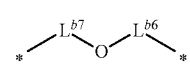
(b1-4)

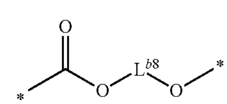
(b1-5)

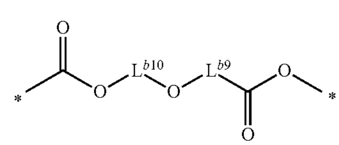
(b1-6)

wherein $L^{b2}$ represents a single bond or a $C_1$ to $C_{15}$ saturated hydrocarbon group;

$L^{b3}$ represents a single bond or a $C_1$ to $C_{12}$ saturated hydrocarbon group;

$L^{b4}$ represents a $C_1$ to $C_{13}$ saturated hydrocarbon group;

$L^{b5}$ represents a $C_1$ to $C_{15}$ saturated hydrocarbon group;

$L^{b6}$ and $L^{b7}$ independently represent a $C_1$ to $C_{15}$ saturated hydrocarbon group;

$L^{b8}$ represents a $C_1$ to $C_{14}$ saturated hydrocarbon group;

$L^{b9}$ and $L^{b10}$ independently represent a $C_1$ to $C_{11}$ saturated hydrocarbon group.

The saturated hydrocarbon group is preferably a liner or branched alkylene group, and may be mixed of a liner, a branched or a cyclic saturated hydrocarbon group.

Among these, the divalent group represented by the formula (b1-1) is preferable, and the divalent group represented by the formula (b1-1) in which $L^{b2}$ represents a single bond or a $—CH_2—$ is more preferable.

Examples of the divalent group represented by the formula (b1-1) include groups below.

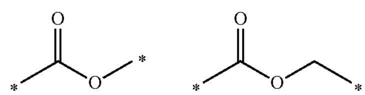

Examples of the divalent group represented by the formula (b1-2) include groups below.

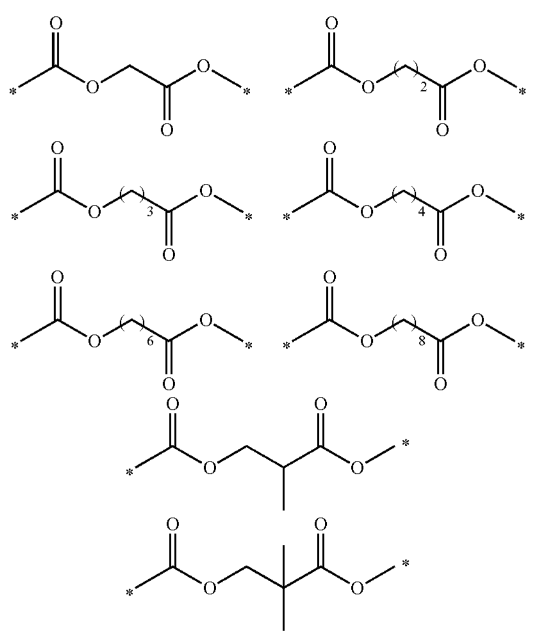

Examples of the divalent group represented by the formula (b1-3) include groups below.

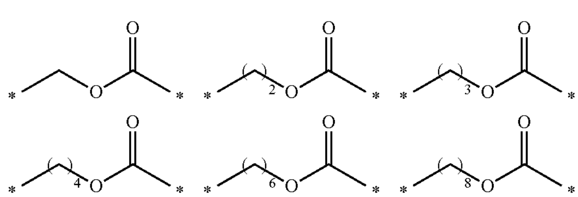

Examples of the divalent group represented by the formula (b1-4) include a group below.

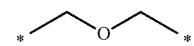

Examples of the divalent group represented by the formula (b1-5) include groups below.

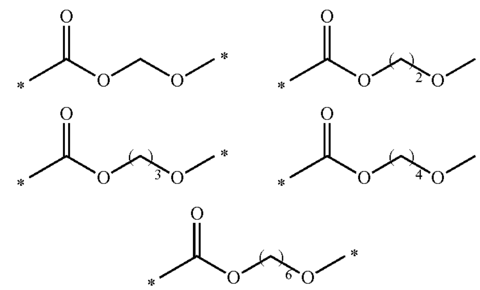

Examples of the divalent group represented by the formula (b1-6) include groups below.

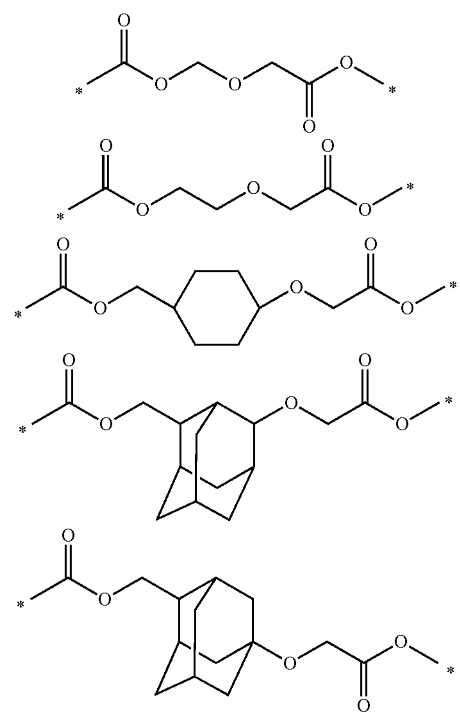

The sulfonate anion is preferably a divalent group represented by the formula (b1-1), and more preferably groups represented by the formula (b1-1-1) to the formula (b1-1-9)

(b1-1-1)

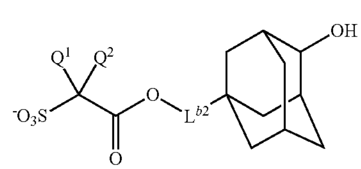

-continued (b1-1-2)

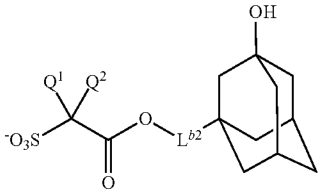

(b1-1-3)

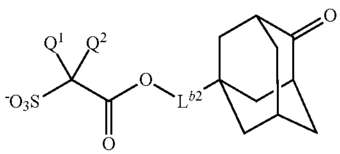

(b1-1-4)

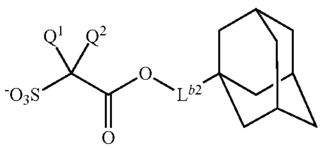

(b1-1-5)

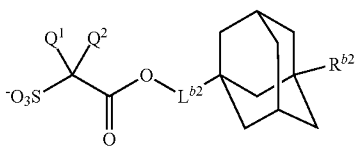

(b1-1-6)

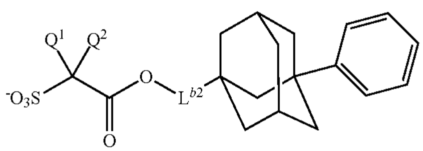

(b1-1-7)

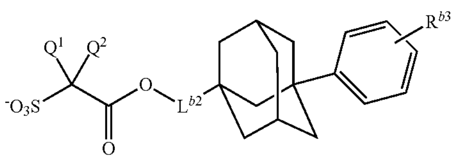

(b1-1-8)

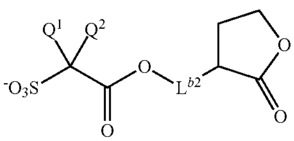

(b1-1-9)

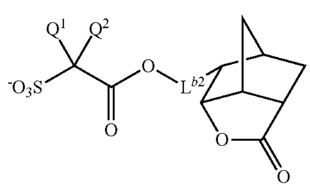

In the formula (b1-1-1) to the formula (b 1-1-9), $Q^1$, $Q^2$ and $L^{b2}$ represents the same meaning as defined above. $R^{b2}$ and $R^{b3}$ independently represent a $C_1$ to $C_4$ aliphatic hydrocarbon group (preferably methyl group).

Specific examples of the sulfonate anion are shown.

Examples of the sulfonate anion having a non-substituted Y and a divalent group represented by the formula (b1-1), or the sulfonate anion having Y substituted with an aliphatic hydrocarbon group and a divalent group represented by the formula (b1-1) include anions below.

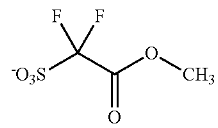

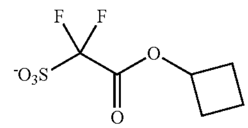

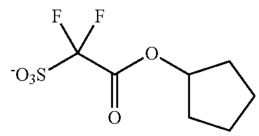

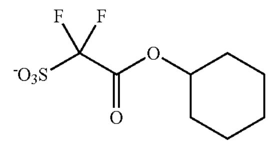

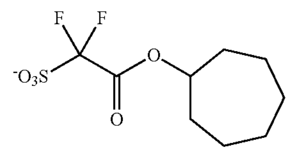

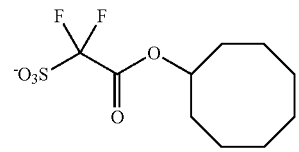

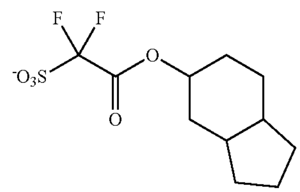

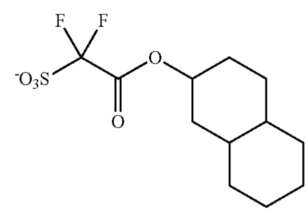

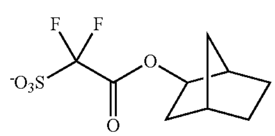

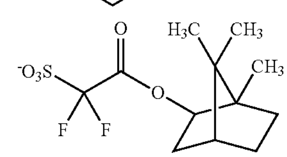

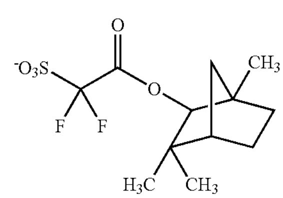

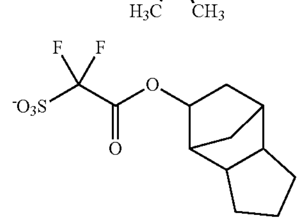

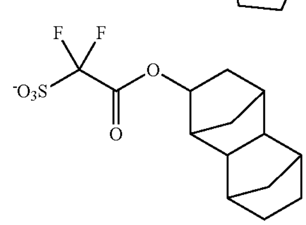

-continued
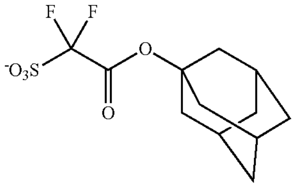
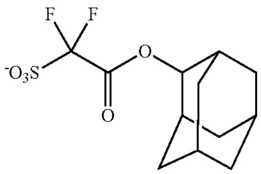
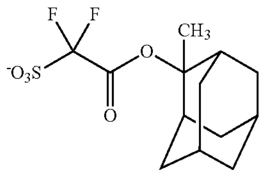
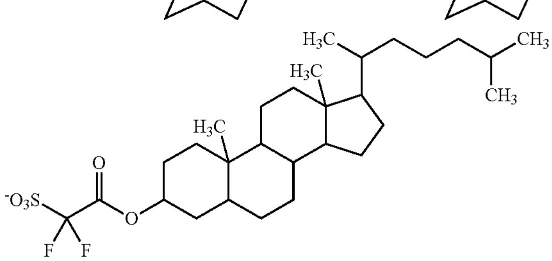
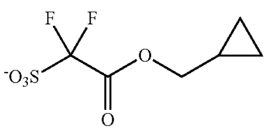
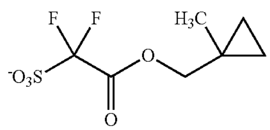
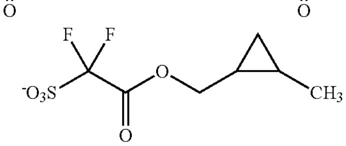
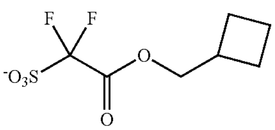
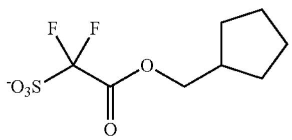
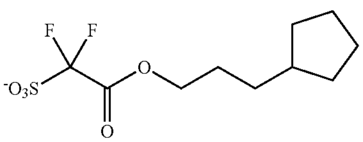
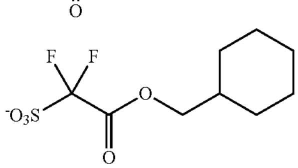
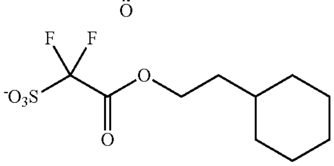
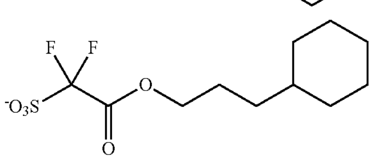
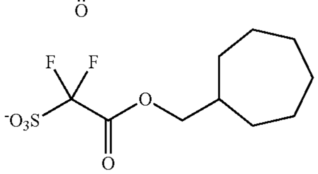
-continued
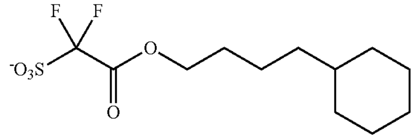
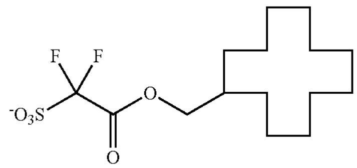
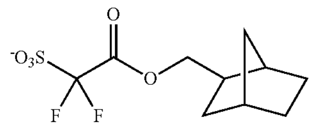
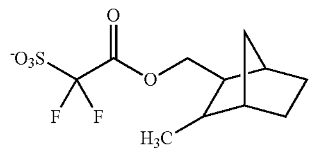
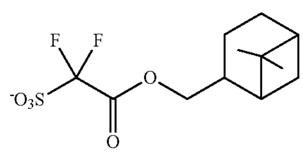
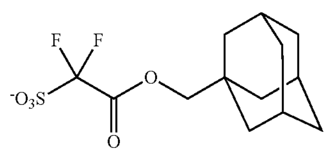
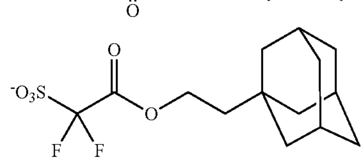
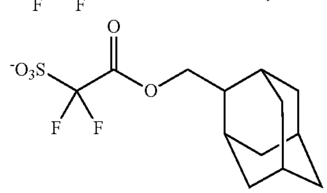
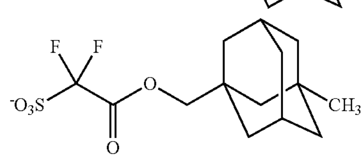
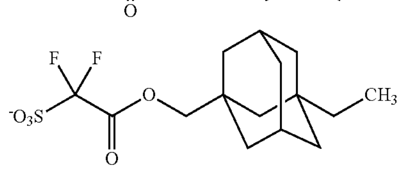
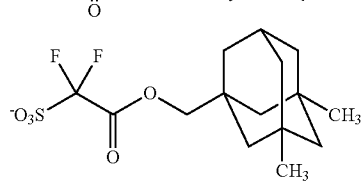

-continued
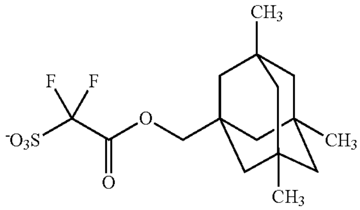
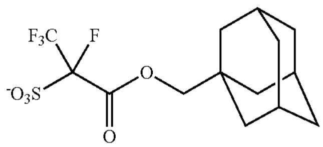
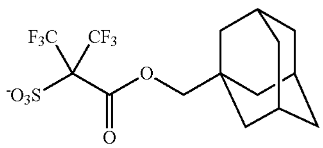
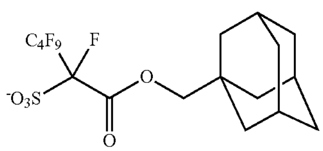
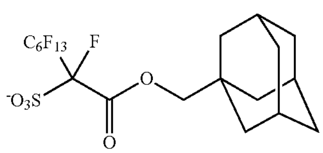
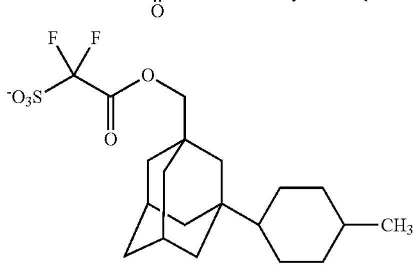
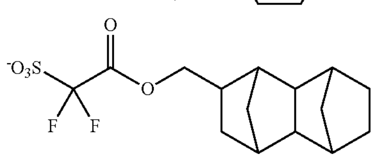
Examples of the sulfonate anion having Y substituted with a —$(CH_2)_{j2}$—CO—O—$R^{b1}$ group, and a divalent group represented by the formula (b1-1) include anions below.
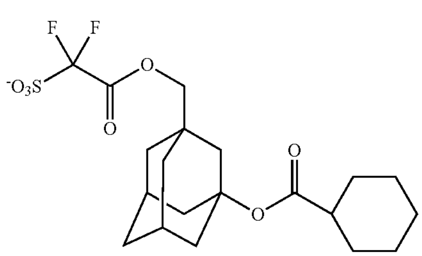
-continued
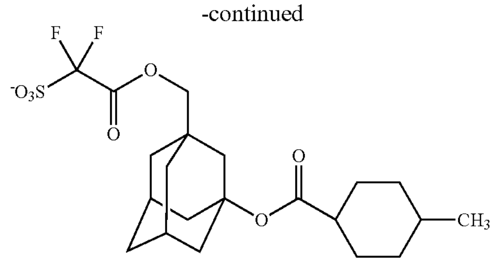
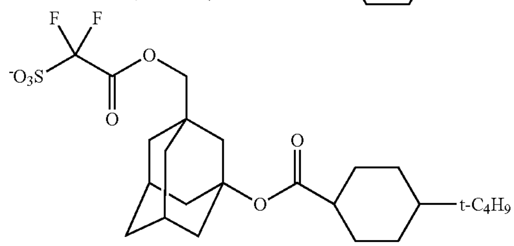
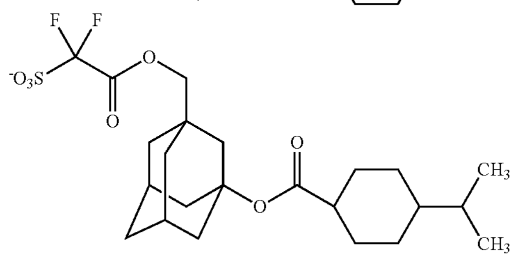
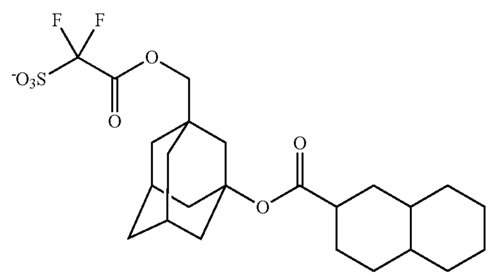
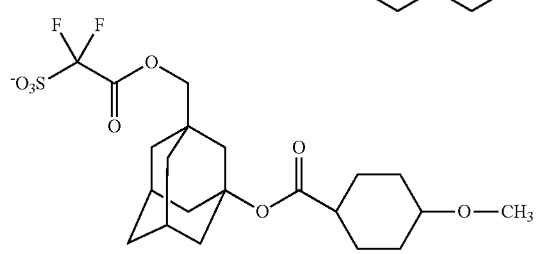
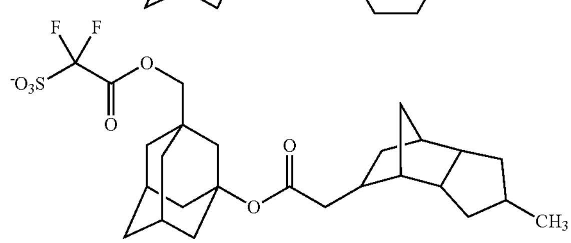
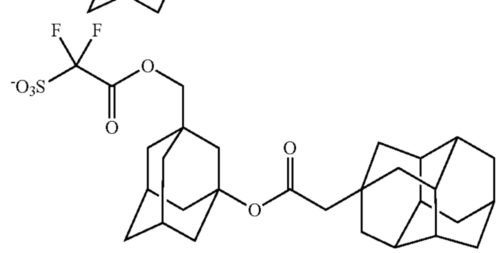

Examples of the sulfonate anion having Y substituted with a hydroxy group or a hydroxy group-containing aliphatic hydrocarbon group, and a divalent group represented by the formula (b1-1) include anions below.
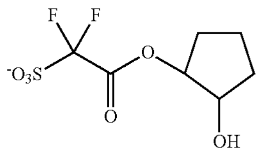
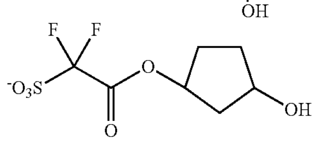
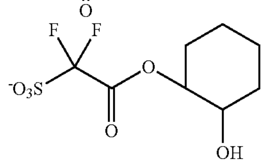
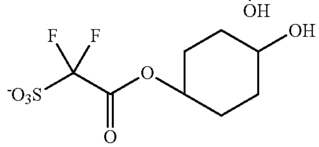
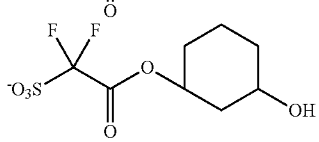
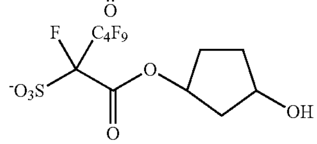
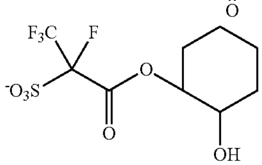
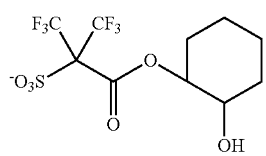
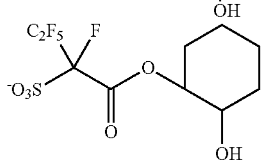
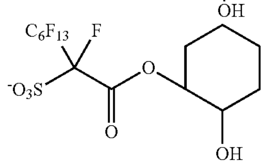
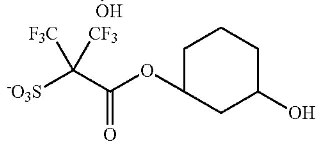
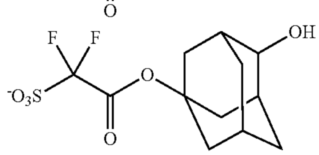
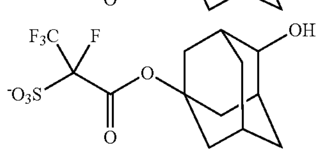
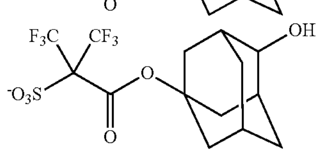
-continued
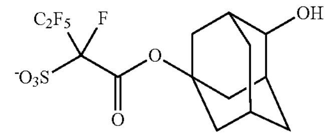
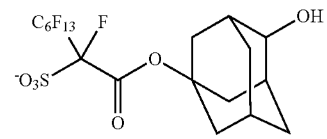
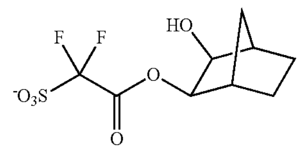
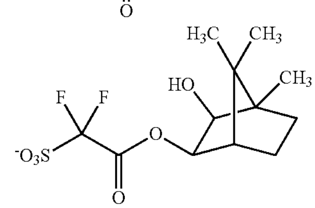
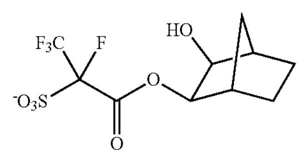
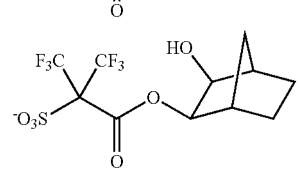
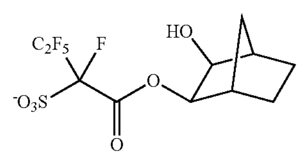
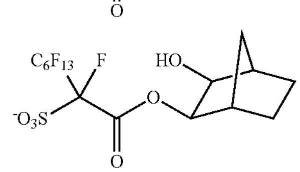
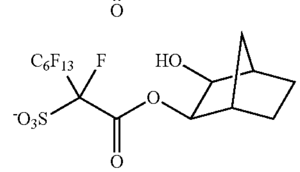
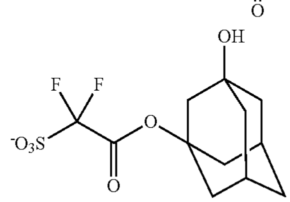
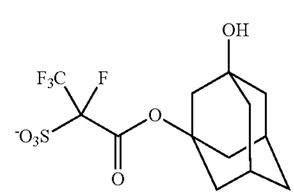
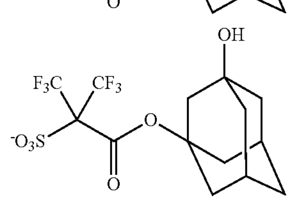
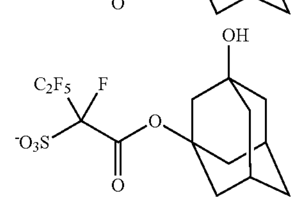

-continued
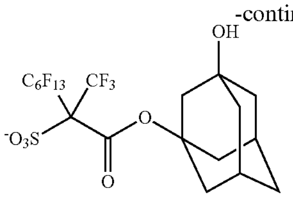
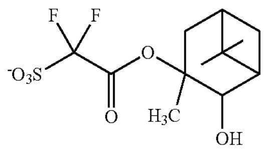
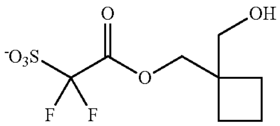
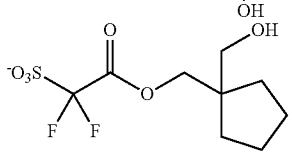
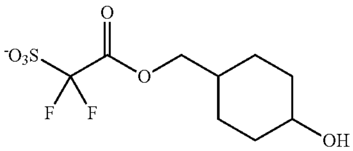
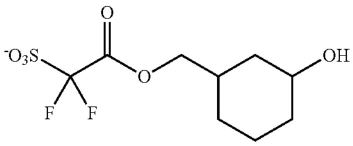
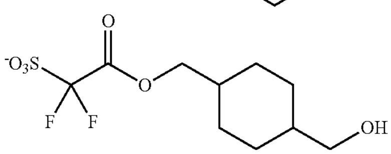
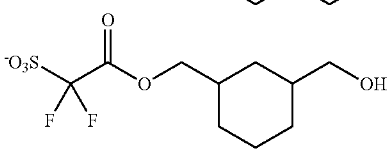
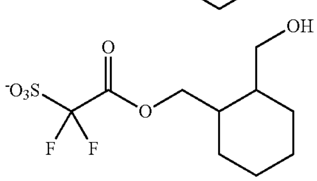
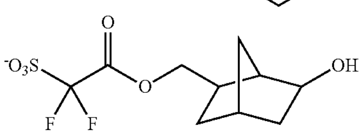
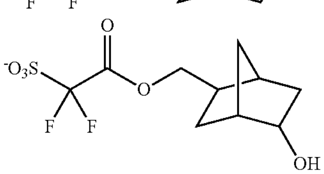
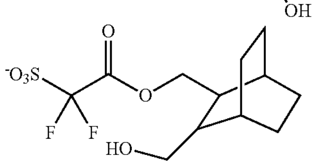
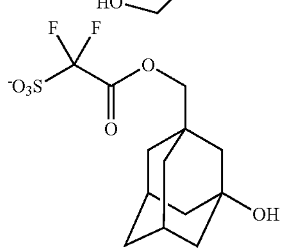
-continued
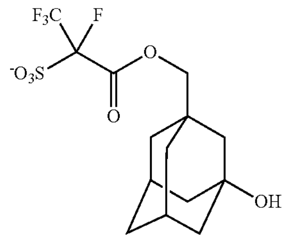
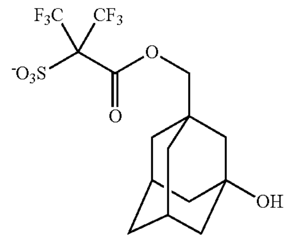
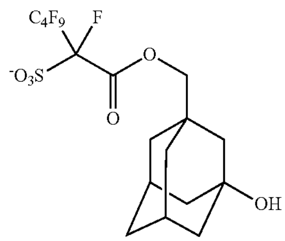
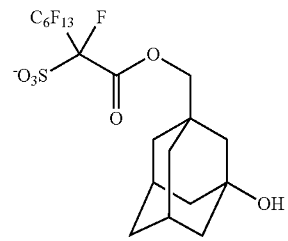
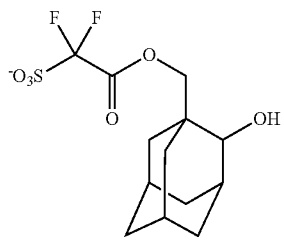
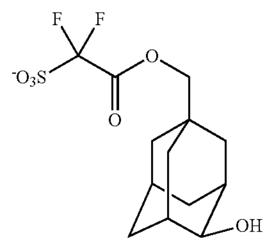
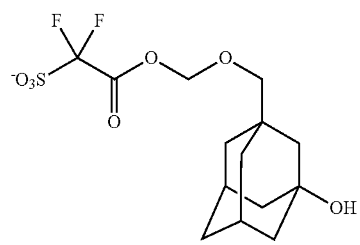
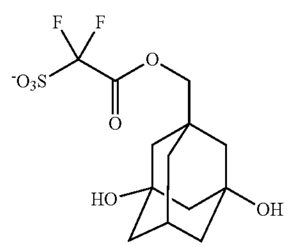
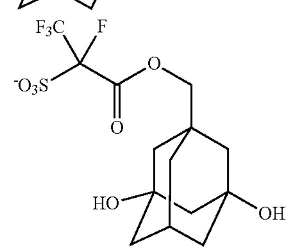
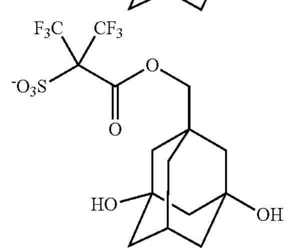
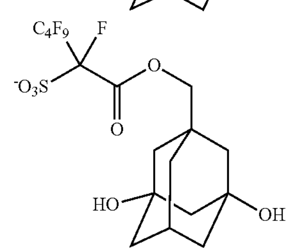
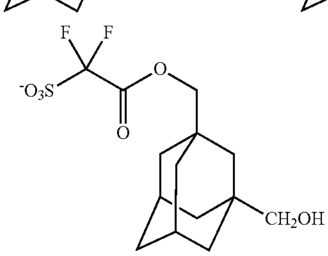

-continued
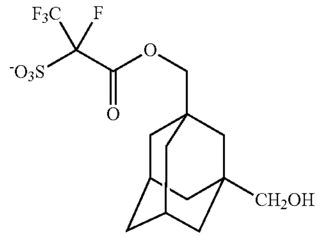
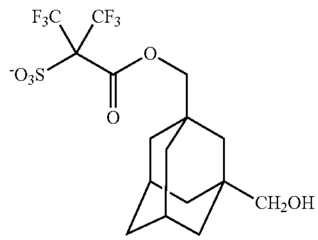
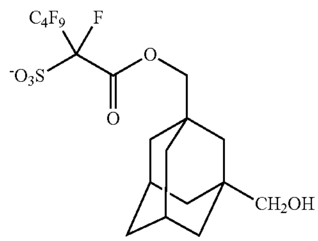
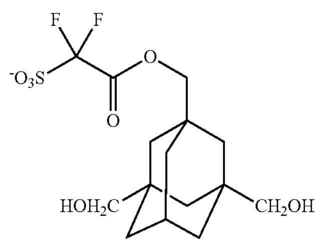
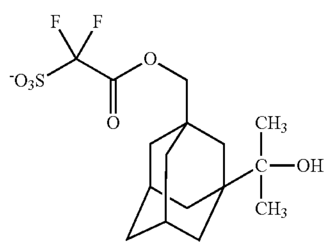
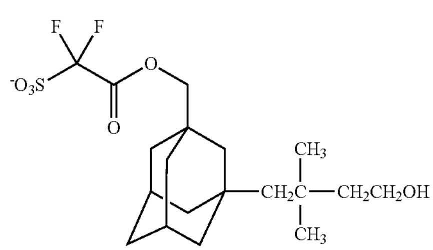
Examples of the sulfonate anion having Y substituted with an aromatic hydrocarbon group or a aralkyl group, and a divalent group represented by the formula (b1-1) include anions below.
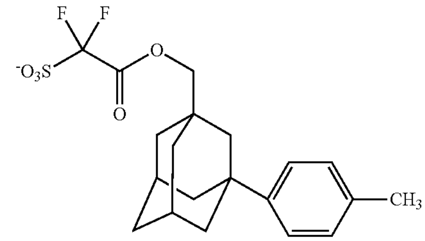
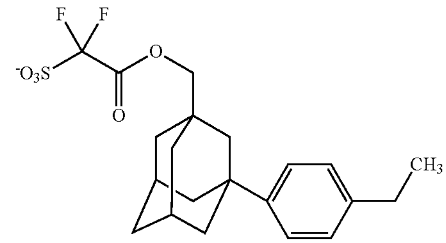
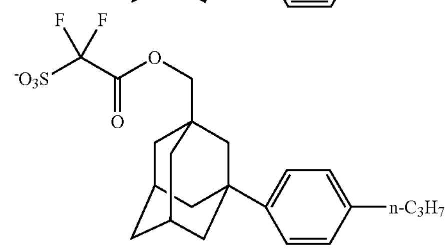
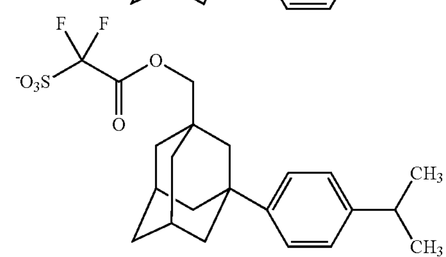
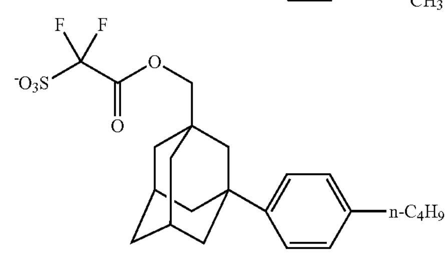
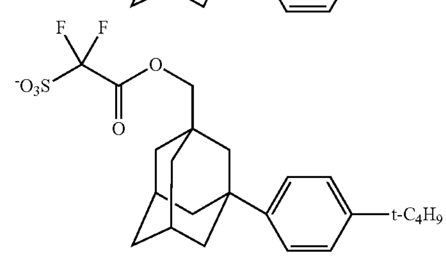
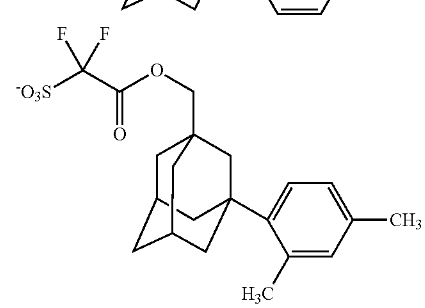

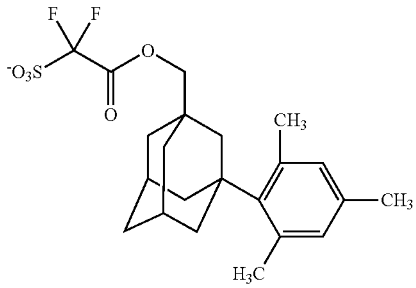
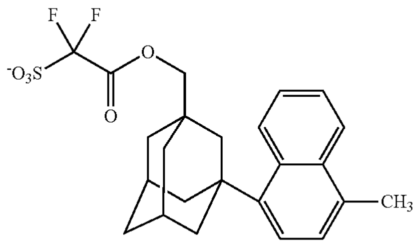
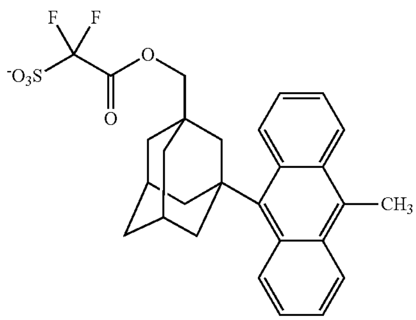
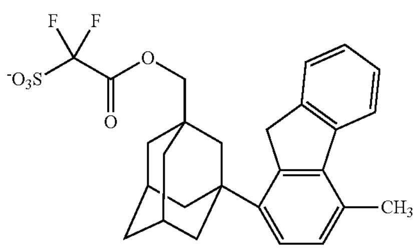
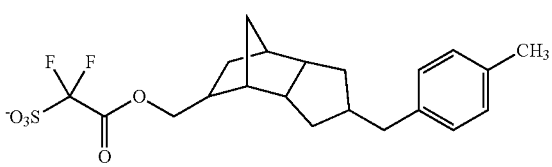
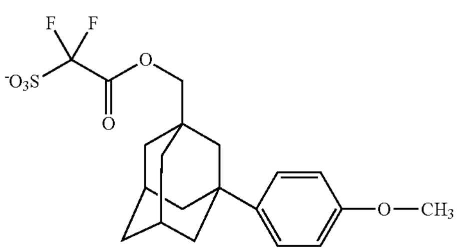
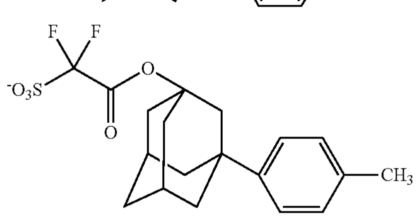
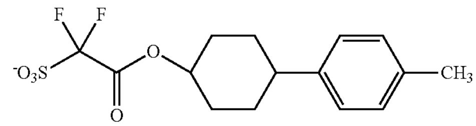
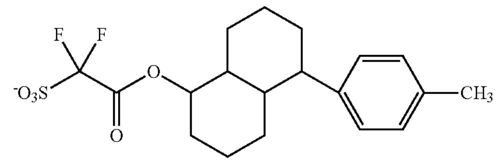
Examples of the sulfonate anion having Y which is cyclic ether, and a divalent group represented by the formula (b1-1) include anion below.
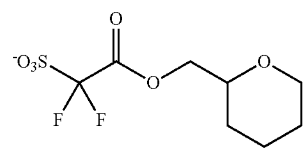
Examples of the sulfonate anion having Y which is a lactone ring, and a divalent group represented by the formula (b1-1) include anions below.
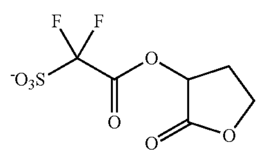
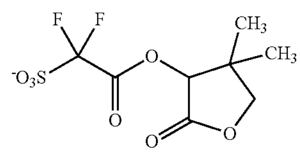
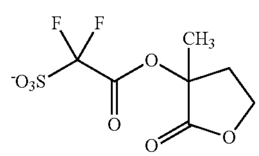
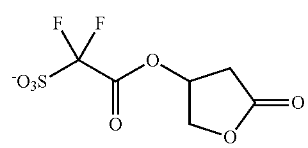
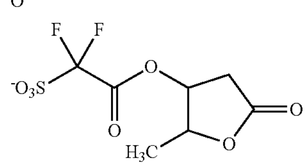
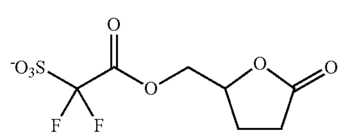
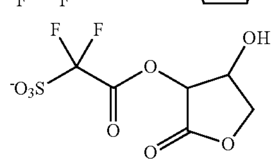
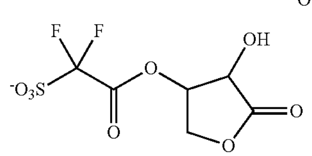
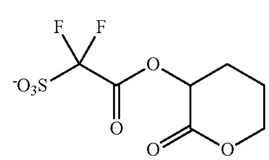

-continued
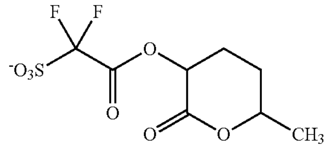
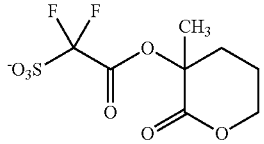
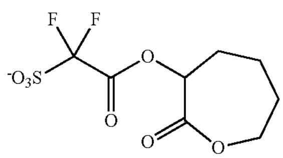
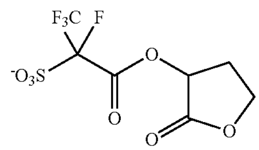
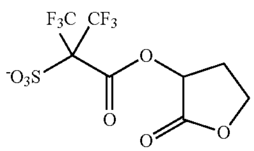
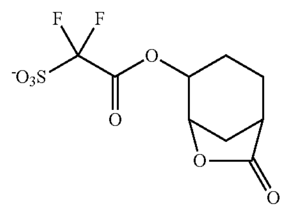
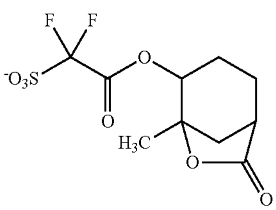
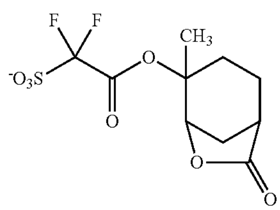
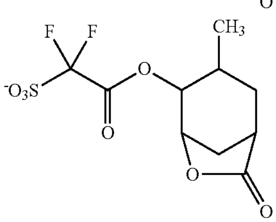
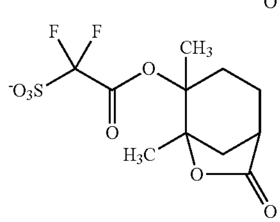
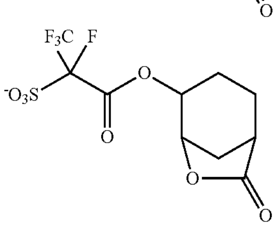
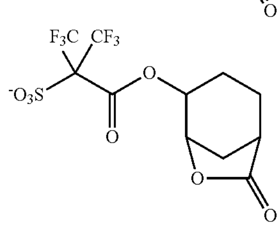
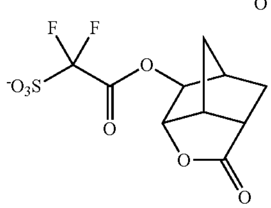
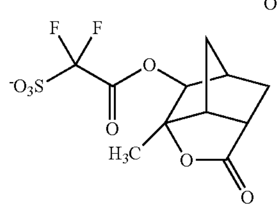
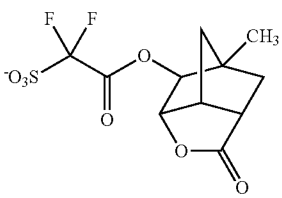
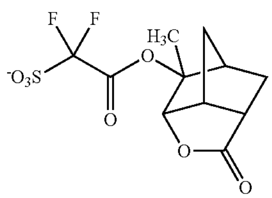
-continued
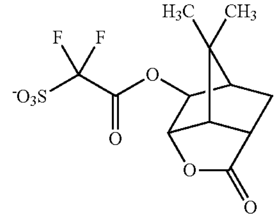
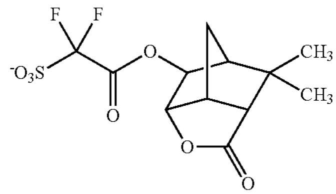
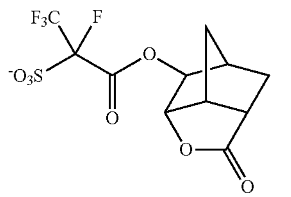
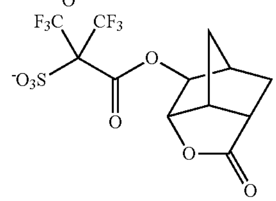
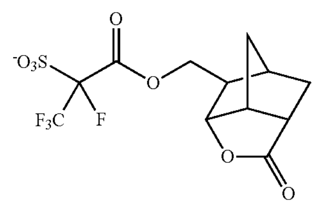
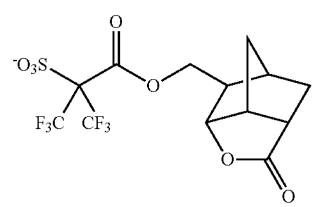
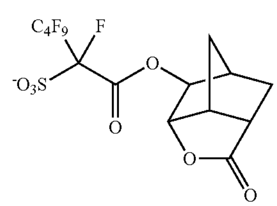
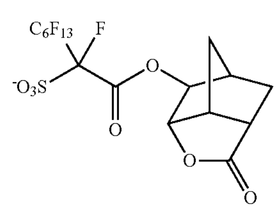
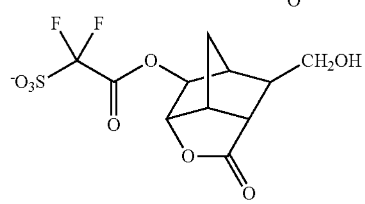

-continued

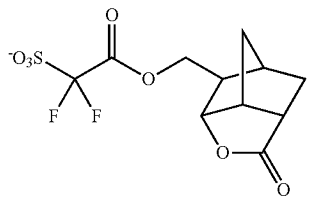

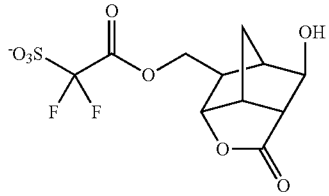

Examples of the sulfonate anion having Y containing an oxo group, and a divalent group represented by the formula (b1-1) include anions below.

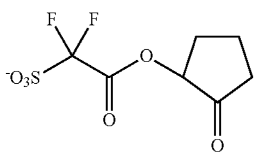

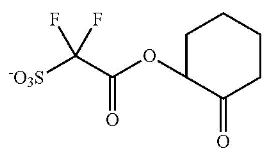

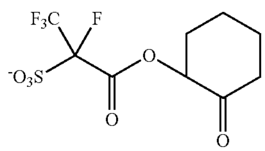

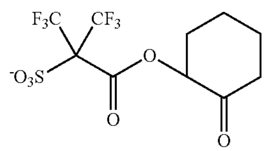

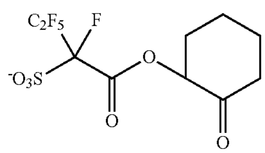

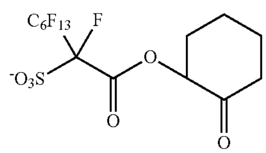

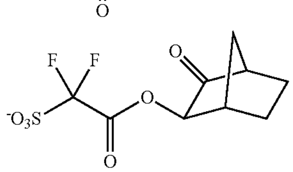

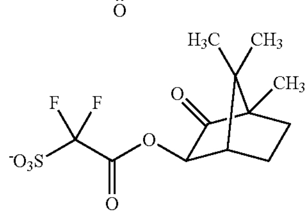

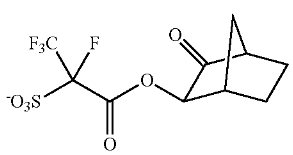

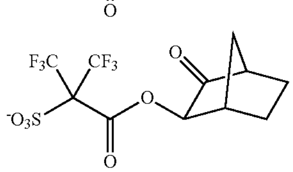

-continued

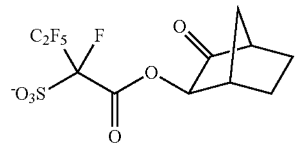

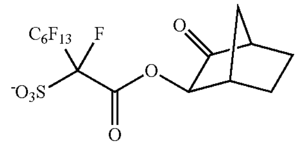

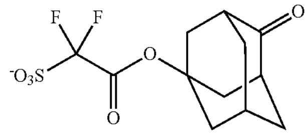

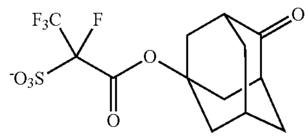

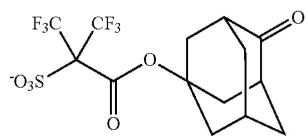

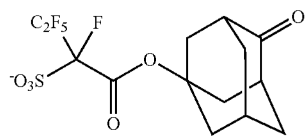

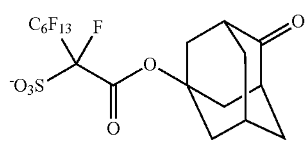

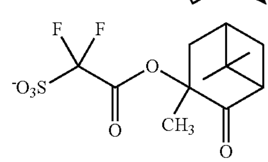

Examples of the sulfonate anion having a non-substituted Y, and a divalent group represented by the formula (b1-2), or the sulfonate anion having Y substituted with an aliphatic hydrocarbon group, and a divalent group represented by the formula (b1-2) include anions below.

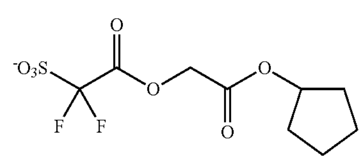

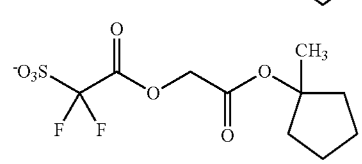

-continued
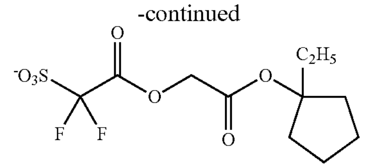
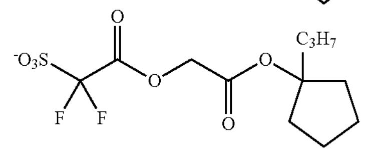
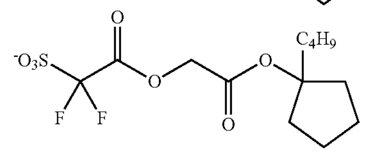
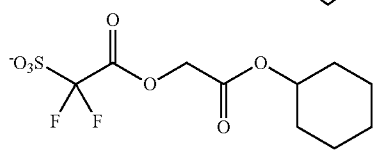
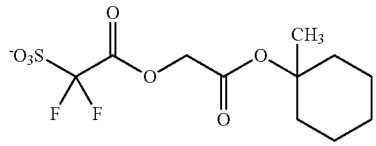
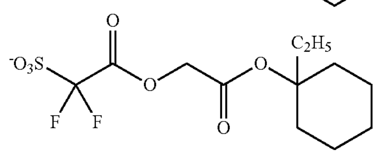
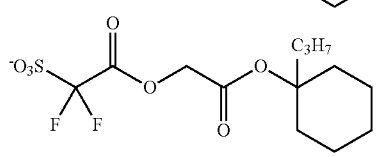
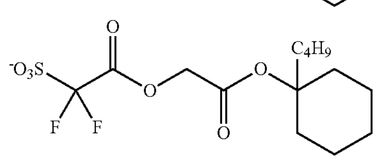
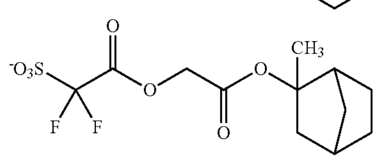
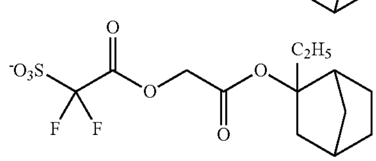
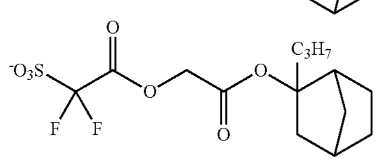
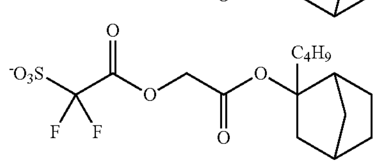
-continued
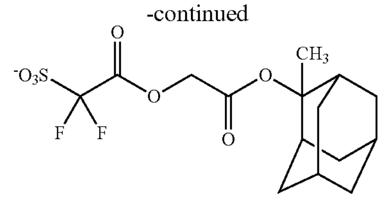
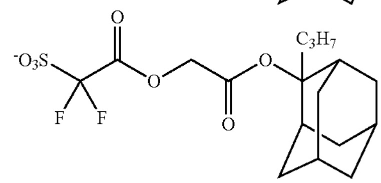
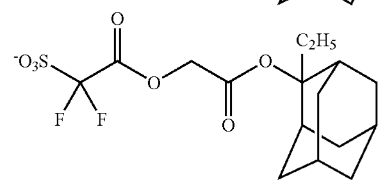
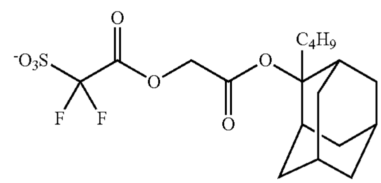
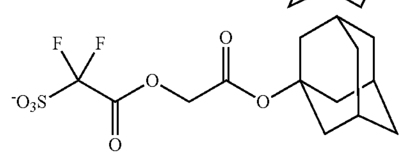
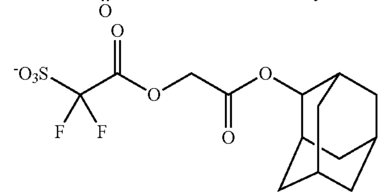
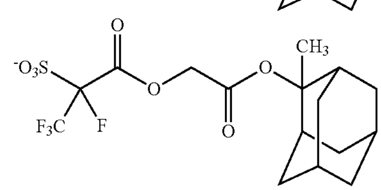
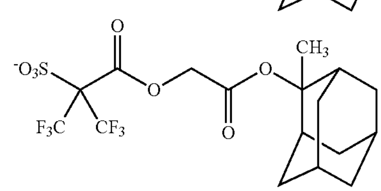
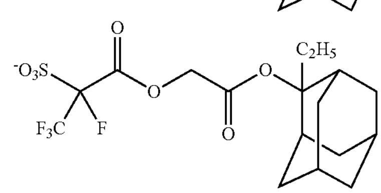
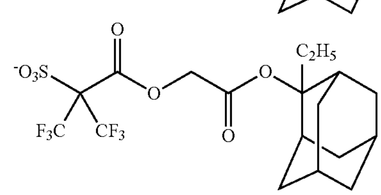

-continued
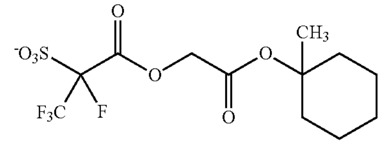
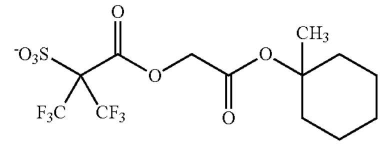
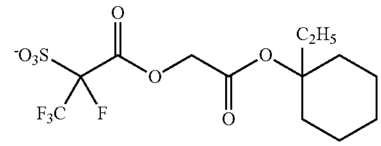
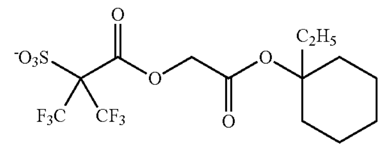
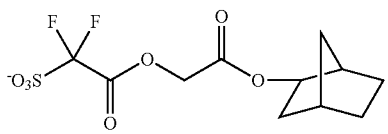
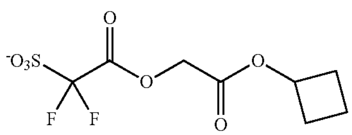
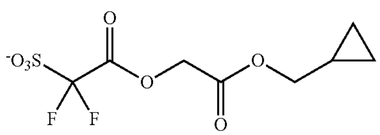
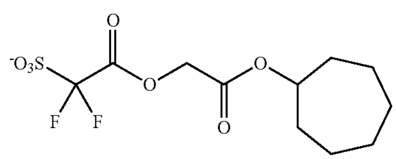
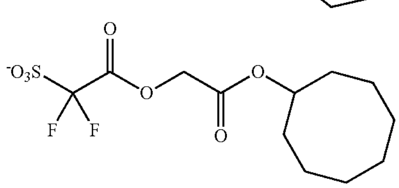
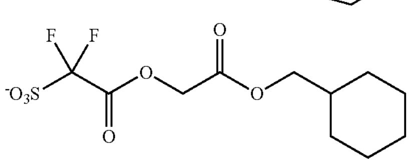
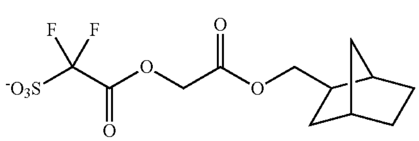
-continued
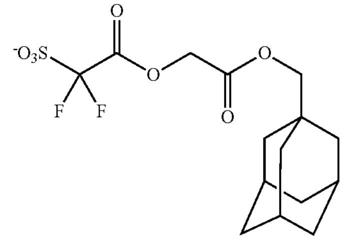
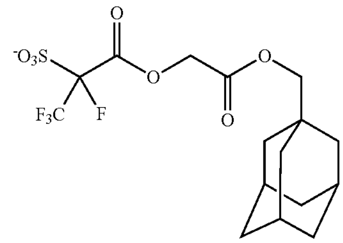
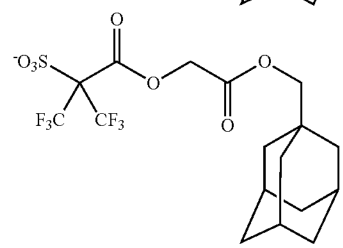
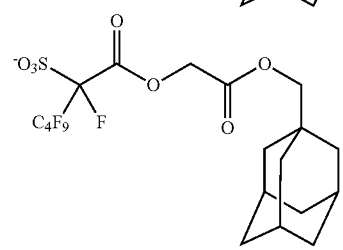
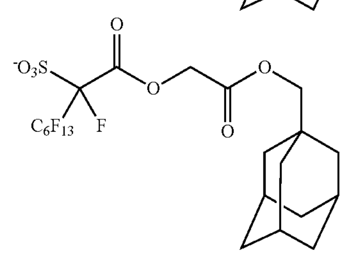
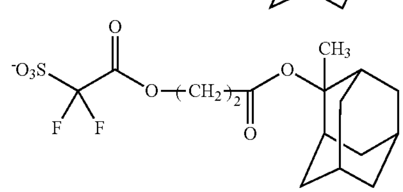
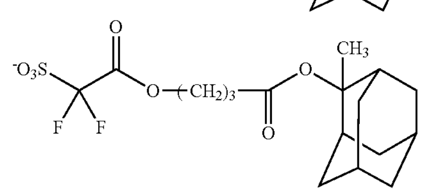
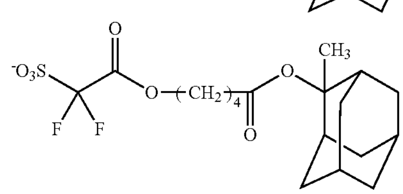

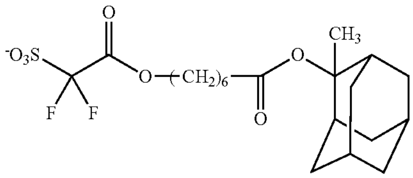
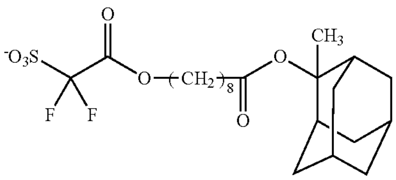
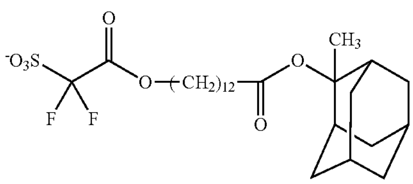
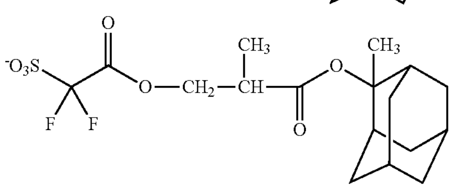
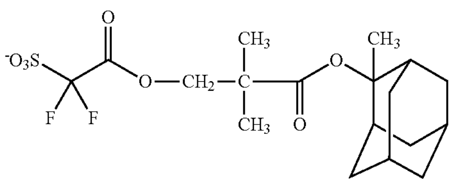
Examples of the sulfonate anion having Y substituted with a —$(CH_2)_{j2}$—O—CO—O—$R^{b1}$ group, and a divalent group represented by the formula (b1-2) include anion below.
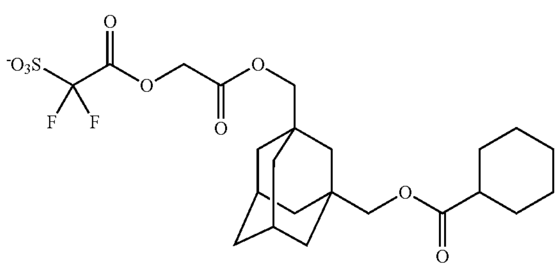
Examples of the sulfonate anion having Y substituted with a hydroxy group or a hydroxy group-containing aliphatic hydrocarbon group, and a divalent group represented by the formula (b1-2) include anions below.
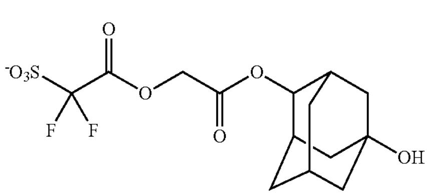
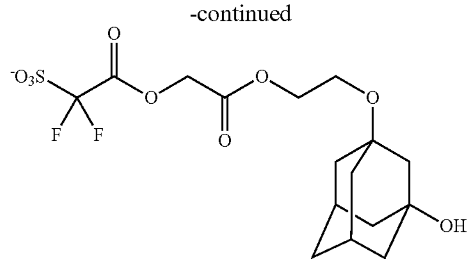
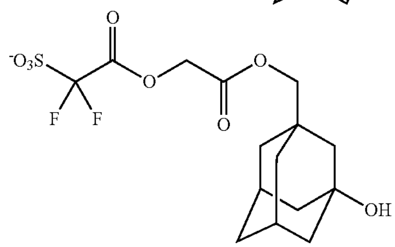
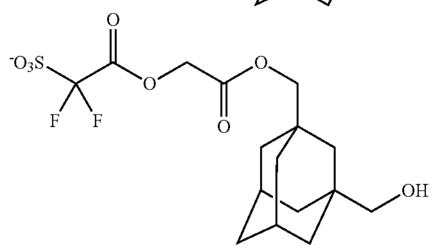
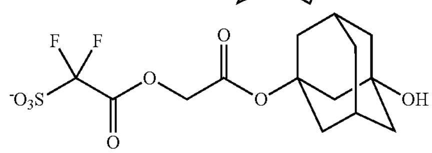
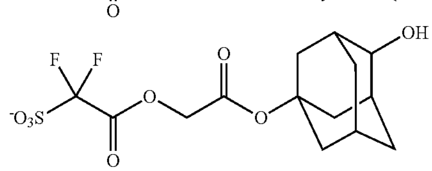
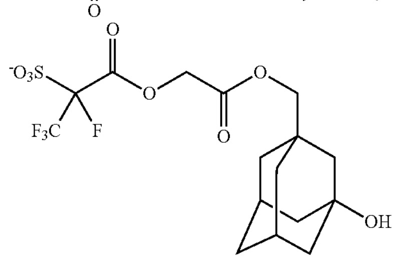
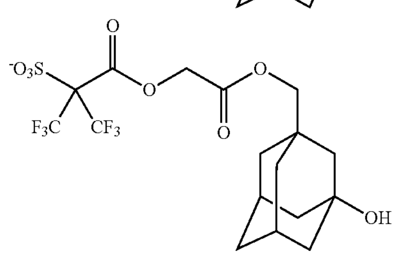
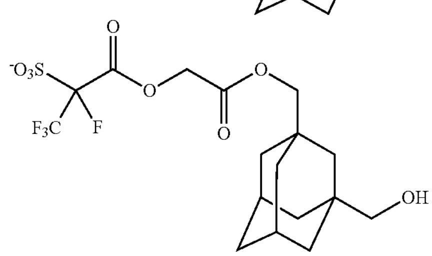

-continued
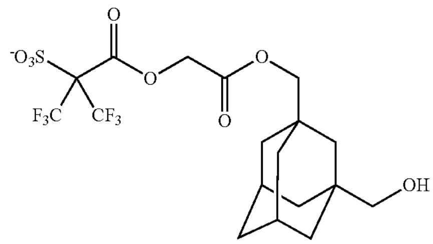
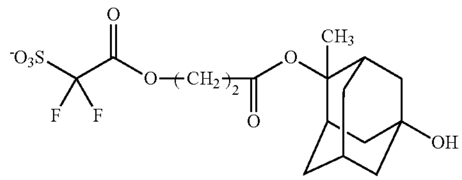
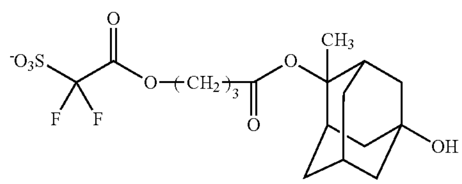
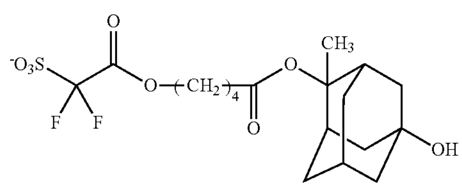
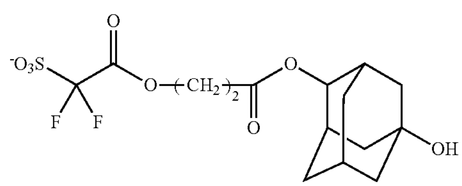
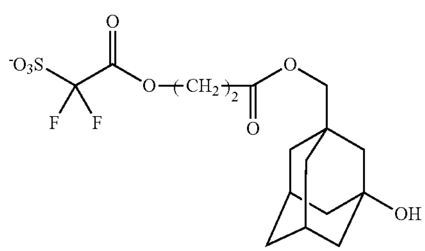
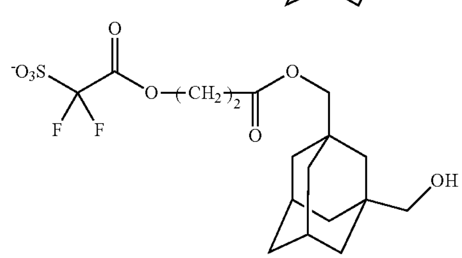
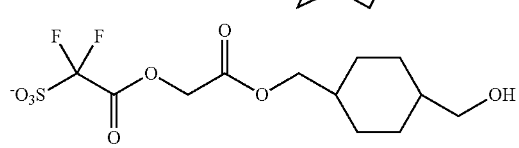
Examples of the sulfonate anion having Y which is cyclic ether, and a divalent group represented by the formula (b1-2) include anion below.
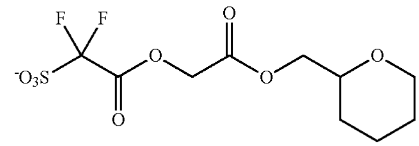
Examples of the sulfonate anion having Y which is lactone ring, and a divalent group represented by the formula (b1-2) include anions below.
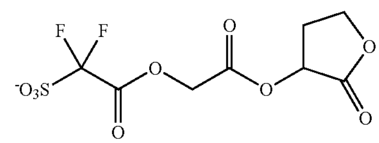
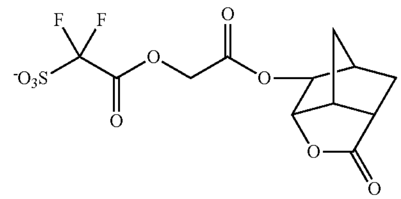
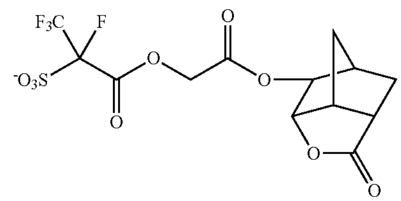
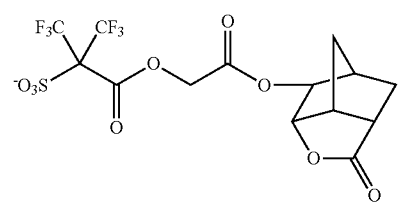
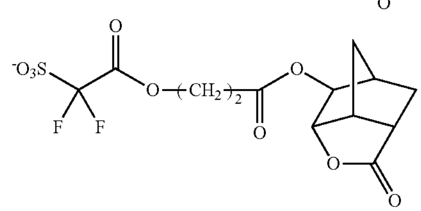
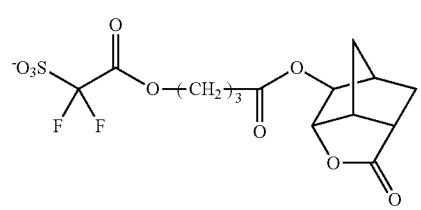
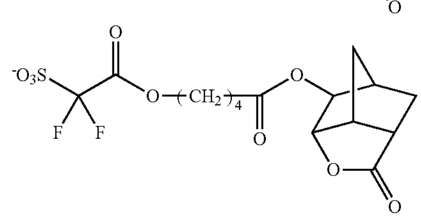

-continued
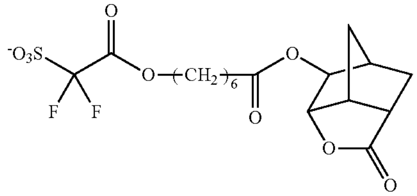
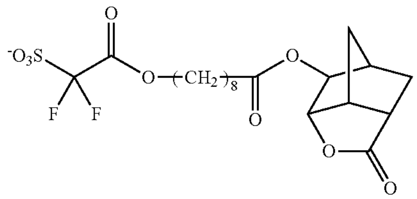
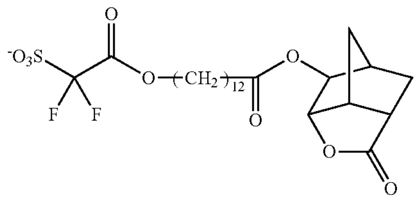
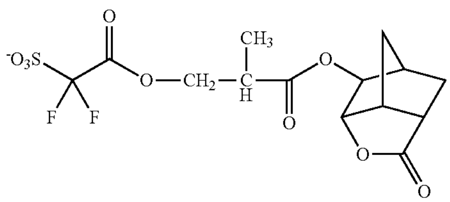
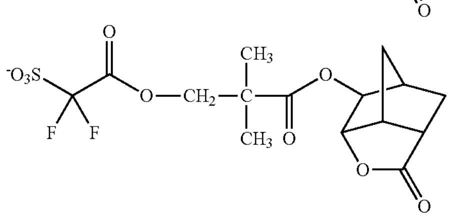
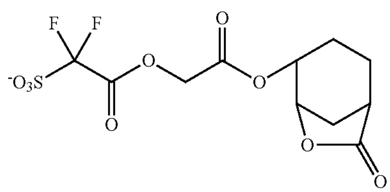
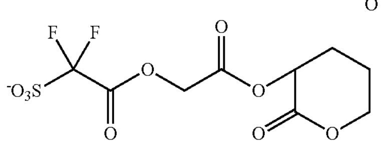
Examples of the sulfonate anion having Y containing an oxo group, and a divalent group represented by the formula (b1-2) include anions below.
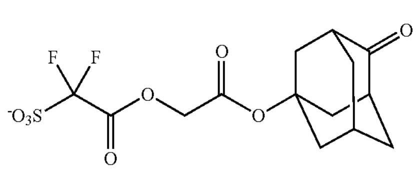
-continued
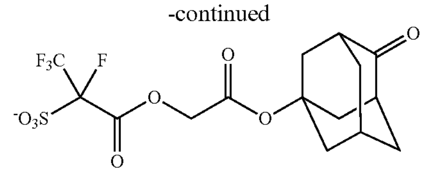
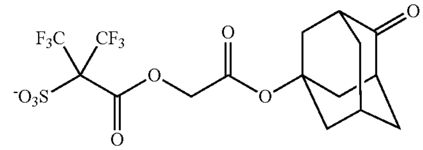
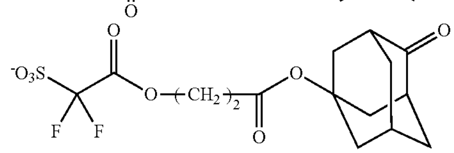
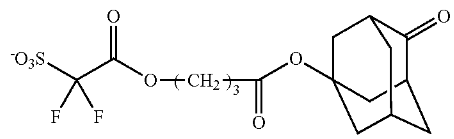
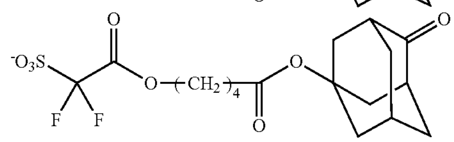
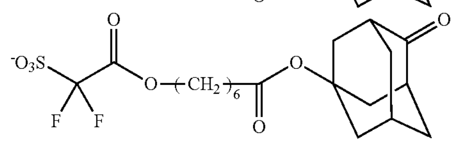
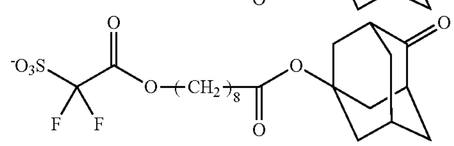
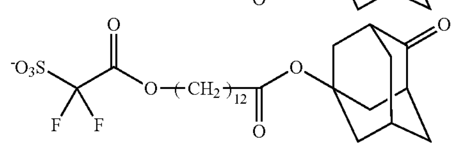
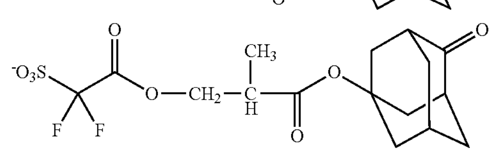
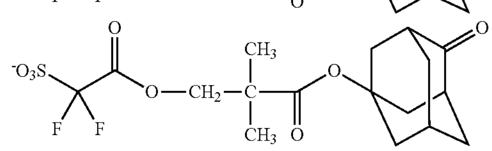
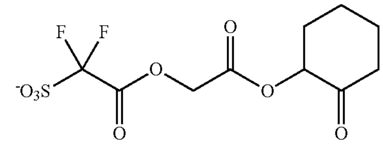
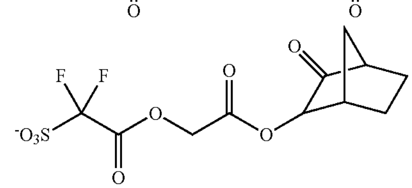

Examples of the sulfonate anion having Y substituted with an aromatic hydrocarbon group, and a divalent group represented by the formula (b1-2) include anions below.

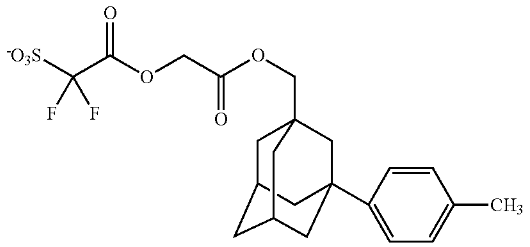

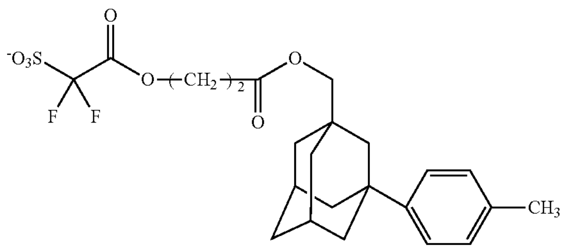

Examples of the sulfonate anion having a non-substituted Y, and a divalent group represented by the formula (b1-3), or the sulfonate anion having Y substituted with an aliphatic hydrocarbon group, and a divalent group represented by the formula (b1-3) include anions below.

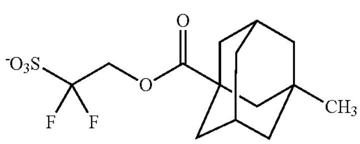

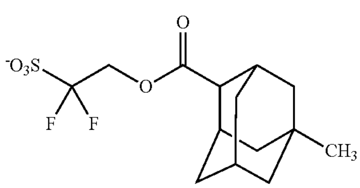

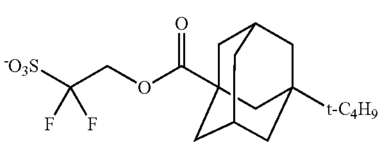

Examples of the sulfonate anion having Y substituted with an alkoxy group, and a divalent group represented by the formula (b1-3) include anions below.

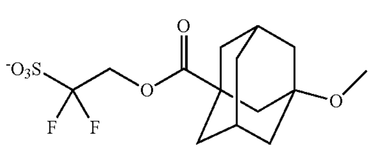

-continued

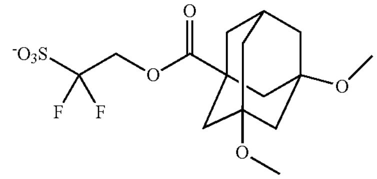

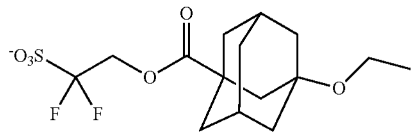

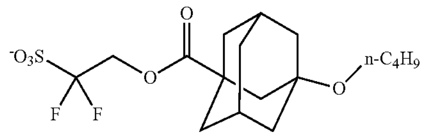

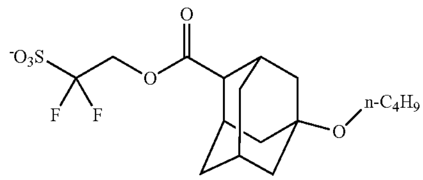

Examples of the sulfonate anion having a Y substituted with a hydroxy group or a hydroxy group-containing aliphatic hydrocarbon group, and a divalent group represented by the formula (b1-3) include anions below.

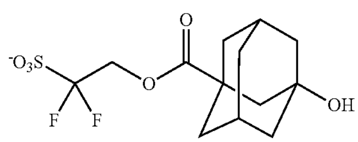

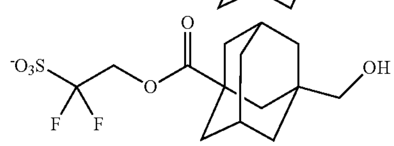

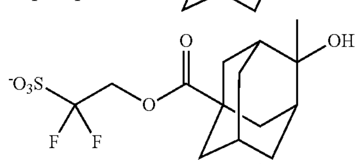

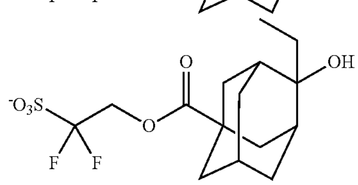

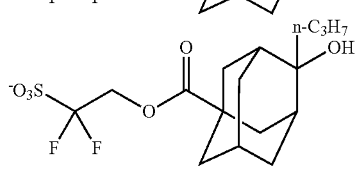

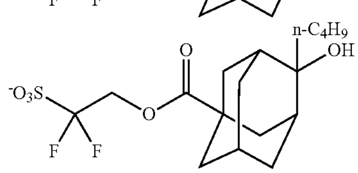

-continued

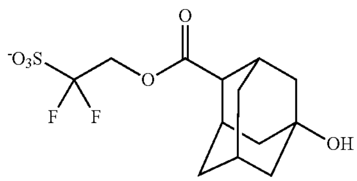

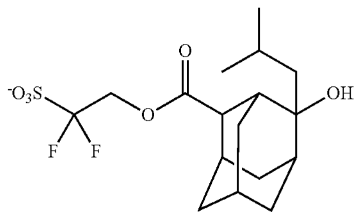

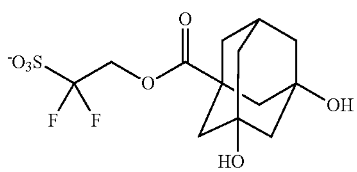

Examples of the sulfonate anion having Y containing an oxo group and a divalent group represented by the formula (b1-3) include anions below.

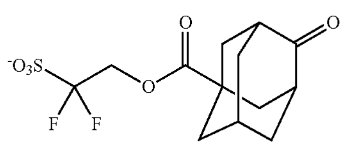

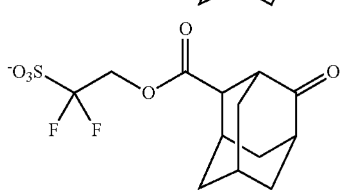

Examples of the sulfonate anion having Y substituted with an aliphatic hydrocarbon group, and a divalent group represented by the formula (b1-4) include anion below.

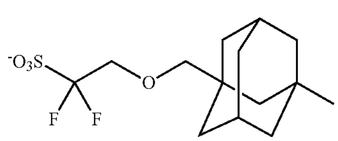

Examples of the sulfonate anion having Y substituted with an alkoxy group, and a divalent group represented by the formula (b1-4) include anions below.

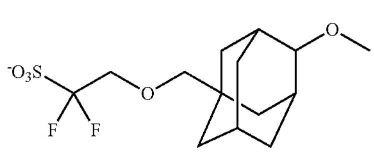

-continued

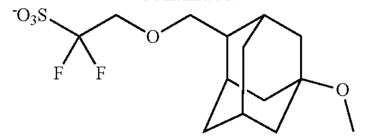

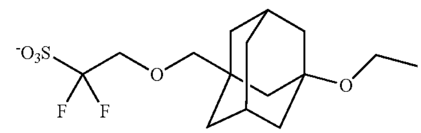

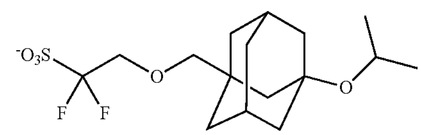

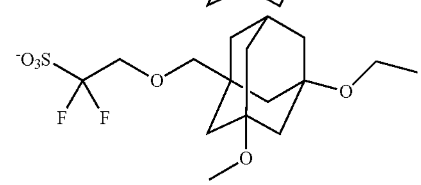

Examples of the sulfonate anion having Y substituted with a hydroxy group or a hydroxy group-containing aliphatic hydrocarbon group, and a divalent group represented by the formula (b1-4) include anions below.

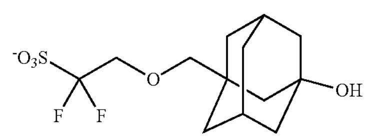

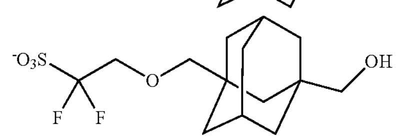

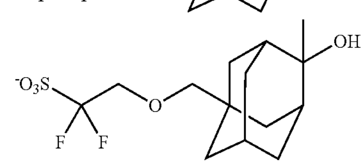

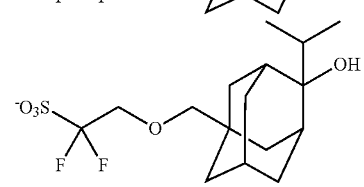

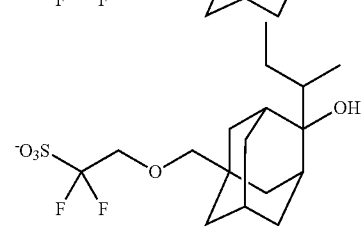

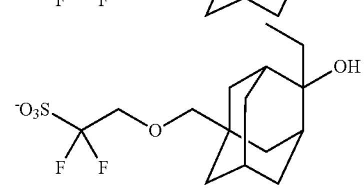

-continued

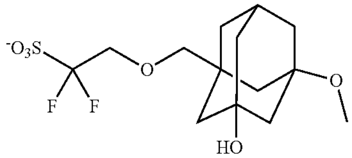

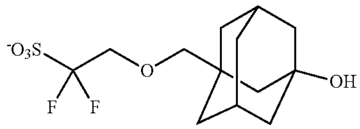

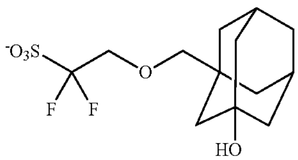

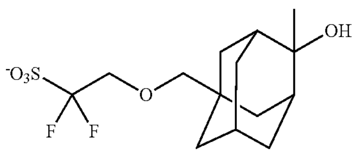

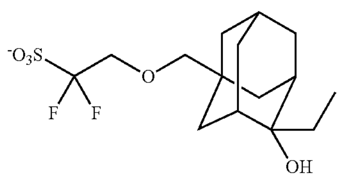

Examples of the sulfonate anion having Y containing an oxo group, and a divalent group represented by the formula (b1-4) include anions below.

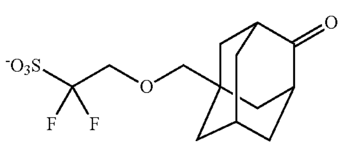

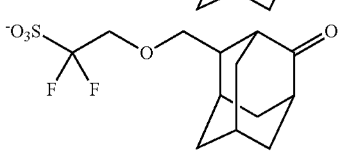

Among these, a sulfonate anion containing a divalent group represented by the formula (b1-1) is preferable as described below.

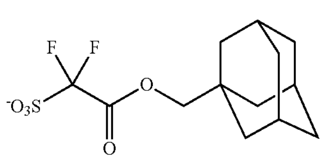

-continued

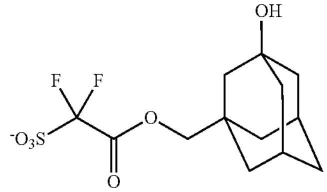

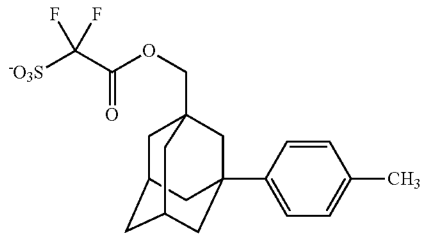

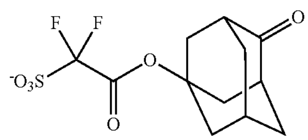

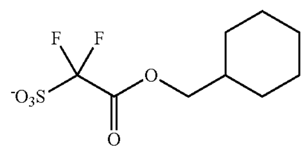

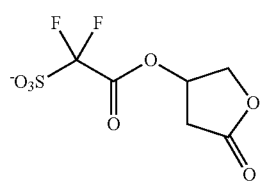

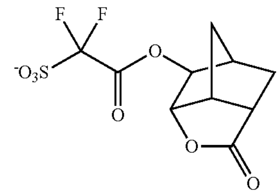

Examples of the cation of the acid generator (B) include an onium cation, for example, sulfonium cation, iodonium cation, ammonium cation, benzothiazolium cation and phosphonium cation. Among these, sulfonium cation and iodonium cation are preferable, and aryl sulfonium cation is more preferable.

$Z^+$ of the formula (B1) is preferably represented by any of the formula (b2-1) to the formula (b2-4).

(b2-1)

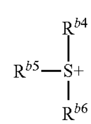

(b2-2)

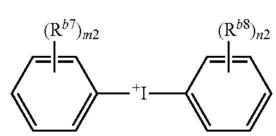

(b2-3)

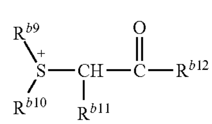

-continued (b2-4)

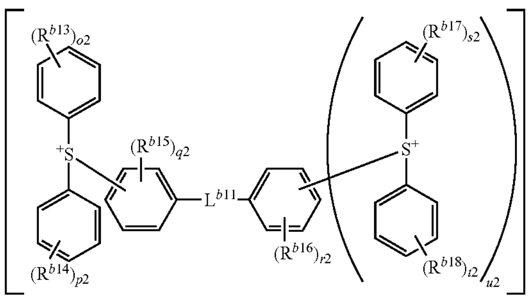

wherein $R^{b4}$ to $R^{b6}$ independently represent a $C_1$ to $C_{30}$ aliphatic hydrocarbon group, a $C_3$ to $C_{36}$ saturated cyclic hydrocarbon group or a $C_6$ to $C_{18}$ aromatic hydrocarbon group, the aliphatic hydrocarbon group may be substituted with a hydroxy group, a $C_1$ to $C_{12}$ alkoxy group or a $C_6$ to $C_{18}$ aromatic hydrocarbon group, the saturated cyclic hydrocarbon group may be substituted with a halogen atom, a $C_2$ to $C_4$ acyl group and a glycidyloxy group, the aromatic hydrocarbon group may be substituted with a halogen atom, a hydroxy group, a $C_1$ to $C_{36}$ aliphatic hydrocarbon group, a $C_3$ to $C_{36}$ saturated cyclic hydrocarbon group or a $C_1$ to $C_{12}$ alkoxy group;

$R^{b7}$ and $R^{b8}$ independently represent a hydroxy group, a $C_1$ to $C_{12}$ aliphatic hydrocarbon or a $C_1$ to $C_{12}$ alkoxyl group;

m2 and n2 independently represent an integer of 0 to 5;

$R^{b9}$ and $R^{b10}$ independently represent a $C_1$ to $C_{36}$ aliphatic hydrocarbon group or a $C_3$ to $C_{36}$ saturated cyclic hydrocarbon group;

$R^{b11}$ represents a hydrogen atom, a $C_1$ to $C_{36}$ aliphatic hydrocarbon group, a $C_3$ to $C_{36}$ saturated cyclic hydrocarbon group or a $C_6$ to $C_{18}$ aromatic hydrocarbon group;

$R^{b12}$ represents a $C_1$ to $C_{12}$ aliphatic hydrocarbon group, a $C_3$ to $C_{18}$ saturated cyclic hydrocarbon group or a $C_6$ to $C_{18}$ aromatic hydrocarbon group, the aromatic hydrocarbon group may be substituted with a $C_1$ to $C_{12}$ aliphatic hydrocarbon group, a $C_1$ to $C_{12}$ alkoxy group, a $C_3$ to $C_{18}$ saturated cyclic hydrocarbon or an alkyl carbonyloxy group;

$R^{b9}$ and $R^{b10}$, $R^{b11}$ and $R^{b12}$ independently may be bonded to form a $C_3$ to $C_{12}$ ring (preferably a $C_3$ to $C_7$ ring), respectively, and one or more —$CH_2$— contained in the rig may be replaced by —O—, —S— or —CO—;

$R^{b13}$ to $R^{b18}$ independently represent a hydroxy group, a $C_1$ to $C_{12}$ aliphatic hydrocarbon group or a $C_1$ to $C_{12}$ alkoxy group;

$L^{b11}$ represents —S— or —O—;

o2, p2, s2 and t2 independently represent an integer of 0 to 5;

q2 or r2 independently represent an integer of 0 to 4;

u2 represents an integer of 0 or 1.

In the formula (b2-1) to the formula (b2-4), the aliphatic hydrocarbon group preferably has $C_1$ to $C_{12}$, and the saturated cyclic hydrocarbon group preferably has $C_3$ to $C_{36}$, and more preferable $C_4$ to $C_{12}$;

a preferred aliphatic hydrocarbon group include methyl, ethyl, n-propyl, isopropyl, n-butyl, sec-butyl, tert-butyl, pentyl, hexyl, octyl and 2-ethylhexyl groups, a preferred saturated cyclic hydrocarbon group include cyclopropyl, cyclobutyl, cyclopentyl, cyclohexyl, cycloheptyl, cyclodecyl, 2-alkyl-2-adamantyl, 1-(1-adamantyl)-1-alkyl group and isobornyl groups.

A preferred aromatic hydrocarbon group include phenyl, 4-methylphenyl, 4-ethylphenyl, 4-tert-butylphenyl, 4-cyclohexylphenyl, 4-methoxylphenyl, biphenyl, and naphthyl groups.

Examples of the aliphatic hydrocarbon group which is substituted with the aromatic hydrocarbon group, i.e., aralkyl group, include benzyl group.

Examples of the ring formed by $R^{b9}$ and $R^{b10}$ bonded together include thiolane-1-ium ring (tetrahydrothiophenium ring), thian-1-ium ring and 1,4-oxathian-4-ium ring.

Examples of the ring formed by $R^{b11}$ and $R^{b12}$ bonded together include oxocycloheptane ring, oxocyclohexane ring, oxonorbornane ring, and oxoadamantane ring.

Among the cations represented by the formula (b2-1) to the formula (b2-4), the cation represented by the formula (b2-1-1) is preferable, and triphenyl sulfonium cation (v2=w2=x2=0 in the formula (b2-1-1)) is more preferable.

(b2-1-1)

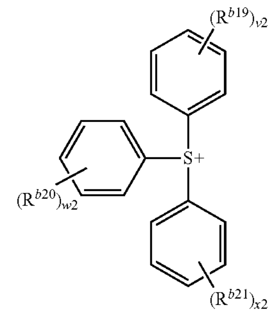

wherein $R^{b19}$ to $R^{b21}$ independently represent a halogen atom, a hydroxy group, a $C_1$ to $C_{36}$ aliphatic hydrocarbon group, a $C_3$ to $C_{36}$ saturated cyclic hydrocarbon group or a $C_1$ to $C_{12}$ alkoxy group;

the aliphatic hydrocarbon group may be substituted with a hydroxy group, a $C_1$ to $C_{12}$ alkoxy group or a $C_6$ to $C_{18}$ aromatic hydrocarbon group, the saturated cyclic hydrocarbon group may be substituted with a halogen atom, a $C_2$ to $C_4$ acyl group and a glycidyloxy group;

v2 to x2 independently represent an integer of 0 to 5 (preferably 0 or 1);

The aliphatic hydrocarbon group preferably has $C_1$ to $C_{12}$.

The saturated cyclic hydrocarbon group preferably has $C_4$ to $C_{36}$.

In the formula (b2-1-1), $R^{b19}$ to $R^{b21}$ independently preferably represent a halogen atom (and more preferably fluorine atom), a hydroxy group, a $C_1$ to $C_{12}$ alkyl group or a $C_1$ to $C_{12}$ alkoxy group; and v2 to x2 independently represent an integer of 0 to 5 (preferably 0 or 1).

Specific examples of the cation of the formula (b2-1-1) include a cation below.

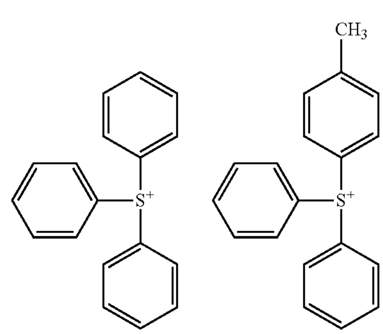

-continued
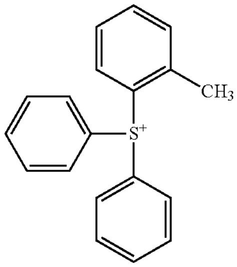
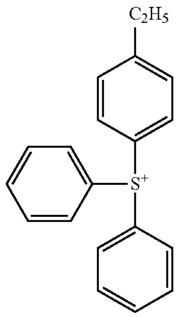
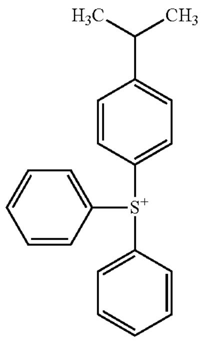
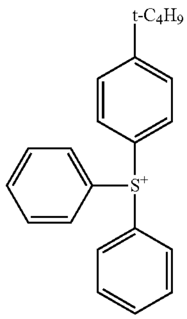
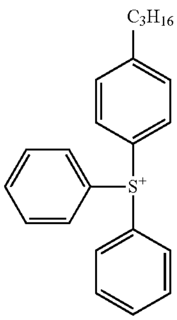
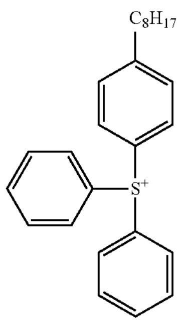
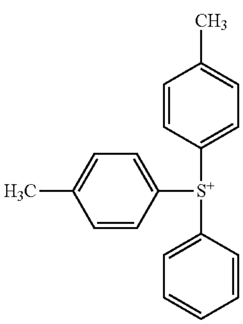
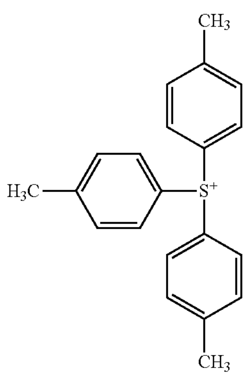
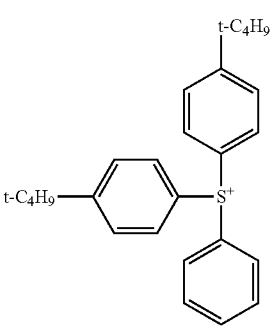
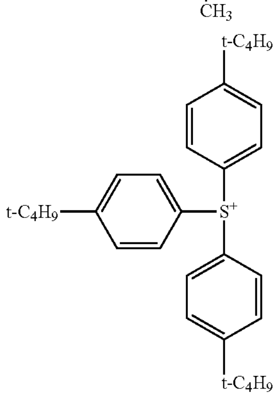
-continued
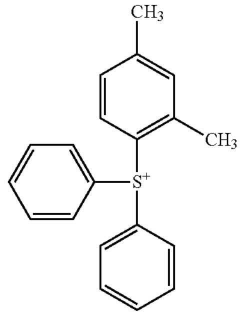
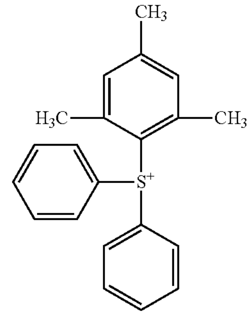
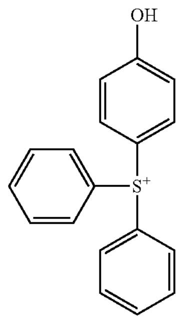
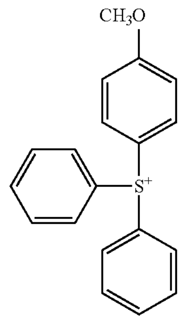
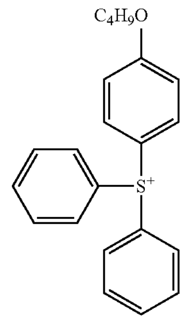
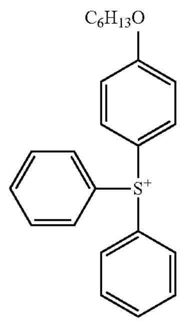
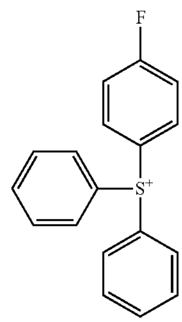
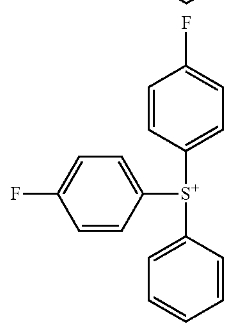
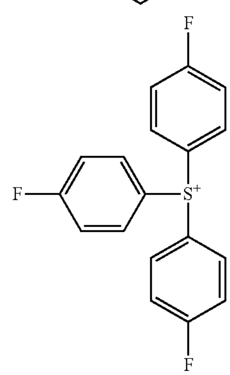
Specific examples of the cation of the formula (b2-2) include a cation below.
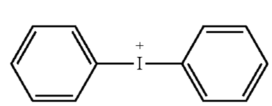
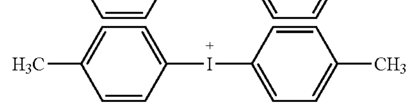
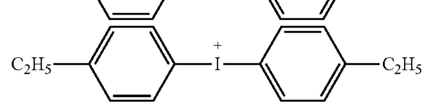

-continued
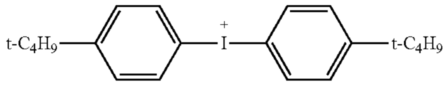
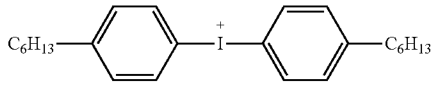
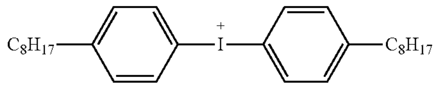
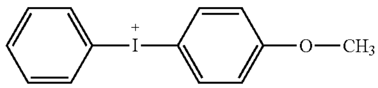
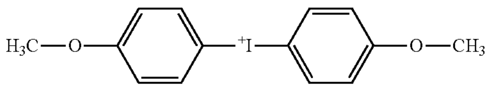
Specific examples of the cation of the formula (b2-3) include a cation below.
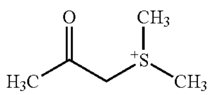
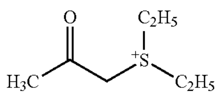
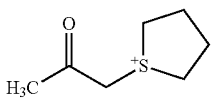
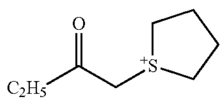
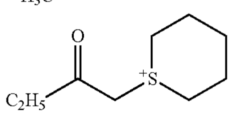
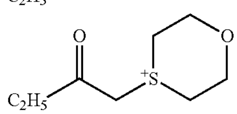
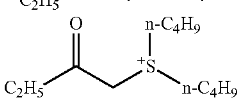
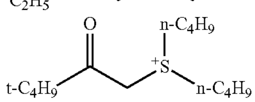
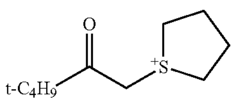
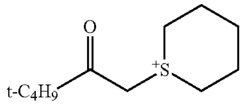
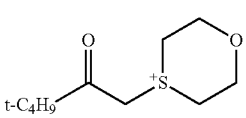
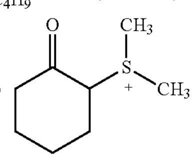
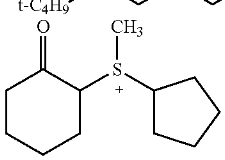
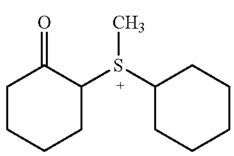
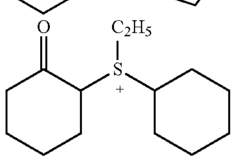
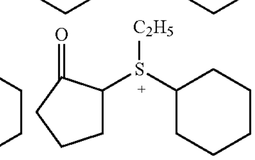
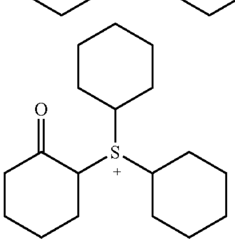
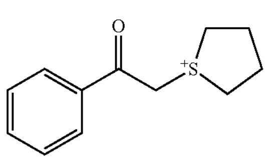
-continued
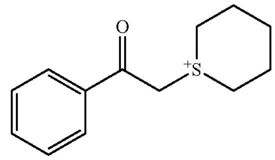
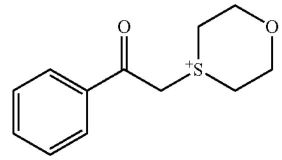
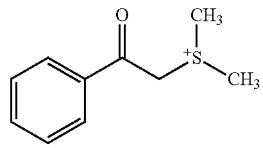
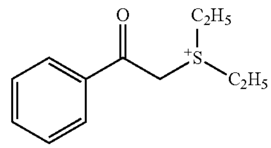
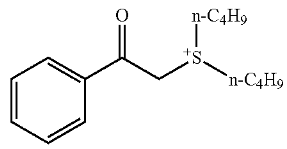
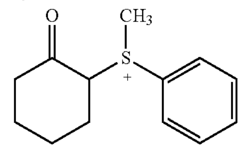
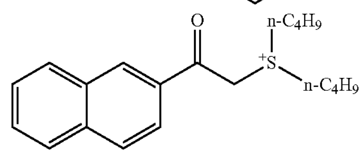
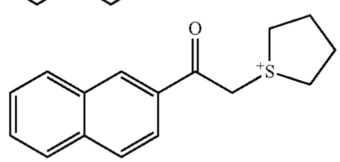
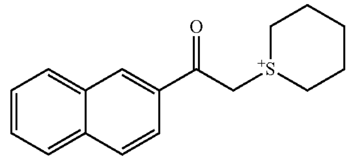
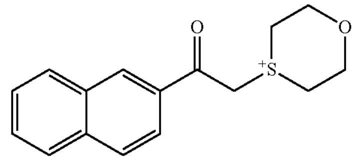
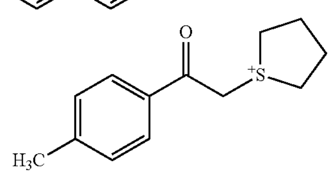
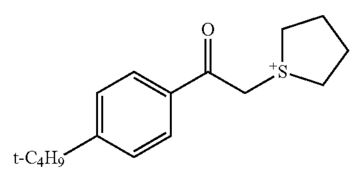
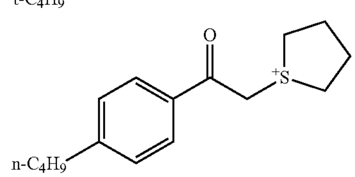
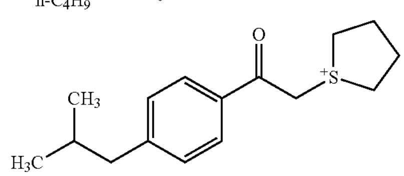

-continued
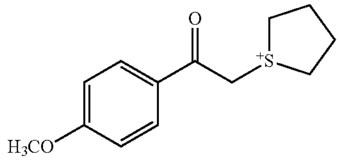
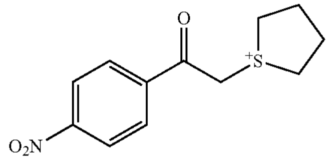
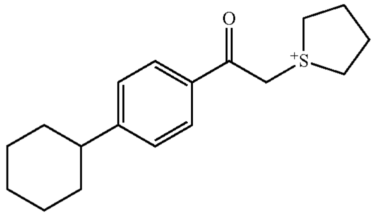
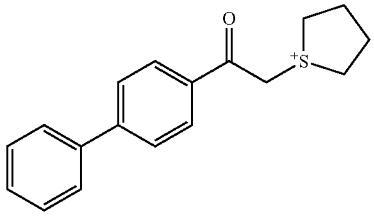
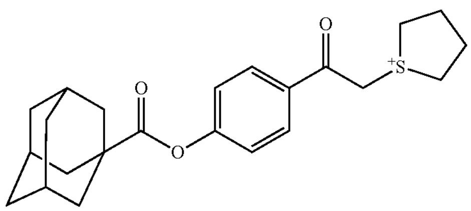 [SMILES: O=C(C[S+]1CCCC1)c1ccc(OC(=O)C23CC4CC(CC(C4)C2)C3)cc1]
Specific examples of the cation of the formula (b2-4) include a cation below.
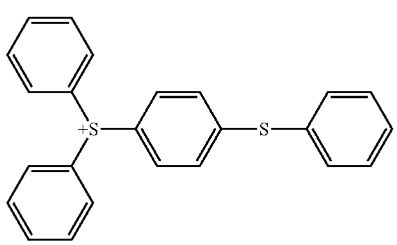
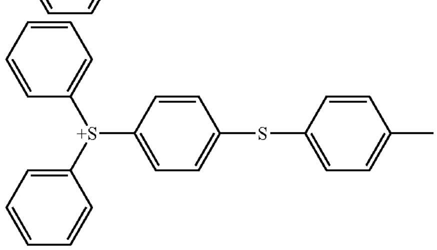
-continued
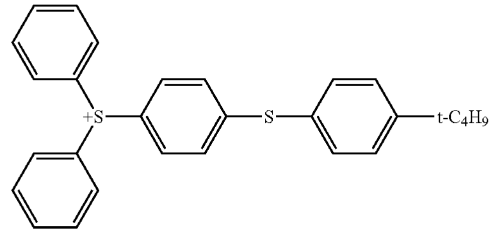
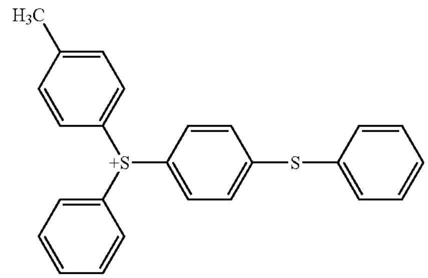
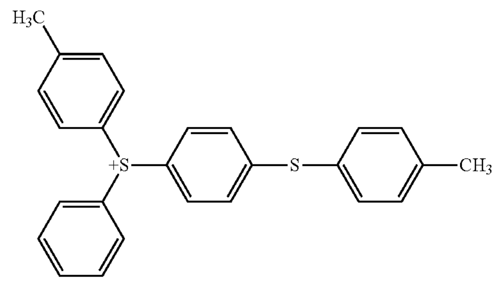
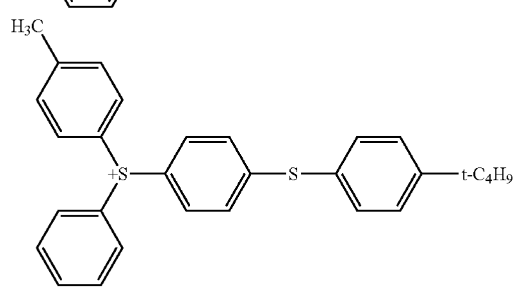
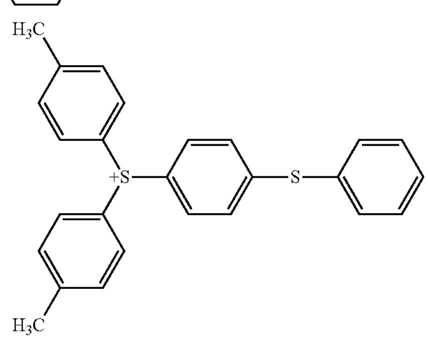
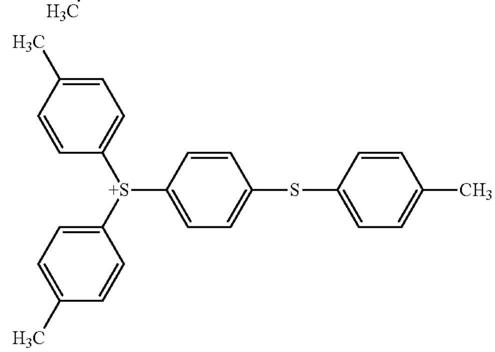

-continued
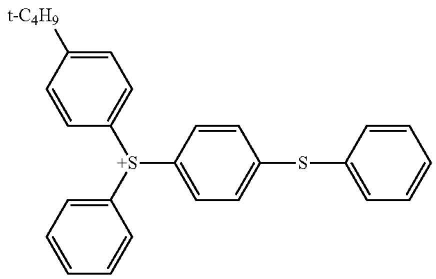
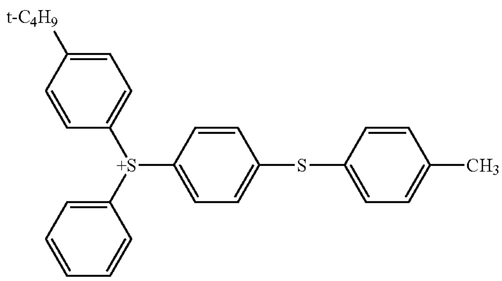
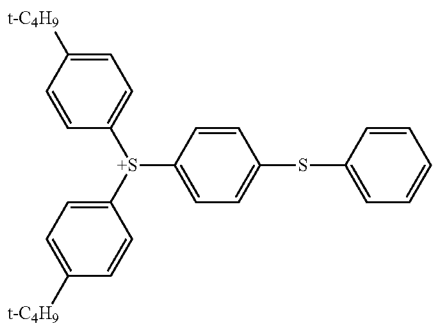
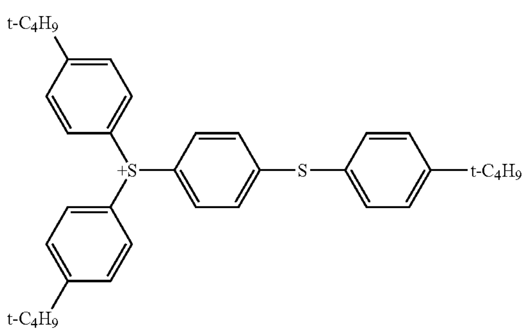
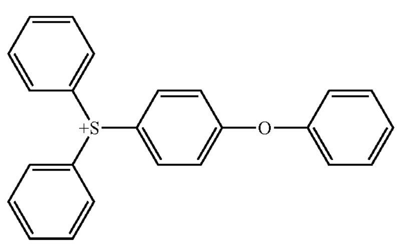
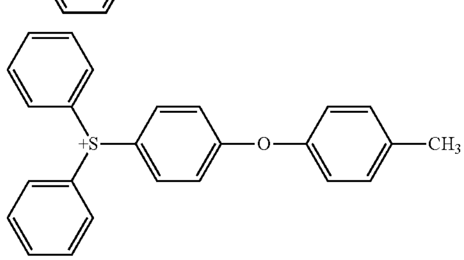
-continued
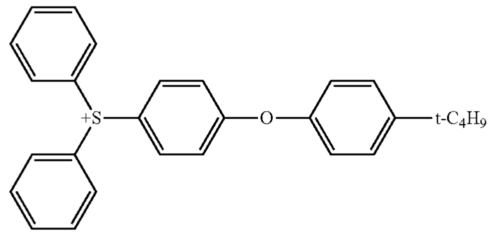
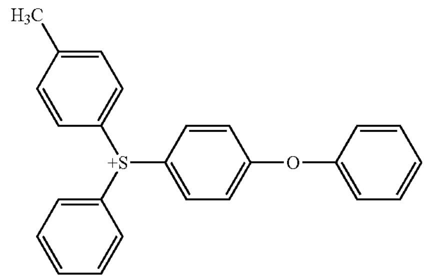
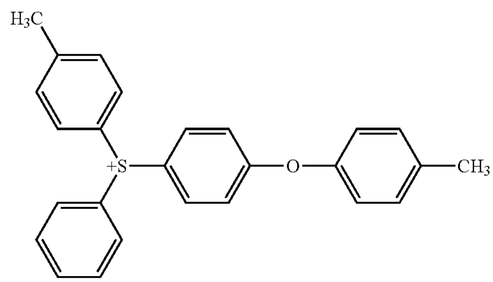
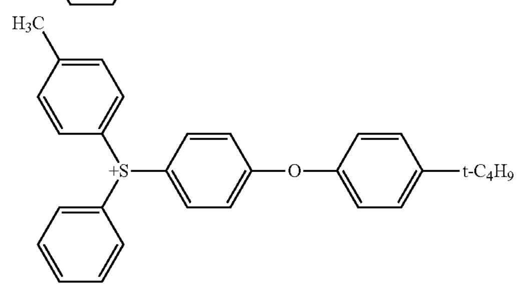
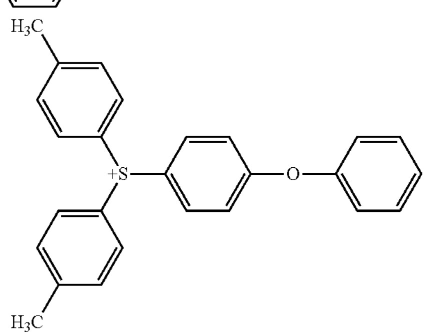
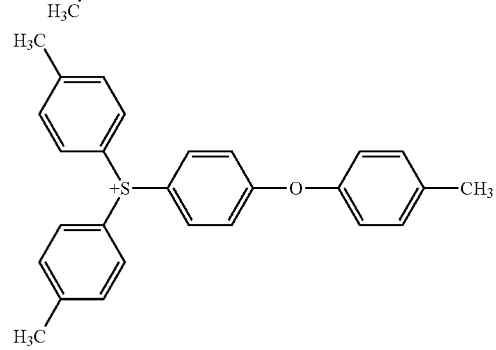

-continued
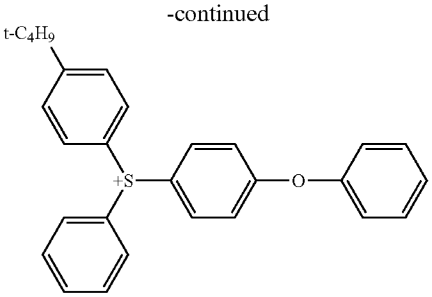
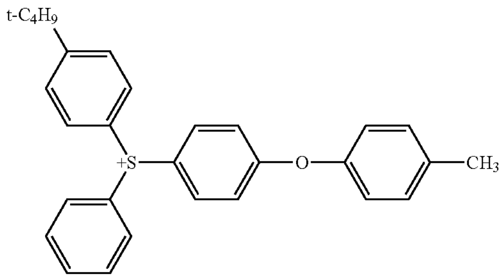
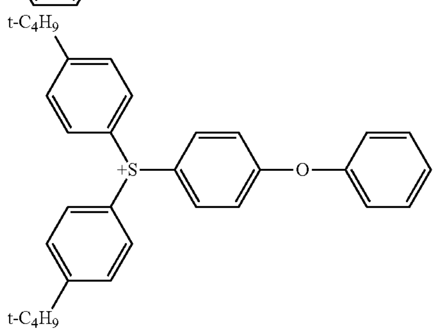
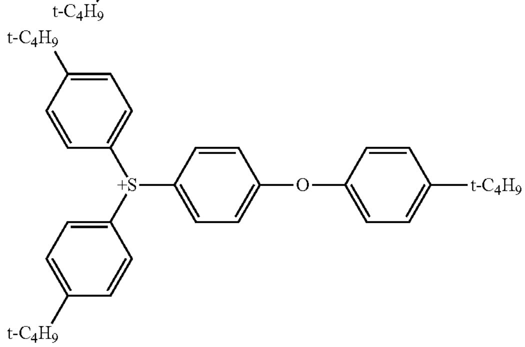
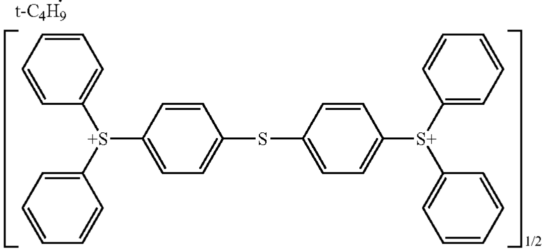
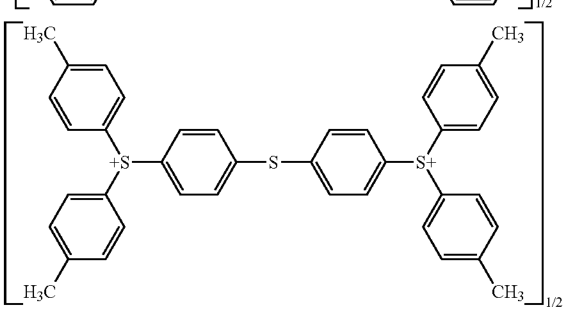
-continued
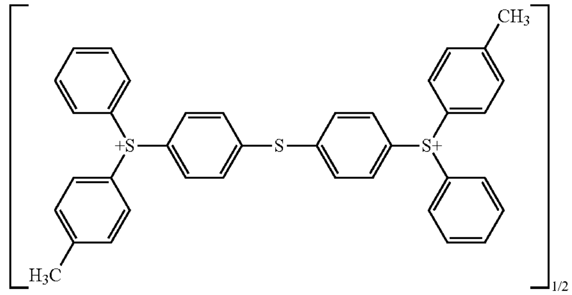
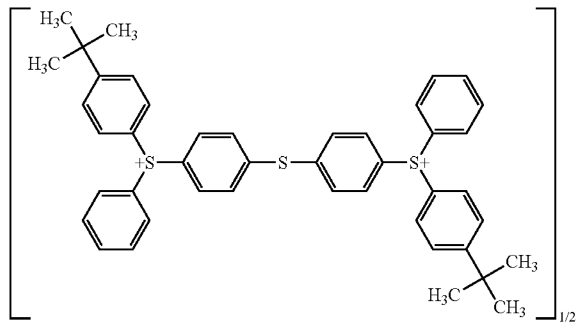
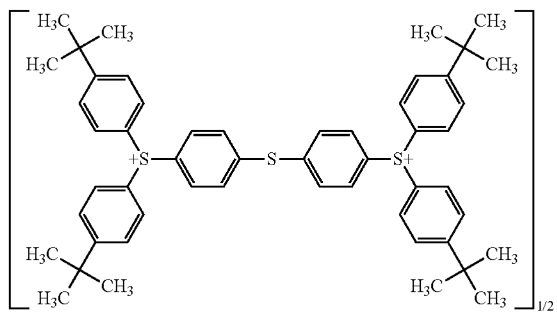
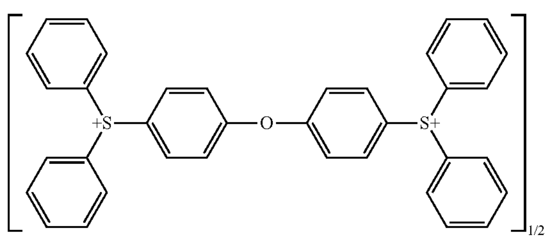
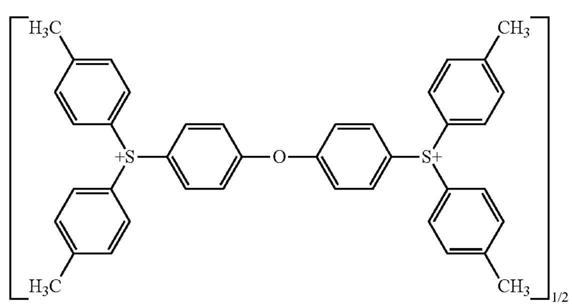

-continued

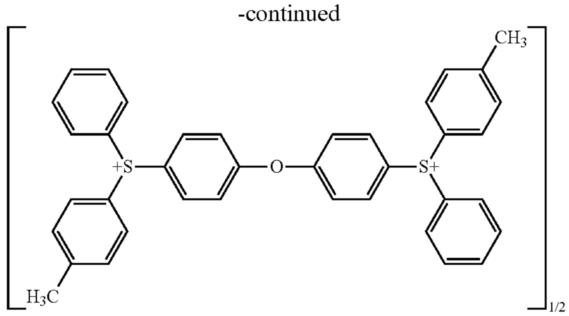

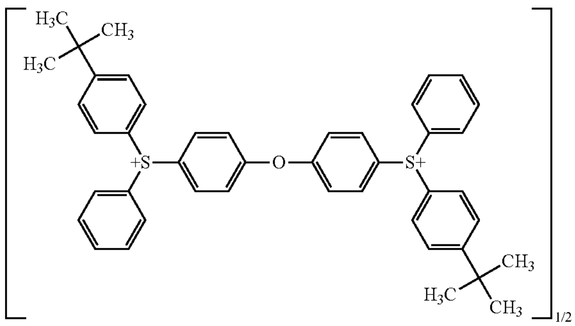

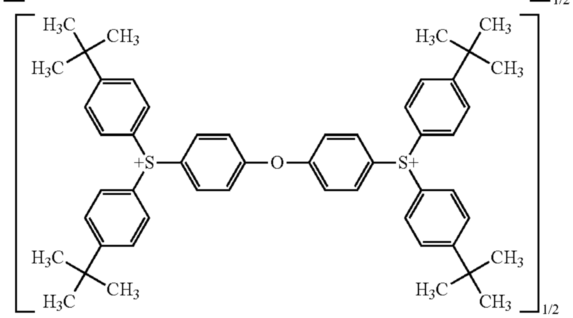

The acid generator (B1) is a compound combined the above sulfonate anion with an organic cation.

The above sulfonate anion and the organic cation may optionally be combined, a combination of any of the anion represented by the formula (b1-1-1) to the formula (b1-1-9) and the cation represented by the formula (b2-1-1), as well as a combination of any of the anion represented by the formula (b1-1-3) to the formula (b1-1-5) and the cation represented by the formula (b2-3) are preferable.

Preferred acid generators (B1) are represented by the formula (B1-1) to the formula (B1-17). Among these, the formulae (B1-1), (B1-2), (B1-6), (B1-11), (B1-12), (B1-13), (B1-14) and (B1-18) which contain triphenyl sulfonium cation are preferable.

(B1-1)

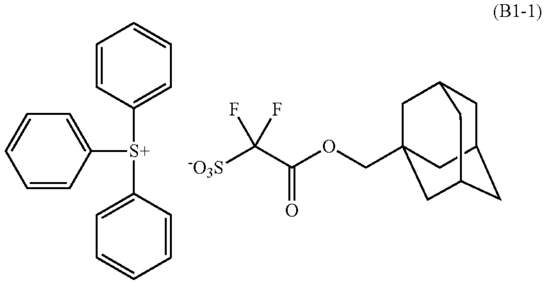

-continued (B1-2)

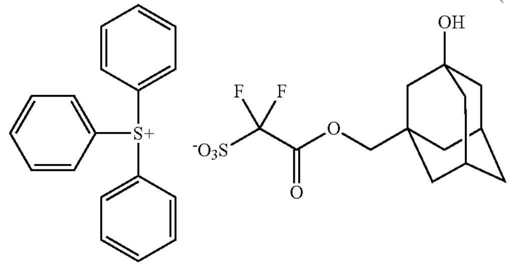

(B1-3)

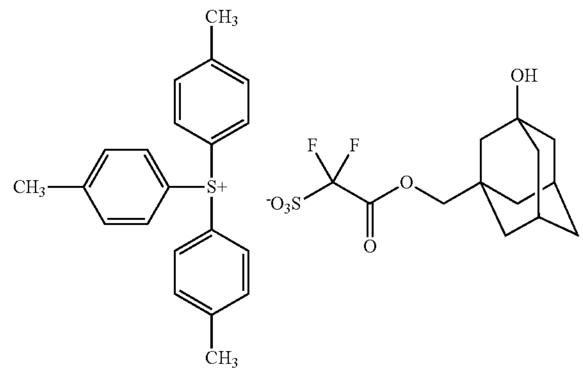

(B1-4)

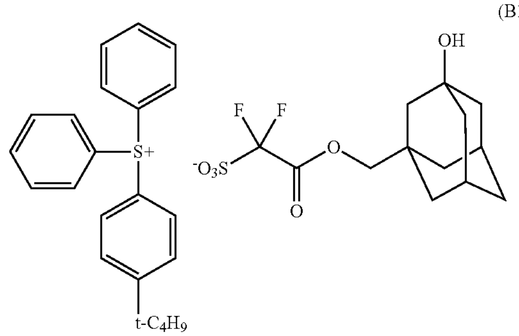

(B1-5)

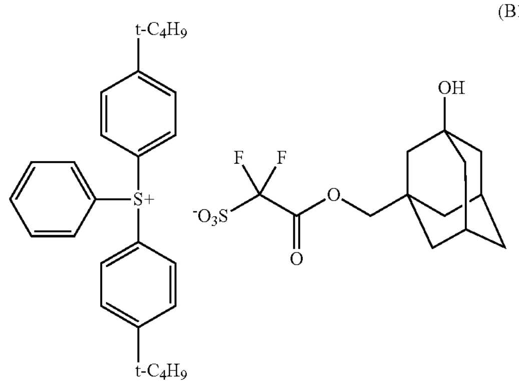

(B1-6)
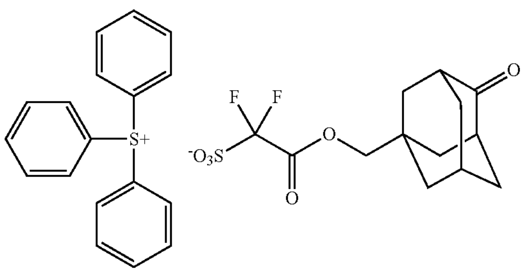
(B1-7)
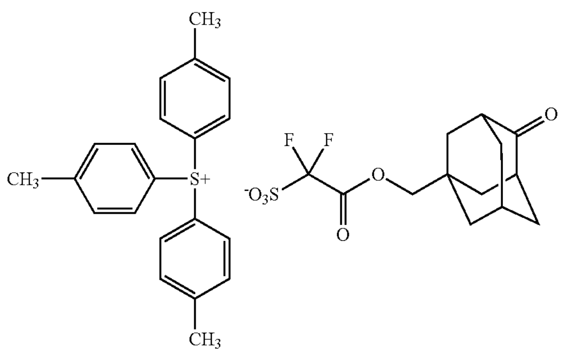
(B1-8)
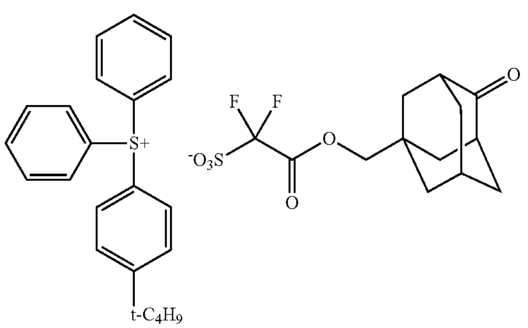
(B1-9)
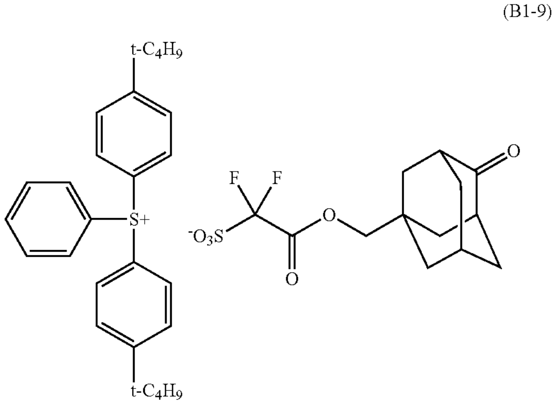
(B1-10)
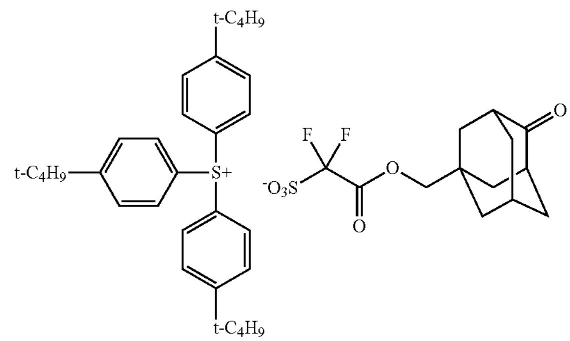
(B1-11)
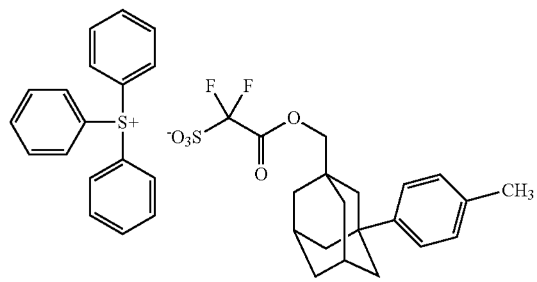
(B1-12)
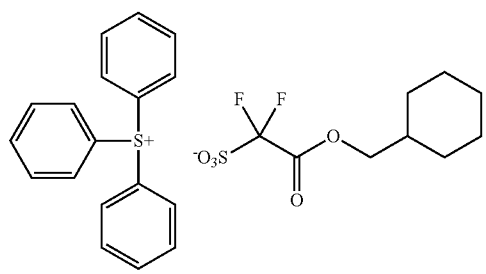
(B1-13)
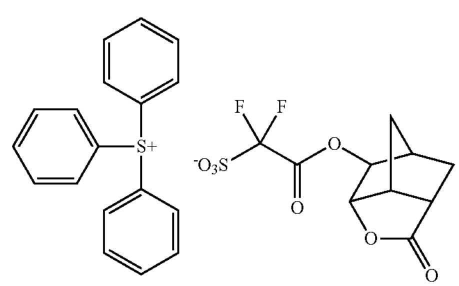
(B1-14)
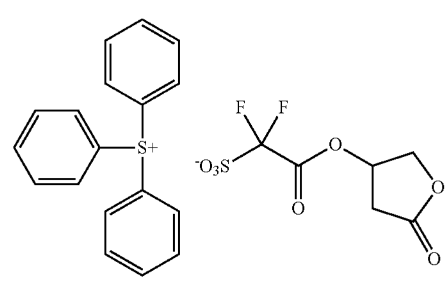

-continued (B1-15)

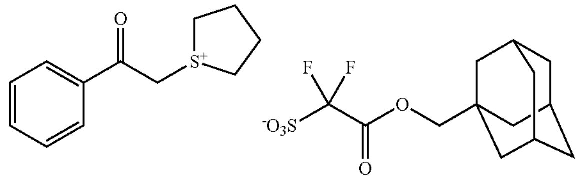

(B1-16)

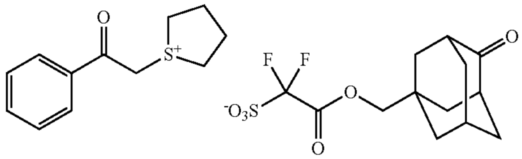

(B1-17)

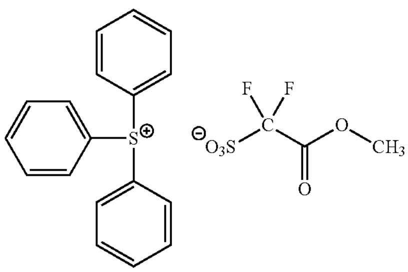

(B1-18)

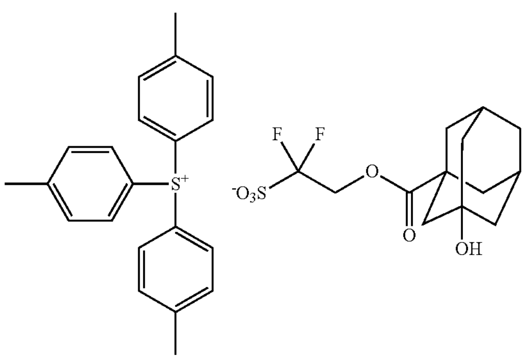

In the resist composition of the present invention, the content of the acid generator (B) is preferably not less than 1 parts by weight (and more preferably not less than 3 parts by weight), and not more than 30 parts by weight (and more preferably not more than 25 parts by weight), with respect to 100 parts by weight of the resin (A).

<Basic Compound (Hereinafter May be Referred to as "Basic Compound (C)">

The resist composition of the present invention may contain a basic compound (C). The content of the basic compound (C) is preferably 0.01 to 1 weight % based on the solid content of the resist composition.

As the basic compounds (C), nitrogen-containing basic compounds (for example, amine) are preferable. The amine may be an aliphatic amine or an aromatic amine. The aliphatic amine includes any of a primary amine, secondary amine and tertiary amine. The aromatic amine includes an amine in which an amino group is bonded to an aromatic ring such as aniline, and an hetero-aromatic amine such as pyridine.

Preferred basic compounds (C) include an aromatic amine presented by the formula ($C_2$), particularly an aromatic amine represented by the formula (C2-1).

(C2)

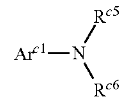

(C2-1)

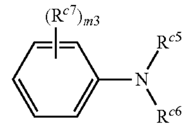

wherein $Ar^{c1}$ represents an aromatic hydrocarbon group;

$R^{c5}$ and $R^{c6}$ independently represent a hydrogen atom, an aliphatic hydrocarbon group (preferably an alkyl or cycloalkyl group), a saturated cyclic hydrocarbon group or a aromatic hydrocarbon group, one or more hydrogen atoms contained in the aliphatic hydrocarbon group, the saturated cyclic hydrocarbon group and the aromatic hydrocarbon group may be replaced by a hydroxy group, an amino group or a $C_1$ to $C_6$ alkoxyl group, one or more hydrogen atoms contained in the amino group may be placed by a $C_1$ to $C_4$ alkyl group;

$R^{c7}$ represents an aliphatic hydrocarbon group (preferably an alkyl or cycloalkyl group), an alkoxy group, a saturated cyclic hydrocarbon group or a aromatic hydrocarbon group, one or more hydrogen atoms contained in the aliphatic hydrocarbon group, the alkoxy group, the saturated cyclic hydrocarbon group and the aromatic hydrocarbon group may be replaced by the same substituents as defined in $R^{c5}$ and $R^{c6}$;

m3 represents an integer of 0 to 3.

The aliphatic hydrocarbon group preferably has $C_1$ to $C_6$, the saturated cyclic hydrocarbon group preferably has $C_5$ to $C_{10}$, the aromatic hydrocarbon group preferably has $C_6$ to $C_{10}$; and the alkoxy group preferably has $C_1$ to $C_6$.

Specific examples of the aromatic amine represented by the formula ($C_2$) include 1-naphtylamine and 2-naphtylamine.

Specific examples of the aniline represented by the formula (C2-1) include aniline, diisopropylaniline, 2-, 3- or 4-methylaniline, 4-nitroaniline, N-methylaniline, N,N-dimethylaniline, and diphenylamine. Among these, diisopropylaniline (particularly 2,6-diisopropylaniline) is preferable.

Also, examples of the basic compound (C) include compounds represented by the formula ($C_3$) to the formula ($C_{11}$);

(C3)

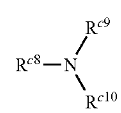

(C4)

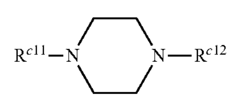

(C5)

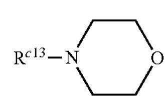

(C6)

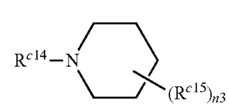

-continued (C7)

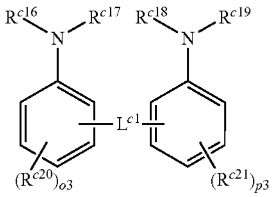

(C8)

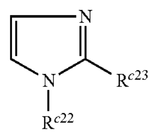

(C9)

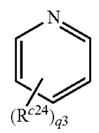

(C10)

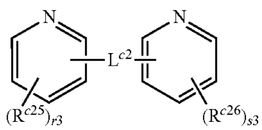

(C11)

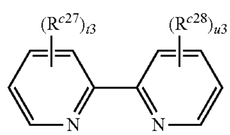

wherein $R^{c8}$ represents any of the group as described in $R^{c7}$;

$R^{c9}$, $R^{c10}$, $R^{c11}$ to $R^{c14}$, $R^{c16}$ to $R^{c19}$ and $R^{c22}$ which are bonded to the nitrogen atom independently represent any of the group as described in $R^{c5}$ and $R^{c6}$;

$R^{c20}$, $R^{c21}$ and $R^{c23}$ to $R^{c28}$ which are bonded to the aromatic carbon atom independently represent any of the group as described in $R^{c7}$;

o3 to u3 independently represent an integer of 0 to 3;

$R^{c15}$ represents an aliphatic hydrocarbon group, a saturated cyclic hydrocarbon group or an alkanoyl group;

n3 represents an integer of 0 to 8;

$L^{c1}$ and $L^{c2}$ independently represent a divalent aliphatic hydrocarbon group (preferably alkylene group), —CO—, —C(═NH)—, —C(═NR$^{c3}$), —S—, —S—S— or a combination thereof;

$R^{c3}$ represents a $C_1$ to $C_4$ alkyl group.

The aliphatic hydrocarbon group preferably has $C_1$ to $C_6$, the saturated cyclic hydrocarbon group preferably has $C_3$ to $C_6$, the alkanoyl group preferably has $C_2$ to $C_6$; and the divalent aliphatic hydrocarbon group preferably has $C_1$ to $C_6$.

Specific examples of the compound represented by the formula ($C_3$) include, for example, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris [2-(2-methoxyethoxy)ethyl]amine, triisopropanolamine, ethylene diamine, tetramethylene diamine, hexamethylene diamine, 4,4'-diamino-1,2-diphenylethane, 4,4'-diamino-3,3'-dimethyldiphenylmethane and 4,4'-diamino-3,3'-diethyldiphenylmethane.

Specific examples of the compound represented by the formula ($C_4$) include, for example, piperazine.

Specific examples of the compound represented by the formula ($C_5$) include, for example, morpholine.

Specific examples of the compound represented by the formula ($C_6$) include, for example, piperizine, a hindered amine compound having piperizine skeleton described in JP H11-52575-A.

Specific examples of the compound represented by the formula ($C_7$) include, for example, 2,2'-methylenebisaniline.

Specific examples of the compound represented by the formula ($C_8$) include, for example, imidazole and 4-methylimidazole.

Specific examples of the compound represented by the formula ($C_9$) include, for example, pyridine and 4-methylpyridine.

Specific examples of the compound represented by the formula ($C_{10}$) include, for example, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine and 2,2'-dipicolylamine.

Specific examples of the compound represented by the formula ($C_{11}$) include, for example, bipyridine.

<Solvent (Hereinafter May be Referred to as "Solvent (E)">

The resist composition of the present invention may include a solvent (E) in the amount of not less than 90 weight % in the composition. If the resist composition contain the solvent, it is suitable to produce the thin resist film. The content of the solvent may be not less than 90 weight % (preferably not less than 92 weight %, and more preferably not less than 94 weight %), and not more than 99.9 weight % (and preferably not more than 99 weight %) in the composition. The content of the solvent (E) can be measured with a known analytical method such as, for example, liquid chromatography and gas chromatography.

Examples of the solvent (E) include glycol ether esters such as ethylcellosolve acetate, methylcellosolve acetate and propylene glycol monomethyl ether acetate; glycol ethers such as propylene glycol monomethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents (E) can be used alone or in combination of two or more.

<Other Ingredient (Hereinafter May be Referred to as "Other Ingredient (F)">

The resist composition can also include small amounts of various additives such as sensitizers, dissolution inhibitors, surfactants, stabilizers, and dyes, as needed.

<Method for Producing Resist Pattern>

The method for producing resist pattern of the present invention includes steps of:

(1) applying the abovementioned resist composition of the present invention onto a substrate;

(2) removing solvent from the applied composition to form a composition layer;

(3) exposing to the composition layer using an exposure device;

(4) heating the exposed composition layer and, (5) developing the heated composition layer using a developing apparatus.

The application of the resist composition onto the substrate can generally be carried out through the use of a device such as a spin coater.

The drying, for example, can either be carried out by baking the applied composition using a heating device such as a hotplate, or can be carried out using a decompression device, and a composition layer is formed. The temperature in this case is generally the range of 50 to 200° C. Moreover, the pressure is generally the range of 1 to $1.0\times10^5$ Pa.

The composition layer obtained is exposed to light using an exposure device or a liquid immersion exposure device. The exposure is generally carried out through a mask that corresponds to the required pattern. Various types of exposure light source can be used, such as irradiation with ultraviolet lasers such as KrF excimer laser (wavelength: 248 nm), ArF excimer laser (wavelength: 193 nm), $F_2$ laser (wavelength: 157 nm), or irradiation with far-ultraviolet wavelength-converted laser light from a solid-state laser source (YAG or semiconductor laser or the like) or vacuum ultraviolet harmonic laser light or the like.

After exposure, the composition layer is subjected to a baking treatment to promote the deprotection reaction. The baking temperature is generally in the range of 50 to 200° C., preferably in the range of 70 to 150° C.

The composition layer is developed after the heat treatment, generally by utilizing an alkaline developing solution using a developing apparatus. Here, for the alkaline developing solution, various types of aqueous alkaline solutions used in this field can be satisfactory. Examples include aqueous solutions of tetramethylammonium hydroxide and (2-hydroxyethyl)trimethylammonium hydroxide (common name: choline).

After developing, it is preferable to rinse with ultrapure water and to remove any residual water on the substrate and the pattern.

<Application>

The resin and composition using same of the present invention are useful in resist compositions, and particularly in chemically amplified photoresist compositions, and can be used in the microfabrication of semiconductors and in manufacture of liquid crystals, thermal print heads for circuit boards and the like, and furthermore in other photofabrication processes, and they can be suitably used in a wide range of applications. In particular, they can be used as a suitable chemically amplified photoresist composition for excimer laser lithography such as with ArF, KrF or the like, as well as ArF liquid immersion exposure lithography and EUV exposure lithography. Moreover, in addition to liquid immersion exposure, they can also be used in dry exposure and the like. Furthermore, they can also be used in double imaging, and have industrial utility.

EXAMPLES

The present invention will be described more specifically by way of examples, which are not construed to limit the scope of the present invention.

All percentages and parts expressing the content or amounts used in the Examples and Comparative Examples are based on weight, unless otherwise specified.

The weight average molecular weight is a value determined by gel permeation chromatography (Tosoh Co. Ltd. HLC-8120GPC type, column: Three of TSK gel Multipore HXL-M, solvent: tetrahydroflun) using polystyrene as the standard product.

Column: Three of TSK gel Multipore HXL-M+guardcolumn (Tosoh Co. Ltd.)

Eluant: tetrahydrofran

Flow rate: 1.0 mL/min

Detecting device: RI detector

Column temperature: 40° C.

Injection amount: 100 μL

Standard material for calculating molecular weight: standard polysthylene (Tosoh Co. Ltd.)

The structures of the compounds were verified by NMR (Nippon electric, GX-270 type or EX-270 type) and mass analysis (LC: Agilent 1100 type, MASS: Agilent LC/MSD type or LC/MSD TOF type).

Example 1a

Synthesis of Resin A1a

Monomer E, monomer F, monomer B, monomer G, monomer C and monomer D were mixed with molar ratio 28:14:6:5:16:31, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 73° C. After that, the reaction solution was poured into a mixture of methanol and ion-exchanged water in large amounts to precipitate. These operations were repeated 3 times for purification, thereby resulting in 81% yield of copolymer having a weight average molecular weight of about 7600. This copolymer, which had the structural units derived from the monomers of the following formula, was designated Resin A1a.

E

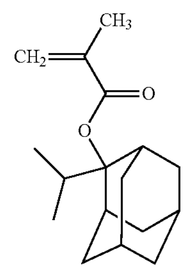

F

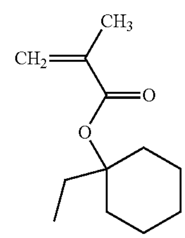

B

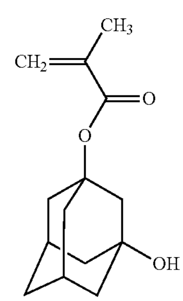

G

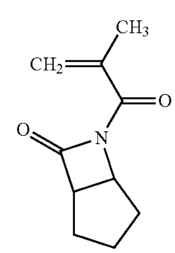

-continued

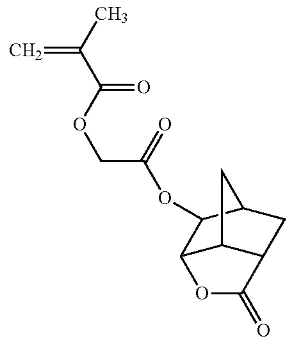

C

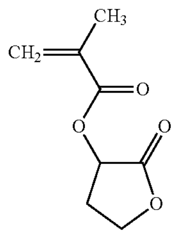

D

Example 2a

Synthesis of Resin A2a

Monomer E, monomer F, monomer B, monomer G and monomer D were mixed with molar ratio 28:14:10:10:38, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 76% yield of copolymer having a weight average molecular weight of about 7200. This copolymer, which had the structural units derived from the monomers of the following formula, was designated Resin A2a.

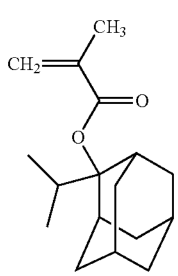

E

-continued

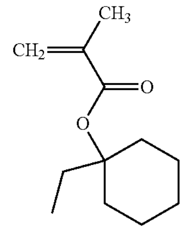

F

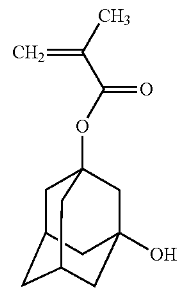

B

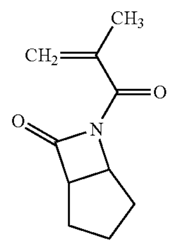

G

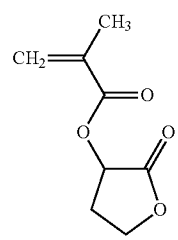

D

Example 3a

Synthesis of Resin A3a

Monomer A, monomer F, monomer B, monomer G and monomer D were mixed with molar ratio 25:18:3:9:45, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 70% yield of copolymer having a weight average molecular weight of about 7600. This copolymer, which had the structural units derived from the monomers of the following formula, was designated Resin A3a.

A

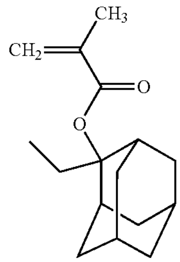

F

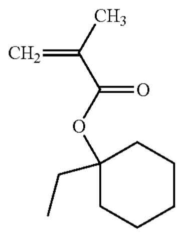

B

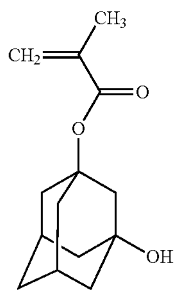

G

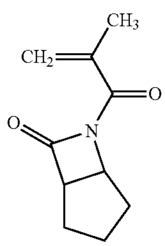

D

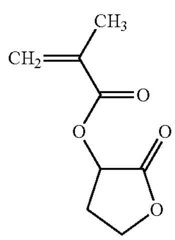

Example 4a

Synthesis of Resin A4a

Monomer A, monomer I, monomer B, monomer G and monomer D were mixed with molar ratio 25:14:10:8:43, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 70° C. After that, the reaction solution was poured into a mixture of methanol and ion-exchanged water in large amounts to precipitate. These operations were repeated 3 times for purification, thereby resulting in 85% yield of copolymer having a weight average molecular weight of about 8600. This copolymer, which had the structural units derived from the monomers of the following formula, was designated Resin A4a.

A

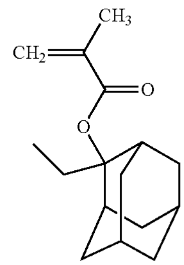

I

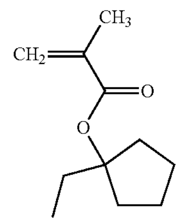

B

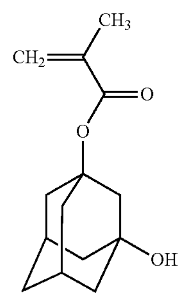

G

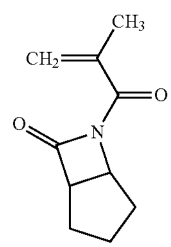

D

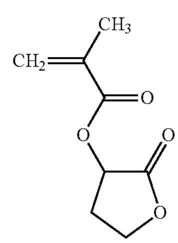

Example 5a

Synthesis of Resin A5a

Monomer A, monomer F, monomer B, monomer J and monomer D were mixed with molar ratio 25:18:3:9:45, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 76% yield of copolymer having a weight average molecular weight of about 8000. This copolymer, which had the structural units derived from the monomers of the following formula, was designated Resin A5a.

A

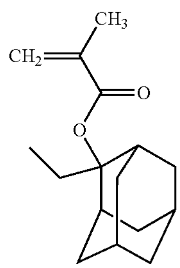

F

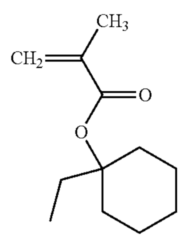

B

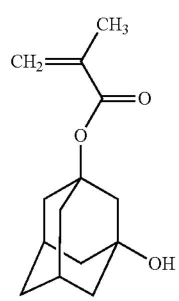

J

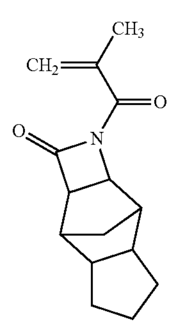

-continued

D

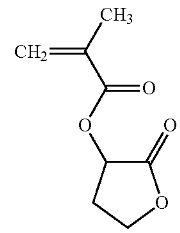

Example 6a

Synthesis of Resin A6a

Monomer A, monomer I, monomer B, monomer J and monomer D were mixed with molar ratio 25:14:10:8:43, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 70° C. After that, the reaction solution was poured into a mixture of methanol and ion-exchanged water in large amounts to precipitate. These operations were repeated 3 times for purification, thereby resulting in 84% yield of copolymer having a weight average molecular weight of about 8700. This copolymer, which had the structural units derived from the monomers of the following formula, was designated Resin A6a.

A

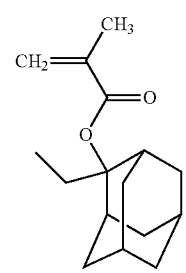

I

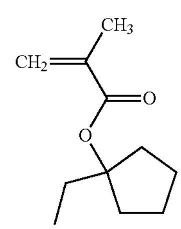

B

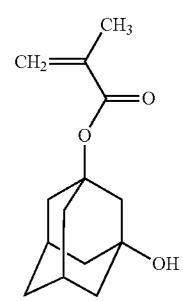

-continued

J

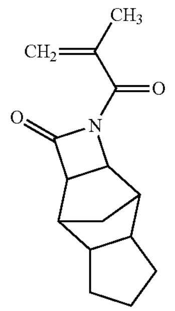

D

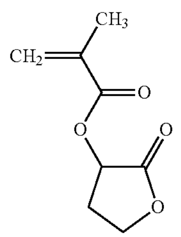

(Synthesis of Resin X1a)

Monomer E, monomer F, monomer B, monomer C and monomer D were mixed with molar ratio 28:14:6:21:31, and dioxane was added thereto in an amount equal to 1.5 weight times of the total amount of monomers. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 74% yield of copolymer having a weight average molecular weight of about 8500. This copolymer, which had the structural units derived from the monomers of the following formulae was designated Resin X1a

E

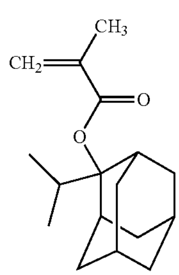

F

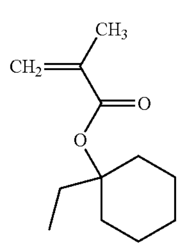

-continued

B

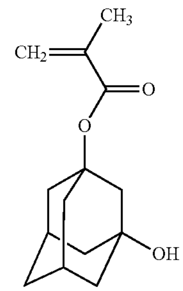

C

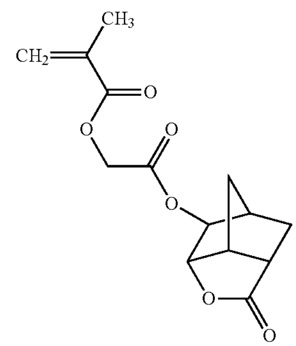

D

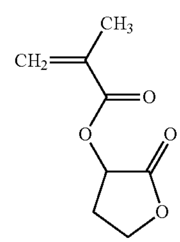

(Synthesis of Resin X2a)

Monomer K, monomer L, monomer H and monomer A were mixed with molar ratio 0.3:39:20.7:40, and dioxane was added thereto in an amount equal to 1.5 weight times of the total amount of monomers. Azobisisobutyronitrile and azobis (2,4-dimethylvaleronitrile) were added as initiators thereto in an amount of 0.9 mol % and 2.7 mol % respectively with respect to the entire amount of monomers, and the resultant mixture was heated for about 5 hours at 70° C. After that, the reaction solution was poured into a mixture of methanol and ion-exchanged water in large amounts to precipitate. These operations were repeated 3 times for purification, thereby resulting in 68% yield of copolymer having a weight average molecular weight of about 10000. This copolymer, which had the structural units derived from the monomers of the following formulae, was designated Resin X2a.

K

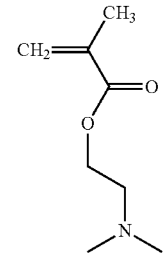

L

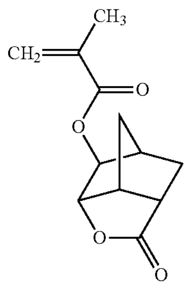

H

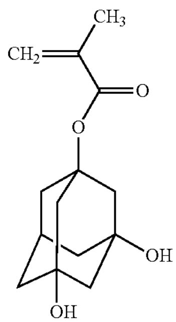

A

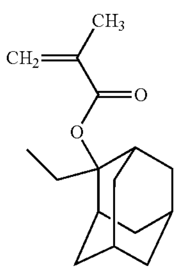

(Synthesis of Resin X3a)

Monomer L, monomer H and monomer A were mixed with molar ratio 40:20:40, and dioxane was added thereto in an amount equal to 1.5 weight times of the total amount of monomers. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 70° C. After that, the reaction solution was poured into a mixture of methanol and ion-exchanged water in large amounts to precipitate. These operations were repeated 3 times for purification, thereby resulting in 82% yield of copolymer having a weight average molecular weight of about 8800. This copolymer, which had the structural units derived from the monomers of the following formulae, was designated Resin X3a.

L

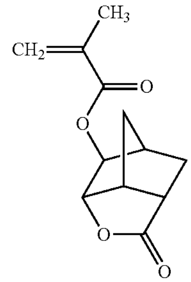

H

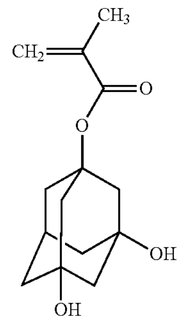

A

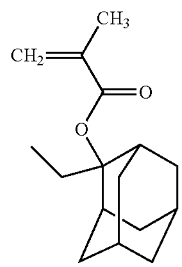

(A) Examples and Comparative Examples

The resist compositions were prepared by mixing and dissolving each of the components shown in Table 1, and then filtering through a fluororesin filter having 0.2 μm pore diameter.

TABLE 1

(Unit: parts)

| (A) | Resin | Acid Generator | Quencher | PB/PEB (° C.) |
|---|---|---|---|---|
| Ex. 7a | A1a = 10 | B1a = 0.70 | C1 = 0.065 | 95/95 |
| Ex. 8a | A2a = 10 | B1a = 0.70 | C1 = 0.065 | 95/95 |
| Ex. 9a | X1a/A2a = 5/5 | B1a = 0.70 | C1 = 0.065 | 95/95 |
| Ex. 10a | A1a = 10 | B2a = 0.70 | C1 = 0.065 | 95/95 |
| Ex. 11a | A1a = 10 | B3a = 0.70 | C1 = 0.065 | 95/95 |
| Ex. 12a | A3a = 10 | B2a = 0.70 | C1 = 0.065 | 105/105 |
| Ex. 13a | A4a = 10 | B2a = 0.70 | C1 = 0.065 | 105/105 |
| Ex. 14a | A5a = 10 | B2a = 0.70 | C1 = 0.065 | 105/105 |
| Ex. 15a | A6a = 10 | B2a = 0.70 | C1 = 0.065 | 105/105 |
| Ex. 16a | A3a = 10 | B1a/B2a = 0.20/0.50 | C1 = 0.065 | 105/105 |
| Ex. 17a | X1a/A3a = 5/5 | B4a = 0.70 | C1 = 0.065 | 105/105 |
| Ex. 18a | X3a/A3a = 5/5 | B4a = 0.70 | C1 = 0.065 | 105/105 |
| Comp. Ex. 1a | X2a/Xa3 = 5/5 | B4a = 0.70 | C1 = 0.065 | 105/105 |

TABLE 1-continued

<Acid generator>

B1a:

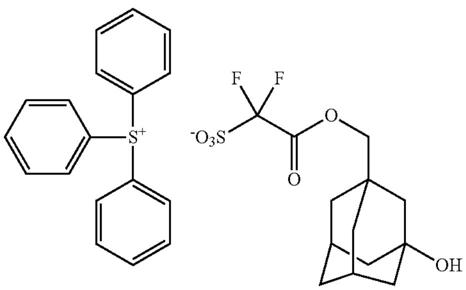

B2a:

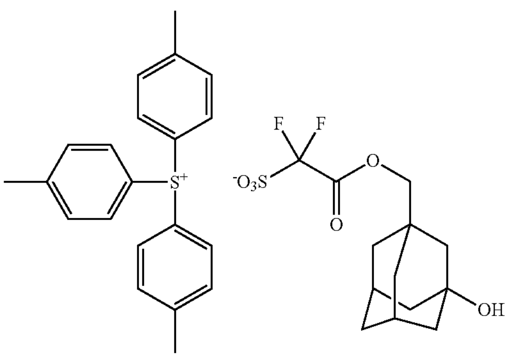

B3a:

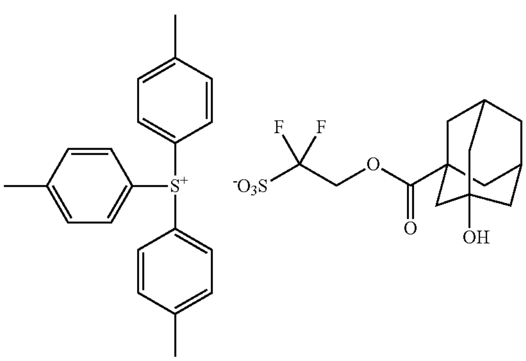

B4a: triphenylsulfoniumnonafluorobutanesulfonate

<Basic compound: Qencher>

C1: 2,6-diisopropylaniline
C2: triphenylimidazole

<Solvent of Resist composition>

| | |
|---|---|
| Propylene glycol monomethyl ether acetate | 265 parts |
| 2-Heptanone | 20 parts |
| Propylene glycol monomethyl ether | 20 parts |
| γ-butyrolactone | 3.5 parts |

A composition for an organic antireflective film ("ARC-29", by Nissan Chemical Co. Ltd.) was applied onto 12-inch silicon wafers and baked for 60 seconds at 205° C. to form a 78 nm thick organic antireflective film.

The above resist compositions were then applied thereon by spin coating so that the thickness of the resulting film became 85 nm after drying.

The obtained wafers were then pre-baked for 60 sec on a direct hot plate at the temperatures given in the "PB" column in Table 1.

Line and space patterns were then exposed through stepwise changes in exposure quantity using an ArF excimer stepper for immersion lithography ("XT: 1900Gi" by ASML Ltd.: NA=1.35, 3/4 Annular, X-Y deflection), on the wafers on which the resist film had thus been formed.

The exposure was followed by 60 seconds of post-exposure baking at the temperatures given in the "PEB" column in Table 1.

This was followed by 60 sec of puddle development with 2.38 wt % tetramethylammonium hydroxide aqueous solution.

Effective sensitivity was represented as the exposure amount at which a 50 nm line and space pattern resolved to 1:1 with the each resist film.

Shape evaluation: a 50 nm line and space pattern was observed using a scanning electron microscope. Top shape and footing shape that were satisfactorily close to rectangular were judged as 0, and it was judged as X when the top shape is rounded or close to a letter T shape, or when tailing was observed.

Focus margin (DOF) evaluation: for the effective sensitivity, when the focus fluctuated with a standard width as the range with a line width of 50 nm±5% (47.5 to 52.5 nm), a "○" was given when the DOF was ≥0.15 μm, and it received an "×" if the DOF was <0.15 μm.

Table 2 gives the there results.

TABLE 2

| | Shape | DOF |
|---|---|---|
| Ex. 7a | ○ | ○ |
| Ex. 8a | ○ | ○ |
| Ex. 9a | ○ | ○ |
| Ex. 10a | ○ | ○ |
| Ex. 11a | ○ | ○ |
| Ex. 12a | ○ | ○ |
| Ex. 13a | ○ | ○ |
| Ex. 14a | ○ | ○ |
| Ex. 15a | ○ | ○ |
| Ex. 16a | ○ | ○ |
| Ex. 17a | ○ | ○ |
| Ex. 18a | ○ | ○ |
| Comp. Ex. 1a | x | x |

Specific examples of monomers used in the Examples and Comparative Examples include monomers below.

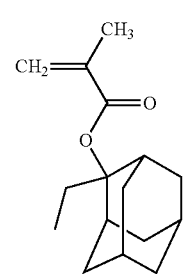

A

-continued
B
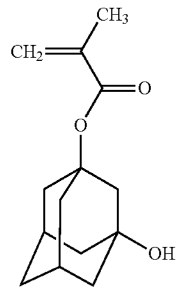
C
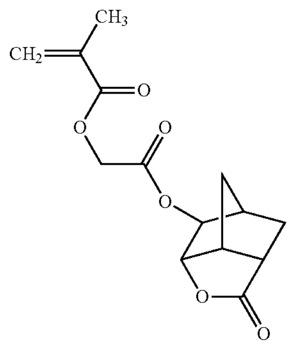
D
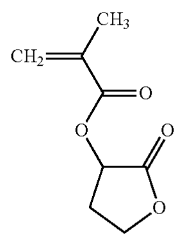
E
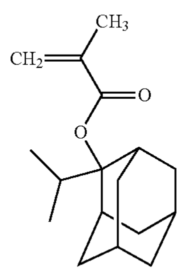
F
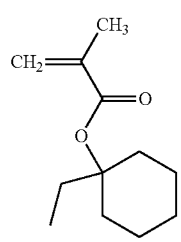
G
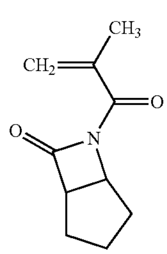
-continued
Ib
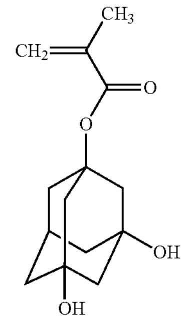
Jb
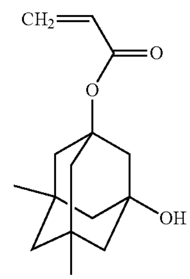
Kb
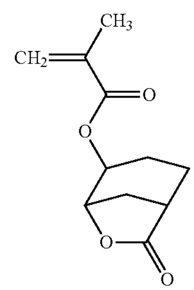
Lb
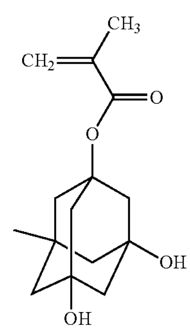
Mb
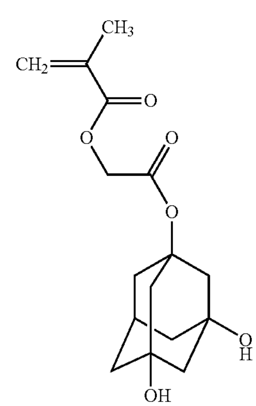

-continued

Nb

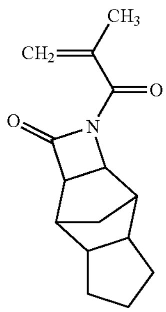

Example 1b

Synthesis of Resin A1b

Monomer E, monomer F, monomer Ib, monomer G, monomer C and monomer D were mixed with molar ratio 30:15:5:5:15:30, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 73° C. After that, the reaction solution was poured into a mixture of methanol and ion-exchanged water in large amounts to precipitate. These operations were repeated 3 times for purification, thereby resulting in 76% yield of copolymer having a weight average molecular weight of about 7200. This copolymer, which had the structural units derived from the monomers of the following formula, was designated Resin A1b.

E′

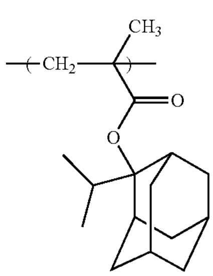

F′

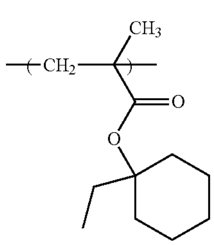

-continued

Ib′

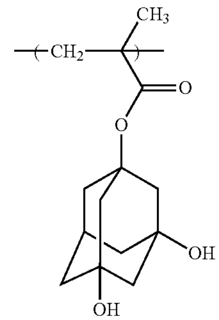

G′

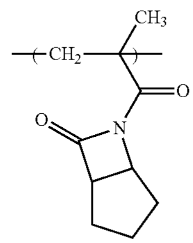

C′

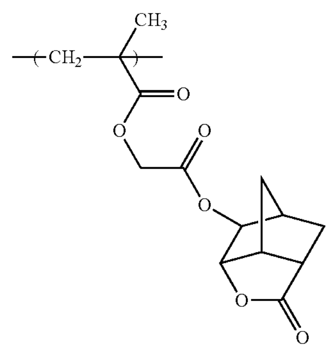

D′

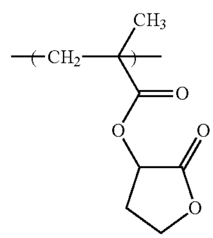

Example 2b

Synthesis of Resin A2b

Monomer E, monomer F, monomer Ib, monomer G and monomer D were mixed with molar ratio 28:14:8:7:43, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 72% yield of copolymer having a weight average molecular weight of about 7400. This copolymer, which had the structural units derived from the monomers of the following formula, was designated Resin A2b.

E'

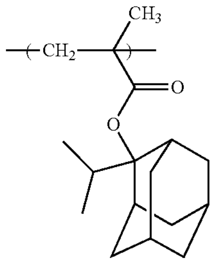

F'

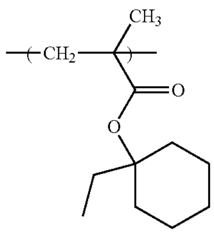

Ib'

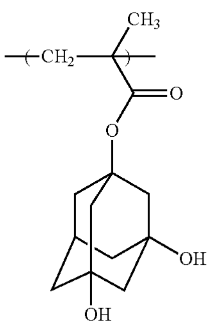

G'

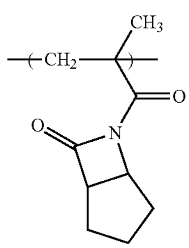

D'

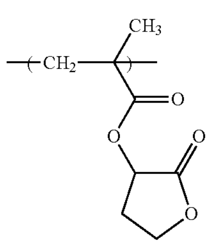

Example 3b

Synthesis of Resin A3b

Monomer A, monomer F, monomer Ib, monomer G, monomer C and monomer D were mixed with molar ratio 32:12:5:6:15:30, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 70% yield of copolymer having a weight average molecular weight of about 7000. This copolymer, which had the structural units derived from the monomers of the following formula, was designated Resin A3b.

A'

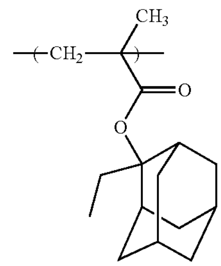

F'

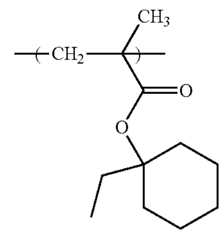

Ib'

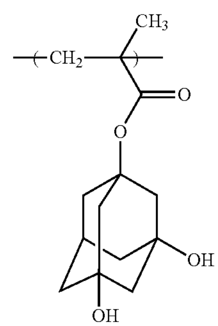

G'

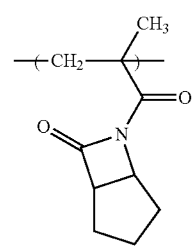

C'

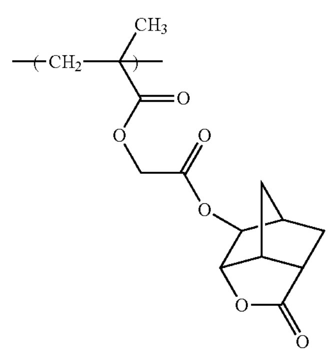

-continued

D′

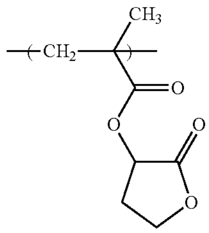

Example 4b

Synthesis of Resin A4b

Monomer A, monomer F, monomer Lb, monomer G, monomer C and monomer D were mixed with molar ratio 32:12:5:6:15:30, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 68% yield of copolymer having a weight average molecular weight of about 7200. This copolymer, which had the structural units derived from the monomers of the following formula, was designated Resin A4b.

A′

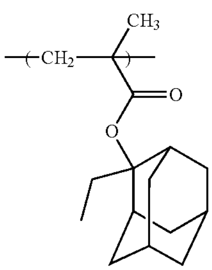

F′

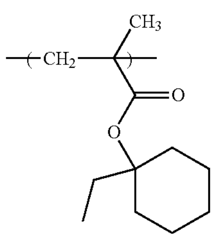

Lb′

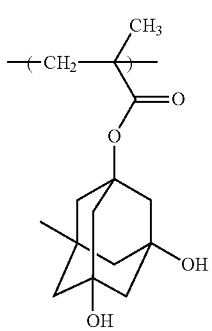

-continued

G′

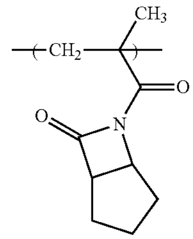

C′

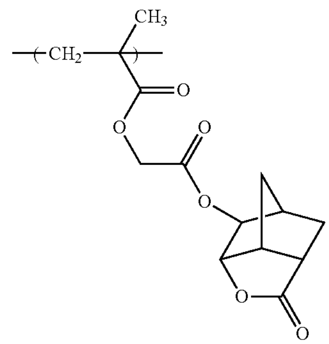

D′

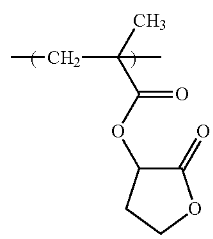

Example 5b

Synthesis of Resin A5b

Monomer A, monomer F, monomer Mb, monomer G, monomer C and monomer D were mixed with molar ratio 32:12:5:6:15:30, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 65% yield of copolymer having a weight average molecular weight of about 6900. This copolymer, which had the structural units derived from the monomers of the following formula, was designated Resin A5b.

A′

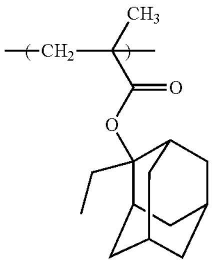

F′

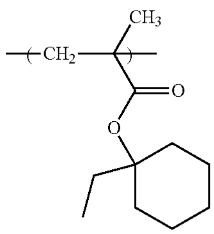

Mb′

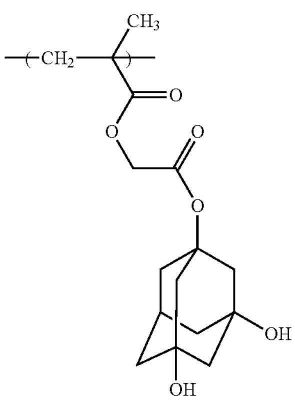

G′

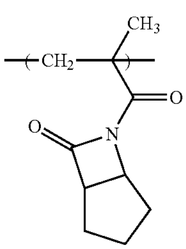

C′

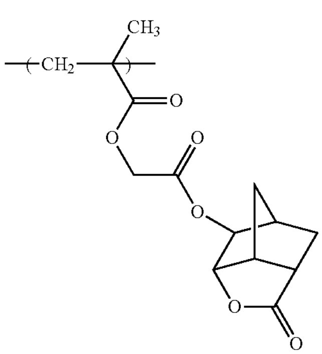

-continued

D′

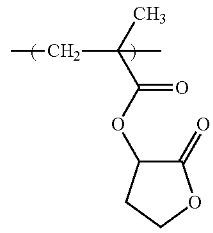

Example 6b

Synthesis of Resin A6b

Monomer A, monomer F, monomer Ib, monomer Nb, monomer C and monomer D were mixed with molar ratio 32:12:5:6:15:30, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 62% yield of copolymer having a weight average molecular weight of about 7300. This copolymer, which had the structural units derived from the monomers of the following formula, was designated Resin A6b.

A′

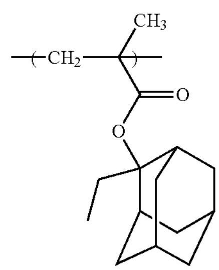

F′

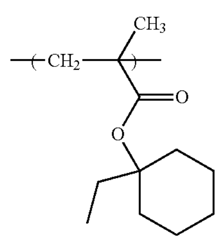

Ib′

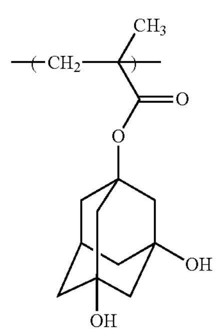

-continued

Nb'

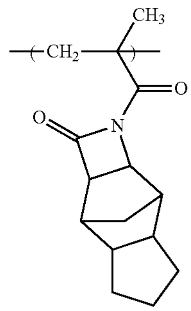

C'

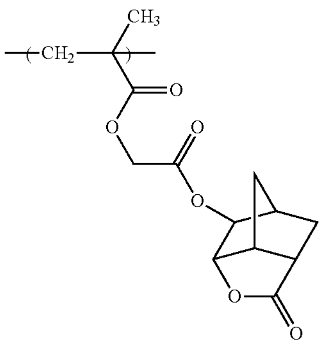

D'

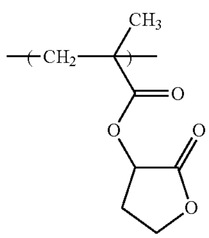

(Synthesis of Resin X1b)

Monomer A, monomer B and monomer D were mixed with molar ratio 50:25:25, and dioxane was added thereto in an amount equal to 1.5 weight times of the total amount of monomers. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 77° C. After that, the reaction solution was poured into a mixture of methanol and ion-exchanged water in large amounts to precipitate. These operations were repeated 3 times for purification, thereby resulting in 55% yield of copolymer having a weight average molecular weight of about 8100. This copolymer, which had the structural units derived from the monomers of the following formulae, was designated Resin X1b.

A'

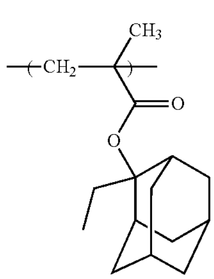

-continued

B'

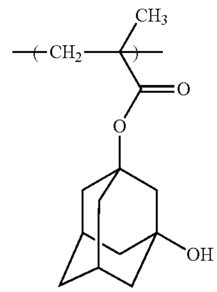

D'

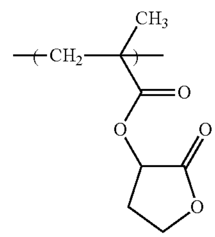

(Synthesis of Resin X2b)

Monomer A, monomer Kb, monomer Ib and monomer Jb were mixed with molar ratio 40:25:8:27, and dioxane was added thereto in an amount equal to 1.2 weight times of the total amount of monomers. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 70° C. After that, the reaction solution was poured into a mixture of methanol and ion-exchanged water in large amounts to precipitate. These operations were repeated 3 times for purification, thereby resulting in 65% yield of copolymer having a weight average molecular weight of about 10000. This copolymer, which had the structural units derived from the monomers of the following formulae, was designated Resin X2b.

A'

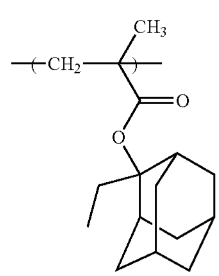

Kb'

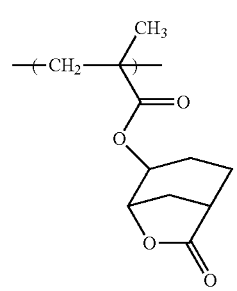

-continued

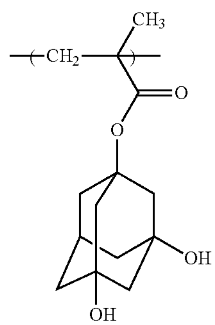

Ib'

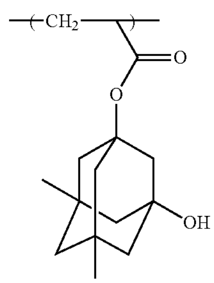

Jb'

(B) Examples and Comparative Examples

The resist compositions were prepared by mixing and dissolving each of the components shown in Table 3, and then filtering through a fluororesin filter having 0.2 μm pore diameter.

TABLE 3

(Unit: parts)

| (B) | Resin | Acid Generator | Quencher | PB/PEB (° C.) |
|---|---|---|---|---|
| Ex. 7b | A1b = 10 | B1b = 0.70 | C1 = 0.065 | 95/95 |
| Ex. 8b | A2b = 10 | B1b = 0.70 | C1 = 0.065 | 95/95 |
| Ex. 9b | A3b = 10 | B1b = 0.70 | C1 = 0.065 | 105/105 |
| Ex. 10b | A4b = 10 | B1b = 0.70 | C1 = 0.065 | 105/105 |
| Ex. 11b | A5b = 10 | B1b = 0.70 | C1 = 0.065 | 105/105 |
| Ex. 12b | A6b = 10 | B1b = 0.70 | C1 = 0.065 | 105/105 |
| Ex. 13b | A3b = 10 | B2b/B3b = 0.10/0.15 | C2 = 0.020 | 105/105 |
| Comp. Ex. 1b | X1b = 10 | B1b = 0.70 | C1 = 0.065 | 105/105 |
| Comp. Ex. 2b | X2b/10 | B2b/B3b = 0.10/0.15 | C2/0.020 | 105/105 |

<Acid generator>

B1b:

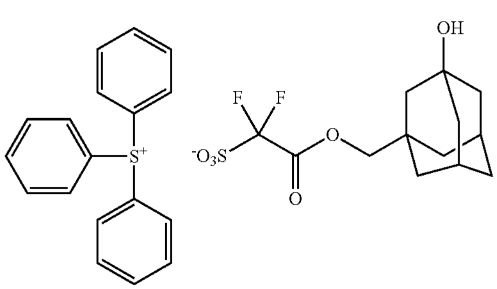

B2b: triphenylsulfonium perfluorooctanesulfonate
B3b: 1-(2-oxo-2-phenylethyl)tetrahydrothiophenium perfluorobutanesulfonate TABLE 3-continued <Basic compound: Qencher>

C1: 2,6-diisopropylaniline,

<Solvent of Resist composition>

| | |
|---|---|
| Propylene glycol monomethyl ether acetate | 265 parts |
| 2-Heptanone | 20 parts |
| Propylene glycol monomethyl ether | 20 parts |
| γ-butyrolactone | 3.5 parts |

A composition for an organic antireflective film ("ARC-29", by Nissan Chemical Co. Ltd.) was applied onto 12-inch silicon wafers and baked for 60 seconds at 205° C. to form a 78 nm thick organic antireflective film.

The above resist compositions were then applied thereon by spin coating so that the thickness of the resulting film became 85 nm after drying.

The obtained wafers were then pre-baked for 60 sec on a direct hot plate at the temperatures given in the "PB" column in Table 3.

Line and space patterns were then emersion-exposed through stepwise changes in exposure quantity using an ArF excimer stepper for immersion lithography ("XT: 1900Gi" by ASML Ltd.: NA=1.35, 3/4 Annular, X-Y deflection), on the wafers on which the resist film had thus been formed.

The exposure was followed by 60 seconds of post-exposure baking at the temperatures given in the "PEB" column in Table 3.

This was followed by 60 sec of puddle development with 2.38 wt % tetramethylammonium hydroxide aqueous solution.

Effective sensitivity was represented as the exposure amount at which a 50 nm line and space pattern resolved to 1:1 with the each resist film.

Evaluation of Resolution: a resist pattern exposed as effective sensitivity was observed with a scanning electron microscope, these were evaluated with a "○" for having more resolution than 45 nm, and with an "×" for not having as much resolution as 45 nm or for having more resolution than 45 nm but a fallen pattern was observed.

Exposure Latitude (EL): in the range of exposure amount of Effective sensitivity±10%, the line widths of the 50 nm-line and space pattern at the exposure amounts were plotted, and found the absolute value of the inclination of an obtained line. A "○" was given when the absolute value of the inclination was 1.3 nm/(mJ/cm$^2$) or less, a and it received an "×" if the absolute value of inclination of the obtained line was more than 1.3 nm/(mJ/cm$^2$).

Table 4 gives the there results.

TABLE 4

| (B) | Resolution | EL |
|---|---|---|
| Ex. 7b | ○ | ○(1.20) |
| Ex. 8b | ○ | ○(1.21) |
| Ex. 9b | ○ | ○(1.12) |
| Ex. 10b | ○ | ○(1.13) |
| Ex. 11b | ○ | ○(1.18) |
| Ex. 12b | ○ | ○(1.25) |
| Ex. 13b | ○ | ○(1.30) |
| Comp. Ex. 1b | x | x(1.35) |
| Comp. Ex. 2b | x | x(1.48) |

Specific examples of monomers used in the Examples and Comparative Examples include monomers below.

A

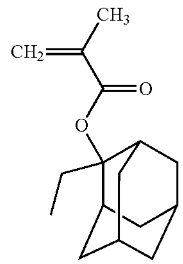

B

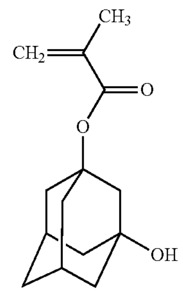

D

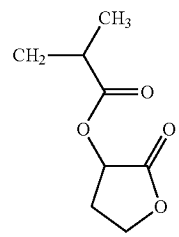

E

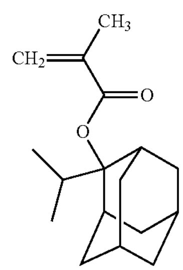

F

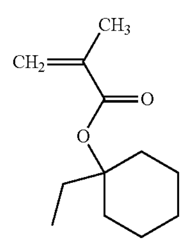

G

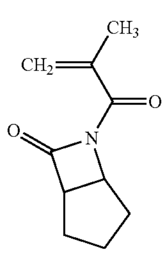

-continued

Hc

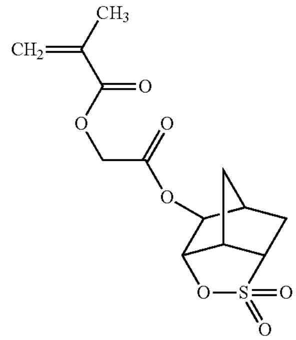

Ic

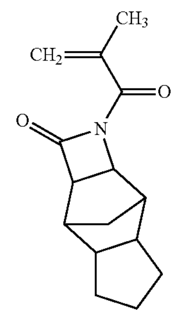

Example 1c

Synthesis of Resin A 1c

Monomer A, monomer F, monomer B, monomer G, monomer Hc and monomer D were mixed with molar ratio 31:7:8:5:5:44, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 73° C. After that, the reaction solution was poured into a mixture of methanol and ion-exchanged water in large amounts to precipitate. These operations were repeated 3 times for purification, thereby resulting in 76% yield of copolymer having a weight average molecular weight of about 7200. This copolymer, which had the structural units derived from the monomers of the following formula, was designated Resin A1c.

A′

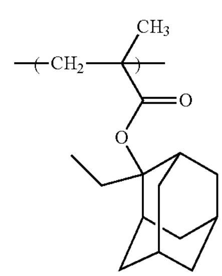

-continued

F′

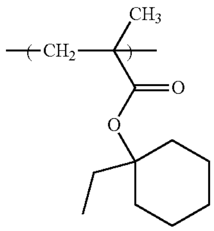

B′

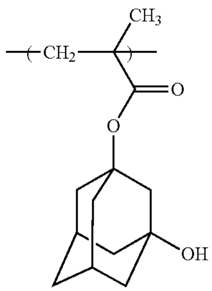

G′

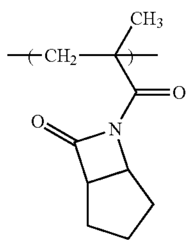

Hc′

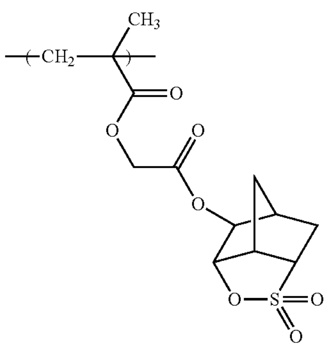

D′

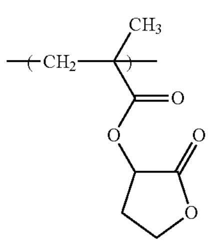

Example 2c

Synthesis of Resin A2c

Monomer E, monomer F, monomer B, monomer G, monomer Hc and monomer D were mixed with molar ratio 28:10:8:5:5:44, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 72% yield of copolymer having a weight average molecular weight of about 7400. This copolymer, which had the structural units derived from the monomers of the following formula, was designated Resin A2c.

E′

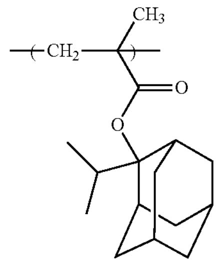

F′

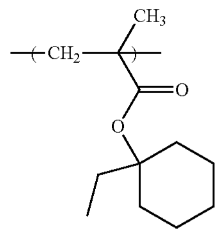

B′

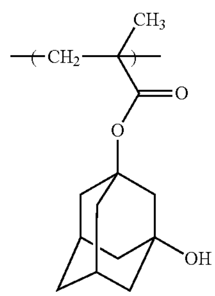

G′

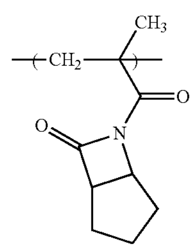

Hc′

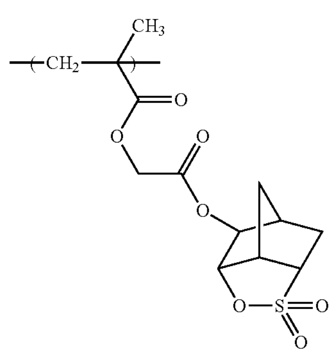

-continued

D'

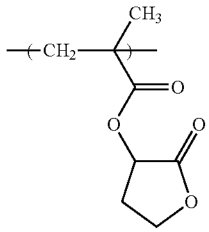

Example 3c

Synthesis of Resin A3c

Monomer A, monomer F, monomer B, monomer Ic, monomer Hc and monomer D were mixed with molar ratio 31:7:8:5:5:44, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 70% yield of copolymer having a weight average molecular weight of about 7000. This copolymer, which had the structural units derived from the monomers of the following formula, was designated Resin A3c.

A'

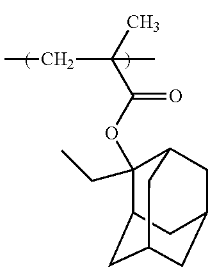

F'

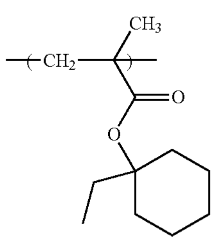

B'

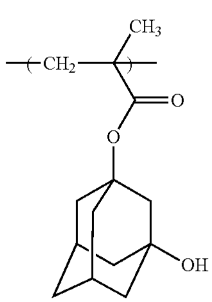

-continued

Ic'

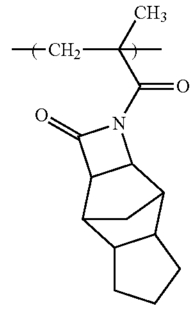

Hc'

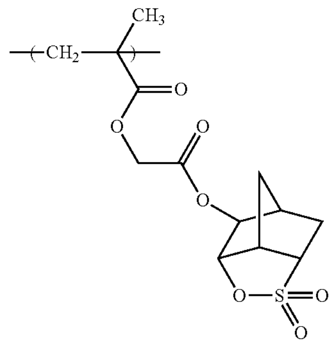

D'

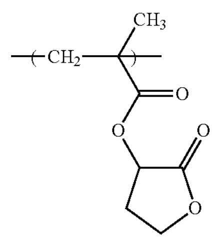

(Synthesis of Resin X1c)

Monomer A, monomer B and monomer D were mixed with molar ratio 50:25:25, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 77° C. After that, the reaction solution was poured into a mixture of methanol and ion-exchanged water in large amounts to precipitate. These operations were repeated 3 times for purification, thereby resulting in 55% yield of copolymer having a weight average molecular weight of about 8100. This copolymer, which had the structural units derived from the monomers of the following formula, was designated Resin X1c.

A'

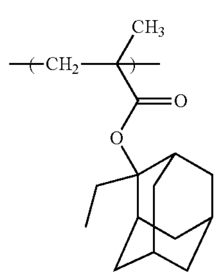

-continued

B′

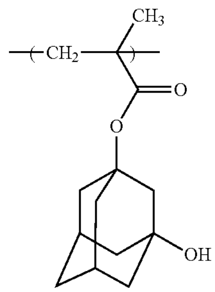

D′

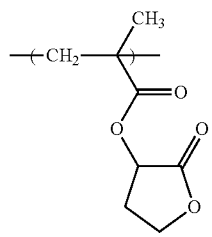

(C) Examples and Comparative Examples

The resist compositions were prepared by mixing and dissolving each of the components shown in Table 5, and then filtering through a fluororesin filter having 0.2 μm pore diameter.

TABLE 5

| (Unit: parts) | | | | |
|---|---|---|---|---|
| (C) | Resin | Acid Generator | Quencher | PB/PEB (° C.) |
| Ex. 4c | A1c = 10 | B1c = 0.70 | C1 = 0.065 | 105/105 |
| Ex. 5c | A2c = 10 | B1c = 0.70 | C1 = 0.065 | 95/95 |
| Ex. 6c | A3c = 10 | B1c = 0.70 | C1 = 0.065 | 105/105 |
| Ex. 7c | A1c = 10 | B2c = 0.70 | C1 = 0.065 | 105/105 |
| Comp. Ex. 1c | X1c = 10 | B1c = 0.70 | C1 = 0.065 | 105/105 |

<Acid generator>

B1c:

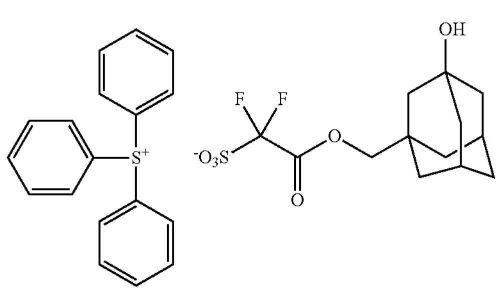

TABLE 5-continued

B2c:

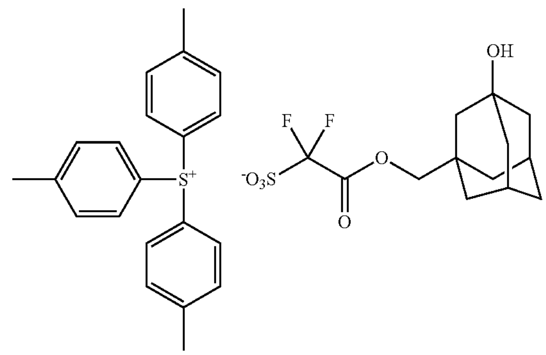

<Basic compound: Qencher>

C1: 2,6-diisopropylaniline,

<Solvent of Resist composition>

| | |
|---|---|
| Propylene glycol monomethyl ether acetate | 265 parts |
| 2-Heptanone | 20 parts |
| Propylene glycol monomethyl ether | 20 parts |
| γ-butyrolactone | 3.5 parts |

A composition for an organic antireflective film ("ARC-29", by Nissan Chemical Co. Ltd.) was applied onto 12-inch silicon wafers and baked for 60 seconds at 205° C. to form a 78 nm thick organic antireflective film.

The above resist compositions were then applied thereon by spin coating so that the thickness of the resulting film became 85 nm after drying.

The obtained wafers were then pre-baked for 60 sec on a direct hot plate at the temperatures given in the "PB" column in Table 5.

Line and space patterns were then exposed through stepwise changes in exposure quantity using an ArF excimer stepper for immersion lithography ("XT: 1900Gi" by ASML Ltd.: NA=1.35, 3/4 Annular, X-Y deflection), on the wafers on which the resist film had thus been formed.

The exposure was followed by 60 seconds of post-exposure baking at the temperatures given in the "PEB" column in Table 5.

This was followed by 60 sec of puddle development with 2.38 wt % tetramethylammonium hydroxide aqueous solution.

Effective sensitivity was represented as the exposure amount at which a 50 nm line and space pattern resolved to 1:1 with the each resist film.

Evaluation of Resolution: a resist pattern exposed as effective sensitivity was observed with a scanning electron microscope, these were evaluated with a "○" for having more resolution than 45 nm, and with an "×" for not having as much resolution as 45 nm.

Focus margin (DOF) evaluation: for the effective sensitivity, when the focus fluctuated with a standard width as the range with a line width of 50 nm±5% (47.5 to 52.5 nm), a "○" was given when the DOF was 0.15 μm, and it received an "×" if the DOF was <0.15 μm.

Exposure Latitude (EL): in the range of exposure amount of Effective sensitivity±10%, the line widths of the 50 nm-line and space pattern at the exposure amounts were plotted, and found the absolute value of the inclination of the obtained line. A "○" was given when the absolute value of the inclination was 1.3 nm/(mJ/cm$^2$) or less, a and it received an "×" if the absolute value of inclination of the obtained line was more than 1.3 nm/(mJ/cm$^2$).

Table 6 gives the there results.

TABLE 6

| | Resolution | DOF | EL |
|---|---|---|---|
| Ex. 4c | ○ | ○(0.21) | ○(1.15) |
| Ex. 5c | ○ | ○(0.18) | ○(1.23) |
| Ex. 6c | ○ | ○(0.15) | ○(1.28) |
| Ex. 7c | ○ | ○(0.24) | ○(1.12) |
| Comp. Ex. 1c | x | x(0.06) | x(1.35) |

Specific examples of monomers used in the Examples and Comparative Examples include monomers below.

A

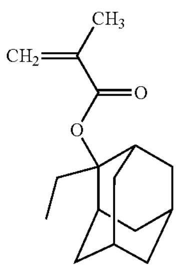

B

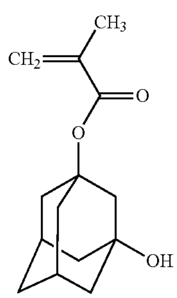

D

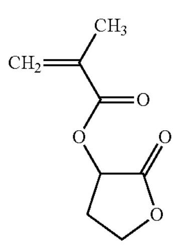

E

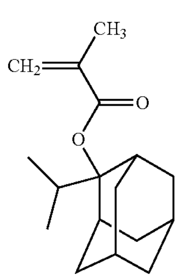

-continued

F

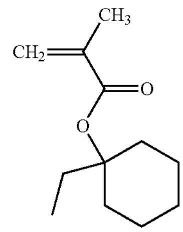

Gd

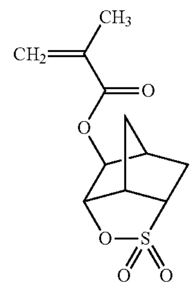

Hd

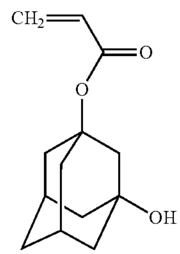

Id

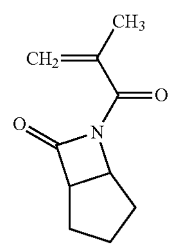

Jd

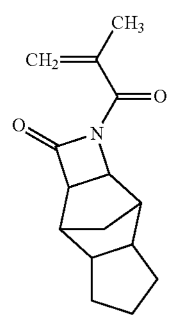

Example 1d

Synthesis of Resin A 1d

Monomer A, monomer F, monomer B, monomer Id, monomer Gd and monomer D were mixed with molar ratio 31:7:8:5:5:44, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 79% yield of copolymer having a weight average molecular weight of about 7600. This copolymer, which had the structural units derived from the monomers of the following formula, was designated Resin A1d.

A′

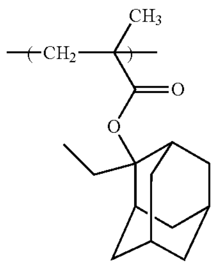

F′

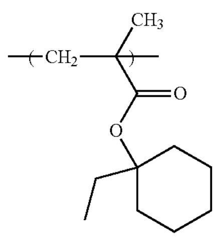

B′

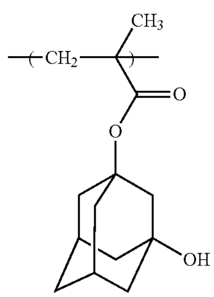

Id′

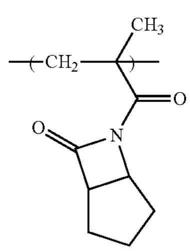

Gd′

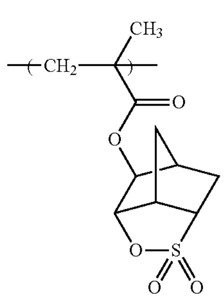

-continued

D′

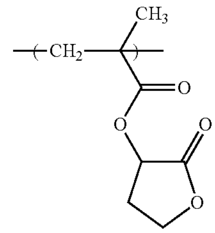

Example 2d

Synthesis of Resin A2d

Monomer A, monomer F, monomer B, monomer Id, monomer Gd and monomer D were mixed with molar ratio 28:10:8:5:5:44, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 75% yield of copolymer having a weight average molecular weight of about 7500. This copolymer, which had the structural units derived from the monomers of the following formula, was designated Resin A2d.

E′

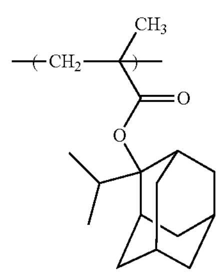

F′

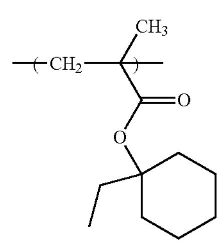

B′

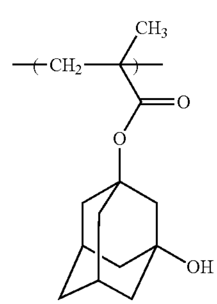

-continued

Id'

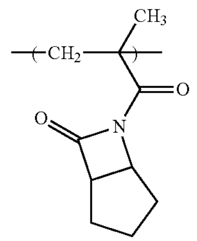

Gd'

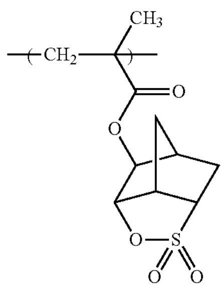

D'

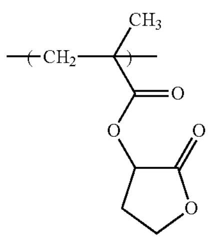

Example 3d

Synthesis of Resin A3d

Monomer A, monomer Hd, monomer Gd and monomer Id were mixed with molar ratio 45:10:35:10, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 75% yield of copolymer having a weight average molecular weight of about 7500. This copolymer, which had the structural units derived from the monomers of the following formula, was designated Resin A3d.

A'

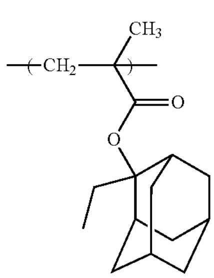

-continued

H'

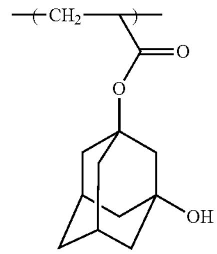

Gd'

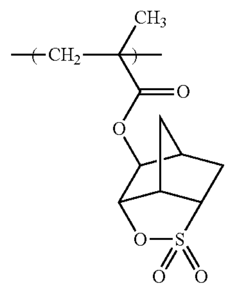

Id'

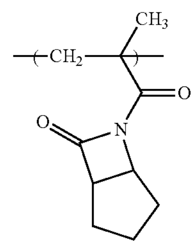

Example 4d

Synthesis of Resin A4d

Monomer A, monomer F, monomer B, monomer Jd, monomer Gd and monomer D were mixed with molar ratio 31:7:8:5:5:44, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 79% yield of copolymer having a weight average molecular weight of about 7200. This copolymer, which had the structural units derived from the monomers of the following formula, was designated Resin A4d.

A'

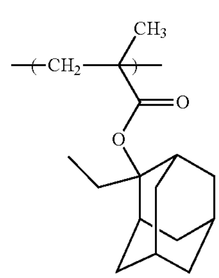

-continued

F'

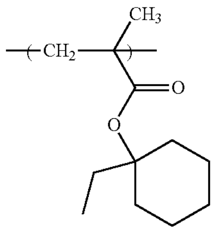

B'

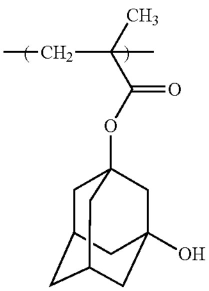

Jd'

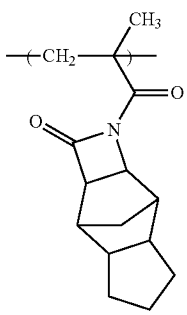

Gd'

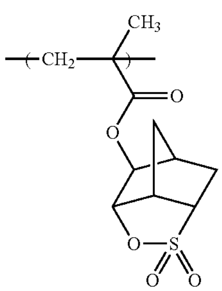

D'

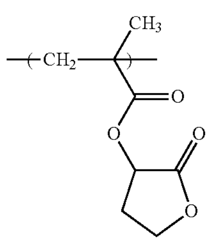

(Synthesis of Resin X1d)

Methylethylketone in an amount equal to 1.7 weight times of the total amount of monomers was raised to the temperature at 75° C. After that, monomer Gd, monomer A and monomer Hd were mixed with molar ratio 31.6:52.6:15.8, and a mixture solution of methylethyleketone in an amount equal to 4.0 weight times of the total amount of monomers and V-601 (Wako Pure Chemical Industries, Ltd.) in an amount of 5 mol % with respect to the entire amount of monomers were added thereto for 2 hours, and the obtained mixture was heated for about 4 hours at 75° C. And then, the reaction solution was poured into a mixture of methanol and ion-exchanged water in large amounts to precipitate. These operations were repeated 3 times for purification, thereby resulting in 59% yield of copolymer having a weight average molecular weight of about 7300. This copolymer, which had the structural units derived from the monomers of the following formula, was designated Resin X1d.

Gd'

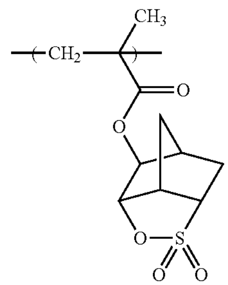

A'

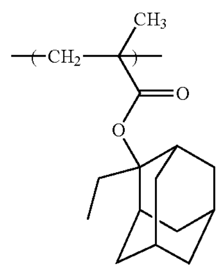

Hd'

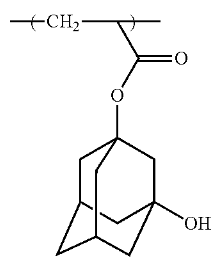

(D) Examples and Comparative Examples

The resist compositions were prepared by mixing and dissolving each of the components shown in Table 7, and then filtering through a fluororesin filter having 0.2 μm pore diameter.

TABLE 7

(Unit: parts)

| (D) | Resin | Acid Generator | Quencher | PB/PEB (° C.) |
|---|---|---|---|---|
| Ex. 5d | A1d = 10 | B1d = 0.70 | C1 = 0.065 | 100/95 |
| Ex. 6d | A2d = 10 | B1d = 0.70 | C1 = 0.065 | 100/95 |
| Ex. 7d | A3d = 10 | B1d = 0.70 | C1 = 0.065 | 100/95 |
| Ex. 8d | A4d = 10 | B1d = 0.70 | C1 = 0.065 | 100/95 |
| Ex. 9d | A1d = 10 | B2d = 0.70 | C1 = 0.065 | 100/95 |
| Ex. 10d | A1d = 10 | B3d = 0.70 | C2 = 0.1 | 100/95 |
| Comp. Ex. 1d | X1d = 10 | B3d = 0.70 | C2 = 0.1 | 100/95 |

TABLE 7-continued

<Acid generator>

B1d:

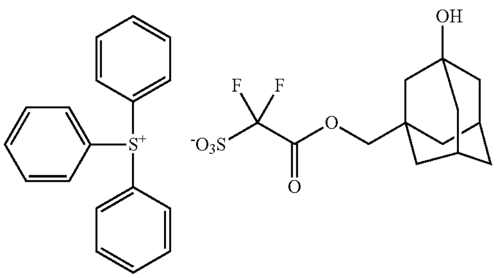

B2d:

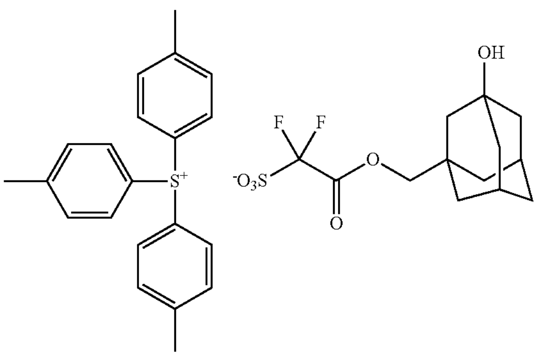

B3d:

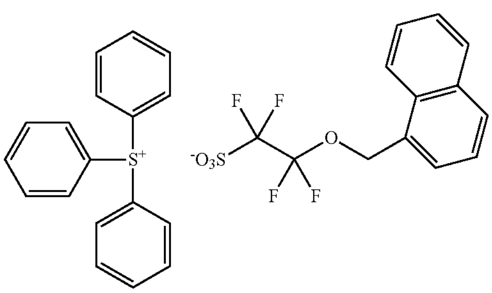

<Basic compound: Qencher>

C1: 2,6-diisopropylaniline,
C2: tri-n-pentylamine

<Solvent of Resist composition>

| | |
|---|---|
| Propylene glycol monomethyl ether acetate | 265 parts |
| 2-Heptanone | 20 parts |
| Propylene glycol monomethyl ether | 20 parts |
| γ-butyrolactone | 3.5 parts |

A composition for an organic antireflective film ("ARC-29", by Nissan Chemical Co. Ltd.) was applied onto 12-inch silicon wafers and baked for 60 seconds at 205° C. to form a 78 nm thick organic antireflective film.

The above resist compositions were then applied thereon by spin coating so that the thickness of the resulting film became 85 nm after drying.

The obtained wafers were then pre-baked for 60 sec on a direct hot plate at the temperatures given in the "PB" column in Table 7.

Line and space patterns were then exposed through step-wise changes in exposure quantity using an ArF excimer stepper for immersion lithography ("XT: 1900Gi" by ASML Ltd.: NA=1.35, 3/4 Annular, X-Y deflection), on the wafers on which the resist film had thus been formed.

The exposure was followed by 60 seconds of post-exposure baking at the temperatures given in the "PEB" column in Table 7.

This was followed by 60 sec of puddle development with 2.38 wt % tetramethylammonium hydroxide aqueous solution.

Effective sensitivity was represented as the exposure amount at which a 50 nm line and space pattern resolved to 1:1 with the each resist film.

Focus margin (DOF) evaluation: for the effective sensitivity, when the focus fluctuated with a standard width as the range with a line width of 50 nm±5% (47.5 to 52.5 nm), a "○○" was given when the DOF was ≥0.17 μm, a "○" was given when the DOF was ≥0.09 μm, and it received an "×" if the DOF was <0.09 μm.

Exposure Latitude (EL): in the range of exposure amount of Effective sensitivity±10%, the line widths of the 50 nm-line and space pattern at the exposure amounts were plotted, and found the absolute value of the inclination of the obtained line. A "○○" was given when the absolute value of the inclination was 1.1 nm/(mJ/cm$^2$) or less, a "○" was given when the absolute value of the inclination was 1.3 nm/(mJ/cm$^2$) or less, a and it received an "×" if the absolute value of gradient of the obtained line was more than 1.3 nm/(mJ/cm$^2$).

Table 8 gives the there results.

TABLE 8

| (D) | DOF | EL |
|---|---|---|
| Ex. 5d | ○○(0.21) | ○○(1.12) |
| Ex. 6d | ○○(0.18) | ○○(1.14) |
| Ex. 7d | ○(0.15) | ○(1.23) |
| Ex. 8d | ○(0.15) | ○(1.26) |
| Ex. 9d | ○○(0.24) | ○○(1.08) |
| Ex. 10d | ○(0.09) | ○(1.29) |
| Comp. Ex. 1d | x(0.03) | x(1.42) |

Specific examples of monomers used in the Examples and Comparative Examples include monomers below.

A

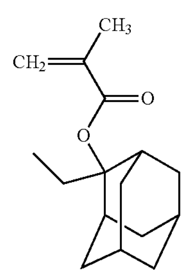

B

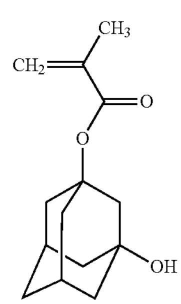

-continued

D

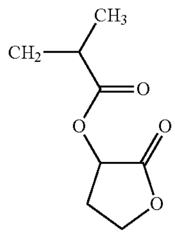

E

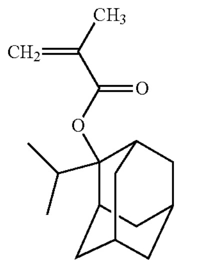

He

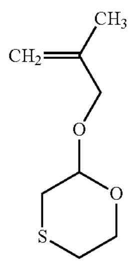

Ide

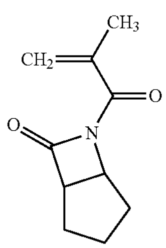

Je

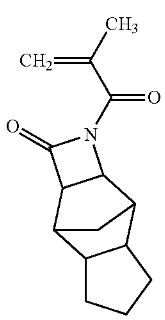

Ke

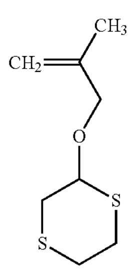

-continued

Le

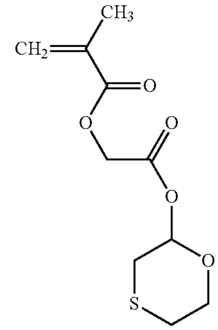

Example 1e

Synthesis of Resin A 1e

Monomer E, monomer He, monomer B, monomer Ie and monomer D were mixed with molar ratio 31:10:12:10:38, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 70% yield of copolymer having a weight average molecular weight of about 6900. This copolymer, which had the structural units derived from the monomers of the following formula, was designated Resin A1e.

E′

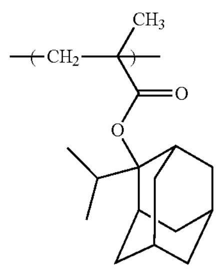

He′

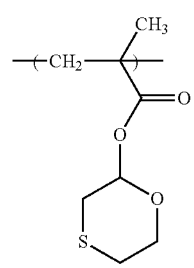

B′

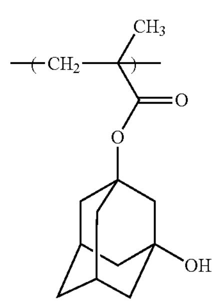

-continued

Ie'

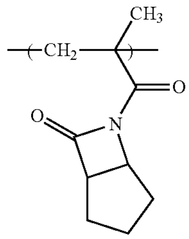

D'

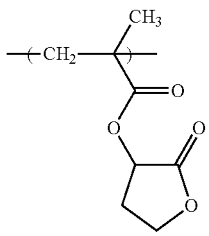

Example 2e

Synthesis of Resin A2e

Monomer He, monomer B, monomer Ie and monomer D were mixed with molar ratio 37.5:15:10:37.5, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 70% yield of copolymer having a weight average molecular weight of about 6900. This copolymer, which had the structural units derived from the monomers of the following formula, was designated Resin A2e.

He'

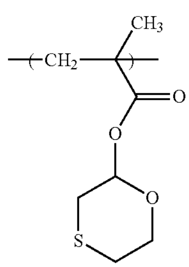

B'

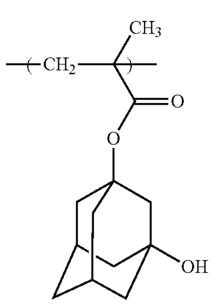

-continued

Ie'

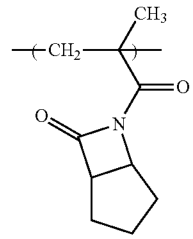

D'

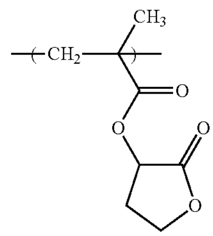

Example 3e

Synthesis of Resin A3e

Monomer A, monomer He, monomer B, monomer Ie and monomer D were mixed with molar ratio 32:12:8:10:38, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 75% yield of copolymer having a weight average molecular weight of about 7200. This copolymer, which had the structural units derived from the monomers of the following formula, was designated Resin A3e.

A'

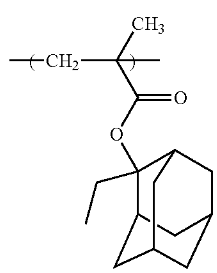

He'

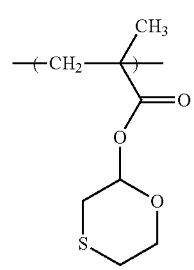

-continued

B'

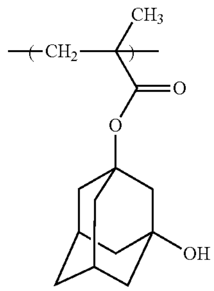

Ie'

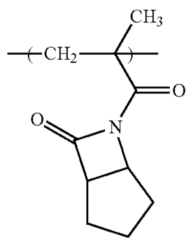

D'

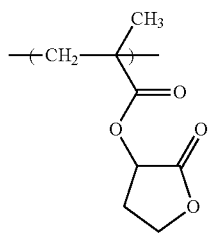

Example 4e

Synthesis of Resin A4e

Monomer A, monomer He, monomer B, monomer Je and monomer D were mixed with molar ratio 32:12:8:10:38, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 68% yield of copolymer having a weight average molecular weight of about 7300. This copolymer, which had the structural units derived from the monomers of the following formula, was designated Resin A4e.

A'

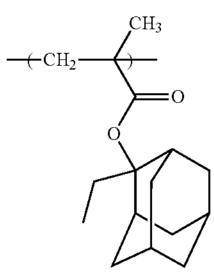

-continued

He'

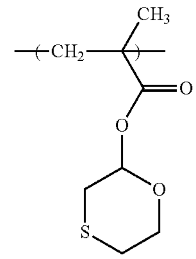

B'

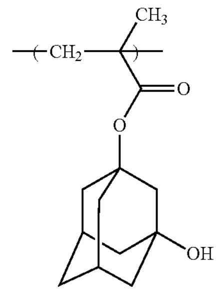

Je'

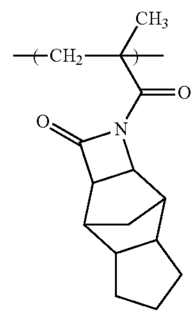

D'

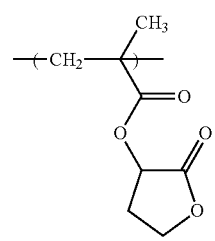

Example 5e

Synthesis of Resin A5e

Monomer A, monomer Ke, monomer B, monomer Ie and monomer D were mixed with molar ratio 32:12:8:10:38, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 72% yield of copolymer having a weight average molecular weight of about 6900. This copolymer, which had the structural units derived from the monomers of the following formula, was designated Resin A5e.

A′

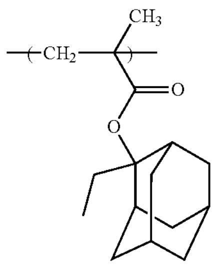

Ke′

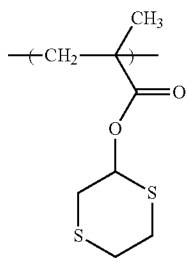

B′

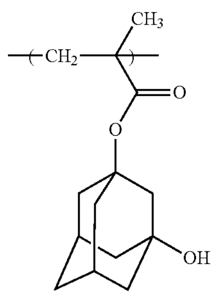

Ie′

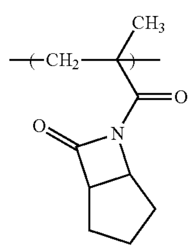

D′

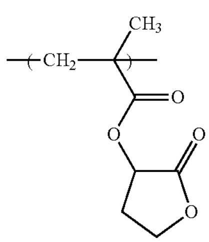

Example 6e

Synthesis of Resin A6e

Monomer A, monomer Le, monomer B, monomer Ie and monomer D were mixed with molar ratio 32:12:8:10:38, and dioxane was added thereto in an amount equal to 1.5 weight times of the total amount of monomers to obtain a solution. Azobisisobutyronitrile and azobis(2,4-dimethylvaleronitrile) were added as initiators thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, thereby resulting in 70% yield of copolymer having a weight average molecular weight of about 6800. This copolymer, which had the structural units derived from the monomers of the following formula, was designated Resin Abe.

A′

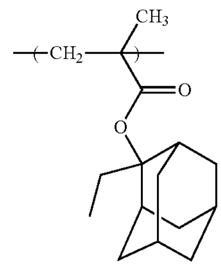

Le′

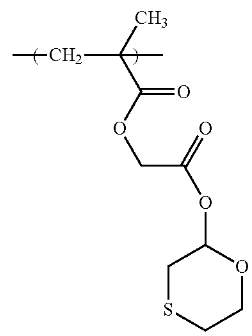

B′

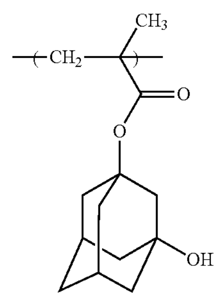

Ie′

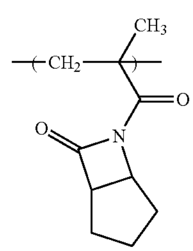

D′

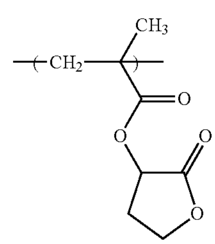

(Synthesis of Resin X1e)

Monomer He, monomer B and monomer D were mixed with molar ratio 50:25:25, and dioxane was added thereto in an amount equal to 1.5 weight times of the total amount of monomers. Azobisisobutyronitrile and azobis(2,4-dimethylvaleronitrile) were added as initiators thereto in an amount of 0.8 mol % and 2.5 mol % respectively with respect to the entire amount of monomers, and the resultant mixture was heated for about 5 hours at 70° C. After that, the reaction solution was poured into a mixture of methanol and ion-exchanged water in large amounts to precipitate. These operations were repeated 3 times for purification, thereby resulting in 48% yield of copolymer having a weight average molecular weight of about 12000. This copolymer, which had the structural units derived from the monomers of the following formulae, was designated Resin X1e.

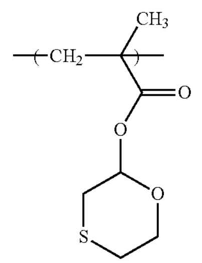

He′

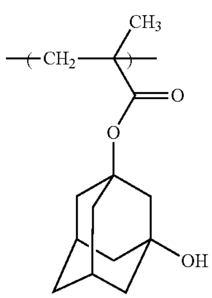

B′

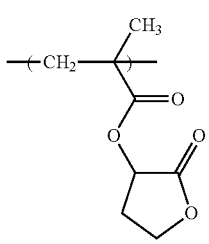

D′

(E) Examples and Comparative Examples

The resist compositions were prepared by mixing and dissolving each of the components shown in Table 9, and then filtering through a fluororesin filter having 0.2 μm pore diameter.

TABLE 9

(Unit: parts)

| (E) | Resin | Acid Generator | Quencher | PB/PEB (° C.) |
|---|---|---|---|---|
| Ex. 7e | A1e = 10 | B1e = 0.70 | C1 = 0.065 | 100/100 |
| Ex. 8e | A2e = 10 | B1e = 0.70 | C1 = 0.065 | 100/100 |
| Ex. 9e | A2e = 10 | B2e = 0.70 | C1 = 0.065 | 100/100 |
| Ex. 10e | A3e = 10 | B1e = 0.70 | C1 = 0.065 | 105/105 |
| Ex. 11e | A4e = 10 | B1e = 0.70 | C1 = 0.065 | 105/105 |
| Ex. 12e | A5e = 10 | B1e = 0.70 | C1 = 0.065 | 105/105 |

TABLE 9-continued

| | | | | |
|---|---|---|---|---|
| Ex. 13e | A6e = 10 | B1e = 0.70 | C1 = 0.065 | 105/105 |
| Ex. 14e | A3e = 10 | B3e = 0.70 | C1 = 0.065 | 105/105 |
| Comp. Ex. 1e | X1e = 10 | B2e = 0.70 | C1 = 0.065 | 100/100 |

<Acid generator>

B1e:

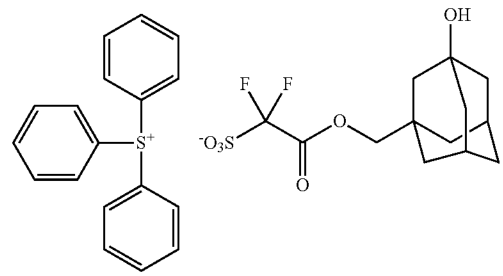

B2e: triphenylsulfonium perfluorobutanesulfonate, trade name: "TPS-109", Midori Kagaku Co., Ltd.

B3e:

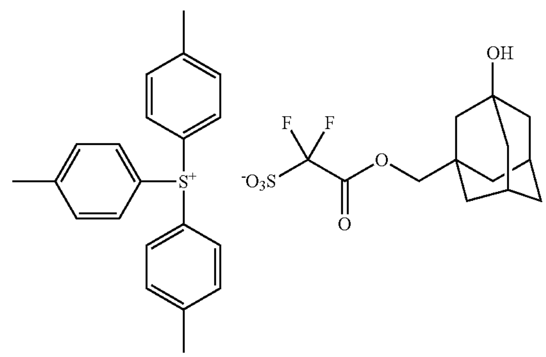

<Basic compound: Qencher>

C1: 2,6-diisopropylaniline,

<Solvent of Resist composition>

| | |
|---|---|
| Propylene glycol monomethyl ether acetate | 265 parts |
| 2-Heptanone | 20 parts |
| Propylene glycol monomethyl ether | 20 parts |
| γ-butyrolactone | 3.5 parts |

A composition for an organic antireflective film ("ARC-29", by Nissan Chemical Co. Ltd.) was applied onto 12-inch silicon wafers and baked for 60 seconds at 205° C. to form a 78 nm thick organic antireflective film.

The above resist compositions were then applied thereon by spin coating so that the thickness of the resulting film became 85 nm after drying.

The obtained wafers were then pre-baked for 60 sec on a direct hot plate at the temperatures given in the "PB" column in Table 9.

Line and space patterns were then emersion-exposed through stepwise changes in exposure quantity using an ArF excimer stepper for immersion lithography ("XT: 1900Gi" by ASML Ltd.: NA=1.35, 3/4 Annular, X-Y deflection), on the wafers on which the resist film had thus been formed.

The exposure was followed by 60 seconds of post-exposure baking at the temperatures given in the "PEB" column in Table 9.

This was followed by 60 sec of puddle development with 2.38 wt % tetramethylammonium hydroxide aqueous solution.

Effective sensitivity was represented as the exposure amount at which a 50 nm line and space pattern resolved to 1:1 with the each resist film.

Exposure Latitude (EL): in the range of exposure amount of Effective sensitivity±10%, the line width of the 50 nm-line and space pattern at its exposure amount was plotted, and found the absolute value of the inclination of the obtained line.

A "○○○" was given when the absolute value of the inclination was 1.3 nm/(mJ/cm$^2$) or less, a "○○" was given when the absolute value of the inclination was 1.5 nm/(mJ/cm$^2$) or less and more than 1.3 nm/(mJ/cm$^2$), a "○" was given when the absolute value of the inclination was 2.0 nm/(mJ/cm$^2$) or less and more than 1.5 nm/(mJ/cm$^2$), and it received an "×" if the absolute value of gradient of the obtained line was more than 2.0 nm/(mJ/cm$^2$).

Table 10 gives the there results.

TABLE 10

| | EL |
|---|---|
| Ex. 7e | ○○○(1.22) |
| Ex. 8e | ○○(1.48) |
| Ex. 9e | ○(1.92) |
| Ex. 10e | ○○○(1.12) |
| Ex. 11e | ○○○(1.28) |
| Ex. 12e | ○○○(1.25) |
| Ex. 13e | ○○○(1.16) |
| Ex. 14e | ○○○(1.08) |
| Comp. Ex. 1e | x(2.24) |

According to the resin of the present invention, it is possible to form a pattern with satisfactory shape and wide DOF using a resist composition contained the resin.

This application claims priority to Japanese Patent Applications No. JP 2009-200637, JP 2009-288800, JP 2010-121139, JP 2009-289082, JP 2009-289083, JP 2009-289084 and JP 2009-289085. The entire disclosure of Japanese Patent Applications No. JP 2009-200637, JP 2009-288800, JP 2010-121139, JP 2009-289082, JP 2009-289083, JP 2009-289084 and JP 2009-289085 are hereby incorporated herein by reference. While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A resin comprising a structural unit derived from a monomer having an acid-labile group and a structural unit derived from a compound represented by the formula (I);

(I)

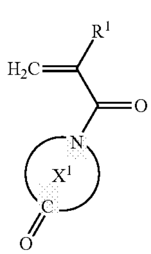

wherein $R^1$ represents a hydrogen atom, a halogen atom or a $C_1$ to $C_6$ alkyl group that optionally has one or more halogen atoms;

$X^1$ represents a $C_2$ to $C_{36}$ non-aromatic heterocyclic group, one or more hydrogen atoms contained in the non-aromatic heterocyclic group may be replaced by a halogen atom, a hydroxy group, a $C_1$ to $C_{24}$ hydrocarbon group, a $C_1$ to $C_{12}$ alkoxyl group, a $C_2$ to $C_4$ acyl group, or a $C_2$ to $C_4$ acyloxy group, and one or more —$CH_2$— contained in the non-aromatic heterocyclic group may be replaced by —CO—.

2. The resin according to claim 1, wherein the compound represented by the formula (I) is a compound represented by the formula (III);

(III)

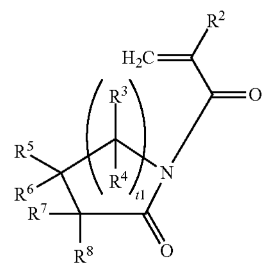

wherein $R^2$ represents a hydrogen atom, a halogen atom or a $C_1$ to $C_6$ alkyl group that optionally has one or more halogen atoms;

$R^3$ to $R^8$ independently represent a hydrogen atom, or a $C_1$ to $C_{24}$ hydrocarbon group, and at least two of $R^3$ to $R^8$ may be bonded together to form a $C_3$ to $C_{30}$ ring, one or more hydrogen atoms contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group, or a $C_2$ to $C_4$ acyloxy group, and one or more —$CH_2$— contained in the hydrocarbon group or the ring may be replaced by —CO—;

t1 represents an integer of 0 to 3.

3. The resin according to claim 1, wherein the compound represented by the formula (I) is a compound represented by the formula (VI);

(VI)

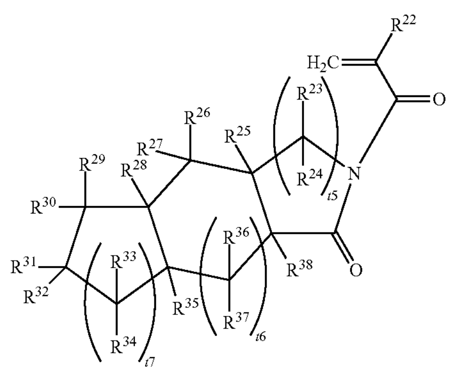

wherein $R^{22}$ represents a hydrogen atom, a halogen atom or a $C_1$ to $C_6$ alkyl group that optionally has one or more halogen atoms;

$R^{23}$ to $R^{38}$ independently represent a hydrogen atom, or a $C_1$ to $C_{12}$ hydrocarbon group, and at least two of $R^{23}$ to $R^{38}$ may be bonded together to form a $C_3$ to $C_{18}$ ring, one or more hydrogen atoms contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group, or a $C_2$ to $C_4$ acyloxy group, and one or more —$CH_2$— contained in the hydrocarbon group or the ring may be replaced by —CO—;

t5, t6 and t7 independently represent an integer of 0 to 3.

4. The resin according to claim 1, wherein the compound represented by the formula (I) is a compound represented by the formula (VII)

(VII)

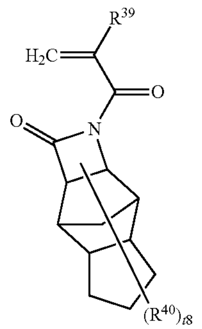

wherein $R^{39}$ represents a hydrogen atom, a halogen atom or a $C_1$ to $C_6$ alkyl group that optionally has one or more halogen atoms;

$R^{40}$ represents a halogen atom, a hydroxy group, a $C_1$ to $C_{12}$ alkyl group, a $C_1$ to $C_{12}$ alkoxyl group, a $C_2$ to $C_4$ acyl group, or a $C_2$ to $C_4$ acyloxy group;

t8 represents an integer of 0 to 14.

5. The resin according to claim 1, wherein the resin comprising the structural unit derived from the compound represented by the formula (I) and a structural unit derived from a compound represented by the formula (II1);

(II1)

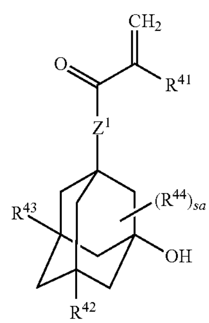

wherein $R^{41}$ represents a hydrogen atom, a halogen atom or a $C_1$ to $C_6$ alkyl group that optionally has one or more halogen atoms;

$Z^1$ represents a divalent $C_1$ to $C_{17}$ saturated hydrocarbon group, and one or more —$CH_2$—contained in the saturated hydrocarbon group may be replaced by —O—, —CO— or —S—;

$R^{42}$ and $R^{43}$ independently represent a hydrogen atom, a methyl group or hydroxy group, provided that at least one of $R^{42}$ and $R^{43}$ represents a hydroxy group;

$R^{44}$ represents a $C_1$ to $C_6$ alkyl group;

sa represents an integer of 0 to 10.

6. The resin according to claim 1, wherein the resin comprising the structural unit derived from the compound represented by the formula (I) and a structural unit derived from a compound represented by the formula (II2);

(II2)

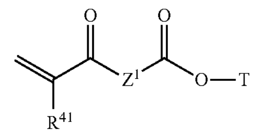

wherein $R^{41}$ represents a hydrogen atom, a halogen atom or a $C_1$ to $C_6$ alkyl group that optionally has one or more halogen atoms;

$Z^1$ represents a divalent $C_1$ to $C_{17}$ saturated hydrocarbon group, and one or more —$CH_2$— contained in the saturated hydrocarbon group may be replaced by —O—, —CO—, —S— or —N($R^{45}$)—;

$R^{45}$ represents a hydrogen atom or a $C_1$ to $C_6$ alkyl group;

T represents a heterocyclic group containing —$SO_2$— as skeleton, one or more hydrogen atoms contained in the heterocyclic group may be replaced by a halogen atom, a hydroxy group, a $C_1$ to $C_{12}$ alkyl group, a $C_1$ to $C_{12}$ alkoxyl group, a $C_6$ to $C_{12}$ aryl group, a $C_7$ to $C_{13}$ aralkyl group, glycidyloxy group or a $C_2$ to $C_4$ acyl group, and one or more —$CH_2$— contained in the heterocyclic group may be replaced by —CO—, —O—, —S—, —$SO_2$— or —N($R^{45}$)—.

7. The resin according to claim 6, wherein T is a group having norbornane skeleton.

8. The resin according to claim 6, wherein T is a group represented by the formula (T3);

(T3)

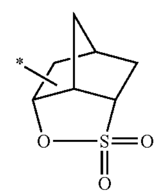

wherein one or more hydrogen atoms contained in the ring may be replaced by a halogen atom, a hydroxy group, a $C_1$ to $C_{12}$ alkyl group, a $C_1$ to $C_{12}$ alkoxyl group, a $C_6$ to $C_{12}$ aryl group, a $C_7$ to $C_{13}$ aralkyl group, glycidyloxy group or a $C_2$ to $C_4$ acyl group, and one or more —$CH_2$—contained in the ring may be replaced by —CO—, —O—, —S—, —$SO_2$— or —N($R^{45}$)—;

$R^{45}$ represents a hydrogen atom or a $C_1$ to $C_6$ alkyl group;

* represents a binding position to —O—.

9. The resin according to claim 1, wherein the resin comprising the structural unit derived from the compound represented by the formula (I) and a structural unit derived from a compound represented by the formula (II3);

(II3)

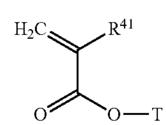

wherein $R^{41}$ represents a hydrogen atom, a halogen atom or a $C_1$ to $C_6$ alkyl group that optionally has one or more halogen atoms;

T represents a heterocyclic group containing —$SO_2$— as skeleton, one or more hydrogen atoms contained in the heterocyclic group may be replaced by a halogen atom, a hydroxy group, a $C_1$ to $C_{12}$ alkyl group, a $C_1$ to $C_{12}$ alkoxyl group, a $C_6$ to $C_{12}$ aryl group, a $C_7$ to $C_{13}$ aralkyl group, glycidyloxy group or a $C_2$ to $C_4$ acyl group, and one or more —$CH_2$— contained in the heterocyclic group may be replaced by —CO—, —O—, —S—, —$SO_2$— or —N($R^{45}$)—;

$R^{45}$ represents a hydrogen atom or a $C_1$ to $C_6$ alkyl group.

10. The resin according to claim 9, wherein T is a group having norbornane skeleton.

11. The resin according to claim 9, wherein T is a group represented by the formula (T3);

(T3)

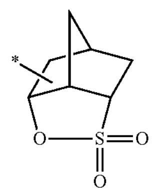

wherein one or more hydrogen atoms contained in the ring may be replaced by a halogen atom, a hydroxy group, a $C_1$ to $C_{12}$ alkyl group, a $C_1$ to $C_{12}$ alkoxyl group, a $C_6$ to $C_{12}$ aryl group, a $C_7$ to $C_{13}$ aralkyl group, glycidyloxy group or a $C_2$ to $C_4$ acyl group, and one or more —$CH_2$—contained in the ring may be replaced by —CO—, —O—, —S—, —$SO_2$— or —N($R^{45}$)—;

$R^{45}$ represented a hydrogen atom or a $C_1$ to $C_6$ alkyl group;

* represents a binding position to —O—.

12. The resin according to claim 1, wherein the resin comprising the structural unit derived from the compound represented by the formula (I) and a structural unit derived from a compound represented by the formula (II4);

(II4)

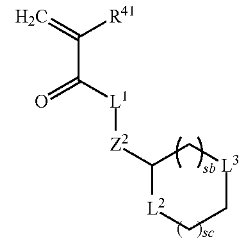

wherein $R^{41}$ represents a hydrogen atom, a halogen atom or a $C_1$ to $C_6$ alkyl group that optionally has one or more halogen atoms;

$Z^2$ represents a single bond or *—$(CH_2)_{sd}$—CO-$L^4$-;

$L^1$, $L^2$, $L^3$ and $L^4$ independently represent —O— or —S—;

sb represents an integer of 1 to 3;

sc represents an integer of 0 to 3;

sd represents an integer of 1 to 4;

* represents a binding position to $L^1$.

13. A resist composition comprising a resin according to claim 1, and an acid generator.

14. The resist composition according to claim 13, which further comprises a basic compound.

15. A method for producing resist pattern comprising steps of;

(1) applying the resist composition according to claim 13 onto a substrate;

(2) drying the applied composition to form a composition layer;

(3) exposing to the composition layer using a exposure device;

(4) baking the exposed composition layer and, (5) developing the baked composition layer using a developing apparatus.

* * * * *